(12) United States Patent
Suzuki et al.

(10) Patent No.: US 6,758,876 B2
(45) Date of Patent: Jul. 6, 2004

(54) SUBSTRATE TRANSPORT APPARATUS, POD AND METHOD

(75) Inventors: Yoko Suzuki, Tokyo (JP); Akira Tanaka, Tokyo (JP); Takashi Kishi, Tokyo (JP)

(73) Assignee: Ebara Corporation, Tokyo (JP)

( * ) Notice: Subject to any disclaimer, the term of this patent is extended or adjusted under 35 U.S.C. 154(b) by 180 days.

(21) Appl. No.: 10/000,304

(22) Filed: Dec. 4, 2001

(65) Prior Publication Data

US 2002/0124906 A1 Sep. 12, 2002

(30) Foreign Application Priority Data

| Dec. 4, 2000 | (JP) | 2000-369333 |
| Dec. 25, 2000 | (JP) | 2000-404696 |
| Jan. 17, 2001 | (JP) | 2001-47404 |

(51) Int. Cl.[7] ............................................. B01D 46/00
(52) U.S. Cl. .................... 55/385.6; 55/385.1; 55/385.2; 55/418; 55/471; 206/710; 206/711; 454/187; 454/192
(58) Field of Search ............................. 55/385.1, 385.2, 55/385.6, 418, 471; 206/710, 711; 454/187, 192

(56) References Cited

U.S. PATENT DOCUMENTS

| 4,471,716 A | * 9/1984 | Milliren ...................... 206/454 |
| 4,967,295 A | 10/1990 | Yamauchi et al. |
| 5,207,548 A | * 5/1993 | Suffel ......................... 414/404 |

(List continued on next page.)

FOREIGN PATENT DOCUMENTS

| EP | 0560379 A1 | 9/1993 |
| EP | 1297882 A1 | 4/2003 |
| JP | 3-143518 | 6/1991 |
| JP | 6-29373 | 2/1994 |
| JP | 6-291177 | 10/1994 |
| JP | 7-94577 | 4/1995 |
| JP | 7-125806 | 5/1995 |
| JP | 7-293956 | 11/1995 |
| JP | 9-29020 | 2/1997 |
| JP | 11-40207 | 2/1999 |
| JP | 11-195699 | 7/1999 |
| JP | 11-274282 | 10/1999 |
| JP | 11-314703 | 11/1999 |
| JP | 2001-174109 | 6/2000 |
| JP | 2000-223554 | 8/2000 |
| JP | 2000-253596 | 9/2000 |
| JP | 2000-311936 | 11/2000 |

OTHER PUBLICATIONS

Shoko Ito et al., "Wafer ambient control for Agile FAB", 0–7803–6731–6/01/&10.00©2001 IEEE, pp. 121–124.

*Primary Examiner*—Minh-Chau T. Pham
(74) *Attorney, Agent, or Firm*—Wenderoth, Lind & Ponack, L.L.P.

(57) ABSTRACT

A method of using a substrate transport pod is provided, which is suitable for manufacturing semiconductor devices with copper wiring and low dielectric insulating film having dielectric constants of less than 3. The method is based on loading the substrates into a pod from an atmosphere of a first process, and circulating a gaseous atmosphere through interior of the pod in such a way to selectively remove at least one contaminant including moisture, particulate substances or chemical substances, and to expose the substrates to a controlled atmosphere intermittently or continually while the substrates are held in the pod before they are unloaded from the pod and introduced into a second process. For a pod that is used to house the substrates for the purpose of retaining or transporting, the pod has a pod main body and a door that provides a hermetic sealing seal, and the pod is made primarily of a materiel that has moisture absorption factor of less than 0.1%, the pod can contact the substrates directly or indirectly and has a conductive area so as to enable static charges to be guided out of the pod.

58 Claims, 101 Drawing Sheets

U.S. PATENT DOCUMENTS

| | | | | |
|---|---|---|---|---|
| 5,255,797 A | * | 10/1993 | Kos | 206/454 |
| 5,346,518 A | | 9/1994 | Baseman et al. | |
| 5,380,503 A | | 1/1995 | Fujii et al. | |
| 5,749,469 A | * | 5/1998 | Williams | 206/454 |
| 6,040,680 A | | 3/2000 | Toya et al. | |
| 6,364,922 B1 | * | 4/2002 | Tanaka et al. | 55/385.1 |
| 6,436,849 B1 | | 8/2002 | Hasunuma et al. | |
| 2001/0011640 A1 | | 8/2001 | Suzuki et al. | |

* cited by examiner

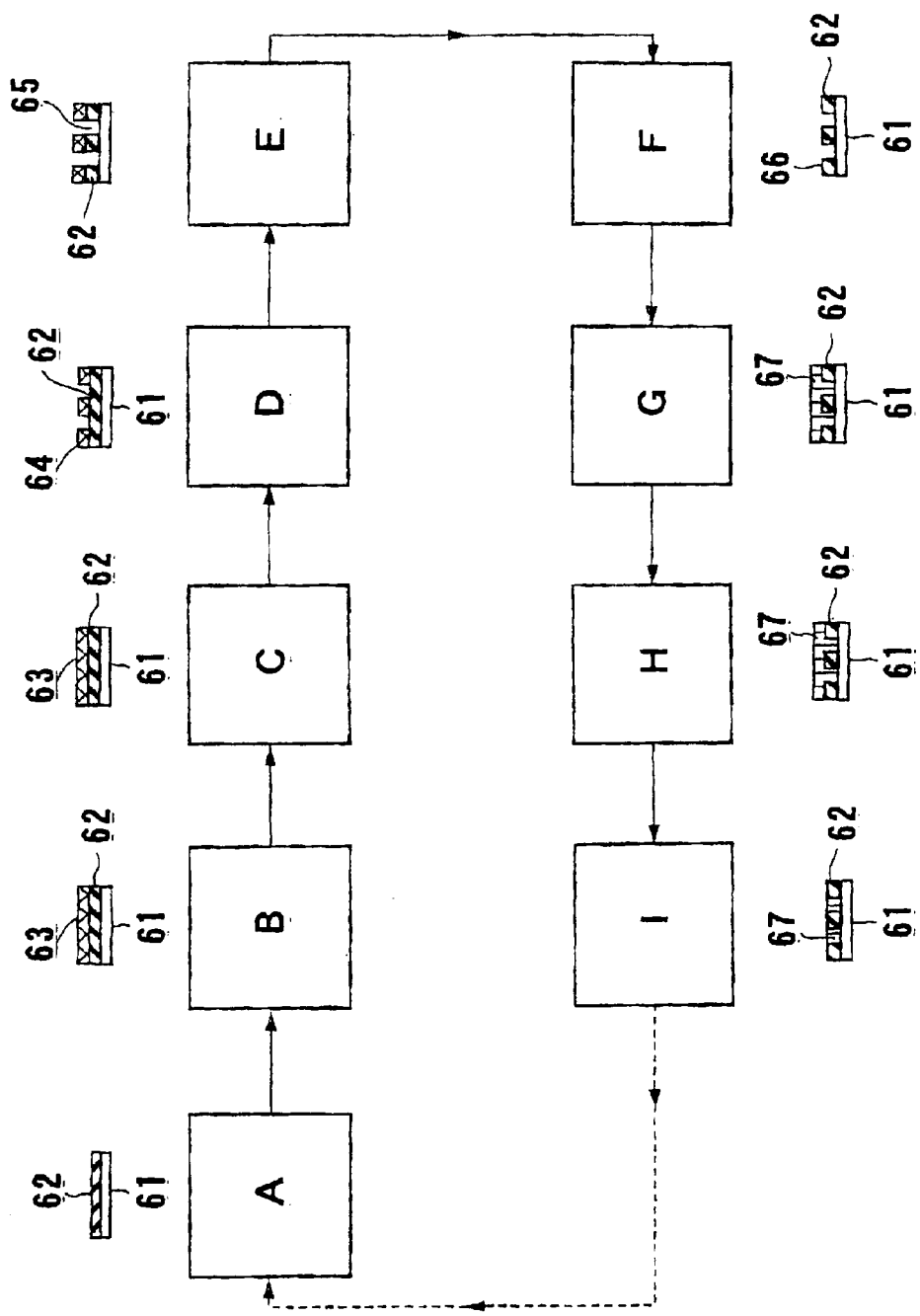

F I G. 1 8
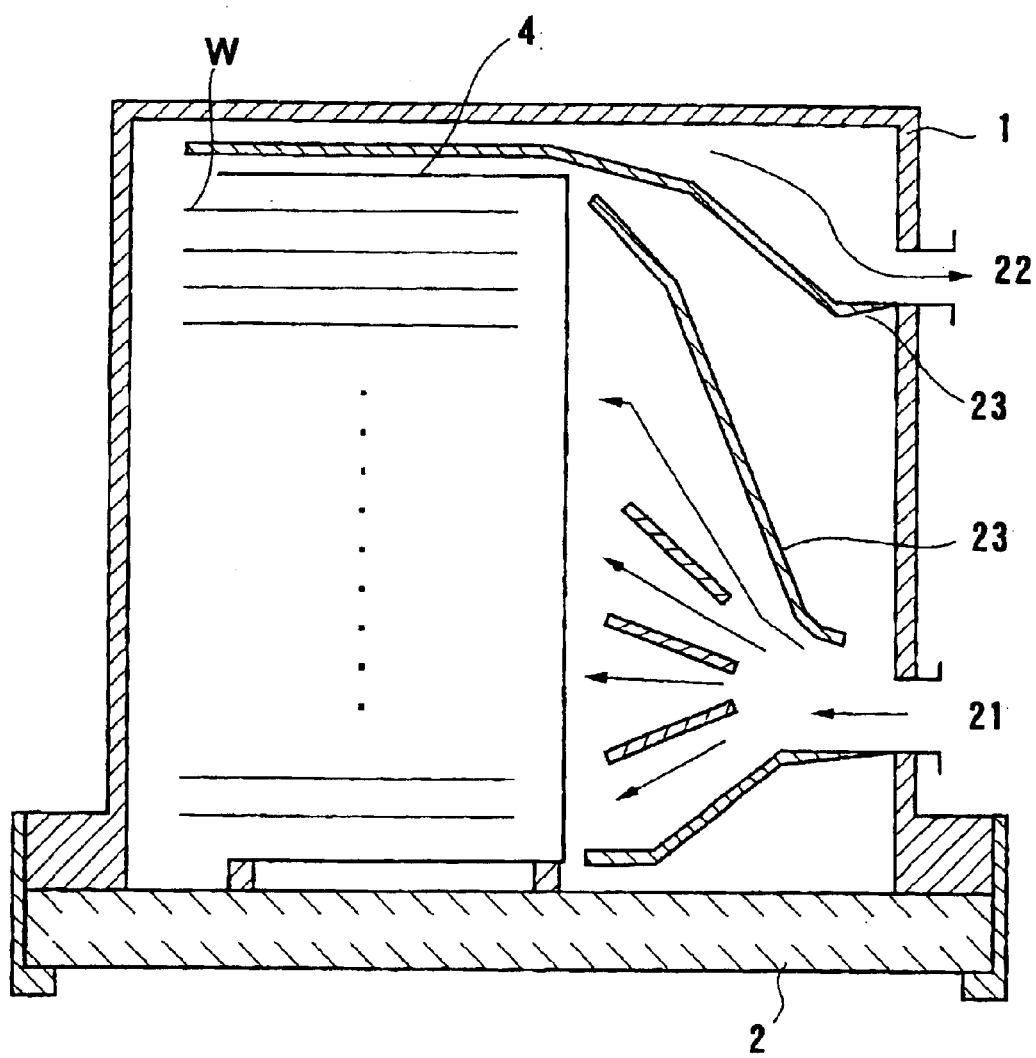

F I G. 19
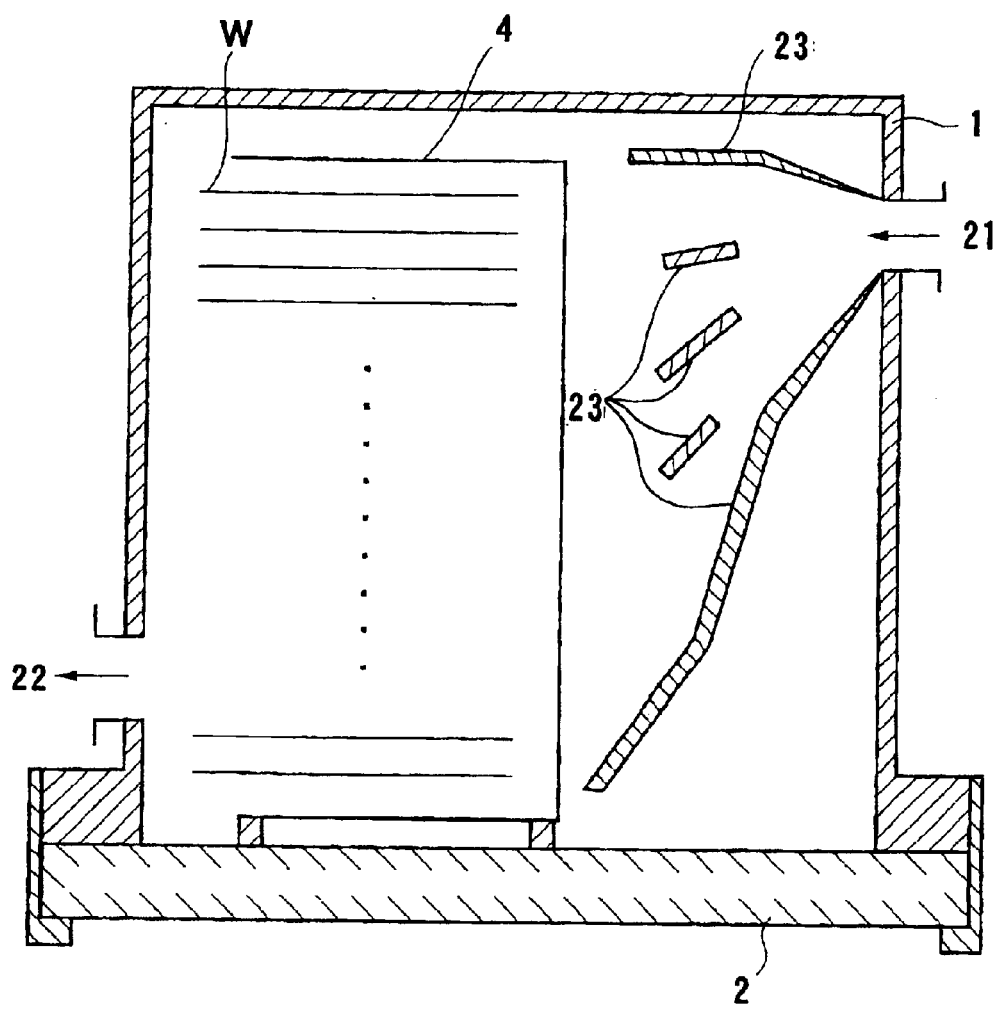

F I G. 2 4
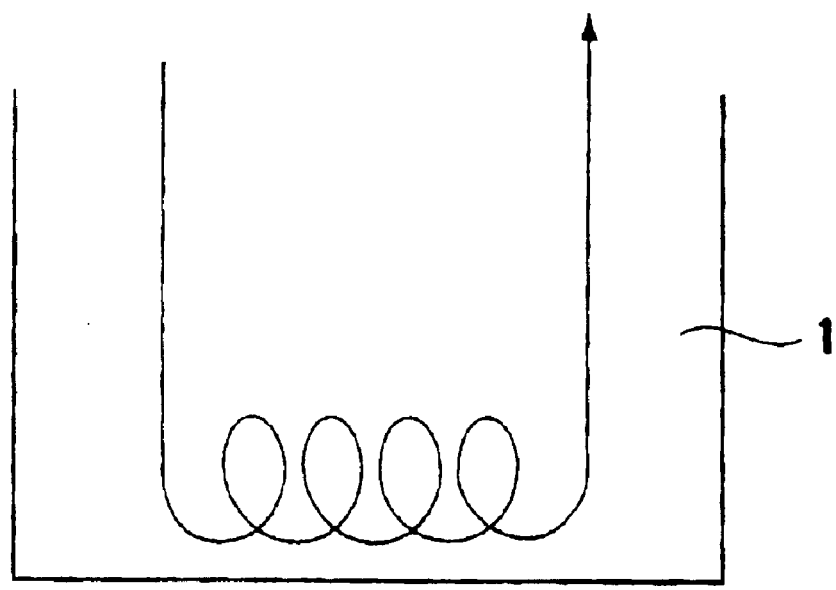
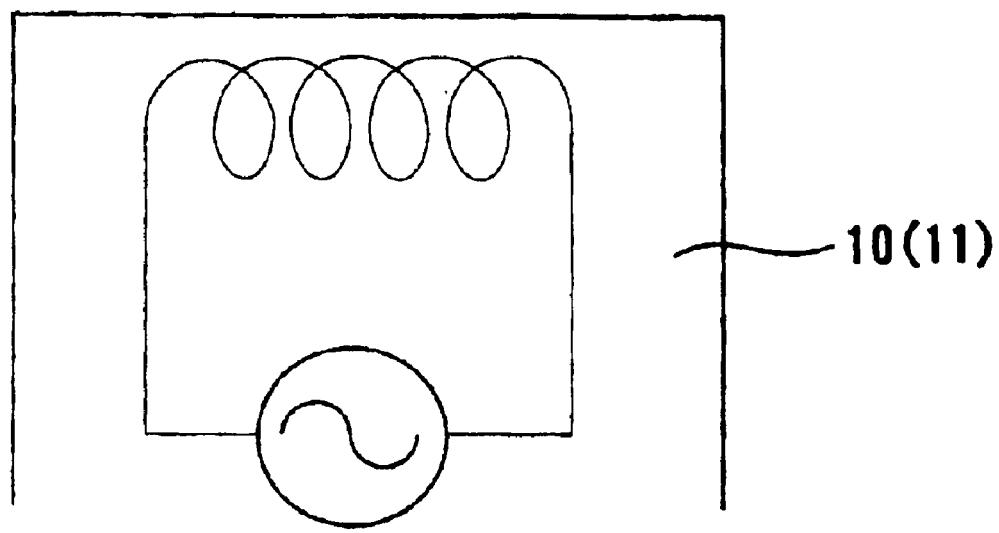

FIG. 27A
FIG. 27B
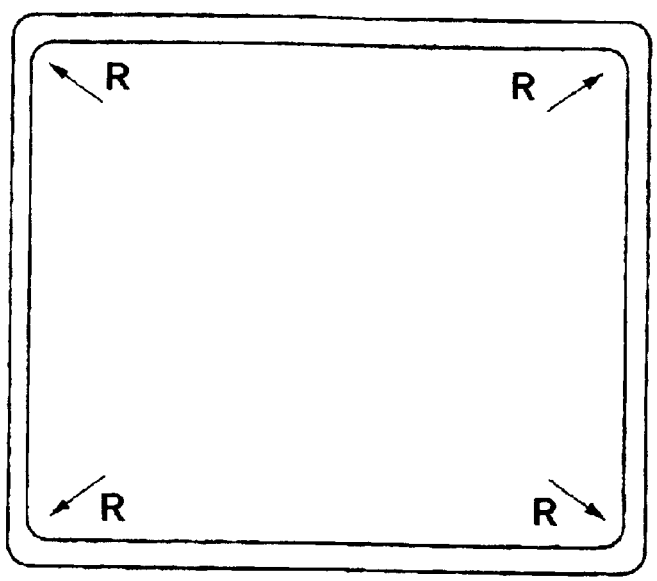
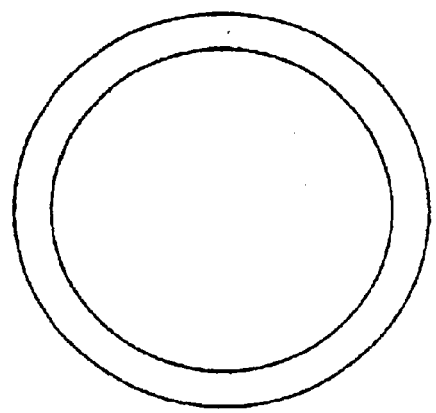

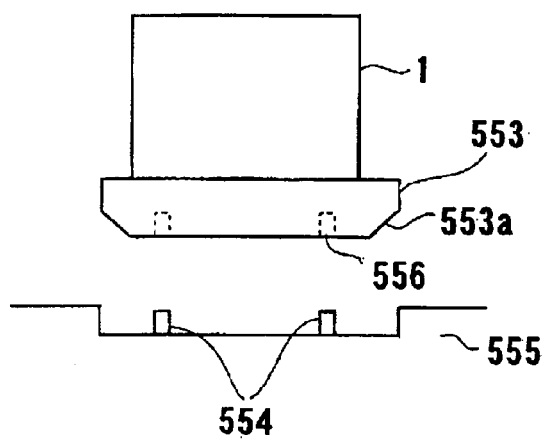
F I G. 3 2 A
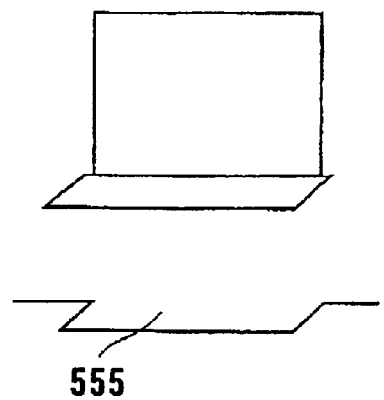
F I G. 3 2 B
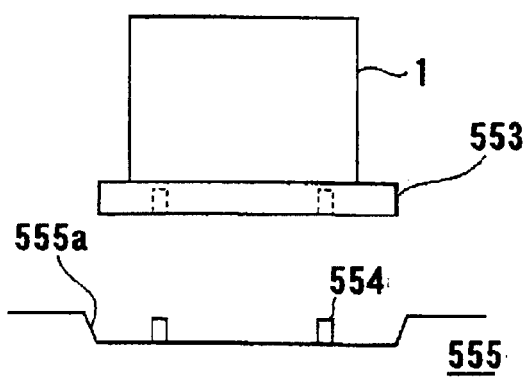
F I G. 3 2 C

F I G. 3 6 A
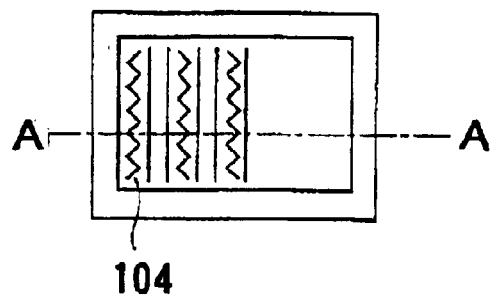
F I G. 3 6 B
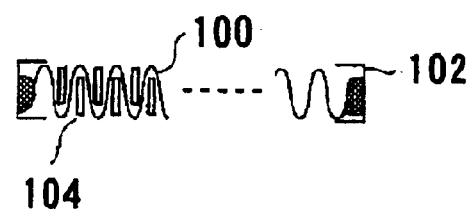
F I G. 3 6 C
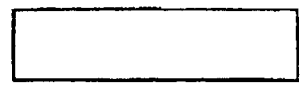

F I G. 3 9
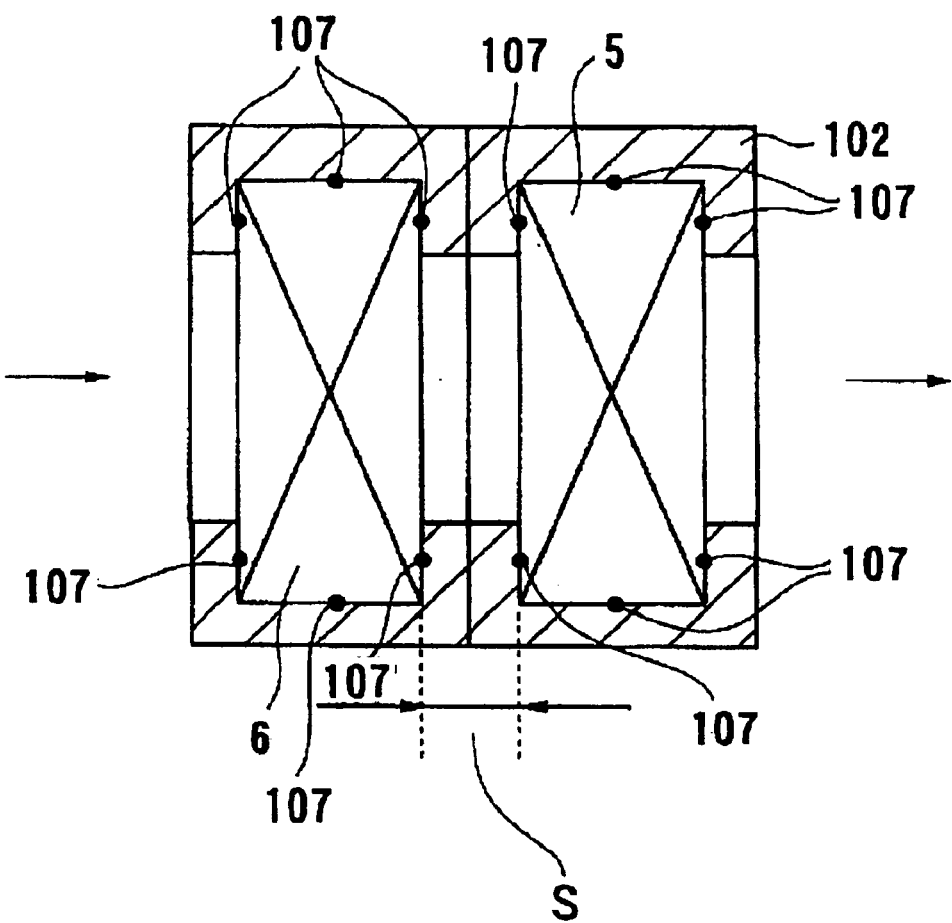

F I G. 45A
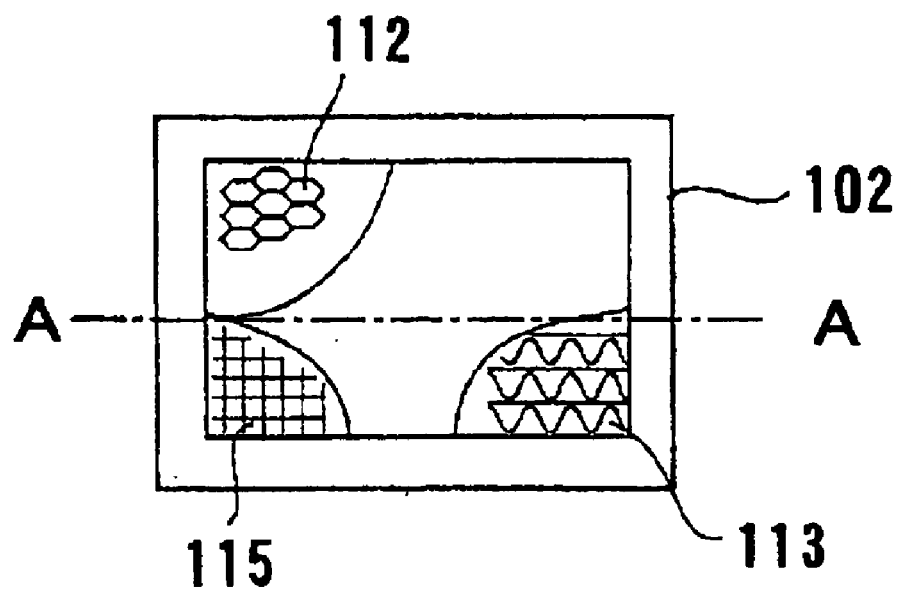
F I G. 45B

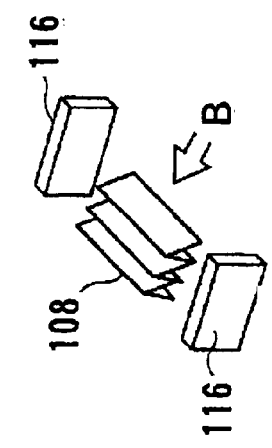
FIG. 46B
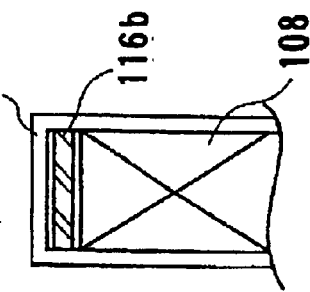
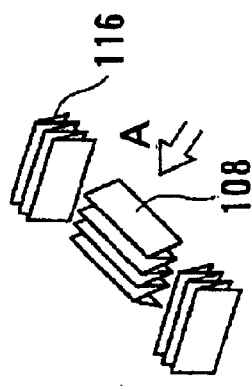
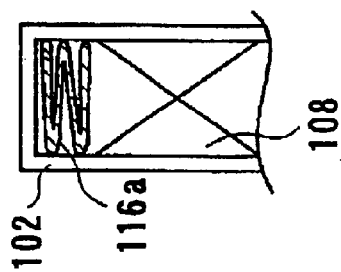
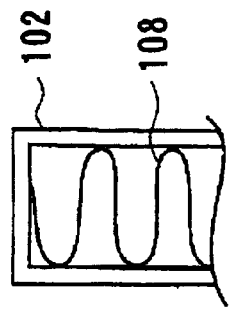
FIG. 46A
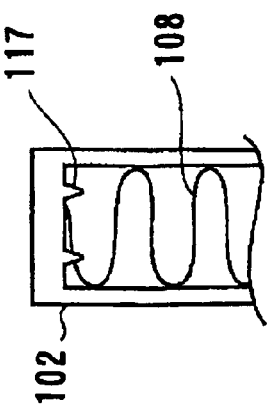
FIG. 46C F I G. 5 0
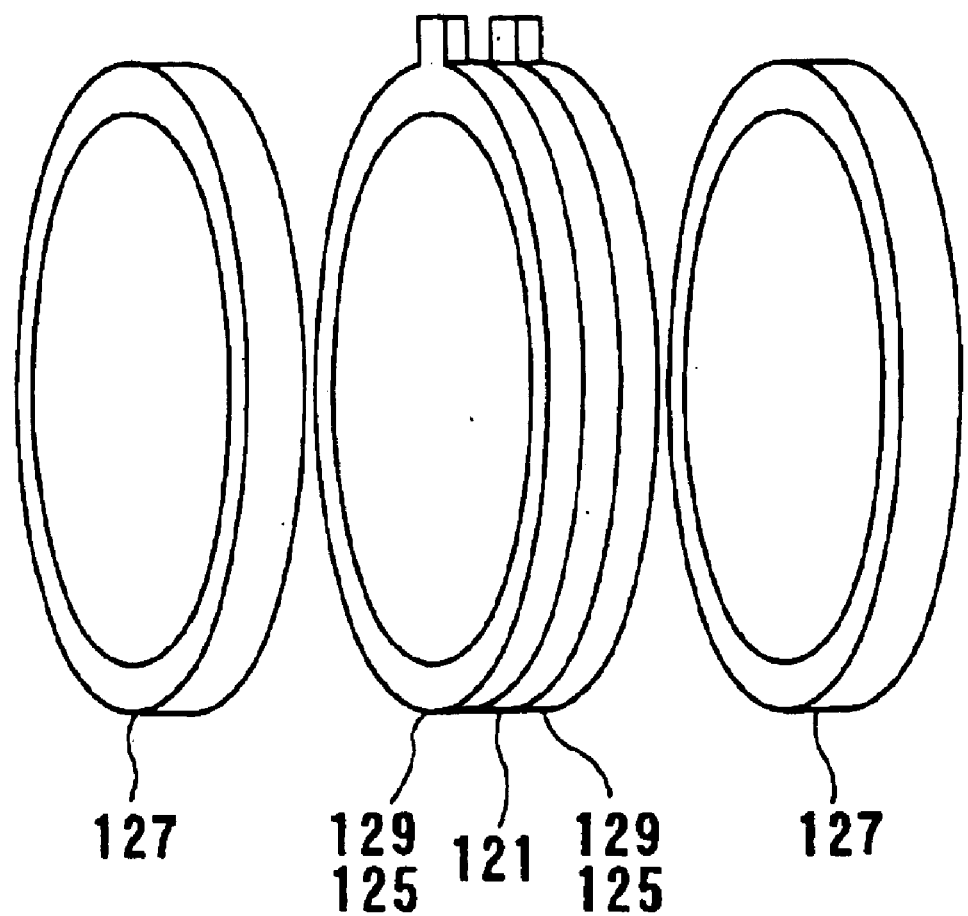
127    129  121  129    127
       125       125

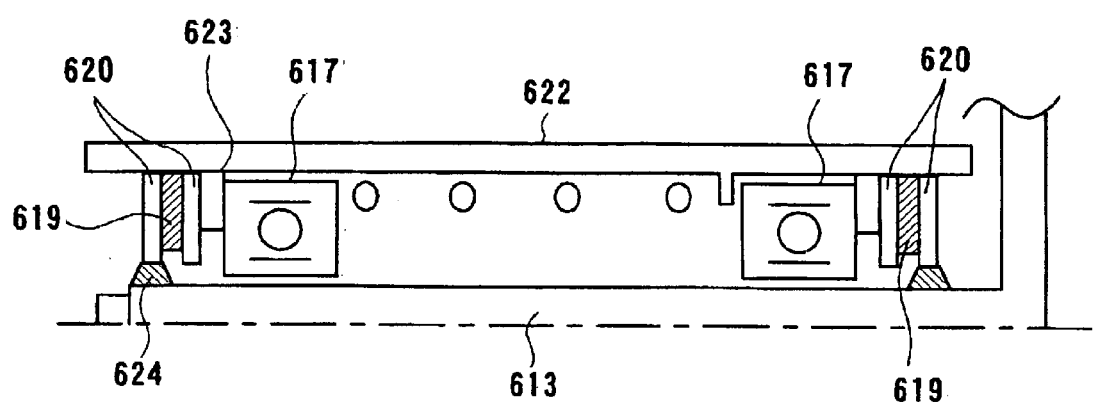
F I G. 5 2

F I G. 5 4
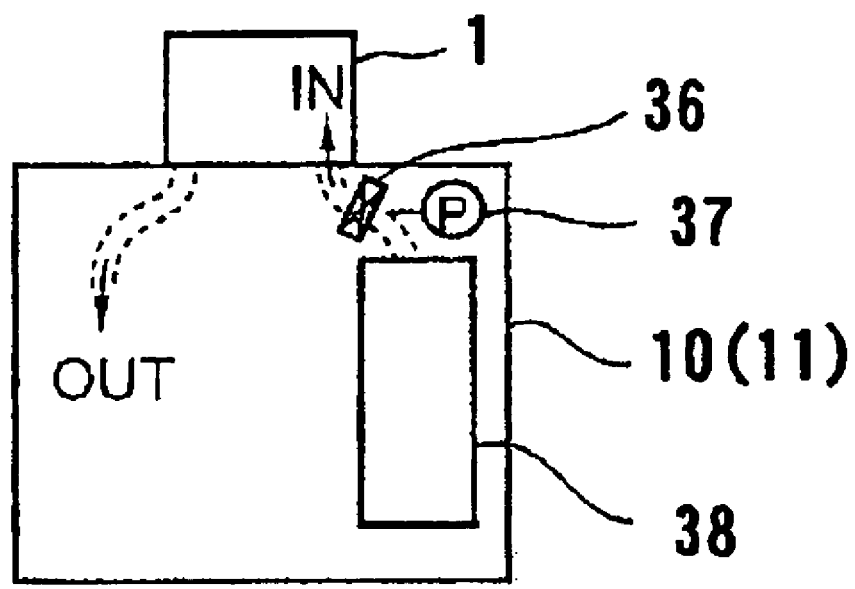

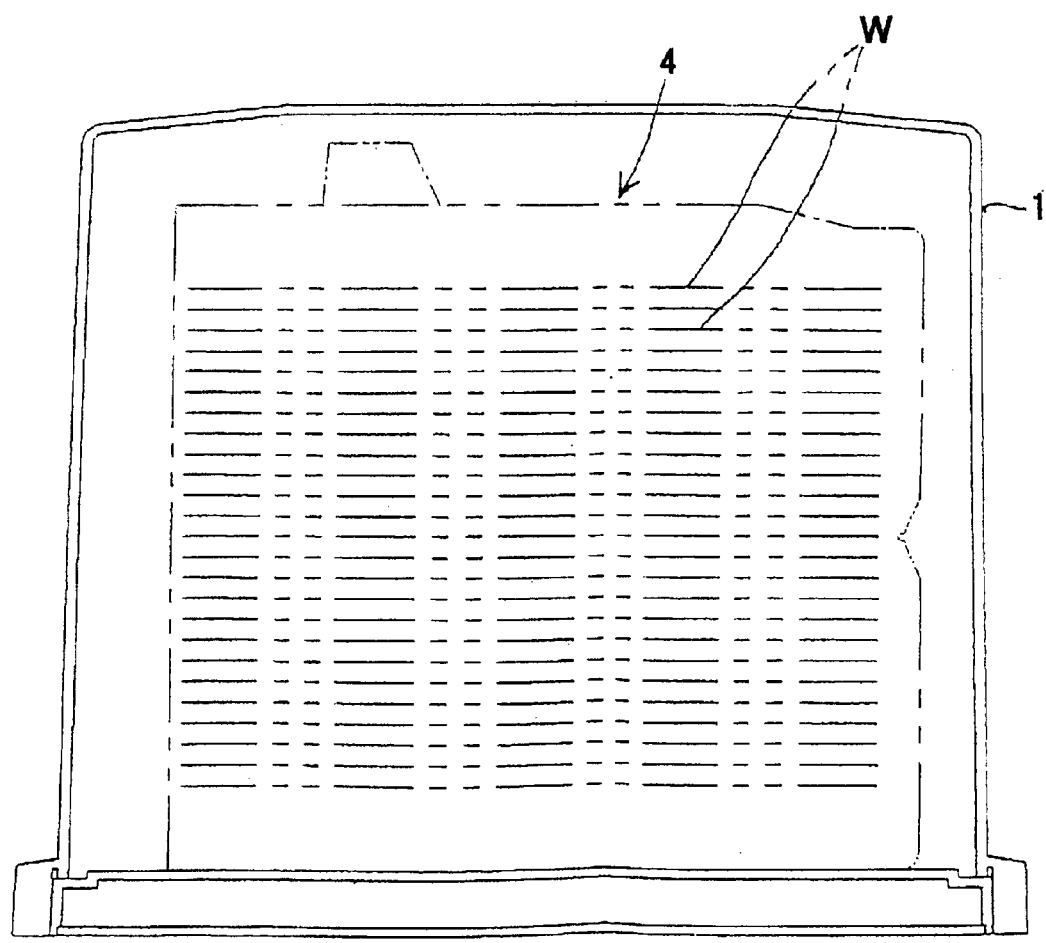
F I G. 5 6

F I G. 6 2
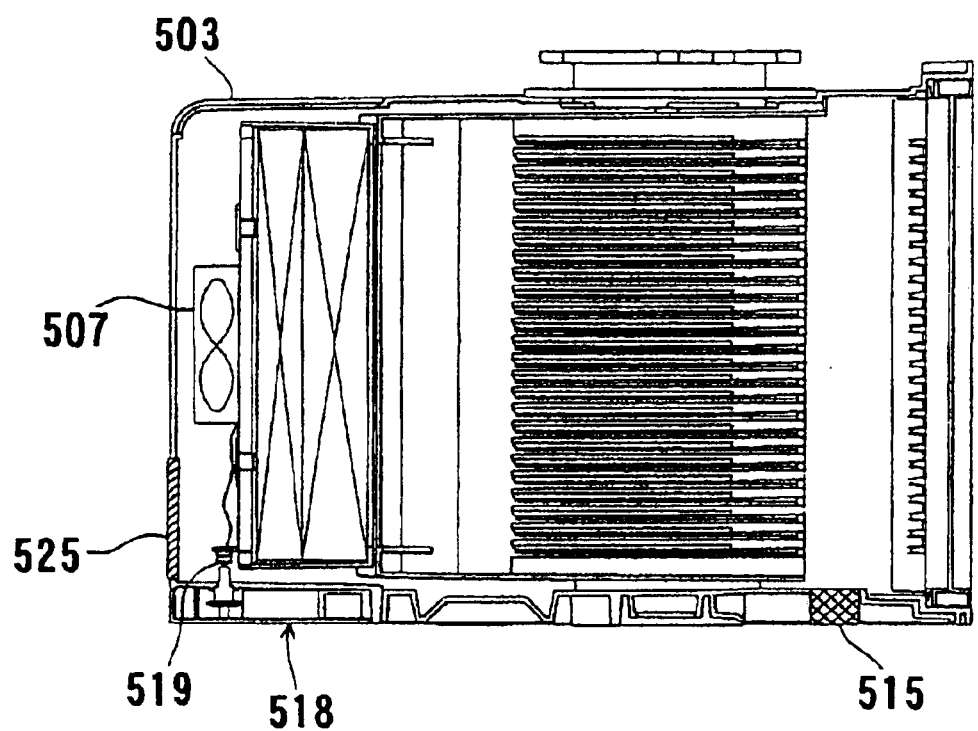

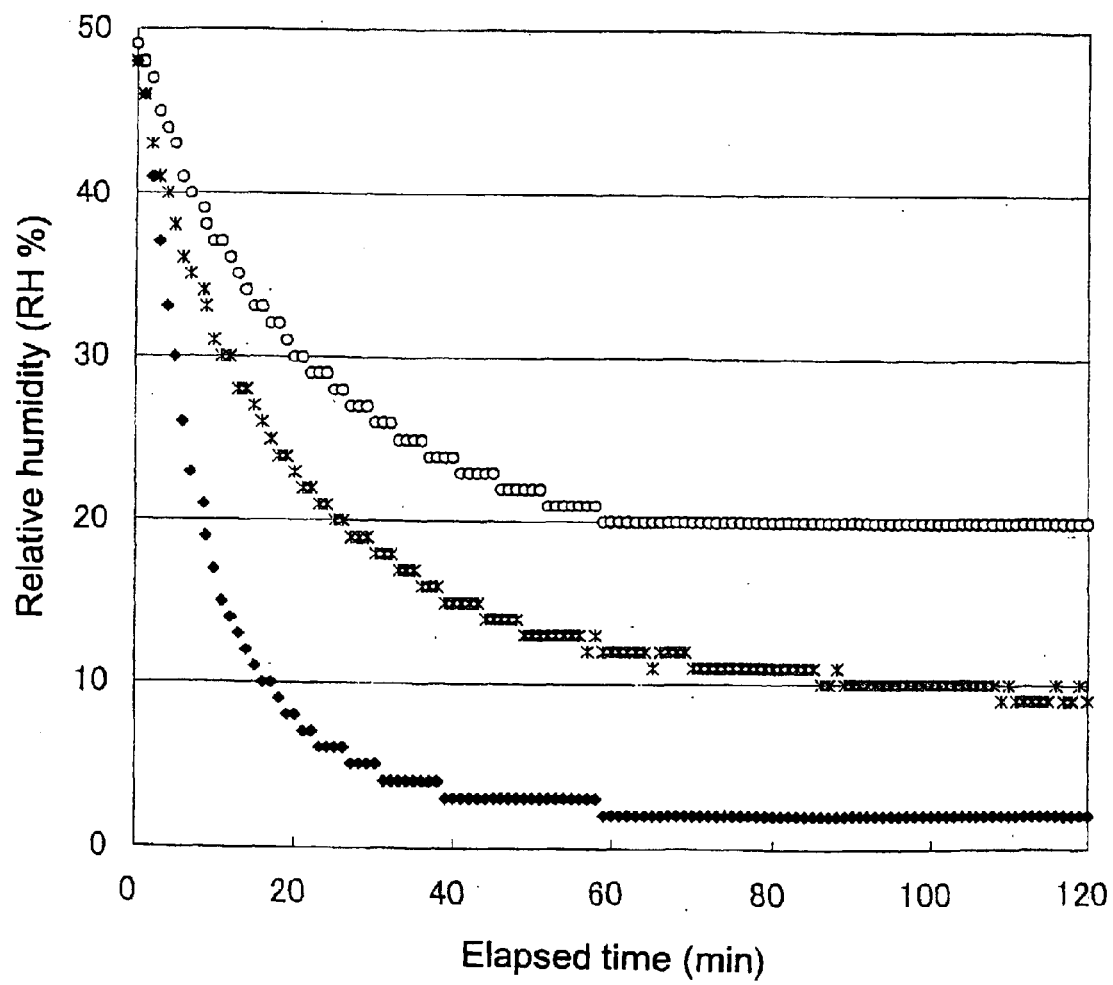
F I G. 74

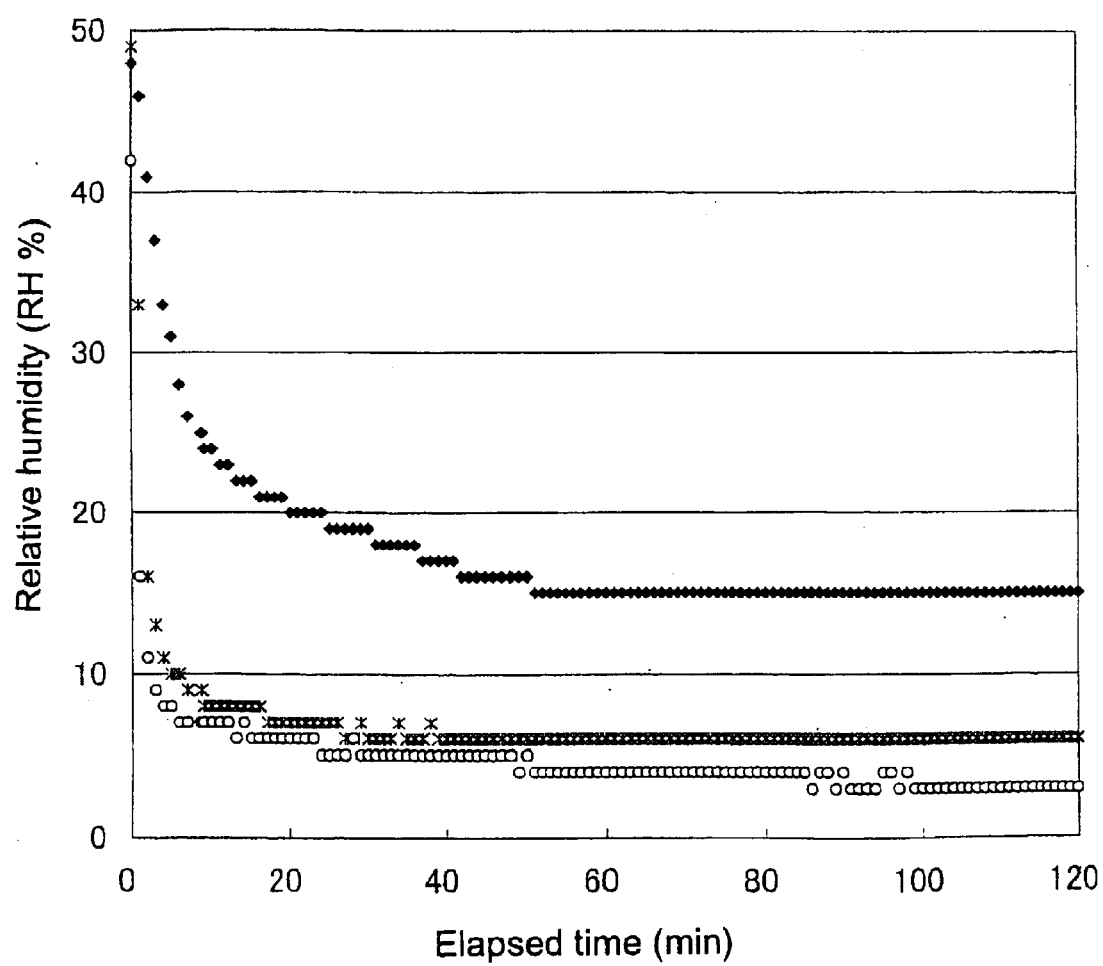
F I G. 75

F I G. 8 3
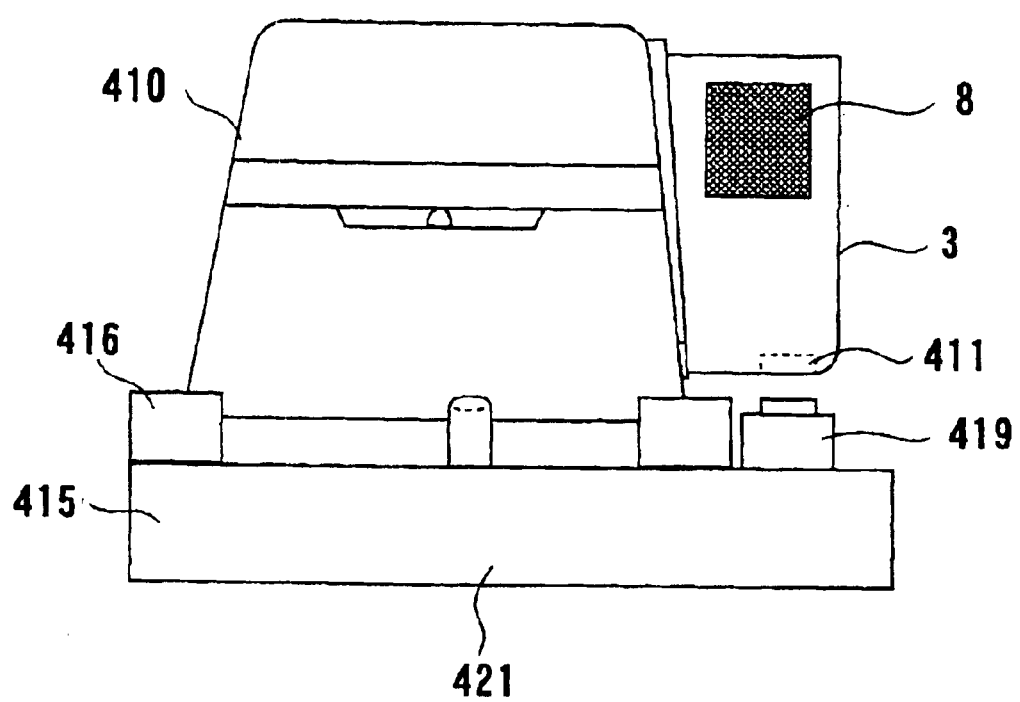

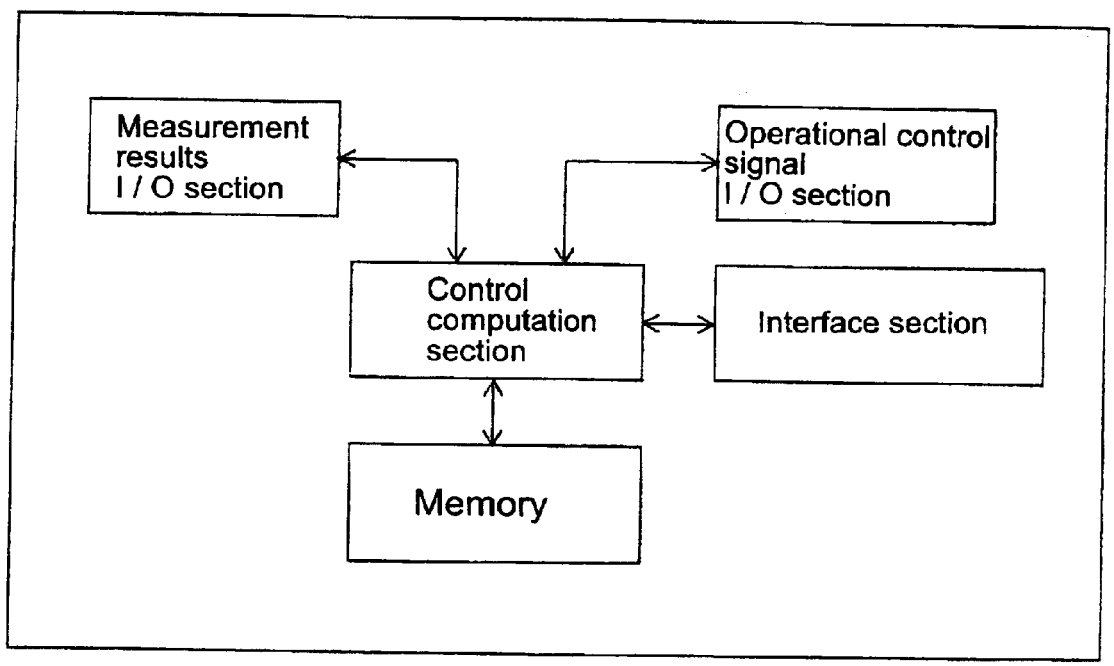
F I G. 85

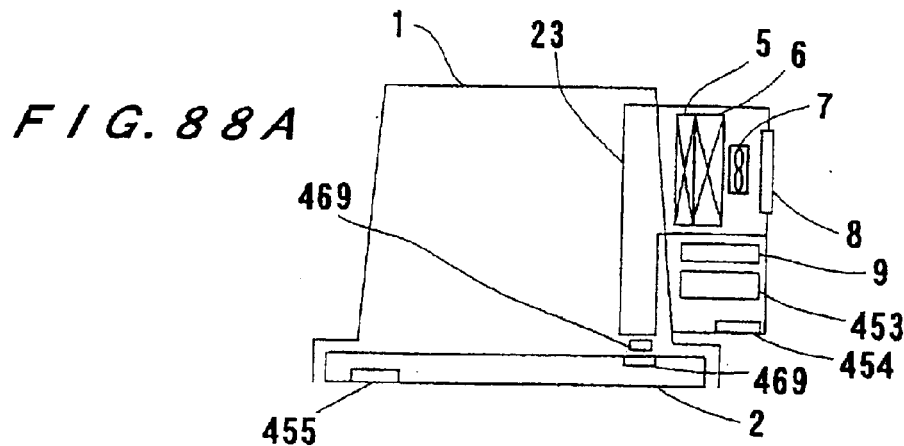
F I G. 88A
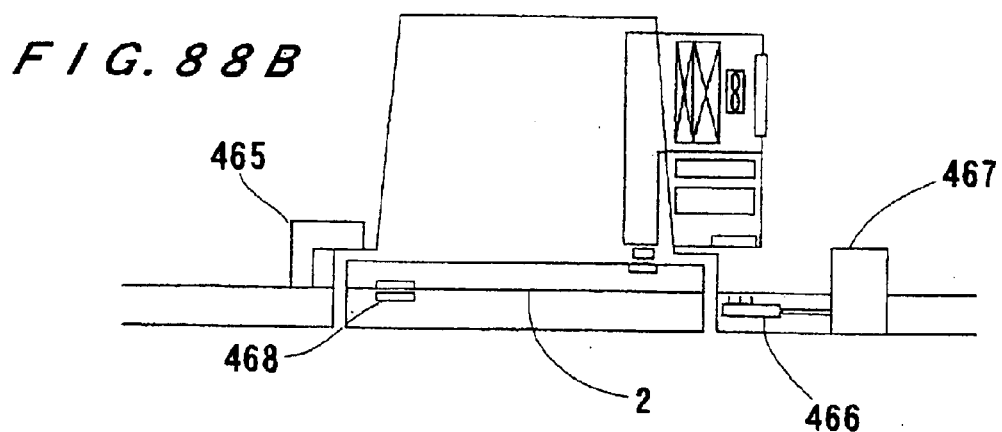
F I G. 88B
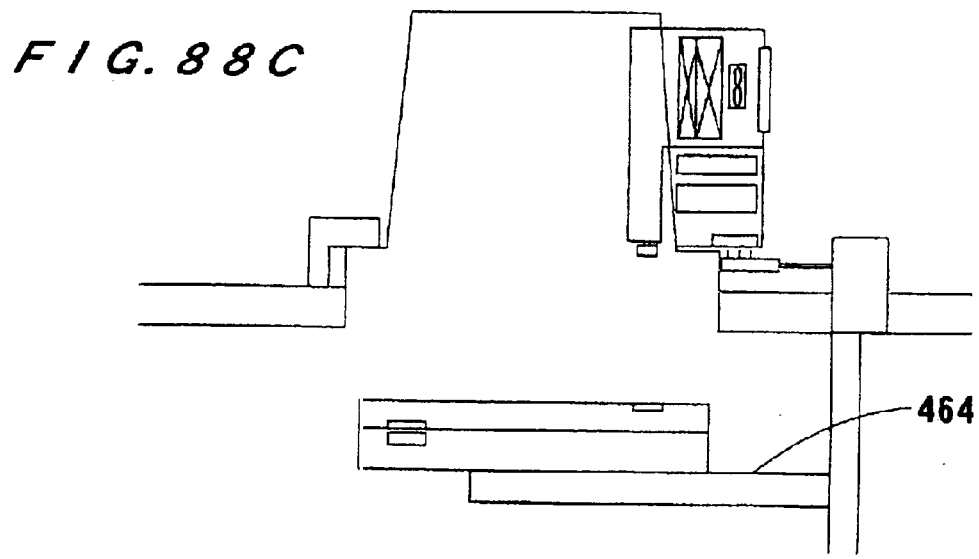
F I G. 88C

F I G. 9 3
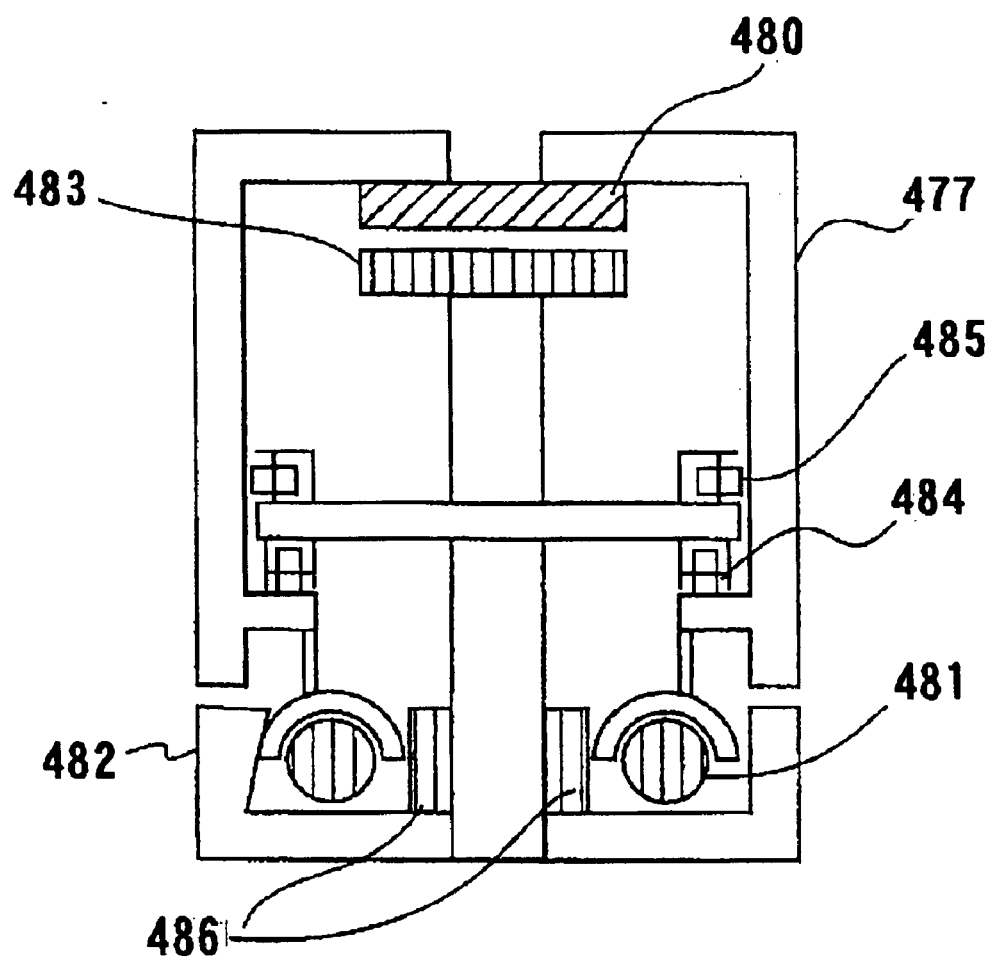

A - A cross-sectional view

B enlarged view

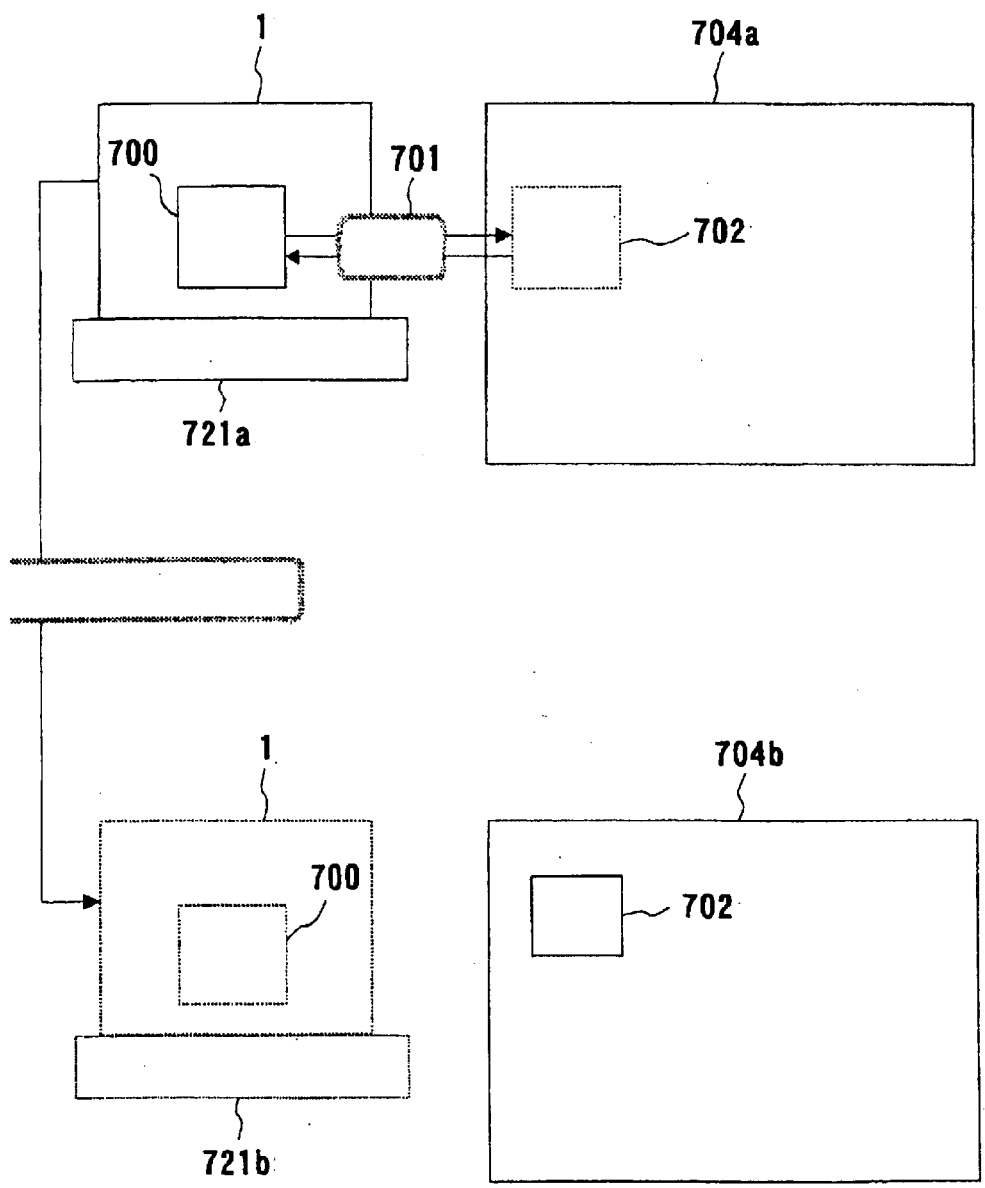
F I G. 1 0 0

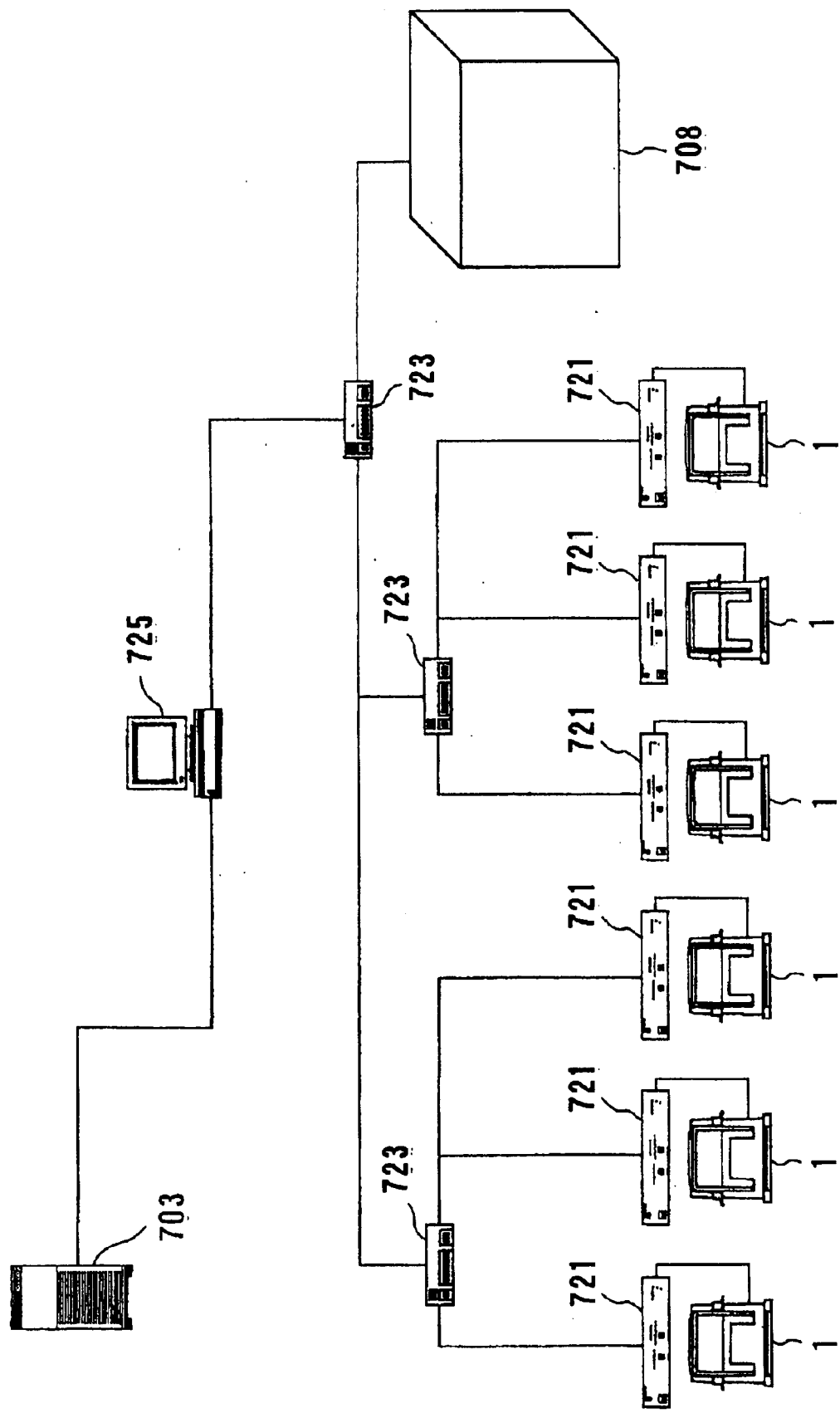

SUBSTRATE TRANSPORT APPARATUS, POD AND METHOD

BACKGROUND OF THE INVENTION

1. Field of the Invention

The present invention relates to the structures, capabilities and methods of operating a substrate transport pod suitable for storing or transporting objects such as semiconductor wafers, photo-masks or hard-disks in a highly clean environment, and relates in particular to a method of managing the operation of the substrate transport pod to be used in semiconductor manufacturing processes.

2. Description of the Related Art

As semiconductor elements become more minute, it is anticipated that an even higher degree of cleanliness would be required in the future. For example, it is anticipated that the target control size of the particles that can cause pattern defects and shorting of wiring would become smaller than 0.1 $\mu$m. Further, in addition to particulate contaminants, it becomes necessary to reduce gaseous contaminants. Various hydrocarbon molecules, by adsorbing onto the semiconductor wafers, cause deterioration in voltage resistance of gate oxide film or thickness variations in deposited films. Basic gases react with chemical enhancement type photo-resist to result in loss of resolution, and acidic gases can cause corrosion of wiring.

In addition, moisture (humidity) has been targeted for reduction in recent years. This is because a finer device structure has led to the use of a variety of materials in forming wiring and films, and moisture in the environment can sometimes bind with the above-mentioned materials to cause problems. On the other hand, independent of the trend towards a finer device structure, the size of the wafers is increasing and automation is also progressing in the field of processing technologies. Automation of semiconductor manufacturing lines is prompted by the fact that it is necessary to segregate humans, who act as a contamination source, and the fact that, as the diameter of wafers increases, the weight of the transport pod increases to about 10 kg, such that manual handling becomes difficult.

In the past, with increasing circuit density and speed of semiconductor chips, aluminum has been used as the material for wiring to connect elements within the semiconductor chip. However, when the width of the wires becomes less than 0.13 $\mu$m, conventional aluminum wiring causes serious problems of heat generation and signal delay so that, in place of aluminum wiring, there is a trend towards the use of copper wiring.

Also, $SiO_2$ has been used as the insulation material for the isolation of wiring. However, the dielectric constant of $SiO_2$ at about 4 is high so that the replacement of aluminum wiring with copper wiring only results in about a 20% improvement in signal delay, so that there has been a need to use a substance of lower dielectric constant, of less than 3, for the insulation material.

In readying for such a development, the examination of copper wiring and low dielectric materials for insulation has already identified a potential problem, arising from the processing of chips with a line-width at the level of 0.18 $\mu$m. Such low dielectric materials are based on organic materials or porous materials so that problems are such as absorption of moisture from the environment are encountered, which leads to increasing dielectric constants, and therefore, these material must be handled differently from conventional insulation films and are presenting an extremely difficult challenge.

Also, copper used for wiring behaves differently from aluminum that has been used in the past because of its tendency to react with oxygen in the air to produce oxide films. Also, because the copper molecules have higher chemical activity compared with aluminum molecules such that, if particles containing copper or copper vapor itself is discharged into the clean-room, it contaminates the clean-room to lead to severe drop in the yield of semiconductor chips. Also, organic contaminants on a silicon substrate surface have been known to cause a drop in reliability of gate oxide film, an increase in incubation time in the low pressure CVD processes and abnormal film growth. Therefore, even if a superior material is found in the future for use in making low dielectric insulation films, it is conceivable that it cannot be adopted because of its susceptibility to contamination from such impurities as organic substances and ions in the environment. Conversely, by controlling the processing environment, an opportunity may emerge of using those materials that have not been able to be used in the past. Also, if ammonia is present, the photo-resist material applied on the semiconductor wafer exhibits a so-called "T-top" phenomenon, which refers to a phenomenon that the top section of the developed photo-resist is wider than the bottom section.

SUMMARY OF THE INVENTION

The present invention is provided in view of the background information described above, and an object is to provide a substrate transport pod suitable for use in processes for manufacturing semiconductor chips comprised by a combination of copper wiring and low dielectric insulation films having a dielectric constant less than 3, and methods for operating the pod. Also, as the line width becomes finer, problems of contamination resulting from minute quantities of ammonia and organic substances generated from workers and particle contaminants generated from a work uniform, become more serious. Furthermore, due to diversification of customer demands for semiconductor products, it is anticipated that the proportion of "large variety/small quantity" products such as system LSI (large scale integration) circuits will increase in relation to the proportion of "small variety and large quantity" products such as DRAM (dynamic random access memory) and MPU (micro-processor units). For these reasons, there will be a need for facilities that enable varying combinations of semiconductor processing easily and quickly. The present invention provides a substrate transport pod suitable for use in an automated semiconductor processing plant for manufacturing semiconductor devices, including large variety and small quantity products, and methods for operating the pod.

To resolve the problems outlined above, the present invention provides a solution for resolving the problems encountered in semiconductor chip manufacturing processes that utilize copper wiring and insulation films of dielectric constant of less than 3. For example, silicon wafer substrates having low dielectric insulation film, photo-resist film or copper wiring may be housed in a substrate transport pod for transferring or storing the substrates between processes, so that the interior air of the pod is controlled in such a way that the level of at least the moisture is held below a certain value or the ammonia concentration is held below a certain value. Or if copper film is exposed to the interior air of the pod, the level of at least moisture or oxygen concentration is controlled, so that various problems associated with manufacturing semiconductor chips having copper wiring and insulation films of a dielectric constant less than 3 can be resolved. In particular, a structure of the substrate transport pod is provided so as to enable to maintain at least one parameter of the interior air, such as particulate concentration, humidity, organic substance concentration, and ionic gas concentration, to a level below a specific value. Further, a method of operating a plurality of substrate transport pods in an automated semiconductor manufacturing plant is provided.

As explained above, the present invention relates to the structure and capabilities as well as a method of using a substrate transport pod suitable for use in storing or transporting an object to be subjected to processing, such as semiconductor wafers, photo-masks or hard disks, under a highly clean atmosphere. Therefore, it is applicable to manufacturing of semiconductor devices based on highly conductive wiring, such as copper wiring, and insulation films having a low dielectric constant.

BRIEF DESCRIPTION OF THE DRAWINGS

FIG. 2 is a block diagram of wiring process of semiconductor elements manufacturing suitable for the application of the a substrate transport pod.

FIG. 18 is a cross sectional view of another embodiment of the substrate transport pod.

FIG. 19 is a cross sectional view of another embodiment of the substrate transport pod.

FIG. 24 is a diagram of an example of a non-contact method of powering the substrate transport pod.

FIGS. 27A and 27B are cross sectional views of a square- and a round-shaped substrate transport pod, respectively.

FIGS. 32A, 32B and 32C are diagrams of connections of the pod main body to a powering apparatus.

FIGS. 36A, 36B and 36C are diagrams of filter structures based on wave-shaped separators.

FIG. 39 is a diagram of a composite type filter unit.

FIGS. 45A and 45B are diagrams of still other examples of chemical filters.

FIGS. 46A, 46B and 46C are diagrams of examples of structures used for gaseous contaminants filters: 46A is a diagram showing direct attachment of the filter to the an outer frame; 46B is a diagram showing indirect attachment of the filter to the outer frame; and 46C is a diagram showing attachment of the filter by way of a protrusion; and (A) is a view through A in FIG. 46B, and (B) is a view through B in FIG. 46B.

FIG. 50 is an exploded diagram of still another dehumidifier based on solid polymer electrolytic film.

FIG. 52 is an enlarged cross sectional view of regions near the a rotation shaft shown in FIG. 51.

FIG. 54 is a diagram of the of dry gas into the interior of the pod.

FIG. 56 is a side view of the pod shown in FIG. 55.

FIG. 62 is a cross sectional view of the substrate transport pod.

FIG. 74 is a graph showing dehumidifying performance and fan operations, and ○ refers to fan stopped, * refers to fan operating intermittently, and ♦ refers to fan operating continually.

FIG. 75 is a graph showing dehumidifying performance and fan operations, and * refers to operation with two dehumidifying units followed by one dehumidifying unit, and ♦ refers to operation with one dehumidifying unit only.

FIG. 83 is a diagram of a substrate transport pod seated on another power input apparatus.

FIG. 85 is a block diagram of the control section on the substrate transport pod side.

FIGS. 88A, 88B and 88C are diagrams of a variation of the example shown in FIG. 87.

FIG. 93 is an enlarged view of a ceiling section of the pod shown in FIG. 92.

FIG. 100 is a block diagram for a process of establishing a charging duration.

FIG. 101 is a conceptual diagram of network management for the substrate transport pods.

DETAILED DESCRIPTION OF THE PREFERRED EMBODIMENTS

Preferred embodiments will be explained in the following with reference to the drawings attached.

First, the necessity for automation and a clean-room will be explained. To prevent human errors by workers and contamination of substrates such as semiconductor wafers by organic substances and minute quantities of ammonia generated from the workers, it is effective to remove the workers from the space used for handling the substrates, and the introduction of process automation is required as a means for achieving such an end. Substrate transport pods for use in such an automated facility include a SMIF (standard mechanical interface) pod and a FOUP (front opening unified pod), which are used in conjunction with a door opener that positions the pod at a specific location and opens a door externally, and transport apparatus for automatic transport. SMIF pods and FOUPs are sealed containers that permit a lesser degree of cleanliness in the exterior environment of the pod, that is, the cleanliness of the clean-room can be to a lesser degree. Accordingly, the capital cost and operating cost of the clean-room can be reduced.

Figure 1A:
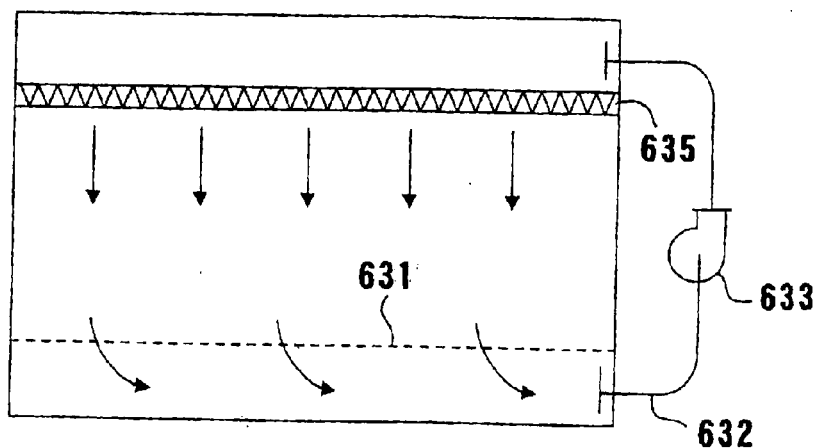
FIGS. 1A, 1B and 1C are diagrams of various air flows in clean-room.
Figure 1B:
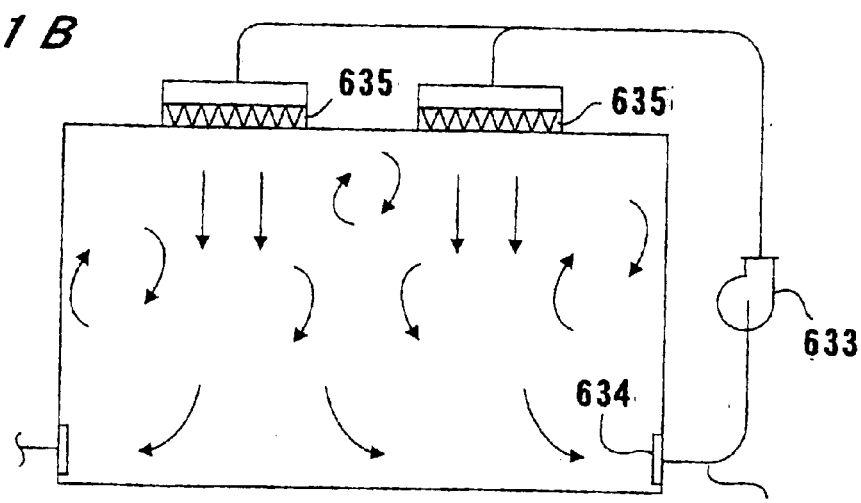
Figure 1C:
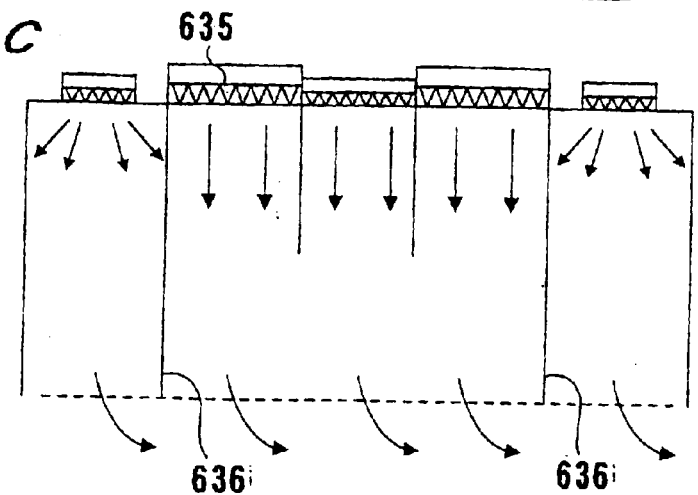

Clean-rooms are classified according to the in air flow pattern, as: a unidirectional flow clean-room, a non-unidirectional flow clean-room and a mixed flow type clean-room. FIG 1A shows the air-flow pattern in the unidirectional flow clean-room. In this type of clean-room, clean air that has been filtered through ULPA filter 635 and others is forced out from the ceiling or the front face of one wall and exits from the floor opposite to the filter or from the ceiling 631, to sweep the air from the clean-room via the circulation line 632 and an air blower 633. This method produces a highly clean environment in the entire room and permits a reduction in the number of partitions required, but on the other hand, this method is the most expensive. FIG. 1B shows the air flow pattern in the non-unidirectional flow clean-room. In this method, clean air that has been filtered through ULPA filter 635 and others is blown out from the ceiling or one portion of one wall and the room air is diluted with the clean air. The air exits from the discharge opening 634. This method is used to generate a degree of cleanliness that is less stringent than class 6 (corresponding to Federal Standard 209D class 1000) defined by JIS B9920. Although the high degree of cleanliness cannot be produced, the method can reduce the number of partitions as well as capital and operating costs. The method provides advantages such as relative ease in switching the production lines because the number of partitions can be reduced. This method is most suitable for semiconductor plants based on mini-environment type production designed to store substrates primarily in containers. FIG. 1C shows the mixed-flow type clean-room that incorporates the features of both unidirectional flow and non-unidirectional flow clean-rooms described above. This method allows reduction in capital and operating costs by producing a high degree of cleanliness only in the production line containing the semiconductor production facilities and passages by the use of the unidirectional flow clean-room, while using the non-unidirectional flow clean-room in service areas and the like that can allow a lesser degree of cleanliness. Because the partition walls 636 are required, it has a disadvantage in that the regrouping of a production line is more difficult. This method is suitable for an open cassette type production plant that handles substrates mostly as they are.

FIG. 2 shows an example of a wiring formation process of a semiconductor chip based on copper wiring and low dielectric insulation film. As shown in FIG. 2, CVD (chemical vapor deposition) apparatus or coater is used to deposit insulation film 62, comprising organic film or porous film, on top of the conductive wiring layer of the semiconductor substrate 61 having device elements fabricated thereon (step A). Next, after forming the plug film and others as necessary, a photo-resist material 63 is applied using a coater, then the coated substrate is dried (step B). Next, after exposing the coated substrate using the stepper (step C), the resist film is developed to form a resist pattern 64 on the insulation film 62 (step D). Next, contact holes and wiring grooves 65 are formed on the insulation film 62 by etching (step E), and after removing the resist film 63, a barrier layer comprising TaN and the like is formed thereon, and on top of this layer, a copper seed layer 66 is formed to serve as the power input layer for electrolytic plating (step F).

Then, by applying a copper layer 67 on the surface of the semiconductor substrate 61, contact holes and grooves of the device substrate are filled with copper when the copper layer 67 is formed on top of the insulation layer 62(step G). Then, the device substrate is annealed (step H) and, using chemical and mechanical polishing (CMP), a portion of the copper layer is removed from the top of the insulation layer so as to roughly level the surfaces of the copper layer 67 filling the contact holes and wiring grooves with the surface of the insulation layer (step 1). This process is repeated as many times as the number of layers of wiring required to produce a multi-layered wiring structure comprised by 6~8 layers.

When the low dielectric insulation layer is exposed to the air, it is preferable that the absolute humidity in the air be lower than $4 \times 10^{-3}$ g/g (20% relative humidity at 25° C.), and more preferably lower than $1 \times 10^{-3}$ g/g (5% relative humidity at 25° C.).

When the copper film is exposed to the air, it is preferable that the absolute humidity in the air be lower than $4 \times 10^{-3}$ g/g (20% relative humidity at 25° C.), or more preferably, lower than $1 \times 10^{-3}$ g/g (5% relative humidity at 25° C.). Further, the level of organic substances of a boiling point higher than 80° C. should be lower than 1 $\mu$g/m$^3$, or more preferably, lower than 0.5 $\mu$m/$^3$. The oxygen concentration should be lower than 10000 ppm, or more preferably lower than 1000 ppm.

When the resist film is exposed to the air, it is preferable that the basic gases should be lower than 1 $\mu$g/m$^3$ in concentration, or more preferably lower than 0.5 $\mu$g/m$^3$.

Also, when the humidity is low, static electricity is generated easily such that there is a danger of destroying elements such as FET and condensers so that it is preferable that each semiconductor wafer be grounded. The method of grounding include includes the use of conductive wafer carriers, grounding the wafers through metallic contacts provided on the wafer carrier or using an electrical conductor material to make the wafer carrier itself.

Next, an embodiment of the substrate transport pod of the present invention will be explained. First, general transport capabilities of the transport pod suitable for automation will be explained. For example, a substrate pod for transporting several semiconductor wafers is comprised at least by the following parts.

(1) a pod main body having an inverted square cup shape;

(2) a door that houses an internal mechanism for engaging with the pod main body to operate the door externally;

(3) a holding means for holding the wafers separated at a given distance;

(4) a retainer for preventing vibration of the wafers; and (5) a holding means for handling the container.

The container main body is generally made of a transparent polymeric material or an opaque material having a transparent window so as to enable confirmation of the contents. The door is provided with a positioning hole for externally guiding a latching pin and the like for operating the door, and internally houses a mechanism for locking and unlocking the door that operates in conjunction with the door operating latching pin. This commercially available latching mechanism includes those operated by mechanical drive or by vacuum, compressed air as well as those having magnet-assisted fixation. The holding means is disposed on the ceiling or the side wall section of the pod, and some are shaped so that positioning notches are used to enable a robot to grip the pod or to enable the pod to be handled manually. The base requirements of the pod suitable for automation purposes may include any of these methods so long as the required function is achieved.

Figure 3:
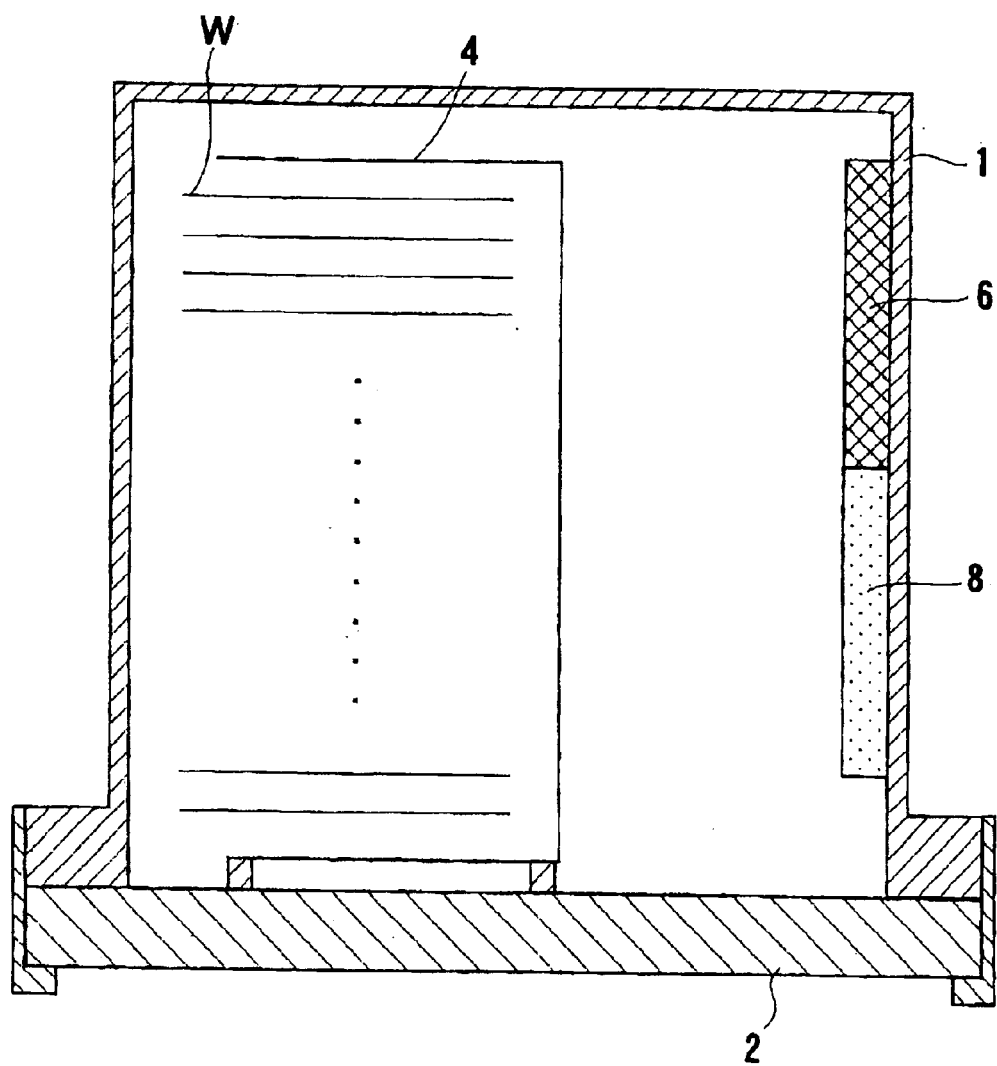
FIG. 3 is a cross sectional view of a first embodiment of the substrate transport pod.

FIG. 3 shows a substrate transport pod of this embodiment for transporting semiconductor wafers. Further, a memory chip may be provided for the pod so as to track wafer ID, history and status for each wafer batch so as to manage the processing data. The pod is comprised by a box member 1 and a lid member 2, which are affixed by a stopper or latching mechanism and the like, for example, to guard the wafers from contamination by the external environment.

Silicon wafers W are stored in the a wafer carrier 4, which is housed inside the substrate transport pod 1. In the interior of the substrate transport pod 1, a gaseous contaminants contaminant capture medium 6 and a dehumidifying agent 8 are disposed. The gaseous contaminant capture medium 6 may include non-woven ion exchange cloth, activated carbon fibers or zeolite to remove such gaseous contaminants such as hydrocarbons and ammonia that may reside inside the pod. Dehumidifying agent 8 may include silica gel, for example, to remove moisture from the interior of the substrate transport pod. It is preferable that such substances have high surface area so as to increase the gaseous contaminant capture efficiency and dehumidifying effects. The filters may be formed preferably in a wavy shape or a folded shape. It is preferable that the area of the non-woven ion exchange cloth or activated carbon fibers be more than 10% or more preferably more than 20% of the surface area of the interior space of the substrate transport pod. It is preferable that the dehumidifying agent be those one having a dehumidifying capacity of more than 0.1 g and less than 0.4 g, or more preferably more than 0.5 g and less than 3 g per L (liter) of the volume of the space to be dehumidified.

Figure 4:
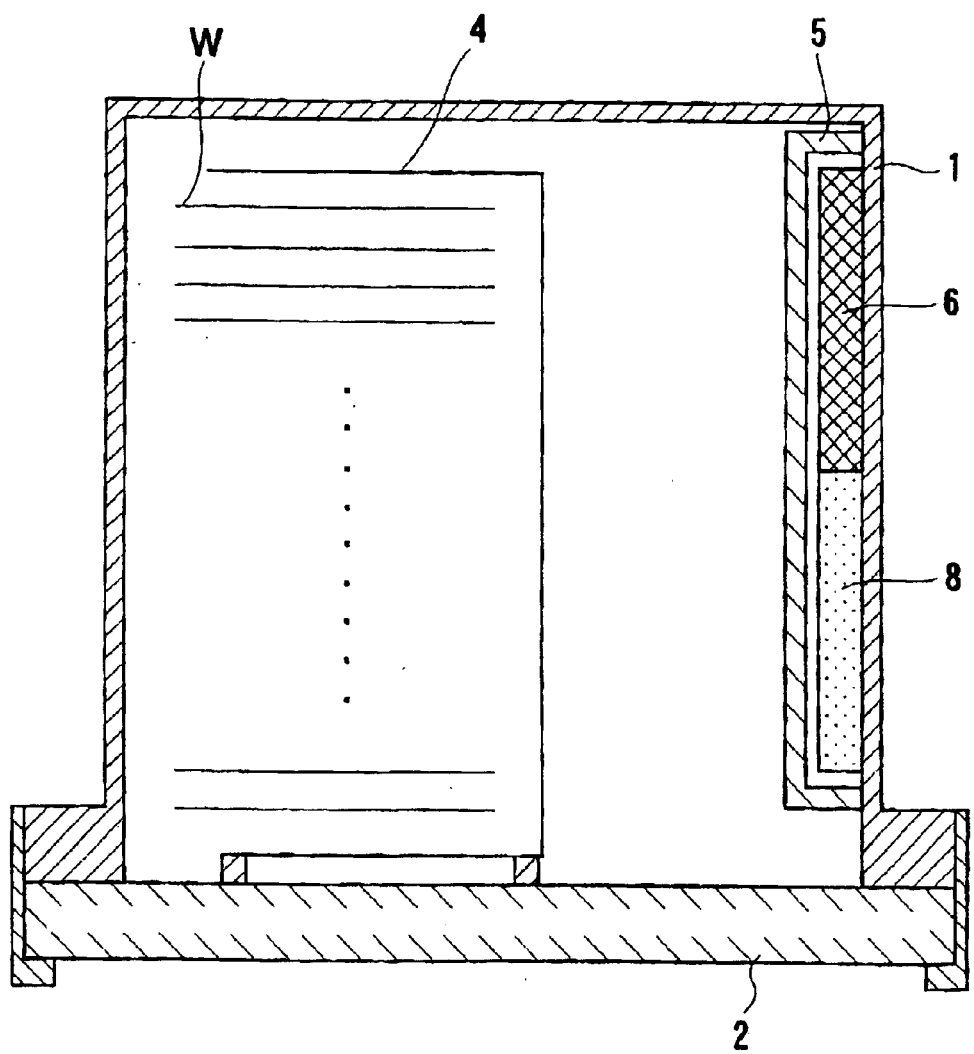
FIG. 4 is a cross sectional view of another embodiment of the substrate transport pod.

FIG. 4 shows an example of a variation of a substrate transport pod. Because there is a danger of dust generation from the gaseous contaminant capture medium 6 and dehumidifying agent 8, in order to prevent particle contamination of semiconductor wafers, they are surrounded by a particle filter 5, such as HEPA filter, and ULPA filter so as to prevent particulate matters from adhering to the semiconductor wafers W.

Figure 5:
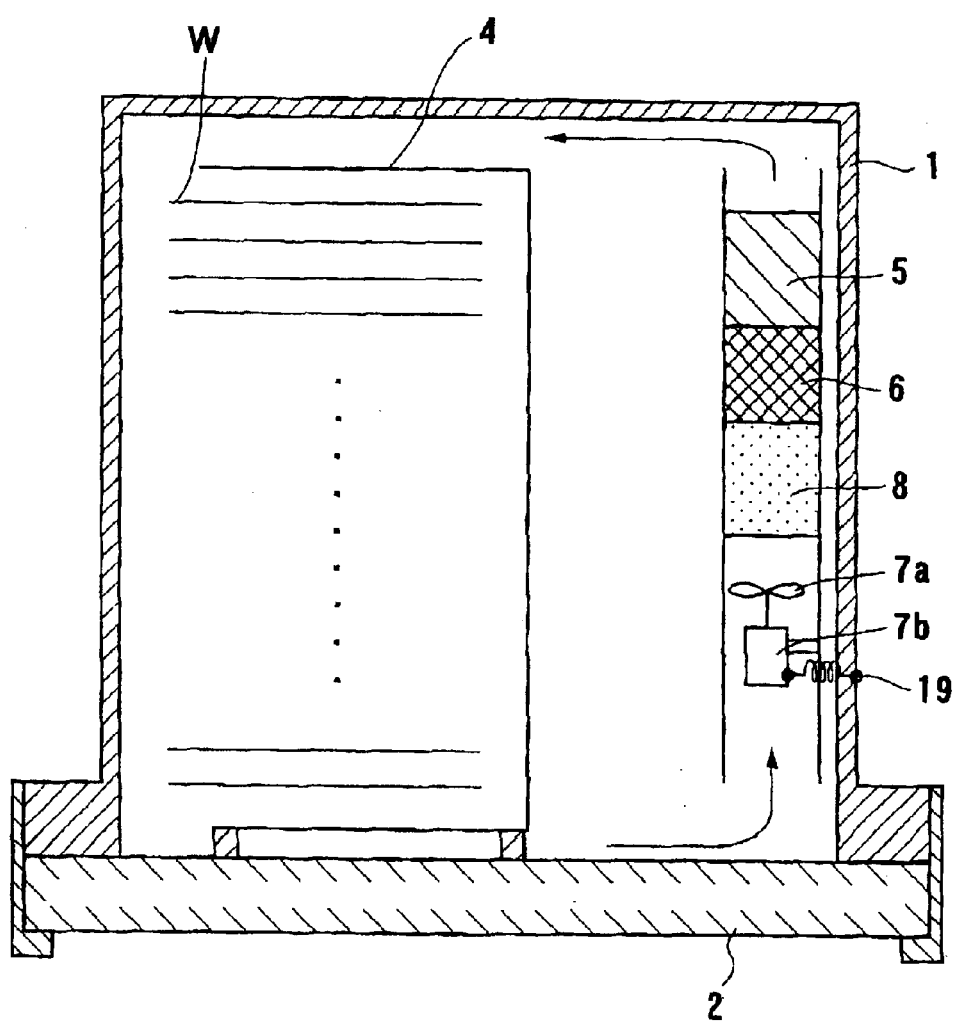
FIG. 5 is a cross sectional view of another embodiment of the substrate transport pod.

FIG. 5 shows a substrate transport pod 1 which is provided with a motor fan 7a for circulating the interior air by operating a motor 7b so as to force the air through the dehumidifying agent or dehumidifier 8, the gaseous contaminant capture medium 6, and the particle filter 5 to actively remove particulate contaminants. Here, when contamination is not a problem, the particle filer 5 may be omitted.

Figure 98:
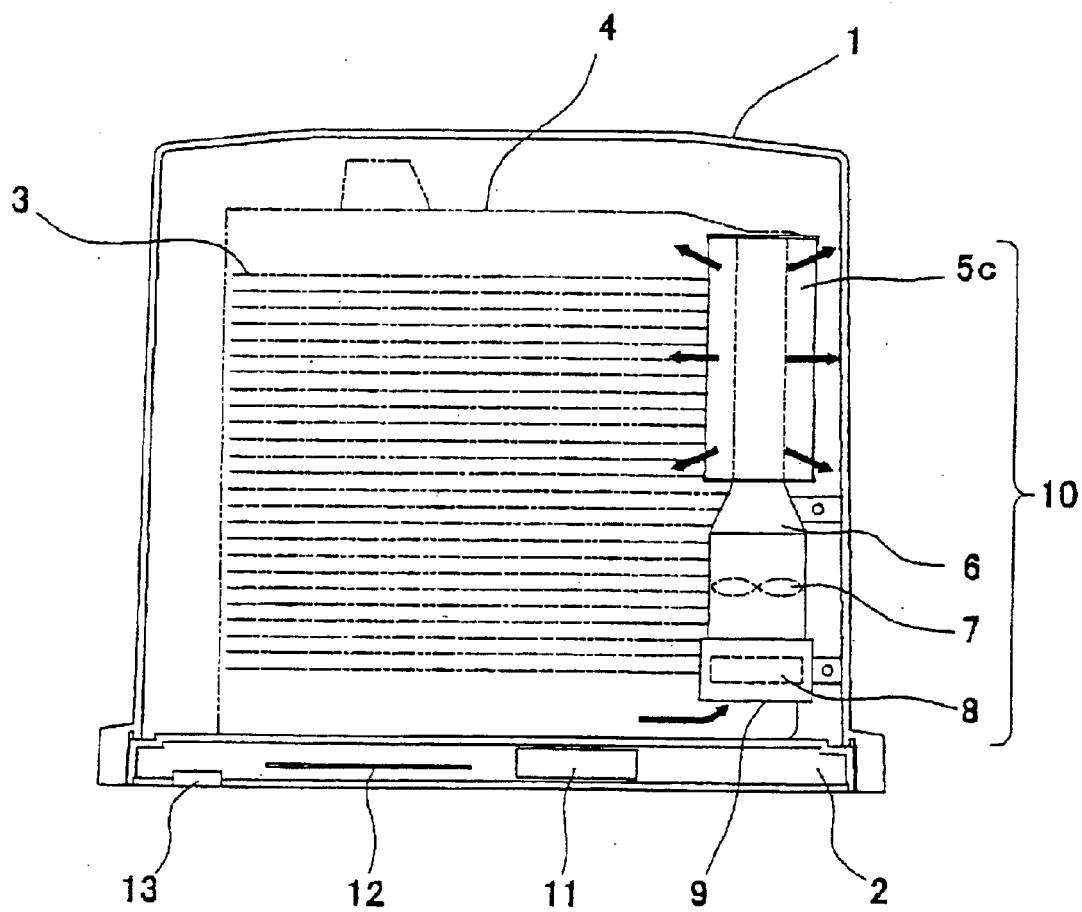
FIG. 98 is a cross sectional view of a substrate transport pod having a cylindrical particle filter (5c) for producing a gaseous stream in the radial direction.
Figure 99:
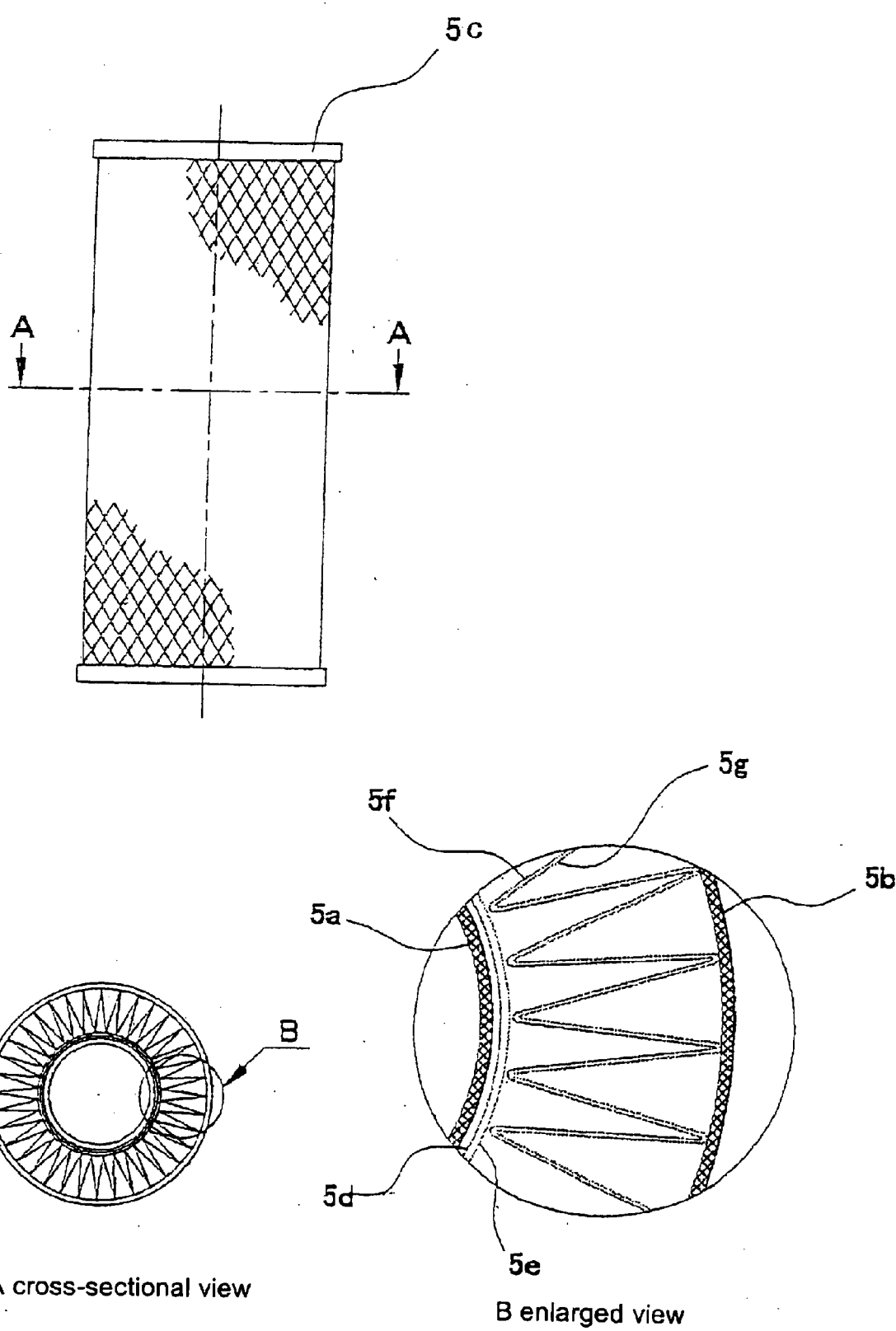
FIG. 99 is an enlarged view of the cylindrical particle filter (5c) shown in FIG. 98, and a cross sectional view through A—A and an enlarged view of section B.

Electrical power may be supplied from an external source through a power input terminal 19 provided on the exterior of the substrate transport pod 1 to operate the fan motor and/or dehumidifier. It is preferable that the surface of the terminal be gold-plated to prevent contamination of the clean-room. Here, as shown in FIGS. 98 and 99, the particle filter 5 is a cylindrical filter and may eject air in the radial direction. This example relates to the particle filter, but a chemical filter may also be constructed in a similar manner.

When supplying power externally, it is preferable that the power be turned on after confirming that the substrate transport pod is present and the power is needed to be supplied or that the external power input connector and the power input terminal of the substrate transport pod are connected. This is because the pod is used in a clean-room, and if sparks fly between the electrical terminals, minute metallic particles are generated and contaminate the clean-room.

Figure 6:
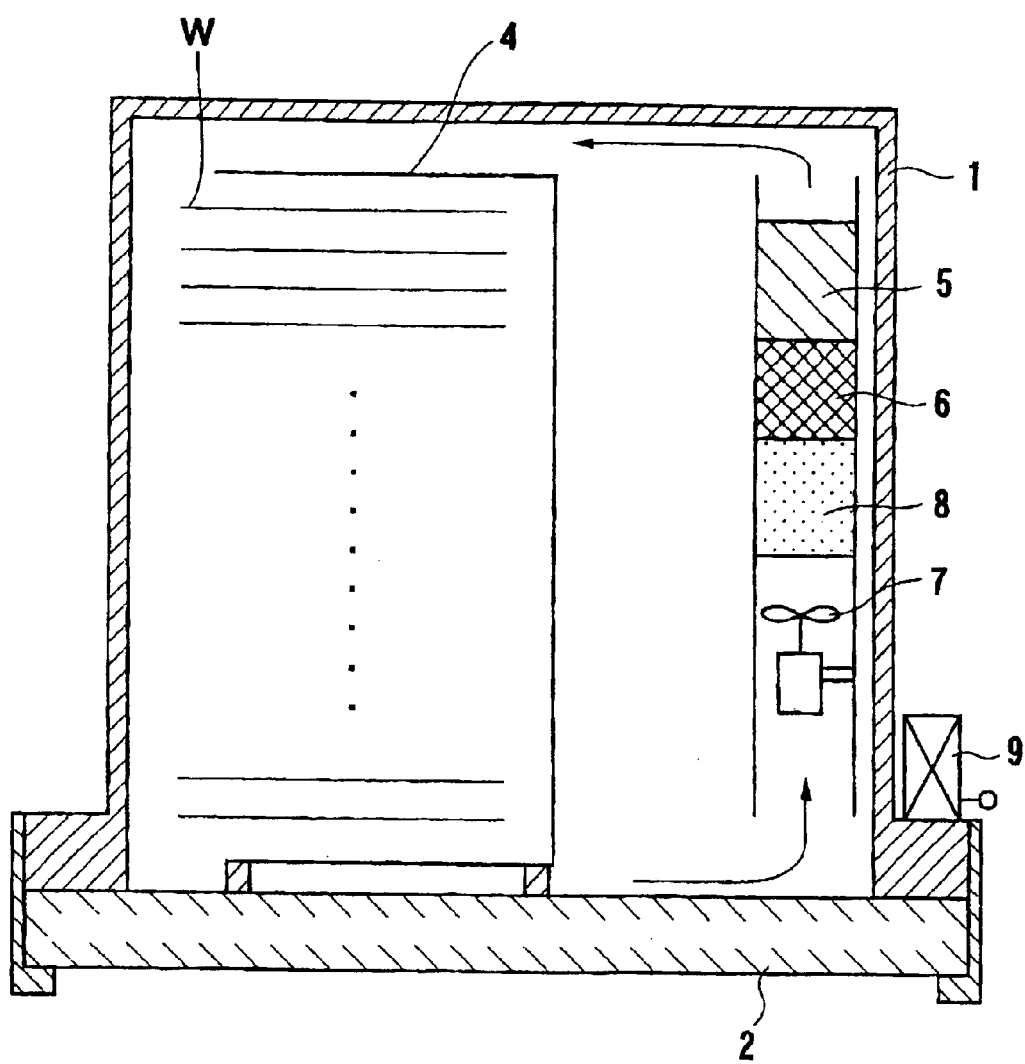
FIG. 6 is a cross sectional view of another embodiment of the substrate transport pod.

Further, as shown in FIG. 6, a battery 9 may be mounted on the substrate transport pod 1. Also, the substrate transport pod may be provided with a charging terminal so that the battery may be charged by supplying electrical power from an external source.

Figure 7:
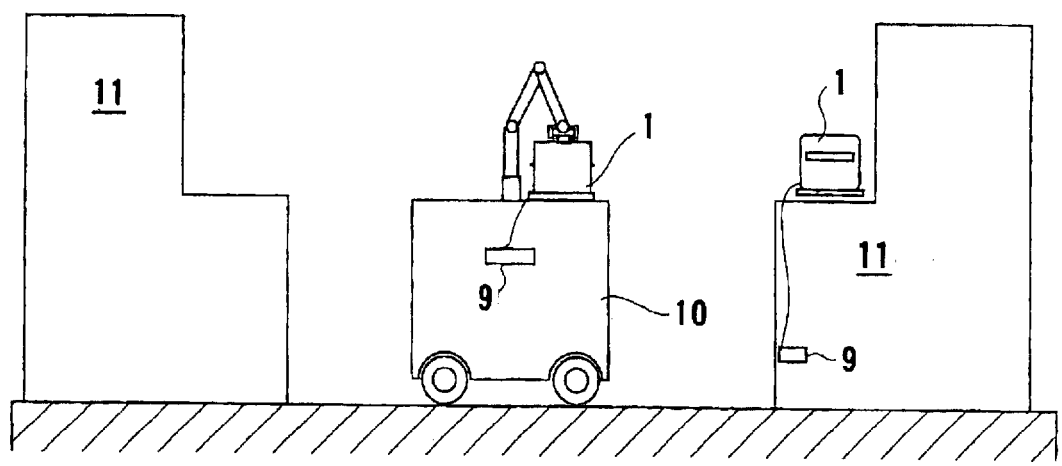
FIG. 7 is a diagram of an embodiment powering a substrate transport pod by mounting it on an AGV.

In the case of a container shown in FIG. 5 or 6, as shown in FIG. 7, during the period of transport of the substrate transport pod 1, mounted on an unmanned vehicle 10 to travel between the processing apparatuses 11, the air inside the substrate transport pod is circulated by supplying power from the battery mounted on the unmanned vehicle 10 or from an external power source (not indicated) to the motor 7 located inside the substrate transport pod 1. Also, when the substrate transport pod 1 is in the standby mode by being placed on a processing apparatus 11, power may be supplied from the processing apparatus 11. For example, a battery provided for the processing apparatus or a part of electrical power supplied from an external source can be used for this purpose. Charging may be carried out in a similar manner.

Figure 8:
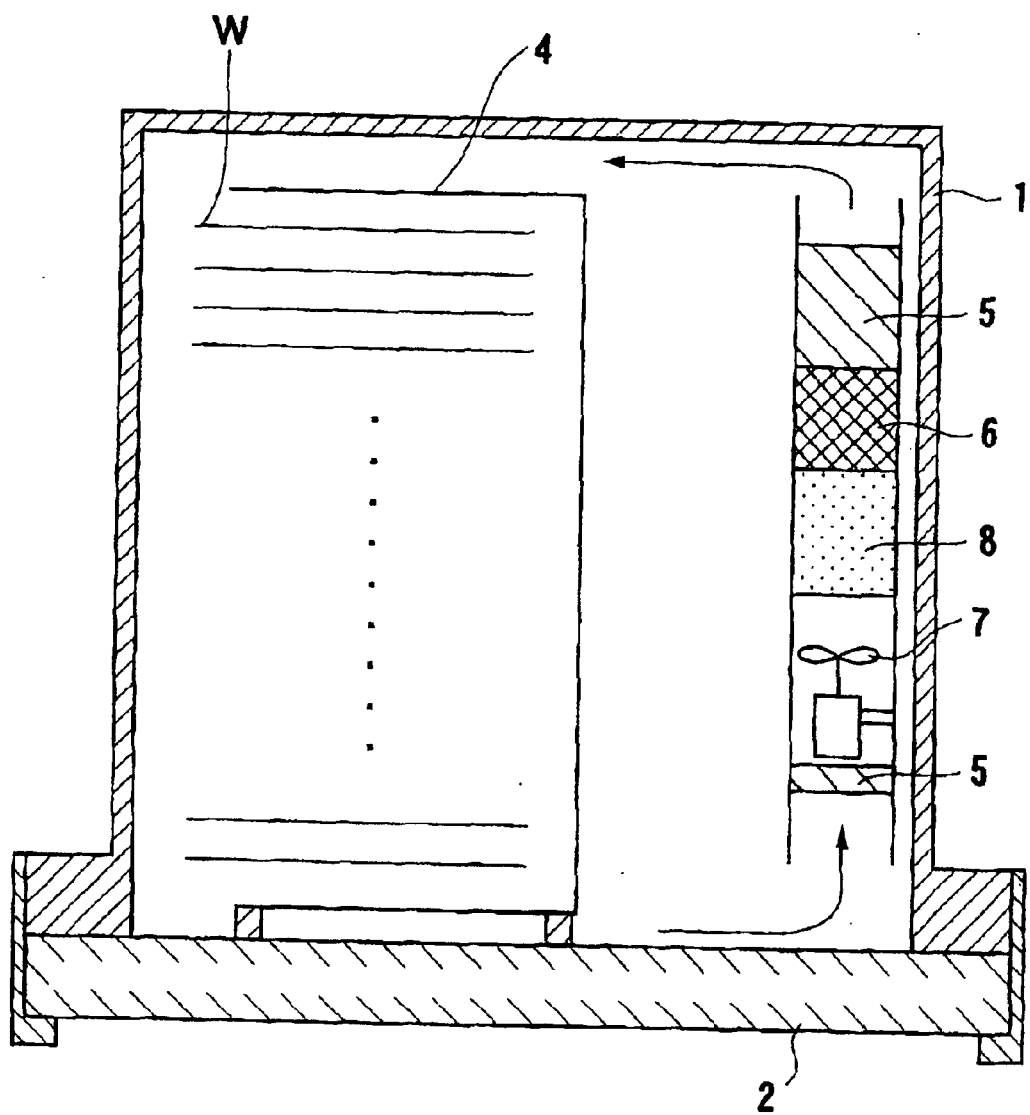
FIG. 8 is a cross sectional view of another embodiment of the substrate transport pod.
Figure 9:
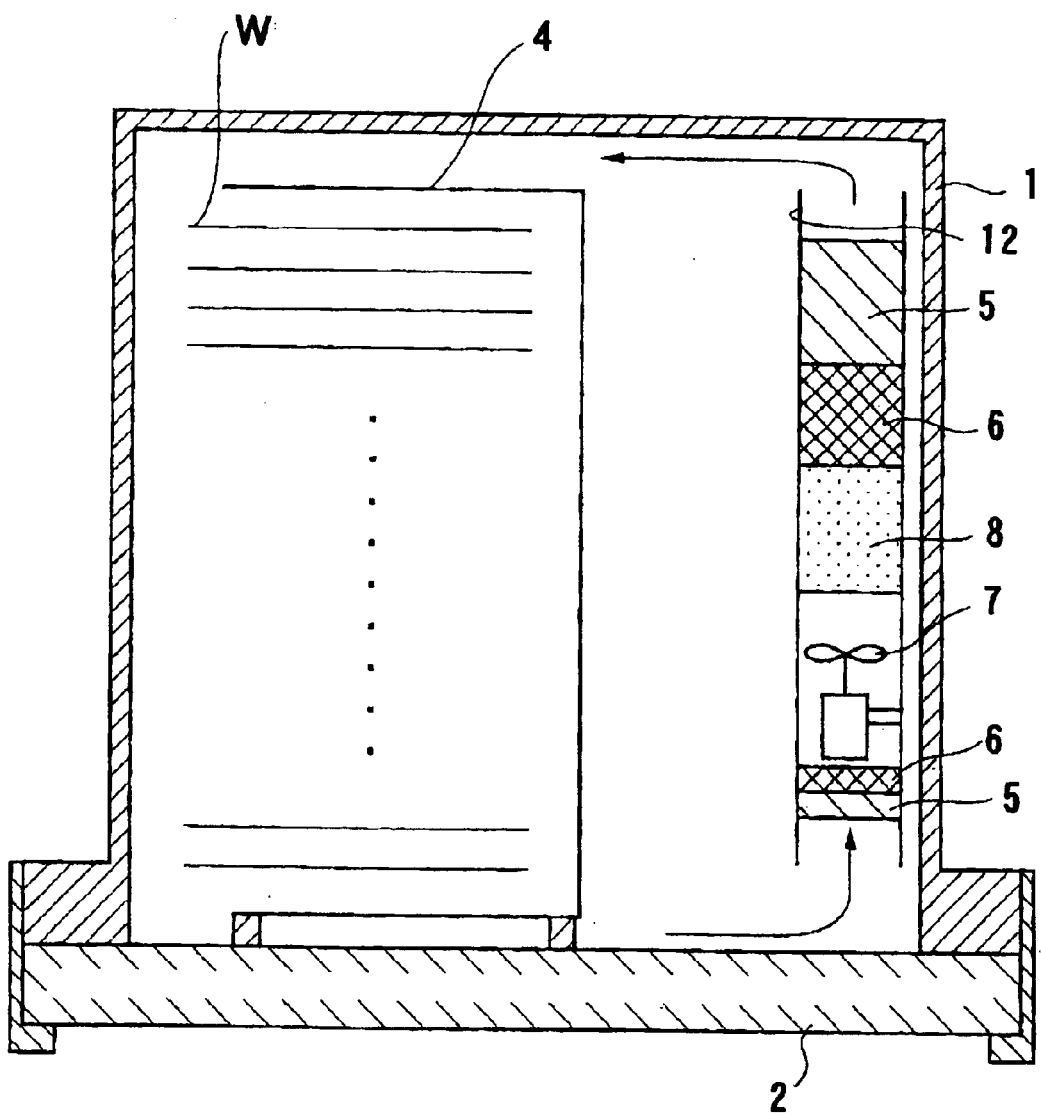
FIG. 9 is a cross sectional view of another embodiment of the substrate transport pod.

Further, in FIGS. 8 and 9, if dust generation from the fan motor is a problem when the fan motor 7 is stopped, the particle filter 5 may be placed upstream of the fan motor 7.

Also, in addition to dust generation from the fan motor 7, if the generation of gaseous contaminants is a problem, a chemical filter 6 may be placed in on the upstream side of the fan motor 7. If moisture generation from the fan motor is a problem, a dehumidifying agent 8 may be placed on the downstream side of the fan motor 7. These may be placed singly or in combination.

Figure 10:
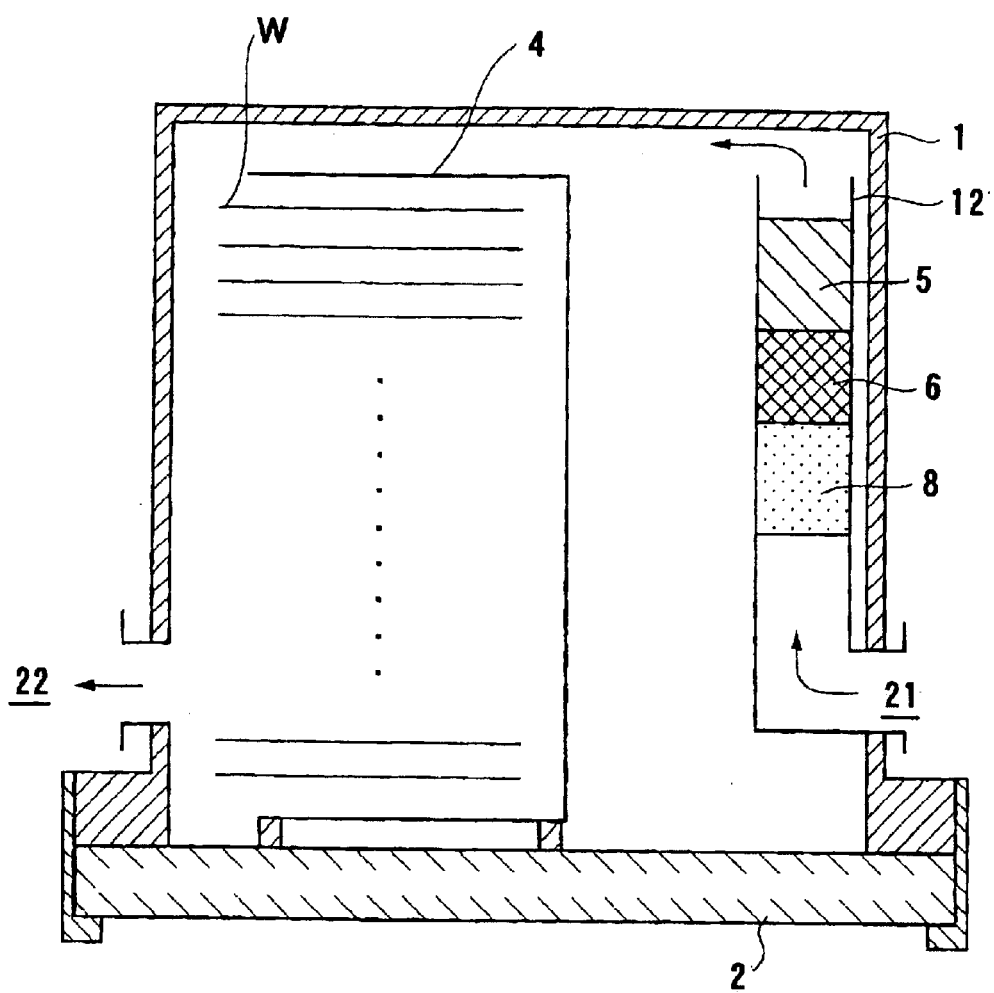
FIG. 10 is a cross sectional view of another embodiment of the substrate transport pod.
Figure 11:
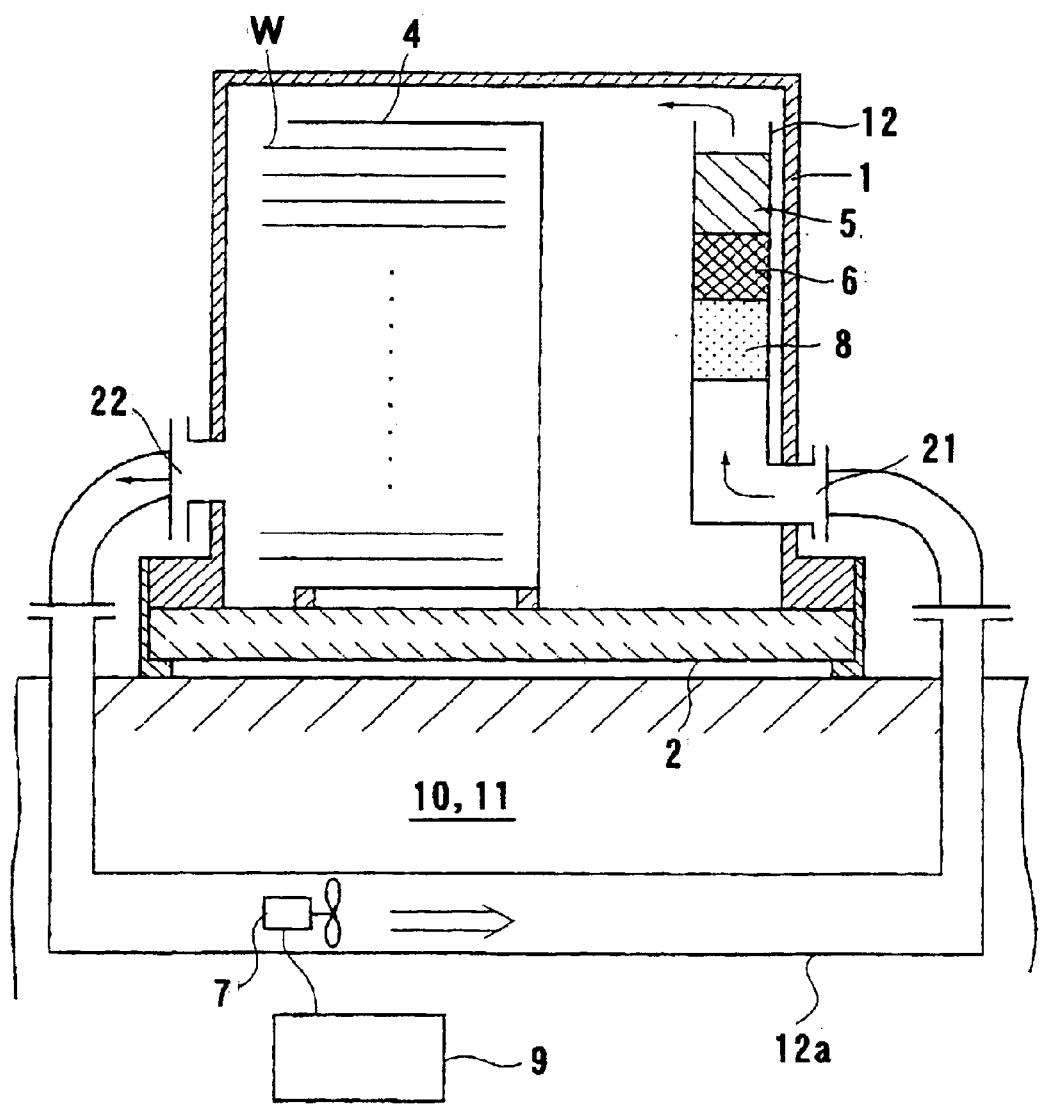
FIG. 11 is a cross sectional view of another embodiment of the substrate transport pod.
Figure 12:
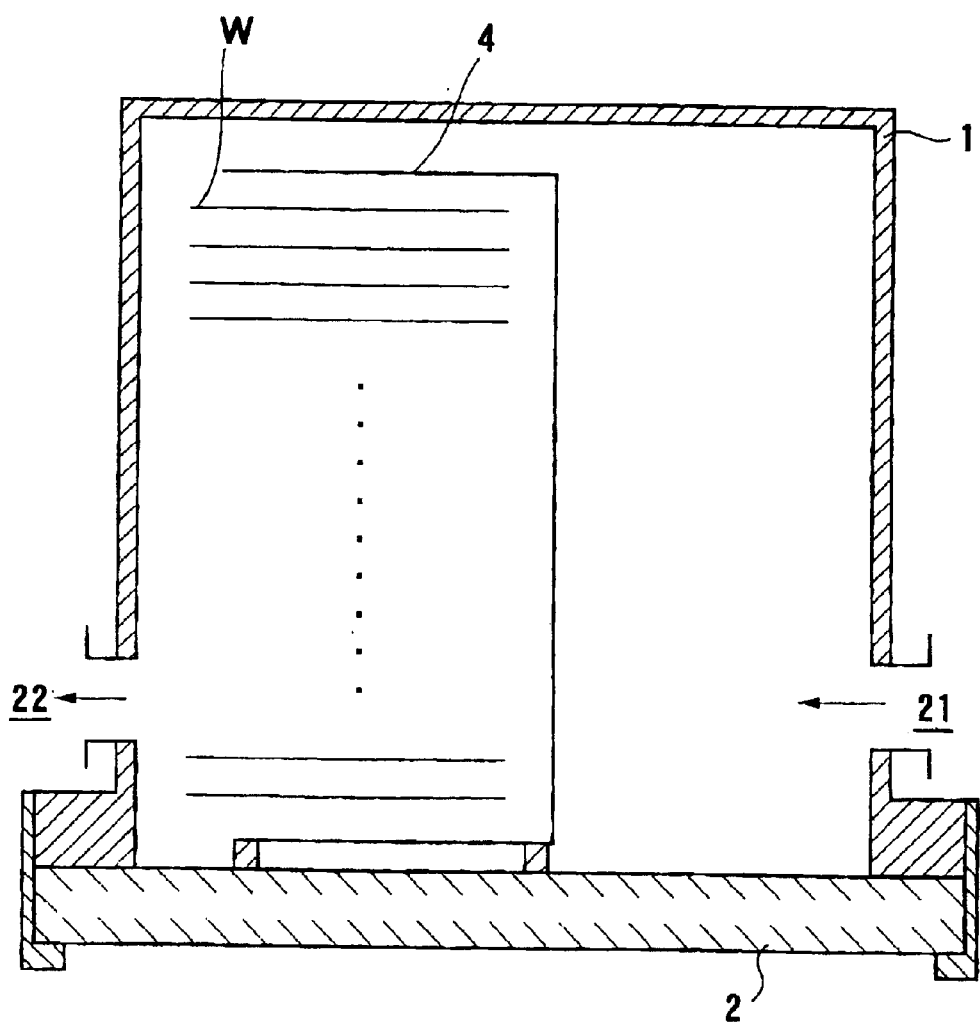
FIG. 12 is a cross sectional view of another embodiment of the substrate transport pod.
Figure 13:
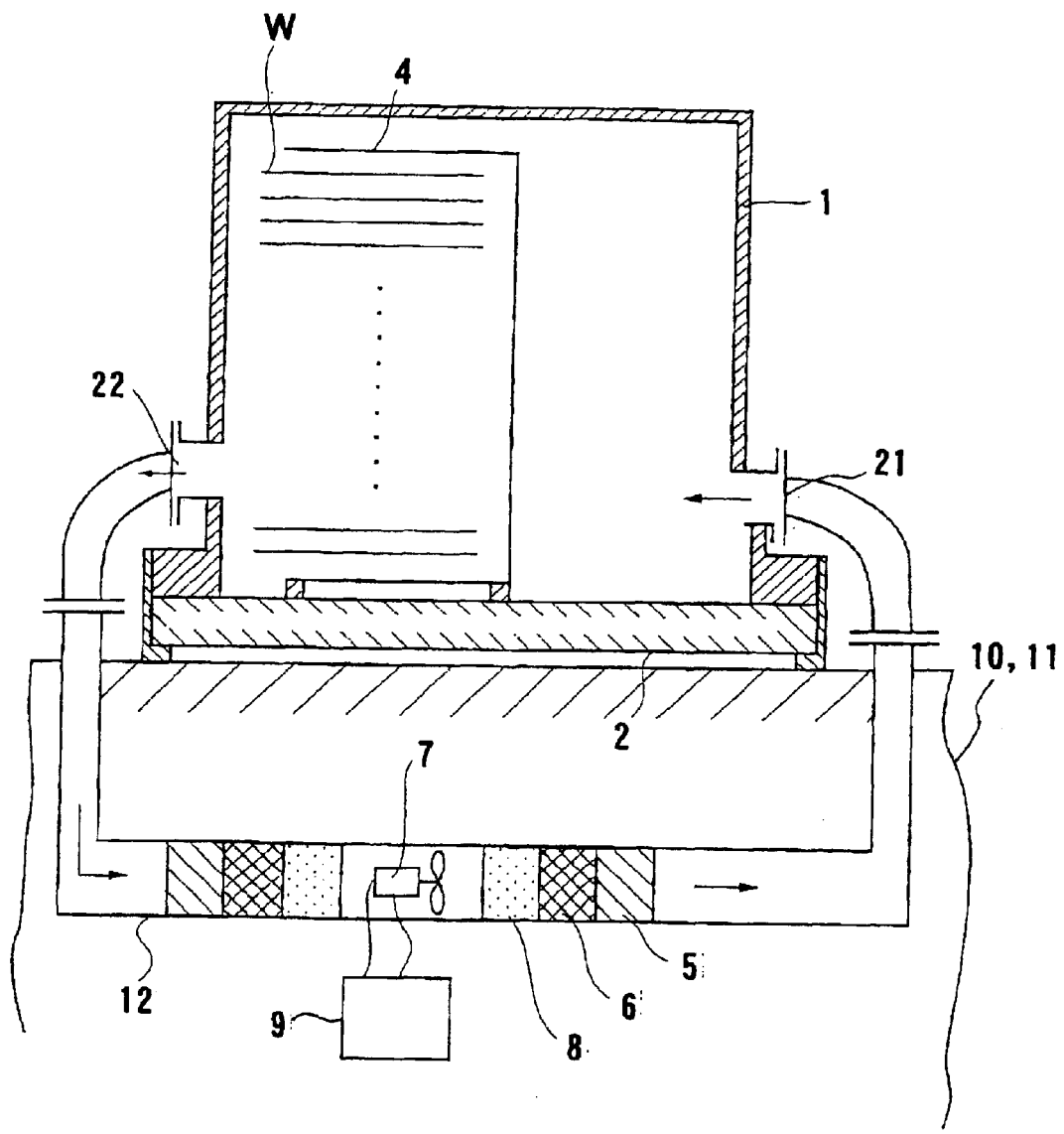
FIG. 13 is a cross sectional view of another embodiment of the substrate transport pod.

As shown in FIG. 9, the substrate transport pod may be provided with a duct 12 that houses the filters 5, 6. Further, as shown in FIG. 10, there may be provided an air supply opening 21 and a discharge opening 22 for discharging the air from the interior of the substrate transport pod externally. Such a substrate transport pod 1 communicates, as shown in FIG. 11, with the interior environment of the processing apparatus or an automatic guided vehicle (AGV). The air supply opening 21 and the discharge opening 22 have a reverse flow prevention device, and they assume a hermetic state excepting when the air is being supplied. The motor fan 7 may be provided on either the processing apparatus 11 or the AGV so that the air inside the substrate transport pod is circulated by flowing through the filter duct 12. The motor fan 7 uses power from the battery 9 provided on the processing apparatus or the AGV 10 or a part of the power supplied from an external source. Further as shown in FIG. 12, the substrate transport pod 1 may be provided only with the air supply opening 21 and the discharge opening 22, such that the fan motor, filter duct and others are provided on the processing apparatus 11 or the transport apparatus 10 or on a storage facility, as shown in FIG. 13, for circulating the air.

Figure 14:
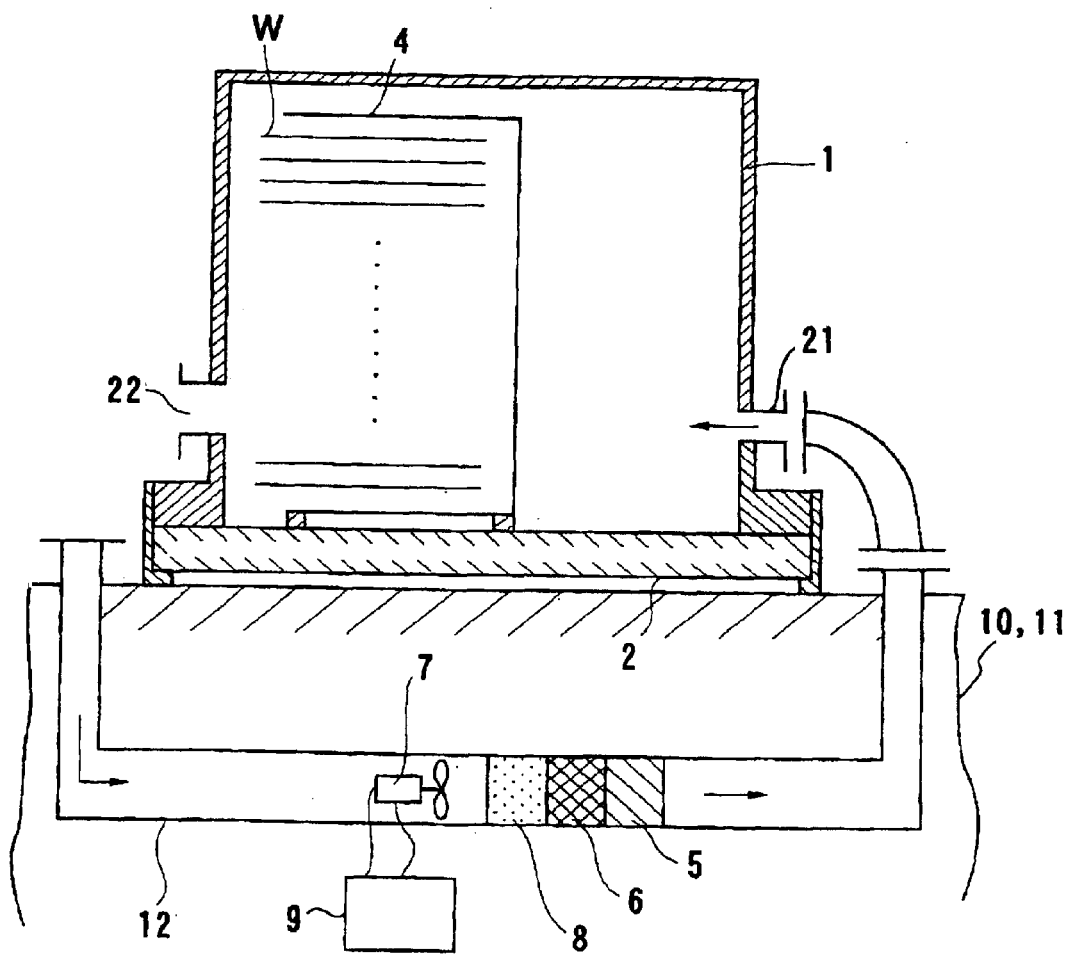
FIG. 14 is a cross sectional view of another embodiment of the substrate transport pod.
Figure 15:
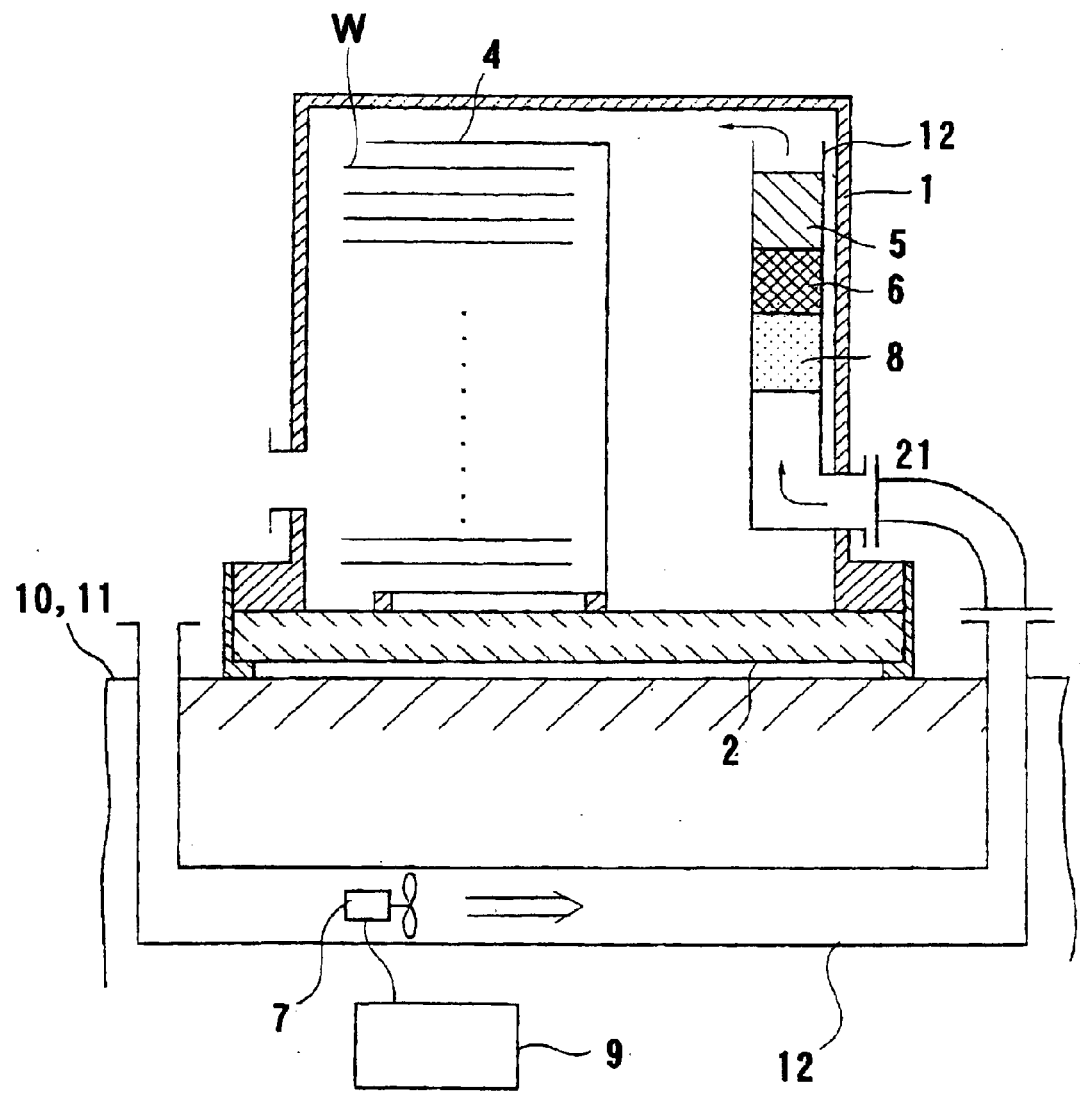
FIG. 15 is a cross sectional view of another embodiment of the substrate transport pod.

Further as shown in FIGS. 14 and 15, processing apparatus 11 or transport vehicle 10 or storage facility may be used to draw air from the clean-room, and the motor fan 7 is used to circulate the air to the substrate transport pod 1 by opening the discharge opening 22 of the substrate transport pod 1 to discharge the air to the clean-room or the discharge ducts in the processing apparatus. Here, the filters 5, 6 of the motor fan 7 in the upstream side of the motor fan and dehumidifying agent 8 may be omitted.

Figure 16:
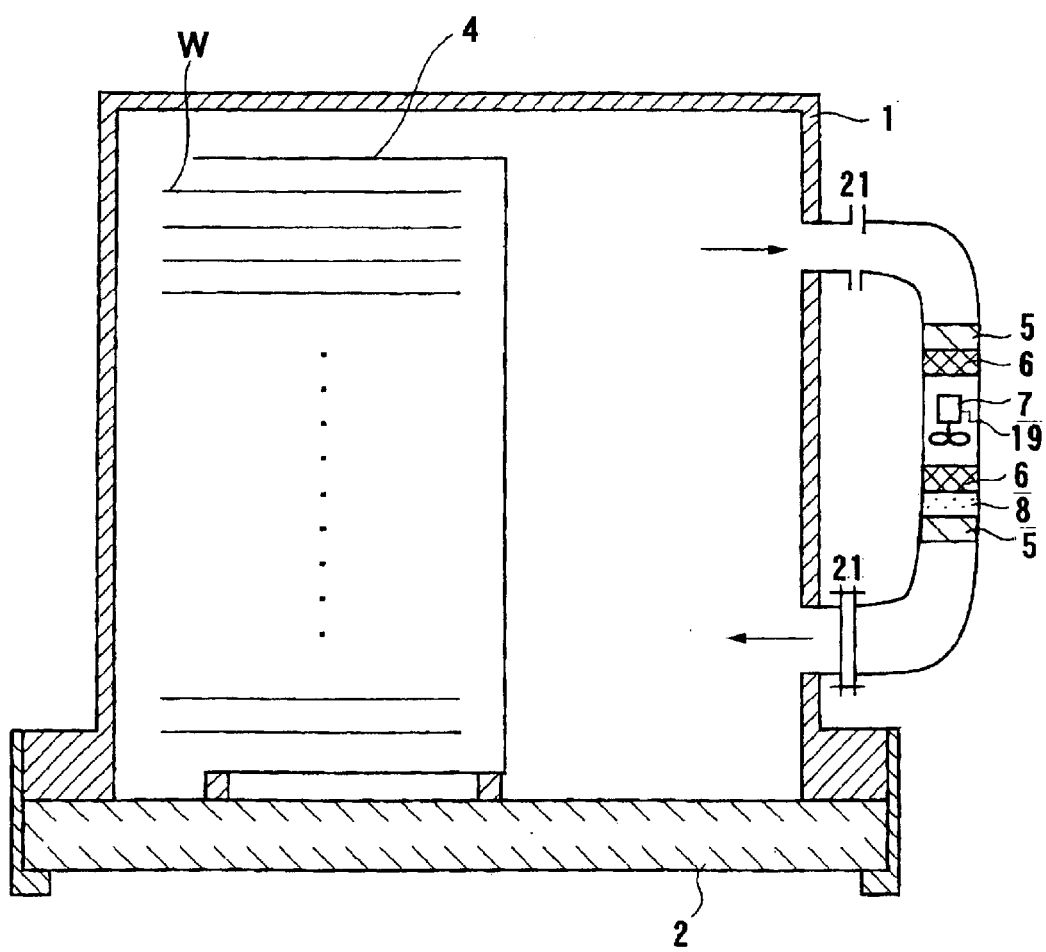
FIG. 16 is a cross sectional view of another embodiment of the substrate transport pod.
Figure 17:
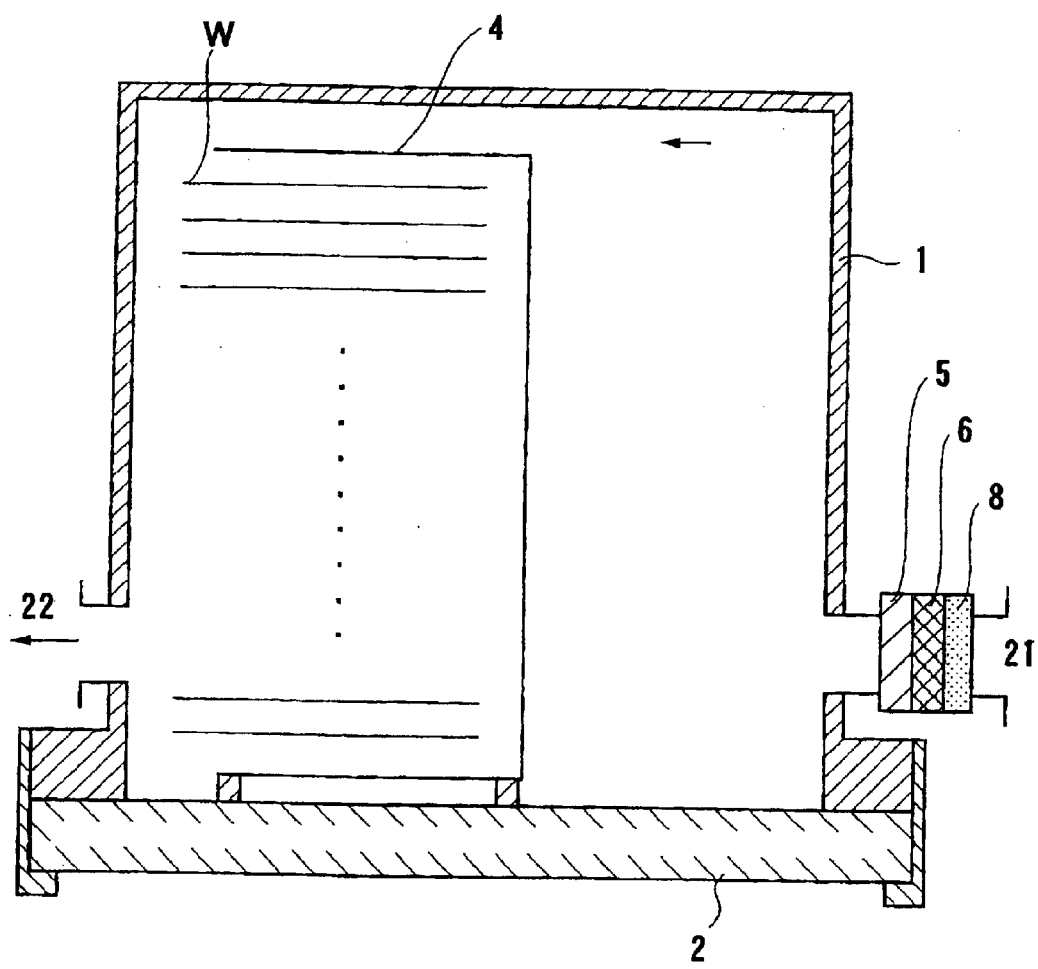
FIG. 17 is a cross sectional view of another embodiment of the substrate transport pod.

Also as shown in FIGS. 16 and 17, by placing a filter unit on the outside of the substrate transport pod 1, the air inside the substrate transport pod may be circulated through the filters 5, 6 and the dehumidifying agent 8 by way of the air supply opening 21 and the discharge opening 22 communicating with the substrate transport pod 1. Because the filter units 5, 6, 7, 8 are placed outside the substrate transport pod, the interior space can be cleaned easily and filter exchanging can be carried out simply.

The interior of the substrate transport pod 1 may be provided with a flow control plate 23, as shown in FIG. 18, so as to prevent the air from bypassing the wafers W by short-cutting from the air supply opening 21 to the discharge opening 22. The degree of opening of the flow control plate 23 increases as the air moves away from the air supply opening 21. Accordingly, the flow of air becomes uniform in the wafer stacking direction. In particular, for particles of smaller than 0.1 $\mu$m size, the Brownian movement is stronger than the gravitational movement. For example, in the case of 0.1 $\mu$m particles, the distance of movement due to Brownian motion is $3\times10^{-3}$ cm per one second while the distance of movement due to gravitational settling is $9\times10^{-5}$ cm per one second. It is preferable that the average speed of air moving between the wafers be at least 0.3 cm/s and lower than 30 cm/s, or preferably faster than 1 cm/s and lower than 10 cm/s.

Figure 20:
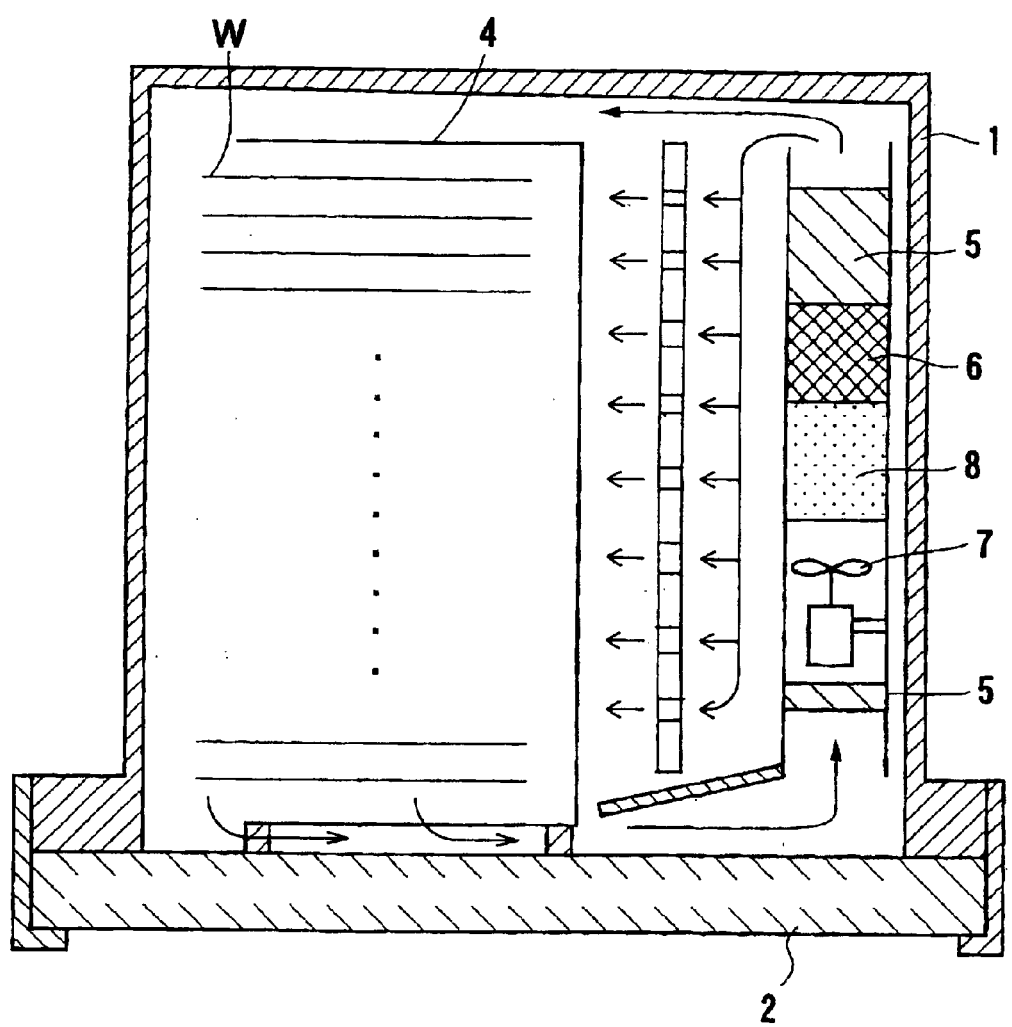
FIG. 20 is a cross sectional view of another embodiment of the substrate transport pod.

Also, because the particles settle due to gravity, it is preferable to attach the supply air opening 21 to the upper section of the substrate transport pod 1 and attach the discharge opening 22 to the lower section of the substrate transport pod 1, as shown in FIG. 19, or the air flow pattern should be formed so as to discharge the air in the lower section of the substrate transport pod 1, as shown in FIG. 20.

Figure 97:
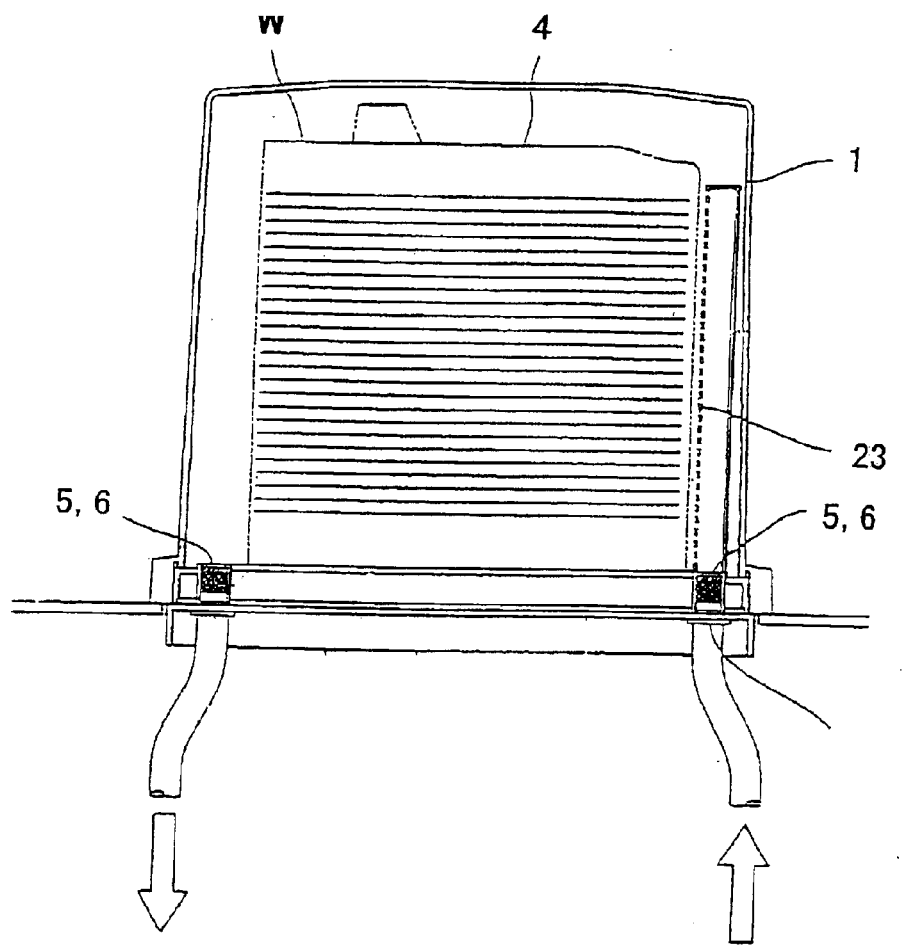
FIG. 97 is a cross sectional view of a substrate transport pod having a filter near a gas intake opening and gas discharge opening.

FIG. 97 shows an example of disposing the particle filter 5 and the chemical filter 6 in the vicinity of the intake opening of the substrate transport pod 1. In this case, the filters 5, 6 are disposed on the upstream as well as downstream side of the pod 1. The filters 5, 6 may also be disposed on either the upstream or downstream side.

FIG. 21 illustrates various practical situations of gaseous flow when the substrates are placed inside the substrate transport pod. The flow inside the pod 1 is formed by the gas flowing through the chemical filter (gaseous contaminants filter) 6 and the ULPA filter 5 by the action of the motor fan 7, so that the wafers W are swept by the cleanest gas. After flowing among the wafers, it again returns to the fan motor 7 by flowing along the inside wall surface of the pod 1. The interior wall surface of the pod 1 relates to at least one surface of the top/bottom and left/right surfaces of the pod. The opening section of the door may be provided anywhere. In automated transport systems, the opening section for the door is provided in the front or bottom surface of the pod.

Figure 21A:
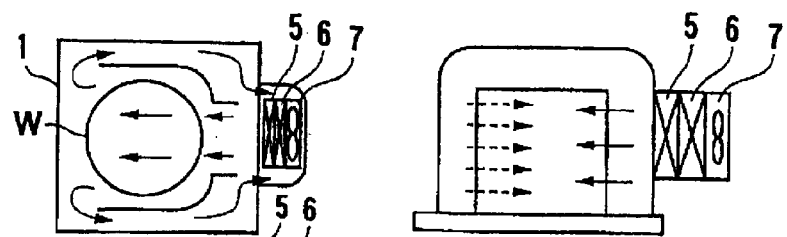
FIGS. 21A to 21F are diagrams of various types of air flow in the substrate transport pod.
Figure 21B:
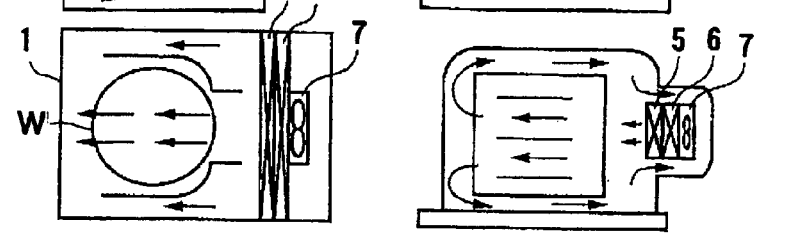
Figure 21C:
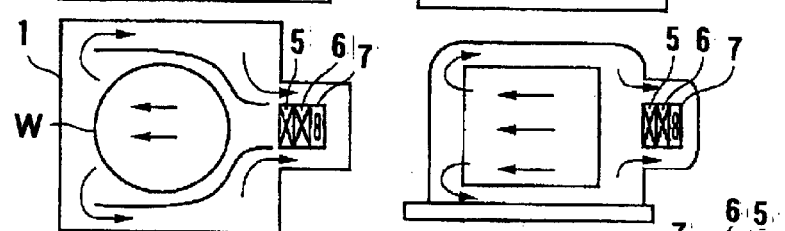
Figure 21D:
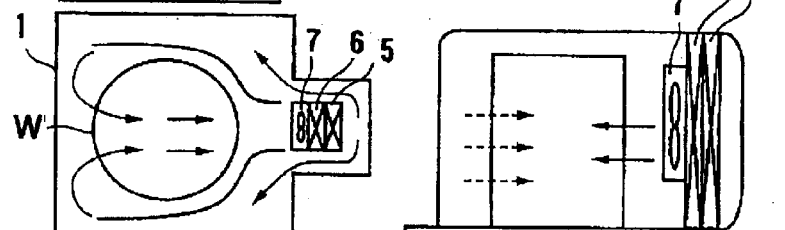
Figure 21E:
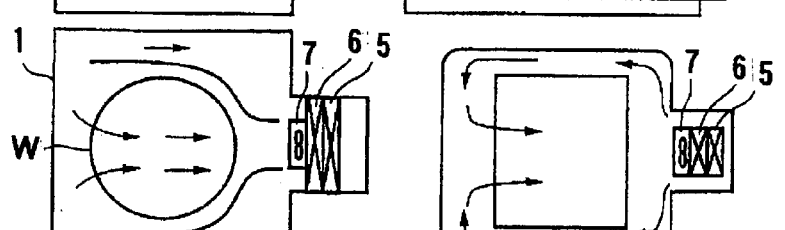
Figure 21F:
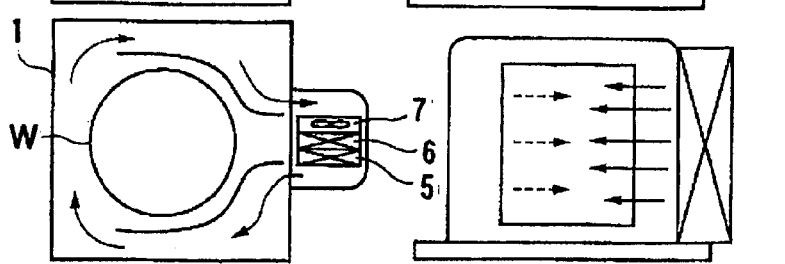

FIG. 21A shows an example of flow pattern of a gas passing through the motor fan 7 to the filters 5, 6 and wafers W and returning to the motor fan 7 along the left and right interior walls of the pod 1. FIG. 21B shows an example of flow pattern of a gas passing through the motor fan 7 to the filters 5, 6 and wafers W and returning to the motor fan 7 along the top and bottom interior walls of the pod 1. FIG. 21C shows an example of flow pattern of a gas passing through the motor fan 7 to the filters 5, 6 and wafers W and returning to the motor fan 7 along all the interior walls of the pod 1. FIG. 21D shows an example of flow pattern of a gas passing through the motor fan 7 to the filters 5, 6 along the left and right interior walls of the pod 1 and then flowing through the wafers W and returning to the motor fan 7. FIG. 21E shows an example of flow pattern of a gas passing through the motor fan 7 to the filters 5, 6 along the top and bottom interior walls of the pod 1 and then flowing through the wafers W and returning to the motor fan 7. FIG. 21F shows an example of flow pattern of a gas passing through the motor fan 7 to the filters 5, 6 and returning to the motor fan 7 along the interior walls of the pod 1. In this example, the gas need not flow directly to the wafers W. In all the cases of flow patterns, it is preferable that the gas be circulated at least once or preferably three times during the period between storing of the substrates in the substrate transport pod and removing the wafers again from the pod, such that the number of circulations can be adjusted, depending on the nature of the environment required by the stored substrates and the degree of contamination existing in the environments associated with the processes preceding and succeeding the current process. If there is no restriction on the power consumed by the fan, it is most preferable that the gas be circulated constantly. Here, it should be noted that "the nature of the environment required by the stored substrates" refers to the creation of an environment inside the pod during transit for individual processes so that all or any particular species of contaminants in the pod that may reduce the yield, such as particulate matters, ions, dopants, organic substances, moisture are kept below the target control level.

The substrate transport pod that performs such environmental control can be used for transporting the substrates within any manufacturing processes, for example, between the steps in a semiconductor manufacturing process, between the floors inside the plant, between plants, or, in addition to transporting them, it may also be used to store substrates.

Figure 22:
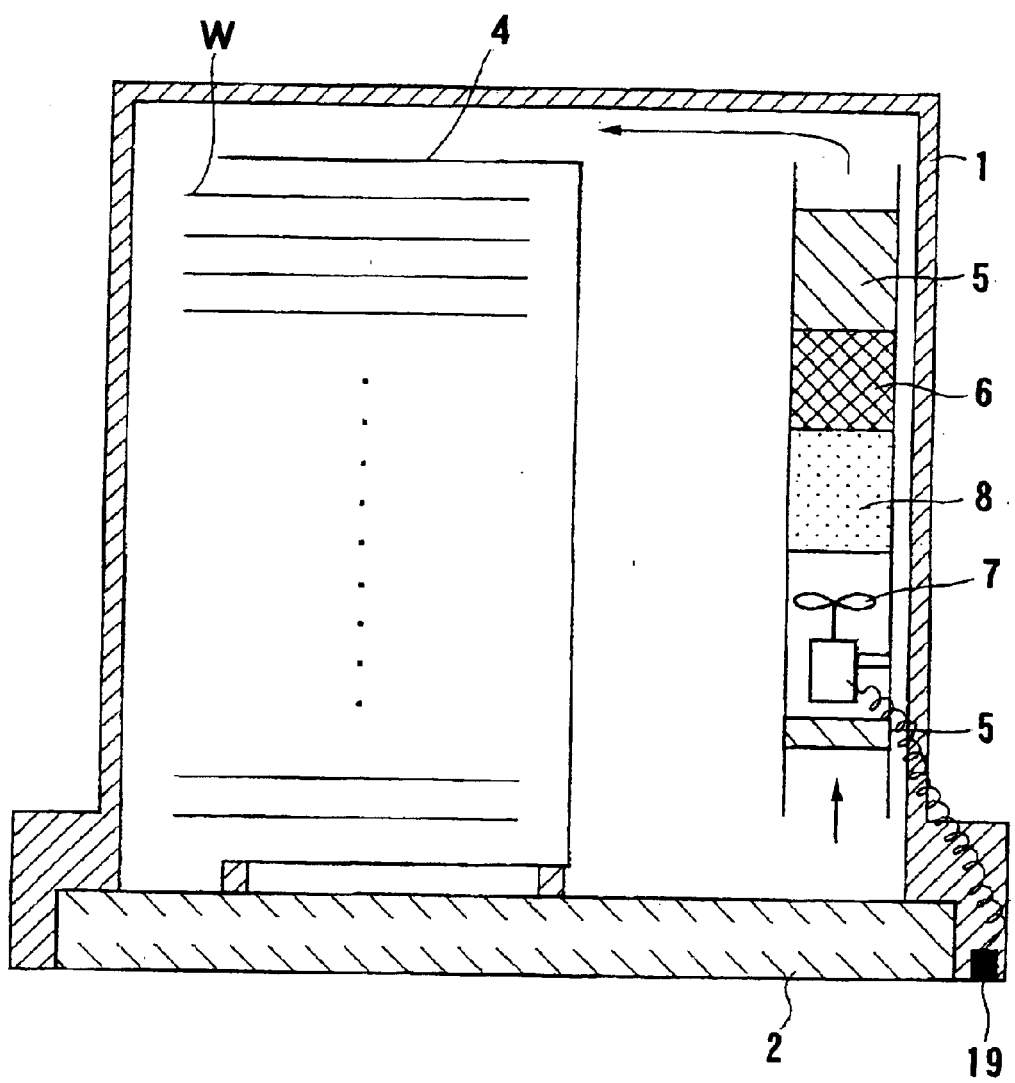
FIG. 22 is a cross sectional view of another embodiment of the substrate transport pod.
Figure 23A:
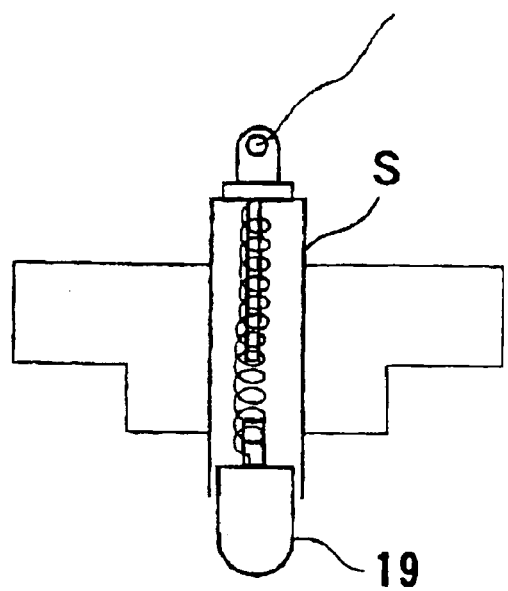
FIGS. 23A and 23B are spring connections of electrical contacts.
Figure 23B:
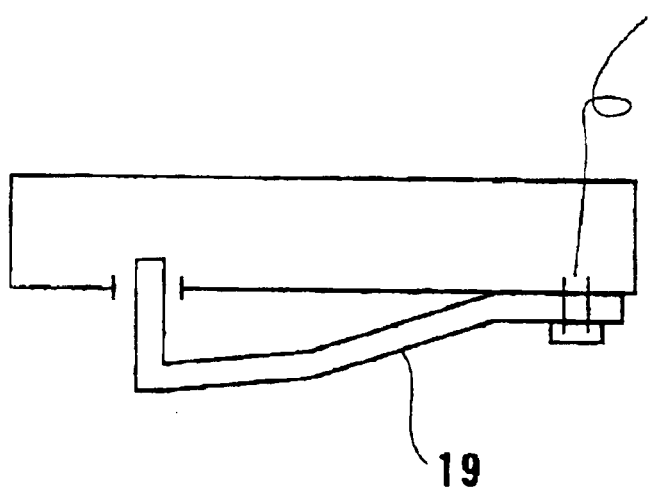

When the substrate transport pod itself has a battery, the fan may be operated intermittently so that the fan will be operating at some intervals. By so doing, the power consumption of the battery can be reduced. It is preferable that the power input terminal 19 be located at the bottom section of the substrate transport pod 1, as shown in FIG. 22, so that the electrical resistance at the connection to the apparatus terminal can be kept low because of the weighting effect of the substrate transport pod. It is preferable that the power input terminal 19 be pressed down by a spring member s, as shown in FIG. 23A, or by a metal terminal 19 itself providing a spring action as shown in FIG. 23B.

Further, it is preferable that the surfaces of the power input terminals be gold plated, at the receiving end as well as the supply end. The power source may be a direct current source, but alternating current power may also be supplied so that inductive current generated by electromagnetic means, as shown in FIG. 24, can be supplied to the substrate transport pod 1 from AGV 10 or processing apparatus 11. In this case, metal surface is not exposed on the terminal surface so that metal to metal contact is avoided to minimize contamination of the clean-room by generation of metallic dust.

Figure 25:
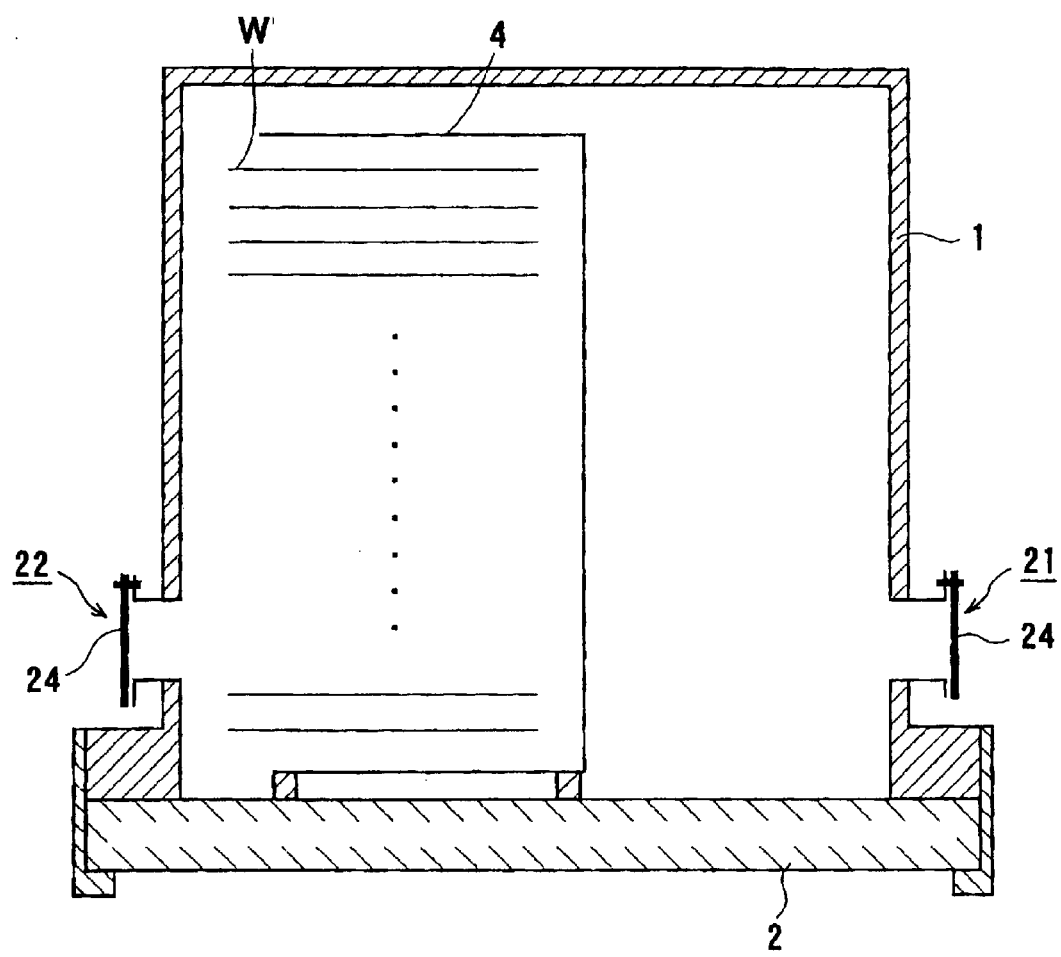
FIG. 25 is a cross sectional view of another embodiment of the substrate transport pod.

Also, as shown in FIG. 25, it is preferable to provide a shutter or a one-way valve 24 to close the air supply opening 21 and the discharge opening 22, when the connection opening of the AGV 10 or processing apparatus 11 is not connected to the air supply opening 21 and discharge opening 22 of the substrate transport pod 1.

Figure 26:
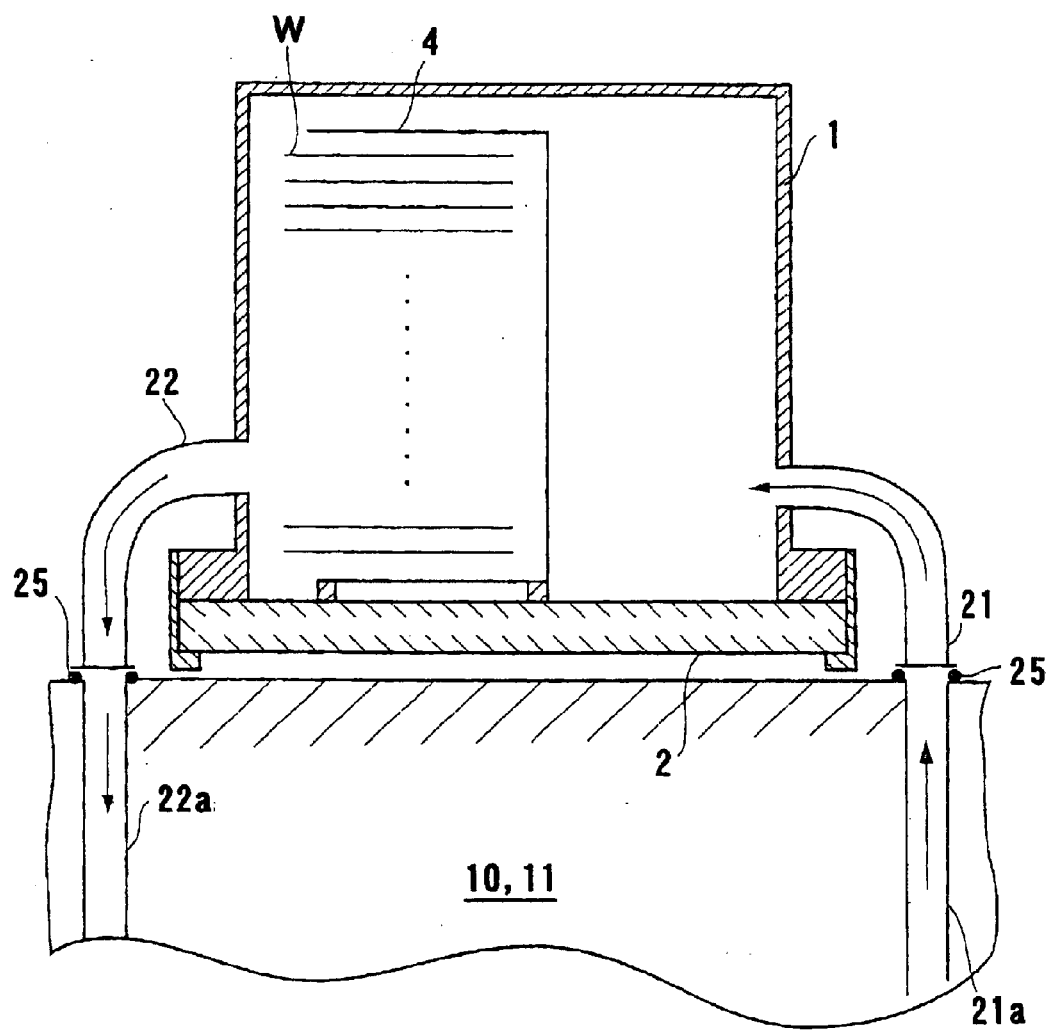
FIG. 26 is a cross sectional view of another embodiment of the substrate transport pod.

Also, as shown in FIG. 26, it is preferable that, by locating the air supply opening 21 and the discharge opening 22 of the substrate transport pod 1 to face toward the bottom of the substrate transport pod 1, the air supply opening 21*a* and the discharge opening 22*a* of AGV 10 or processing apparatus 11 is hermetically connected by means of respective seals 25. The seal 25 may be associated with either the substrate transport pod, AGV or with the processing apparatus.

The air supply opening and air discharge opening may be provided on the door 2. The cross sectional shape of the substrate transport pod may be square as shown in FIG. 27A or circular as shown in FIG. 27B, but when it is square shaped, it is preferable that the corner radius R be greater than 10 mm or more preferably greater than 20 mm Also, it is preferable that the supply opening and discharge opening be provided with a pre-filtering means such as membrane filter to prevent admission of particulate matters.

For storing semiconductor wafers inside the pod, the most difficult problem is humidity control.

In the substrate transport pod in this embodiment, the pod main body and the door are made of a polymeric or moisture impervious material having less than 0.1% water absorption factor. The method of determining the water absorption factor is according to ASTM (American Society for Testing and Materials) D570. Some values of the water absorption factor of general materials used in transporting and storing of semiconductor wafers and the like are: PC (polycarbonate) 0.2%; PBT (polybutylene terephthalate) 0.08%; PEEK (polyether etherketone) 0.14%; PEI (polyetherimide) 0.25%; and PP (polypropylene) 0.03%.

It is preferable that the water absorption factor of the pod 10 be at the most less than 0.3% or more preferably less than 0.1%. Polymeric materials of less than 0.1% water absorption factor include: PE (polyethylene)<0.01%; PP (polypropylene) 0.03%; PBT (polybutylene terephthalate) 0.06~0.08%; PPS (polyphenylene sulfide) 0.02%; PTFE (polytetrafluoroethylene)<0.01%; PC (polycarbonate with 20% added carbon) 0.1%; and PBT (polybutylene terephthalate with 20% added carbon) 0.05%. The material preferable for the pod should have a water absorption factor of less than 0.1%, resistant to chemicals, be stable at elevated temperatures, and have a low mold shrinkage of less than 1% or more preferably less than 0.5%, and includes such materials as: PPS (polyphenylene sulfide); PPS with added carbon, PBT with added carbon; and PC with added carbon. The material for the pod may include alloy material of different polymers so long as the afore-mentioned characteristics are satisfied.

Also, it is preferable that at least the wafer support material that contacts the wafers and the door that grounds the wafer support to the pod bottom be made of some electrically conductive material having carbon or other electrical conductor added thereto. The polymeric materials in general are classified as follows: those having surface resistivity $1\times10^3 \sim 1\times10^8 \Omega$ are classified as static-charge conductive materials; those having $1\times10^5 \sim 1\times10^{12} \Omega$ as static-charge dispersing materials; and those with values higher than $1\times10^{12} \Omega$ as insulating materials. Also, those materials having volume resistivity $1\times10^2 \sim 1\times10^5$ $\Omega \cdot cm$ are classified as static-charge conductive material; those having $1\times10^4 \sim 1\times10^{11}$ $\Omega \cdot cm$ as static-charge dispersing materials; and those with values higher than $1\times10^{11}$ $\Omega \cdot cm$ as insulating materials. In the present invention, it is preferable that the surface resistivity be less than $1\times10^{10} \Omega$; and volume resistivity be less than $1\times10^9$ $\Omega \cdot cm$, or more preferably surface resistivity be less than $1\times10^8 \Omega$; and volume resistivity be less than $1\times10^7$ $\Omega \cdot cm$. Also, because the non-woven ion exchange cloth and activated charcoal used for the gaseous contaminant capture medium contain adsorbed moisture, immediately after their production, it is preferable to dry them before use.

When the atmosphere inside a hermetically sealed pod is replaced with a dry gas, i.e. dried air or an inert gas that does not contain moisture, the internal humidity immediately after replacement drops to the limiting humidity of nearly 0%. However, if the pod is left in this condition by stopping the supply of dry gas, moisture contained in the polymeric material used in the interior walls diffuses into the pod due to the moisture gradient. Therefore, the humidity inside the container that has been filled with dry gas gradually increases with the passage of time. As one example, it has been shown that, when commercial PC (polycarbonate) is used for the pod, the relative humidity at 0% inside the pod attained immediately after replacement with a dry gas, rises to a value higher than 30% after several hours. When PPS (polyphenylene sulfide) that has a water absorption factor of 0.02% is used, the relative humidity at 0% attained immediately after replacement with the dry gas remains at about 12% even after more than several hours, demonstrating its superior suppression effect against a humidity rise. It is clear from this that it is possible to prevent the rise in the humidity of the interior of the pod space during storage/transport of wafers. Also, it is known that the growth of natural oxide film is prevented by storing the wafers in a dark environment. For this reason, it is preferable that the material for constructing the pod should be selected from optically opaque materials rather than from optically transparent materials.

Figure 28:
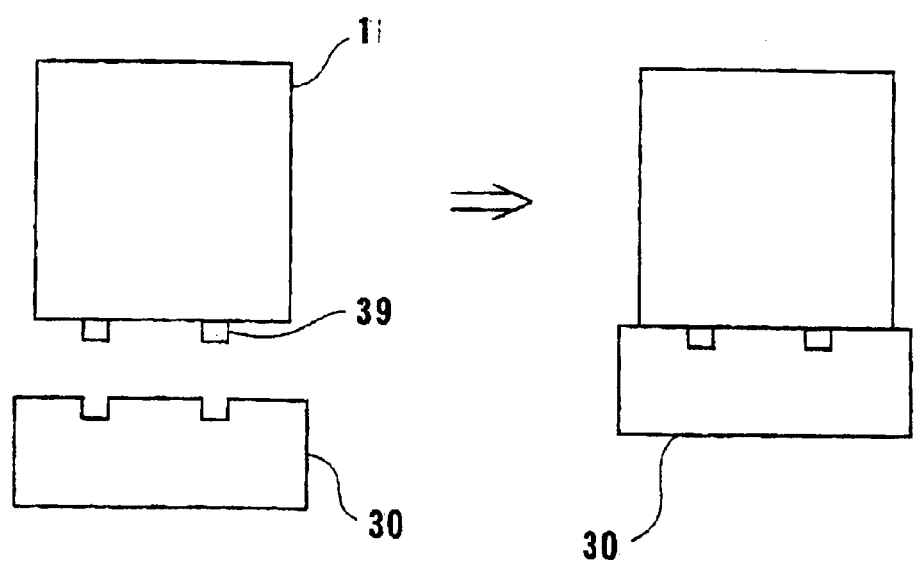
FIG. 28 shows structures for powering and static charge discharging.

The pod may be manufactured in one piece by press forming of sheet metal. The optically opaque material should block wavelengths shorter than 1500 nm (near infrared), or more preferably those shorter than 750 nm (visible light) to produce luminance of less than 10 lux or more preferably less than 1 lux. Further, the pod material may be made of a charge-retaining material so as to attract fine particles inside the pod, thereby preventing such fine particles from sticking to the wafers. For example, as shown in FIG. 28, the pod may be externally charged or discharged so that the fine particles are adhered to the interior walls during the period of charging the pod and the fine particles adhered to the interior walls are removed during the period of discharging the pod. The pod 1 is charged only when it is placed on the powering/discharging apparatus 30. The pod is provided with a powering/discharging terminals 39 to couple with the powering/discharging apparatus 30.

Figure 29A:
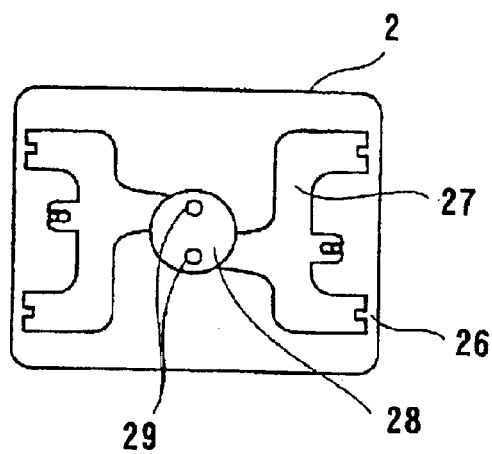
FIGS. 29A to 29F are diagrams of various methods of affixing a door to a pod main body.
Figure 29B:
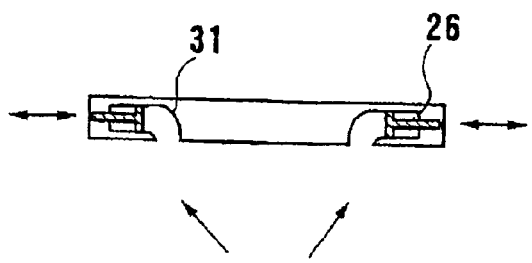
Figure 29C:
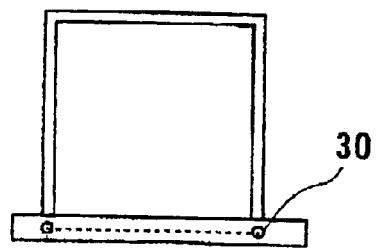
Figure 29D:
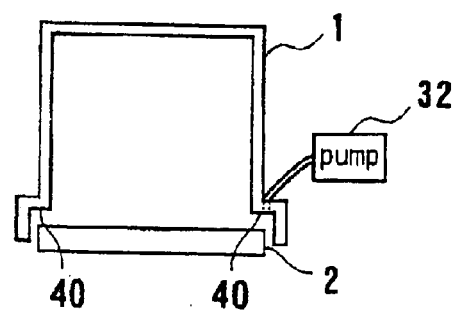

Various mechanisms of latching the door 2 to the pod 1 are shown in FIGS. 29A and 29B that show a mechanical arrangement, FIG. 29C shows a magnetic device 30 to hold the door against a sealing surface and FIG. 29D shows a vacuum chucking device 40 provided on the interface between the door and a sealing surface. The vacuum chuck is operated by the action of an evacuation means such as vacuum pump 32. Also, the door 2 may be attached to the pod 1 by evacuating the entire vessel to a negative pressure.

Figure 29E:
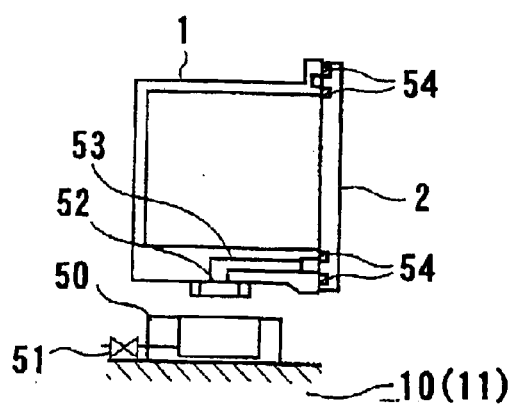
Figure 29F:
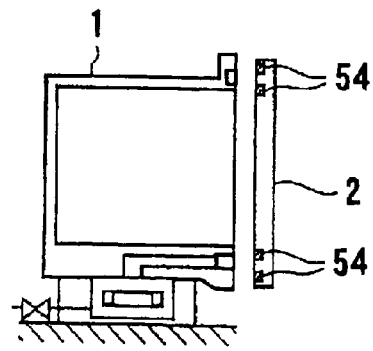

A preferred example of the method of FIG. 29D is shown in FIGS. 29E and 29F. The pod 1 has a door 2 that can be opened or closed, and a seal member 54 is provided between the door 2 and the pod to maintain hermetic condition of the interior of the pod. The sealing member is formed in one piece along the external frame of the door. One or a number of sealing members may be provided. Also, the pod has an exhaust duct 53 for closing the door 2 and a port valve 52 for closing/opening one end of the exhaust duct. A groove 55 is formed at the door side end section of the exhaust duct to extend along the flange. An interface is provided on the transport apparatus side and a valve 51 to communicate with the interface is provided.

Next, the flow pattern in the vacuum chucking method will be explained. As shown in FIGS. 29E and 29F, a method of opening the door from the pod is to place the pod 1 on the interface 50 while the door 2 is closed against the pod 1. Valve 51 is opened to evacuate the interface. Then, valve 51 is closed to maintain the interface section under vacuum and the port valve 52 is opened. Valve 51 is opened to introduce atmosphere inside the interface and the door is opened. A method of closing the door against the pod is to evacuate the interface while holding the door against the pod somehow and opening the port valve 52. The door 2 is then closed tightly against the pod 1. Port valve 52 is closed and the valve 51 is opened to introduce atmospheric pressure inside the interface section, so the pod 1 becomes movable.

Figure 30:
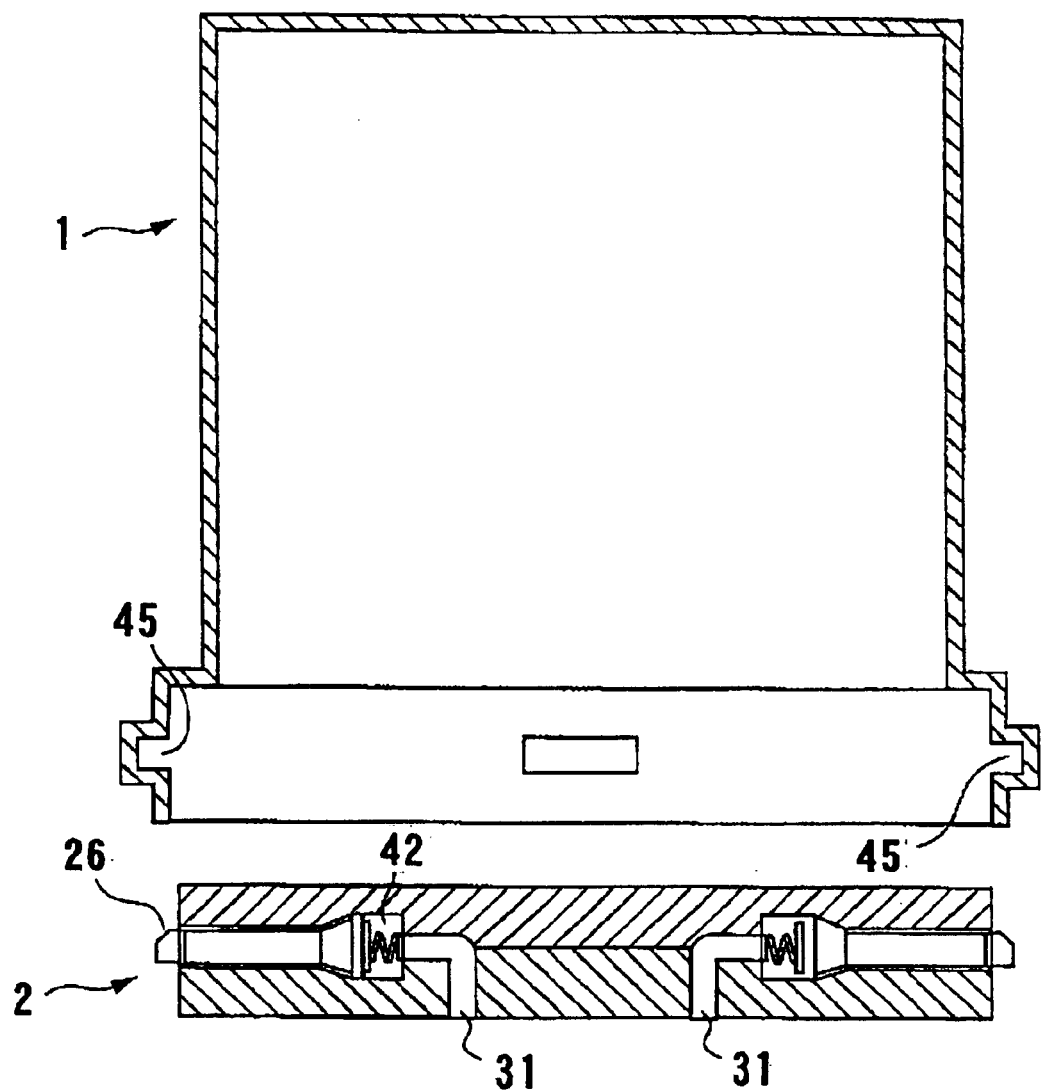
FIG. 30 is a diagram of an example of a latching mechanism.

The drive source for the mechanical latching device shown in FIG. 29B may be based on an external mechanical latching device, or it may be based on the method shown in FIG. 29B to operate the latch 26 in/out of the door 2 using compressed air through the duct 31. A more preferable method based on FIG. 29B is shown in FIG. 30. The latch 26 is provided so as to slide horizontally inside the door so that the latch 26 is always pushed outwards by the pressing means 42 such as coil spring. The pressing means may utilize a metallic coil spring, for example. The latch can be positioned in the first fixed position or the second fixed position. In the first fixed position, the latch 26 is disposed outside of the door 2. This is so that the latch 26 protrudes beyond the door when gas is not evacuated through the duct 31. In the second fixed position, the latch is housed inside the door. This is so that the suction through the duct 31 pulls the latch inside the door. The pod 1 has a groove 45 for receiving the latch. The latch and groove may be provided in plurality. It is preferable that the door 2 be made of an electrically conductive polymeric material, such as carbon-containing polymer, because of protection for static electricity, which will be explained later.

Next, positioning of the pod will be explained. As shown in FIGS. 32A and 32B and 32C, a locating hole 556 is provided on the pod bottom section 553 so as to correspond with the locating pin 554 provided on the station side. Also, as shown in FIGS. 32A and 32B, the end section 553a of the pod bottom section 553 is beveled so as to facilitate entry into the pod mounting section 555 of the station side. As shown in FIG. 32C, the end section 555a of the apparatus mounting section 555 may be machined at a slant angle. In this case, the end section 553a of the pod need not be beveled.

Figure 33A:
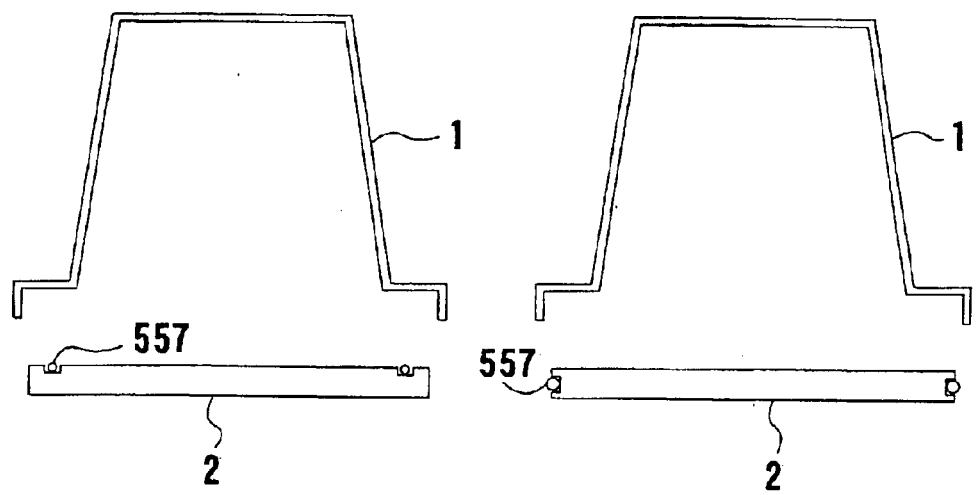
FIGS. 33A and 33B are diagrams of seal structures between the pod main body and a lid.
Figure 33B:
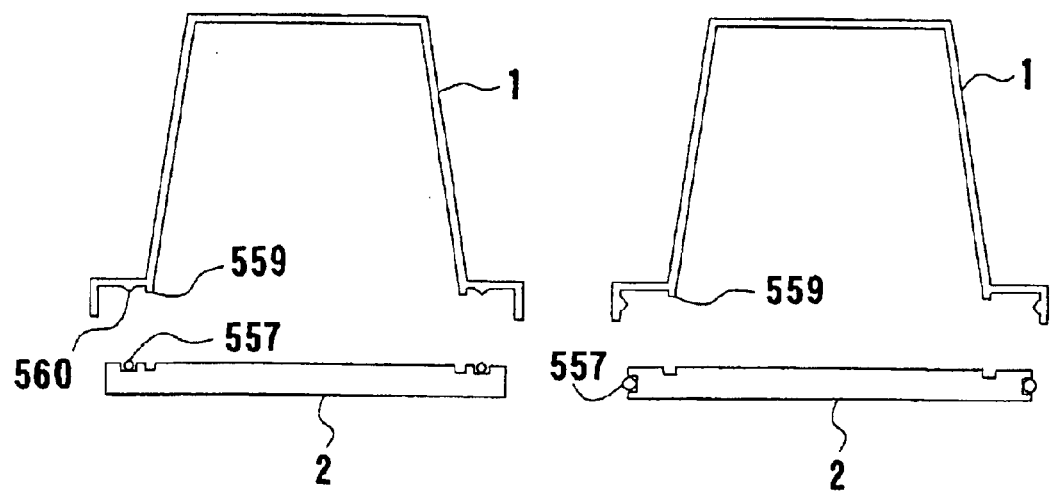
Figure 34A:
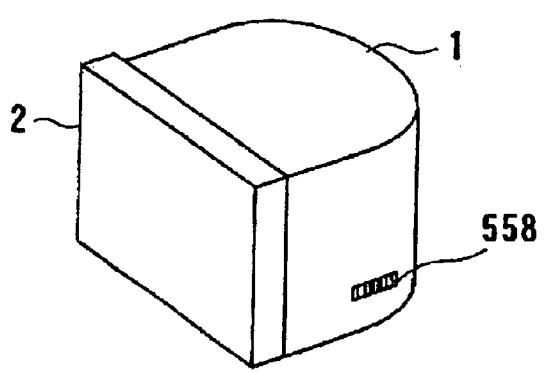
FIG. 34A and 34B are diagrams of an example of attaching a computation unit to the pod.
Figure 34B:
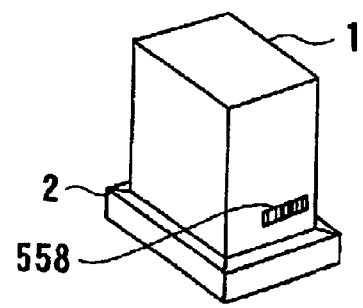

As shown in FIG. 33, in order to maintain a clean atmosphere inside the pod, sealing member is required between the box and the door. One method is to seal the interface by means of a sealing member provided at the interface between the two. In the flange section of the pod main body, to contact the sealing member provided on the door 2, guide ribs 559 may be provided inside the flange for mechanical strengthening. Also, a protrusion 560 may be provided on the contact section with the seal member so that a hermetic sealing is achieved with a smaller contact pressure. For the sealing member 557, it is preferable to use a fluoride-based elastomer, a polyester-based elastomer, a polyurethane-based elastomer or a polyolefin-based elastomer. Further, heat treatment enhances prevention of degassing from the sealing member during processing. Also, it is known that a positive pressure inside the pod prevents entry of contaminants from external sources. Positive pressure environment can be generated constantly or periodically. Further, as shown in FIGS. 34A and 34B, a bar code 558 may be displayed on the outer surface of the pod 1 for content identification.

Next, the particle filter will be explained.

In general, air filters are used generally to remove particulate matters. According to the JIS standards, filters are classified into the following four categories according to their particle size and capture efficiency.

1. coarse particle filter: an air filter used primarily for particles larger than 5 $\mu$m;
2. medium performance air filter: an air filter having medium performance primarily for particles smaller than 5 $\mu$m;
3. HEPA filter: an air filter having a capture efficiency of greater than 99.97% for particles of 0.3 $\mu$m at a specified wind velocity and generates a pressure drop of less than 245 Pa; and
4. ULPA filter: an air filter having a capture efficiency of greater than 99.99% for particles of 0.1 $\mu$m at a specified wind velocity and generates a pressure drop of less than 245 Pa In the case of creating a clean environment as in the present substrate transport pod, either the HEPA filter or the ULPA filter should be used. The ULPA filter is generally constructed so that a folded filter member is provided with spacers to secure flow passages. The pressure loss through the ULPA filter varies depending on the flow resistance of the filtering membrane and the manner of folding the membrane and uniformity of the passages. When the structure is such that the opening area of the filter is small, the length of the flow passage should be increased and it is preferable to use filters having low pressure drop by packing more filtering medium. Filtering media are available commercially in various materials such as glass fibers and fluoride-based resins, and any such filtering medium may be used, but it is preferable to use fluoride-based resins that offer superior chemical resistance, low gas emission and low flow resistance. When the opening area can be made large, it is preferable to decrease the length of flow so as to maximize the utilization of the limited space available.

Figure 35A:
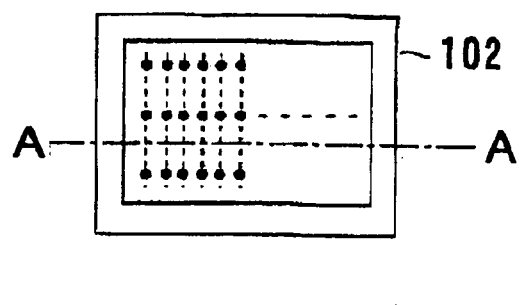
FIGS. 35A, 35B and 35C are diagrams of filter structures based on a folded filtering member.
Figure 35B:
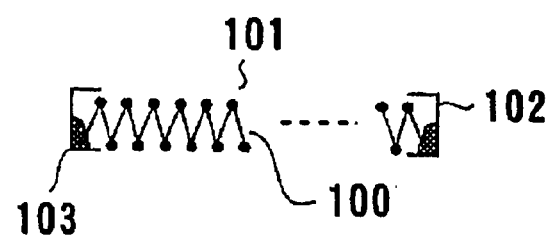
Figure 35C:

A frame made of aluminum or a stainless steel (SUS) or a polymer is filled with folded HEPA or ULPA filter. As shown in FIGS. 35A and 35B, the folded filter member has partitions called ribbons 101 at the apexes. The ribbons serve to maintain a constant separation of the folds to secure passage of air through the filter member. The folded filtering medium 100 is affixed to the outer frame 102 using an adhesive 103. Instead of the ribbons, the filter member may be embossed to secure the flow passages or the ribbon may be eliminated. Also, when the outer frame is made of a polymer, attachment may be made by fusing instead of using adhesive.

Here, as shown in FIG. 36, a filter member may be manufactured by inserting wave-shaped separators 104, instead of the ribbons.

Figure 37:
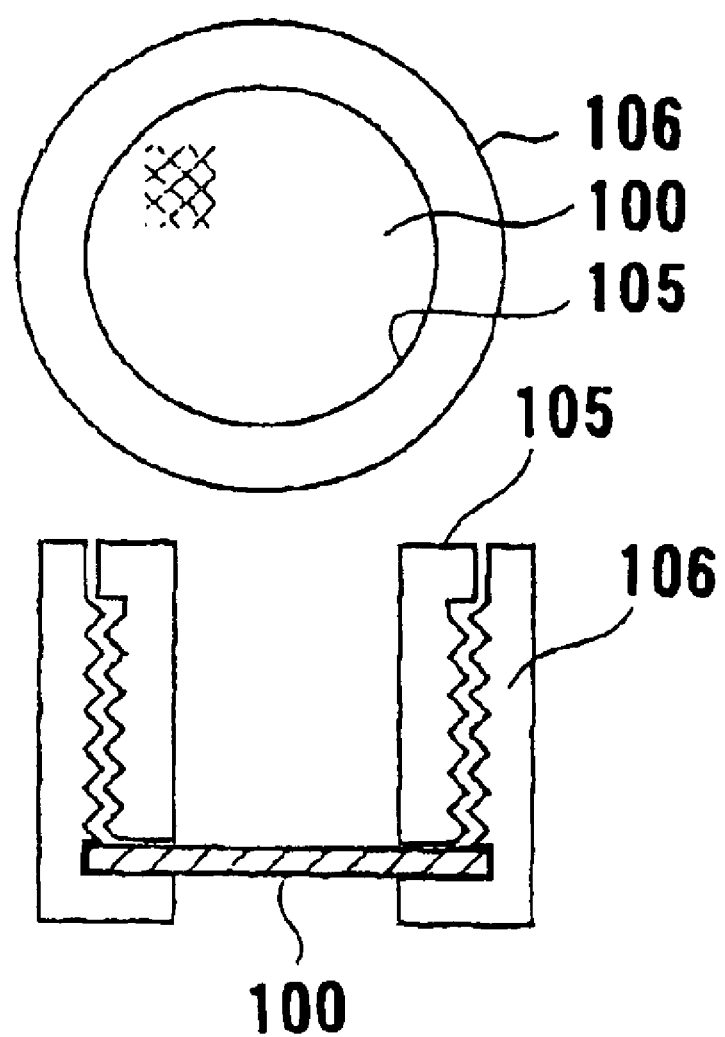
FIG. 37 is a diagram of a flat film structure filter.

Also, without folding the filter member, a flat film may be used as a filter member. For example, as shown in FIG. 37, a circular filtering medium 100 may be inserted between a circular inner support member 105 and an outer support member 106, and mechanically affixed to produce a flat structured filter Such a filter has a high flow resistance, and therefore, it is suitable for application to air moving devices such as pumps.

Filtering media for particle filtering include PTFE, glass fibers, non-woven cloths, and recycled products. The structure of the filter may include folded structures (pleats, mini pleats), membranes (sheet type), corrugation and hollow fibers.

Figure 38:
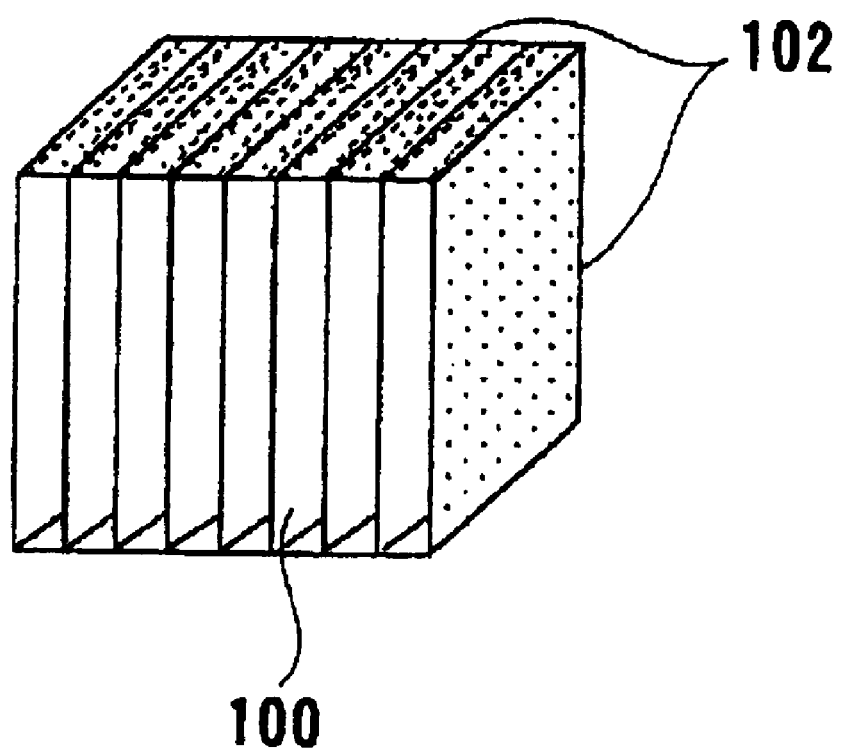
FIG. 38 is a diagram of a unit structure of a filter.

The particle filters are used in an assembled unit by surrounding the filtering medium 100 in an outer frame 102 as shown in FIGS. 38 and 39. To prevent the captured particles from being detached from the filter, it is necessary to seal between the filter members and the outer frame at the sealing sections 107. A general method of sealing is to use an adhesive 103. It is also possible to pressure-bond the filtering medium 100 and the outer frame 102. The adhesive includes urethane-based or epoxy-based resins. Furthermore, when the outer frame is made of a polymeric material, filter members may be fused to the frame. By constructing the particle filter 5 separately from the gaseous contaminants filter 6, as shown in FIG. 39, when the service life is ended, each filter can be replaced independently of the other to increase the respective efficiency of filter utilization. Also, a space S is created between the particle filter 5 and the gaseous contaminants filter 6 by way of the outer frame 102, and moisture transmission and the pressure drop of filters themselves can be avoided.

Next, the chemical filter (gaseous contaminants filter) 6 will be explained.

Different gaseous contaminant removing means can be chosen depending on the nature of the target substance. Basic gases can be removed effectively by the use of strongly acidic or weakly acidic cation exchange non-woven cloth or fibers, or strongly acidic or weakly acidic cation exchange beads. They can also be removed by the use of activated charcoal or ceramics coated with an acidic chemical. Acidic gases, boron, and phosphorous may be removed effectively by the use of strongly basic or weakly basic anion exchange non-woven cloth or fibers, or strongly basic or weakly basic cation exchange beads. They can also be removed by the use of activated charcoal or ceramics coated with a basic chemical. Organic substances can be removed by activated charcoal, activated carbon fibers, zeolite, molecular sieve, silica gel and porous ceramics. Ozone can be removed by the use of a carrier medium made of manganese dioxide in the form of grains or sheet or by attaching them to a carrier, or activated charcoal coated with manganese dioxide. Also, ionized metals in a vapor form, for example, copper sulfide, can be removed by non-woven ion exchange cloth or ion exchange beads. The structure of adsorbing material can be chosen to suit the allowable size of the filter, shape and pressure drop.

Figure 40A:
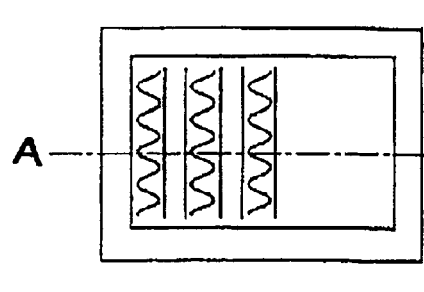
FIGS. 40A, 40B and 40C are diagrams of examples of the structure of chemical filters.
Figure 40B:
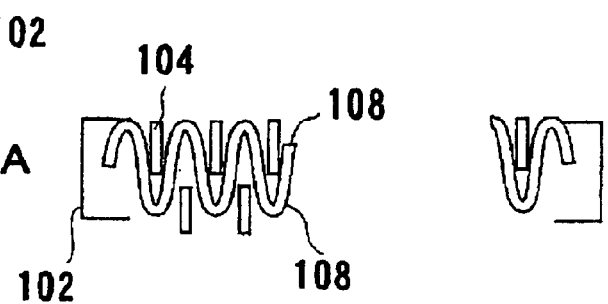
Figure 40C:
Figure 41:
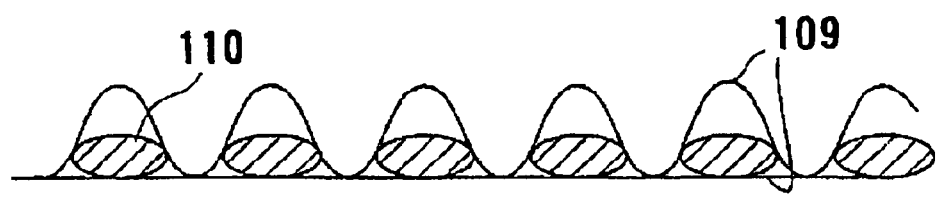
FIG. 41 is a diagram of a filter comprised by an adsorbing agent held between two sheets of paper.

FIG. 40 shows an example of the chemical filter made of a folded sheet type adsorbing material, comprised by an outer frame 102, a sheet shaped adsorbing agent 108, a separator 104 and a seal member. The outer frame is made of Al or stainless steel (SUS) or a polymeric material. Sheet type adsorbing material includes: 1. non-woven ion exchange cloth; 2. activated carbon fibers; 3. non-woven cloth impregnated with activated charcoal in a particulate or powder form; 4. two melt-bonded non-woven cloths 109 laminated and the space filled with adsorbing material 110 comprised by activated charcoal powder or ion exchange resin, as shown in FIG. 41; and 5. non-woven cloth or fibers for capturing debris falling from activated carbon fibers and others. The adsorbing material may be affixed to the outer frame by means of urethane adhesive or by pressing to a sponge type gasket member.

Figure 42A:
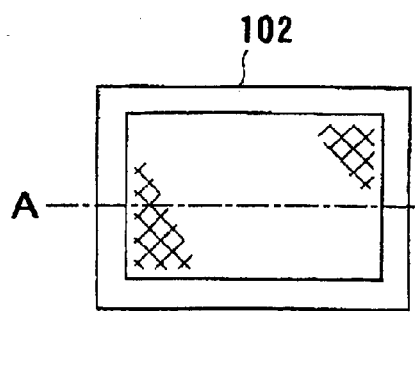
FIGS. 42A, 42B and 42C are diagrams of examples of the structure of chemical filters.
Figure 42B:
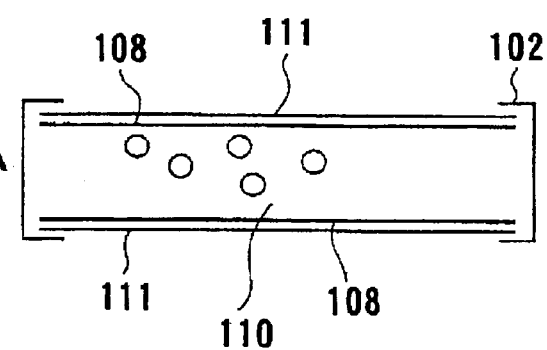
Figure 42C:
Figure 43A:
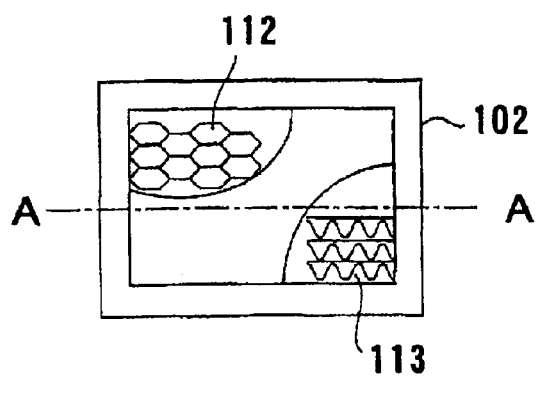
FIGS. 43A, 43B and 43C are diagrams of another other examples of chemical filters.
Figure 43B:
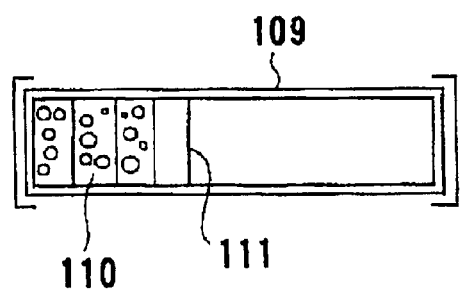
Figure 43C:
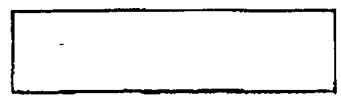

As shown in FIGS. 41 and 42, the chemical filter is comprised by an outer frame 102, an adsorbing material 108 or 110 and a support member 111. The structure is such that activated charcoal particles or zeolite or ceramic particles or single crystal particles or ion exchange resin 110, singly or in combination, is wrapped by non-woven ion exchange cloth or fibers or non-woven cloth or fibers 108 having no adsorbing capability, and the structure is reinforced with a support member 111 so as not to expand the activated charcoal particles. Another method is shown in FIG. 43, in which the spaces in a honeycomb structure 112 or corrugated core 113 are filled with activated charcoal particles or zeolite or ceramic particles or single crystal particles or ion exchange resin 110, singly or in combination, and the filled carrier is wrapped in a non-woven cloth 109 with a support member 111. The material for the honeycomb structure or corrugated core may or may not have adsorbing capability.

Figure 44A:
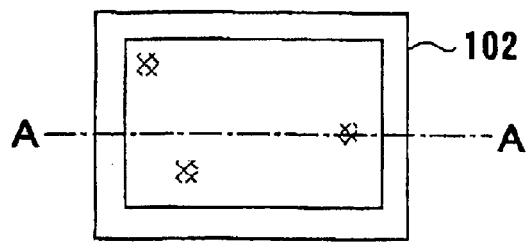
FIGS. 44A, 44B and 44C are diagrams of still other examples of chemical filters.
Figure 44B:
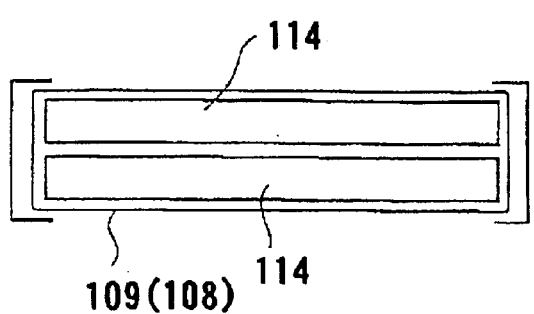
Figure 44C:

Another filter structure is shown in FIG. 44, in which a unified adsorbing member 114 is wrapped with a non-woven ion exchange cloth or fibers 108 or with a non-woven cloth or fibers 109 having no adsorbing capability. Adsorbing agent may be made by bonding activated charcoal or activated charcoal coated with acidic or alkaline substance or ion exchange resin or zeolite to a three-dimensional web structure of foamed urethane, for example, or by making a unified structure by cementing activated charcoal particles using an adhesive and drying.

Another filter structure is shown in FIG. 45, in which the outer frame holds activated charcoal in fiber/paper form or a ceramic material made into a corrugated form 113 or in a lattice form 115, or activated charcoal powder formed into a honeycomb structure 112, which are wrapped with a non-woven ion exchange cloth or fibers, or with non-woven cloth or fibers having no adsorbing capability. It is also permissible to use the honeycomb structure 112 mentioned in 4 above.

The material for chemical filter (gaseous contaminants filter) includes: activated charcoal, activated carbon fibers, zeolite, silica gel, ceramic material, a non-woven ion exchange cloth or fibers, ion exchange resins, activated charcoal coated with acid or alkaline substance, activated charcoal on a manganese dioxide carrier, metallic catalyst and photo-sensitive catalyst.

The filter structure can be made of a single material or a plurality of materials. When a plurality of materials is to be used, activated charcoal particles and non-woven ion exchange cloth may be used, for example. In such a case, non-woven ion exchange cloth is used to contain the particles or powder of activated charcoal. Non-woven ion exchange cloth may be made into a sheet form or a folded form. They may be applied on a carrier body made of urethane, foam body, plastic, polymeric or metallic material. For example, activated charcoal particles on a urethane carrier and ion exchange resin on a urethane carrier; or activated charcoal particles on a urethane carrier and a urethane carrier impregnated with activated charcoal particles.

The shape of the chemical filter may include a plate type, rolled core type, w-type, cylindrical type, plate-fin type, bypass type, and a three-dimensional skeletal type.

As shown in FIGS. 46A, 46B and 46C, the structure of the gaseous contaminants filter is unitized by attaching the filter member 108 to an outer frame 102. The outer frame 102 may be made of metals such as stainless steel or aluminum, or plastic. FIG. 46A illustrates a direct method and FIG. 46B illustrates an indirect method for attaching the filter 108 to the outer frame. In the direct method, the elastic force of the filter itself is used to press against the outer frame. For example, the filter 108 is folded, and the elastic force in the lamination direction presses the filter against the outer frame 102 (refer to FIG. 46A, see-through view A). Indirect mounting utilizes an elastic member 116a between the filter and the outer frame. For example, an elastic member 116b such as gasket (Teflon) and the like may be used (refer to FIG. 46B, see-through view B). Also, as shown in FIG. 46C, on the inside surface of the outer frame, a protrusion 117 is provided so as to act as a seal when the filter is pressed against the outer frame.

Also, a particle filter and a chemical filter may be mounted on one frame to produce a composite filter unit. Or, a particle filter and a sheet type chemical filter may be folded together to produce a unified filtering device.

Figure 47:
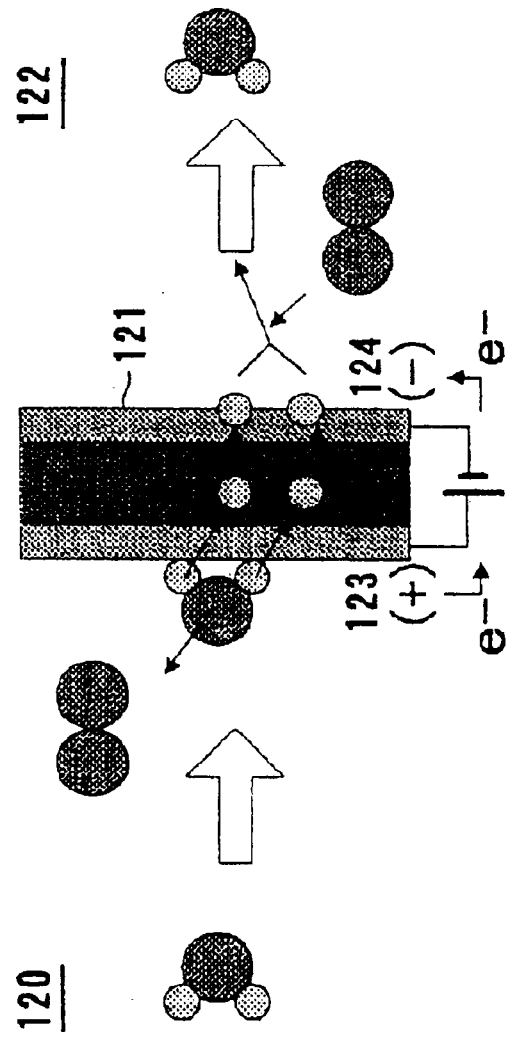
FIG. 47 is an illustration of the principle of dehumidification action by solid polymer electrolytic film.

Next, dehumidifying agent and dehumidifier will be explained. To remove moisture contained in air, methods based on a dehumidifying agent containing primarily either silica gel, zeolite (including synthetic zeolite), calcium carbonate, calcium chloride or magnesium chloride is available. When using the dehumidifying agent, it is preferable to use an agent such as silica gel, which can be reused after regenerative heating and available in a cartridge form for easy replacement that can be carried out automatically. Another method that may be considered is to cool the pod or insert a cooled rod inside the pod for a given duration to collect the frozen moisture for removal. Also possible is a dehumidifier based on solid polymer electrolytic film. FIG. 47 shows a mechanism of dehumidification. In this method, water molecules on the dehumidifier-side space 120 is are decomposed into hydrogen and oxygen using a catalyst, and hydrogen is removed through a solid polymer electrolytic film 121 impressed with a voltage towards the outer side of the dehumidifier space 120, that is, hydrogen is discharged towards the moisture discharge side space 122.

Figure 48:
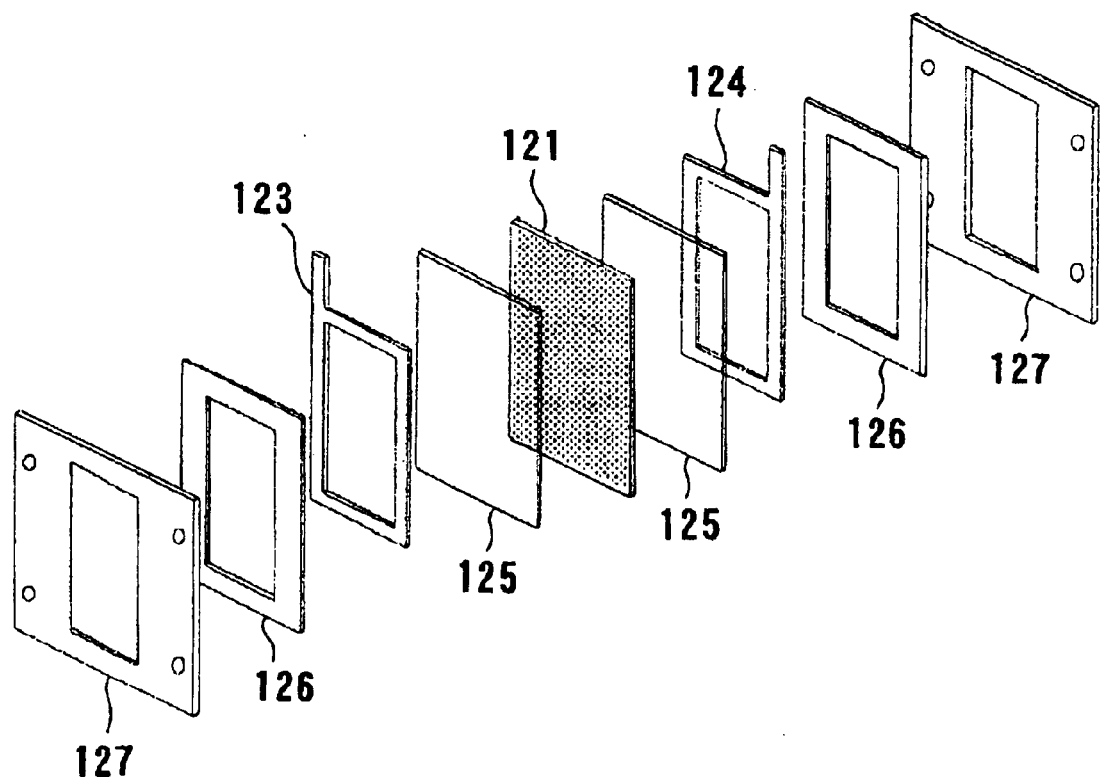
FIG. 48 is an exploded diagram of a dehumidifier based on solid polymer electrolytic film.
Figure 49:
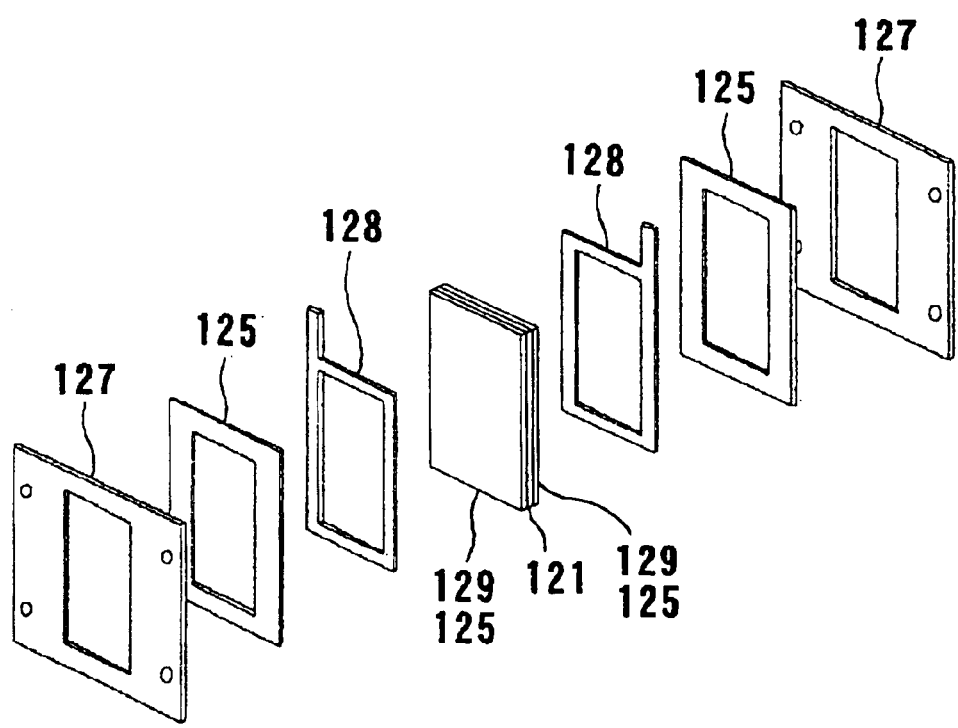
FIG. 49 is an exploded diagram of another dehumidifier based on solid polymer electrolytic film.

An example of a minimum number of components required for dehumidifier based on a solid polymer electrolytic film will be explained with reference to FIG. 48. The essential components are: a positive electrode 123, a negative electrode 124, a solid polymer electrolytic film 121 and a catalytic layer 125. Also, a feature of assembling the components is that the positive electrode 123 and negative electrode 124 have a catalytic layer 125 and a porous substrate base. The solid polymer electrolytic film 121, porous electrode 129 (123, 124) and the catalyst 125 are assembled into a single unit by having the substrate base coupled into the solid polymer electrolytic film 121 and forming the catalytic layer in the coupling space. It is possible to use ROSAHL made by Ryosai Technica Co. Ltd., for example (refer to FIG. 49).

FIG. 50 shows another example of the structure of a dehumidifier based on the solid polymer electrolytic film. This example relates to a unified structure produced by molding a fixation flange section 127 with the pod 1. The effective area of the dehumidifier may be made into a square, rectangular, circular, oval or polygonal shape and others, but it is preferable that the effective area (opening area that contacts the gas to be processed) relative to the electrode area be as large as possible, and specifically, the ratio of the opening area that contacts the gas to be processed to the electrode area be higher than 50% and less than 99%, or more preferably higher than 60% and less than 90%. If the ratios of the opening area that contacts the gas to be processed to the electrode area are the same, an oval shape is preferable than a circular shape and a rectangular shape is preferable than a square shape, and specifically, it is preferable to design so that the short axis and the long axis, or the short perimeter and the long perimeter are related in a range of not less than 10% and not more than 99%. The solid polymer electrolytic film should preferably transmit protons, but it may be served by Nafion (registered trade mark) -117 made by DuPont Co, which has a nominal film thickness of 170 $\mu$m. It is also possible to use Nafion-115, or XUS-13.204.10 made by Dow Chemical Co., for example. It is preferable to use platinum or platinum black as the catalyst because of its capability and durability, but platinum on carbon carrier or other platinum group metallic catalyst may be used. It is preferable to use aluminum or stainless steel for the current terminal 128 necessary for application of uniform voltage on the porous electrode 129. For packing material, PTFE is preferable because of its low emission of organic substances. Because the fixation flange contacts the process gas directly so that it is preferable to avoid using metals that are susceptible to corrosion by the process gas, so that resin materials such as polycarbonate is preferable, but if there is no danger of corrosion, stainless steel may be used. Also, it is preferable to provide a guard on the fixation flange and the pod main body so as to avoid contacting the electrode section directly from outside.

In any of these methods, the use of the fan to circulate air inside the pod can hasten the process of dehumidification. In practicing the present invention, it is acceptable to use any type of dehumidifier so long as the method chosen allows all machines to be arranged suitably. Also, by providing ports on the pod main body for introducing and discharging high purity nitrogen or inert gas into the interior of the pod so that replacement of the interior atmosphere is carried out along with dehumidification, it is possible to further reduce the time required for attaining low humidity in the interior of the pod.

Also, it is preferable to mount both the dehumidifier and moisture absorbing material (activated charcoal, ion exchange agent, silica gel and the like) to act as a dehumidifying unit for the purpose of removing moisture. This is to maintain the moisture absorbing material in the active initial stage, which exhibits fastest absorption speed, at all times by keeping the absorbing material in the dry state at all times using the dehumidifier. Further, the use of a pod having a means for forcing gas circulation achieves low humidity in the shortest possible time. Whether the means for creating a gas flow is a fan or gas purging, it is preferable to circulate the gas at least once or more, or more preferably more than three times during the duration between wafer storing and wafer removal, such that the number of circuluations can be adjusted according to the degree of contamination existing in the outer environments before and after the current process in relation to the degree of cleanliness required by the stored wafers. If there is no restriction on the power consumed by the fan, it is most preferable that the gas be circulated constantly. Here, it should be noted that "the nature of the environment required by the stored substrates" refers to the creation of an environment within the pod during transit between the processes so that all or any particular species of contaminants in the pod that may reduce the yield, such as particulate matters, ions, dopants, organic substances, moisture are kept below the target control level. The substrate transport pod that performs such environmental control can be used for transporting the substrates within the any semiconductor manufacturing processes, for example, between the steps, between the floors inside the plant, between plants, or, in addition to transporting them, it may also be used to store substrates.

Here, when the object is to maintain low humidity, it is better to use a material that has low moisture absorption factor for the pod. This is because, in a typical environment of 25° C. and 50% relative humidity (RH) generally adopted for clean-rooms, if the interior of the pod space only is reduced in humidity, (1) moisture contained in the polymeric materials that comprise the pod migrates towards the low temperature side due to the temperature gradient, (2) the moisture contained in the environment external to the pod migrates towards the interior of the pod due to humidity gradient between the interior of the pod and the external environment, and (3) air in the external environment leaks into the interior of the pod through the pod joints. These three reasons cause the moisture to migrate towards the interior of the pod which is maintained at a lower temperature. When the pod is highly hermetic, of the three reasons cited above, the factor that most affects the rise in humidity in the interior of the pod is the above-noted (1) moisture contained in the polymeric materials that comprise the pod migrates towards the low temperature side.

The water absorption factor of polymeric materials is specified in ASTM (American Society for Testing and Materials) D570, and is reproduced in literature or polymer makers catalogue and the like. Polycarbonate (PC) is used often for making substrate transport pod, but the water absorption factor of PC is 0.2~0.3% so that the pod main body and the door weighing 3 kg would contain 6~9 g of moisture. By using a material having water absorption factor of at least less than 0.1%, it is possible to reduce the amount of moisture that can be migrated inside the pod, and contributes to improving the performance of the dehumidifier. Polymeric materials of less than 0.1% water absorption factor include: PE (polyethylene)<0.01%; PP (polypropylene) 0.03%; PBT (polybutylene terephthalate) 0.06~0.08%; PPS (polyphenylene sulfide) 0.02%; PTFE (polytetrafluoroethylene)<0.01%; PC/carbon (polycarbonate with 20% added carbon) 0.1%; and PBT/carbon (polybutylene terephthalate with 20% added carbon) 0.05%. Of these substances, for constructing the substrate transport pod, it is preferable to use PPS (polyphenylene sulfide) or PBT (polybutylene terephthalate) or the above-mentioned materials with carbon addition that show characteristics of chemical resistance, superior high temperature properties and low mold shrinkage.

Figure 51:
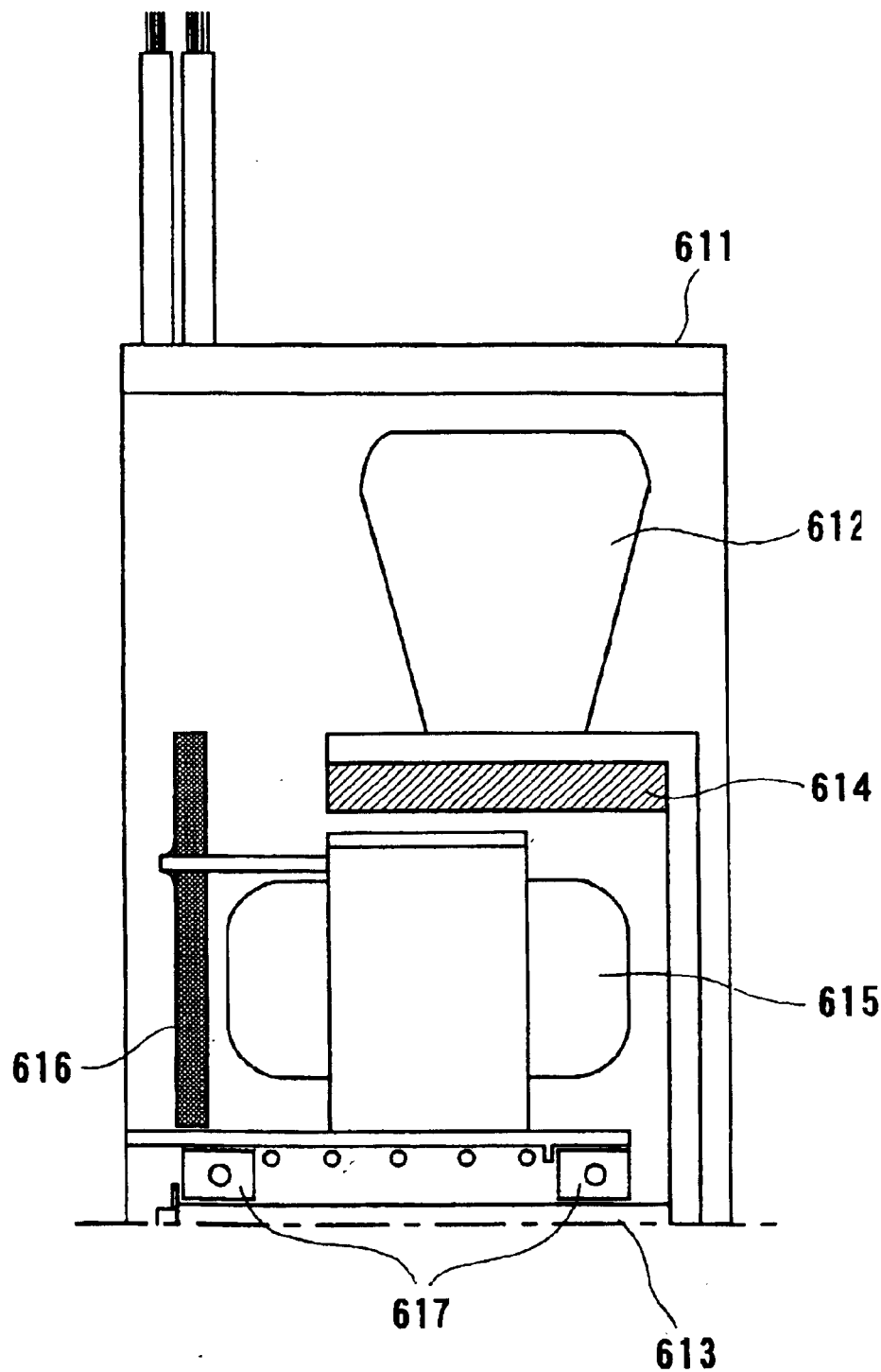
FIG. 51 is a cross sectional view of an example of the structure of a fan motor.

For the gas circulation apparatus, an axial flow fan, scirocco fan, and scroll fan may be used. A general construction of an axial flow fan is shown in FIG. 51. A brushless fan motor is generally comprised by a casing 611, impeller 612, rotation shaft 613, magnet 614, winding 615, control board 616, and a bearing 617. Of the foregoing components, primary contamination sources are magnet 614, winding 615, control board 616, bearing 617 and adhesives used in various joints. First, if rubber is used in the magnet member or ferrite-based magnets bound with an adhesive, rubber and adhesives act as contamination sources, and emit base gases and organic substances. The winding 615 emits organic substances from lubricants used in manufacturing to promote copper wire drawing and insulation materials. The control board 616 emits organic substances from flux and solder resist that are applied for corrosion protection of copper foil. The bearing 617 emits organic substances from the mineral oil based grease used as sliding lubricant, and particulate contaminants are produced by rubbing of the rotor or retainer against the inner or outer ring.

For example, magnet 614, control board 616, and winding 615 can be coated by the use of the Parylene coating technology, which involves deposition of a polyparaxylene resin by chemical vapor deposition. In the Parylene coating technology, diparaxylene is heated and sublimed under low pressure, and when it is heated to about 600° C., thermal decomposition takes place and some paraxylene radical gas is generated. By directing the vapor to the target object, a polyparaxylene coating of a molecular weight of about 500,000 can be produced. Parylene coating offers features such as (1) processing temperature is about 35° C. and almost no thermal load is applied to the target object; (2) because the process is CVD, it is possible to apply uniform coating on complex shapes and composite materials made of metal and plastic; (3) gas permeation is extremely low; (4) cost can be lowered by coating a large quantity of products at one time; and (5) there is no need to change the design because the coating can be applied directly to commercially available fan components. Therefore, this method appears to be suitable for reducing chemical contaminants. Coating A coating thickness of more than 0.1 $\mu$m and less than 0.5 $\mu$m is suitable.

The bearing 617 is comprised by an outer ring, an inner ring, a rotor, and a retainer. In general, the outer ring, inner ring and rotor are made of high carbon chrome steel or stainless steel or ceramic, and the retainer is made of stainless steel or polyamide resin. Over the years, special-purpose bearings have been developed for vacuum use, low dust generation use, anti-corrosion use and non-magnetic uses, and commercial products have been available since about 1986. Impurities that can be produced from the bearing include particulate contaminants first. According to literature, it is known that particle contaminants from the bearing are often produced by the rotor contacting inner or outer ring. On the other hand, bearings using mineral oil based grease produce the highest amount of chemical contaminants, and contamination decreases in the order of fluoride-based grease and fluoride-based solid polymer lubricants. Particulate contaminants and chemical contaminants are reduced by combining a solid lubricant which emits least amount of gases and a retainer made from a polyamide-based resin or a fluoride-based resin that have self-lubricating properties.

Further, a method of preventing emission of contaminants from general-purpose bearings using grease that does not consider above problems is to use a magnetic fluid seal. Magnetic fluid is made by dispersing ultra-fine particles of magnetic powder in an oil base along with a surfactant agent, for example. Base oil may include paraffin, synthetic isoparaffin, alkyl naphthalene and para-fluoroether and the like. Magnetic particles may include iron, nickel, cobalt, ferrite and the like.

FIG. 52 shows an enlarged cross sectional view of the vicinity of a rotation shaft 613 of an axial flow brushless fan motor having a magnetic fluid seal. The parts that are required for the magnetic fluid seal are permanent magnet 619, a permanent magnet retainer 620 made of a magnetic material and a magnetic liquid 624, for example. Other necessary parts include a sleeve 622 and a spacer 623 and the like for separating the bearing from the permanent magnet retainer. In the magnetic fluid 624, a magnetic field is formed by the magnetic force generated by the permanent magnet 619 in the direction of permanent magnet→permanent magnet retainer→magnetic fluid→rotation shaft→permanent magnet retainer→permanent magnet to prevent segregation in the magnetic fluid due to rotational motion. The particulate and molecular contaminants generated from the bearing 617 are sealed by the magnetic fluid 624 and are prevented from being emitted. Additionally, other special items of note include: the rotation shaft being magnetic; the permanent magnet retainer is to be a magnetic body or to be covered with a magnetic body; the housing that holds the permanent magnet retainer is to be a non-magnetic body or to be covered with a non-magnetic body; and another magnetic body is not to be placed near the magnetic fluid. If there is a magnetic body nearby, it is necessary to provide means for shielding the magnetic force field. In the example shown in FIG. 52, both ends of the two bearings are provided with a magnetic fluid seal, but depending on the necessity, it is permissible to have a seal on one end only.

A method of reducing the contaminants generated by the magnet 614 is to use a plastic magnet. Plastic magnet is used originally to prevent cracking that occurs in sintered ferrite magnets, to reduce the number of components required by unitizing the magnet and the impeller, for example, to reduce the number of steps in assembling the fan motor; or to improve the dimensional precision. In addition to the advantages of the present invention described above, reduction in chemical contamination is achieved by noting that magnetic body can be unified by means of thermoplastic resins. There are ferrite group materials and samarium-cobalt group materials and the like that can serve as the magnetic body, but the choice is made according to the necessary magnetic flux density.

Figure 53:
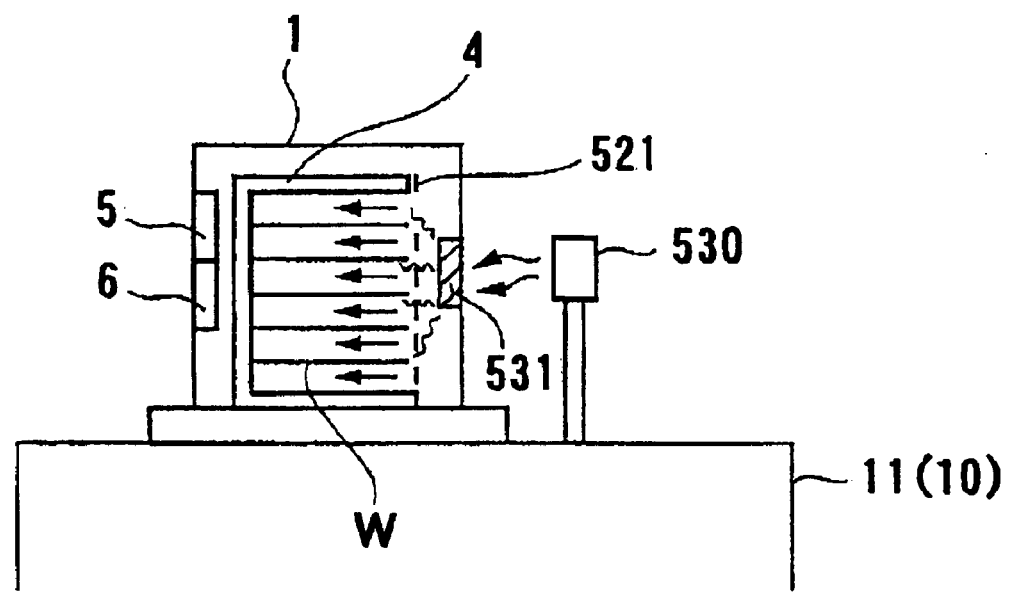
FIG. 53 is a diagram of air-flow inside the pod caused by thermal convection.

FIG. 53 shows a gas circulation method for circulating air inside the pod main body, other than those based on the gas circulation apparatus. Heat is generated from a heating source 530 external to the pod main body 1 and is absorbed by a heat absorbing section 531 provided on the pod main body. For example, by using thermal radiation such as infrared radiation, the gas inside the pod main body in the vicinity of the heat absorbing section is warmed and consequently, convective current is generated inside the pod main body 1. The gas flow generated inside the pod main body 1 comes into contact with the filters (particle filter 5, gaseous contaminants filter 6) and is cleaned. Further, a dehumidifying unit may be provided inside the pod main body. Further, a flow controller board 521 for forming a uniform pattern of gas flow in the wafer stacking direction may be provided.

FIG. 54 shows an apparatus for supplying a dry gas inside the pod 1. Air or nitrogen may be used as dry gas. A gas cylinder 38 filled with a dry gas is provided within the apparatus. Dry gas is introduced into the pod main body 1 through a pipe path having a pressure gauge 37 for detecting the pressure inside the interior of the pod, and, according to its reading, a mass flow controller 36 is operated to control the flow rate of the dry gas. Gas discharging is performed more effectively by evacuation. Mobility is increased if the AGV 10 has a gas cylinder 38. Also, if the gas supply source is provided by the nitrogen line from the plant, the processing apparatus 11 can also be served.

Also, the wafer is susceptible to static charging at low humidity, it is preferable that an electrical conductor with added carbon be used to construct at least the wafer support section that contacts the wafers and the door that grounds to the pod bottom section through the wafer support section. Further, non-woven ion exchange cloth or activated charcoal used for gaseous contaminant capture medium contain adsorbed moisture immediately after their manufacture, it is preferable that they be used after being subjected to water removing treatment.

Next, a method of manufacturing a semiconductor device will be explained.

Semiconductor device manufacturing process is divided into a first stage in which the device elements such as transistors and condensers are formed within the chip area and the elements are interconnected with copper wiring, and a second stage in which each chip is cut away from the wafer and wiring connections are made to external terminals.

FIG. 2 shows a flowchart of an example of the first state processing. In the first stage processing, after the elements are formed on the wafer, wiring steps are repeated as many times as the number of wiring layers in the multilayered structure. Silicon wafers having FET (field-effect-transistors) and condensers formed thereon are transported to a processing apparatus such as a coater or a CVD apparatus to form insulation layer above the surface. At this time, a low dielectric insulation film having a dielectric constant of less than 3 is formed.

The low dielectric insulation film may be made using an inorganic material such as $SiO_x$-based substances made in a porous or honeycomb shape, or PAE (poly arylene ether)-based or MSQ (methyl silses quioxane)-based organic material, and other organic substances in a porous form are useable.

Such low dielectric insulation films are susceptible to moisture absorption resulting that film is degraded by moisture absorption, or the dielectric constant of the insulation film is raised by the moisture absorbed. Further, it can be anticipated that the physical properties of the insulation film are altered by the effects of impurities such as organic matters, ions and metals contained in the environment. Because stable film growth may not be achieved under changing environment, it is essential to provide a stable, clean environment.

Therefore, at this stage, the wafers having low dielectric insulation film formed on the surface are stored in the substrate transport pod explained earlier, and are transported between the insulation forming apparatus such as coater or CVD apparatus and a photo-resist coating apparatus. The substrate transport pod in this case may be any one of the pods described above, but it is preferable that the interior of the pod is provided with a dehumidifier to provide dry air. Also, it is preferable that the air inside the substrate transport pod is circulated through a dehumidifier to dry the air. It is preferable that the air inside the substrate transport pod be less than 25% humidity, or more preferably less than 10% or even more preferably less than 5%.

When there is a danger of damaging the elements due to static electricity generated by low humidity, it is preferable to discharge the wafer charges by using electrical conductor for constructing the wafer support member and removing the charges through such members. Electrically conductive materials that can be used include polymeric material with added carbon, surfactant agent or metals. For example, for a pod having a door at the bottom, the box door supports the wafer support member so that the box door is constructed of an electrical conductor. The box grounds the pod through the box door when the box is placed on the processing apparatus or station. It is permissible that the box door is entirely or only the surface layer is constructed of an electrical conductor, so that it can be grounded through a conductive object to the bottom section of the box. Or, only the portion that supports the wafers may be constructed of an electrically conductive polymer or a metallic material, for example.

Further, if chemical contamination is a problem, a chemical filter should be provided inside the substrate transport pod. It is preferable that the chemical filter be capable of removing non methane-based organic substances, and further, it may be combined with an ionic filter. If particular contamination is also a problem, particle filters such as HEPA and ULPA may be incorporated.

Figure 55:
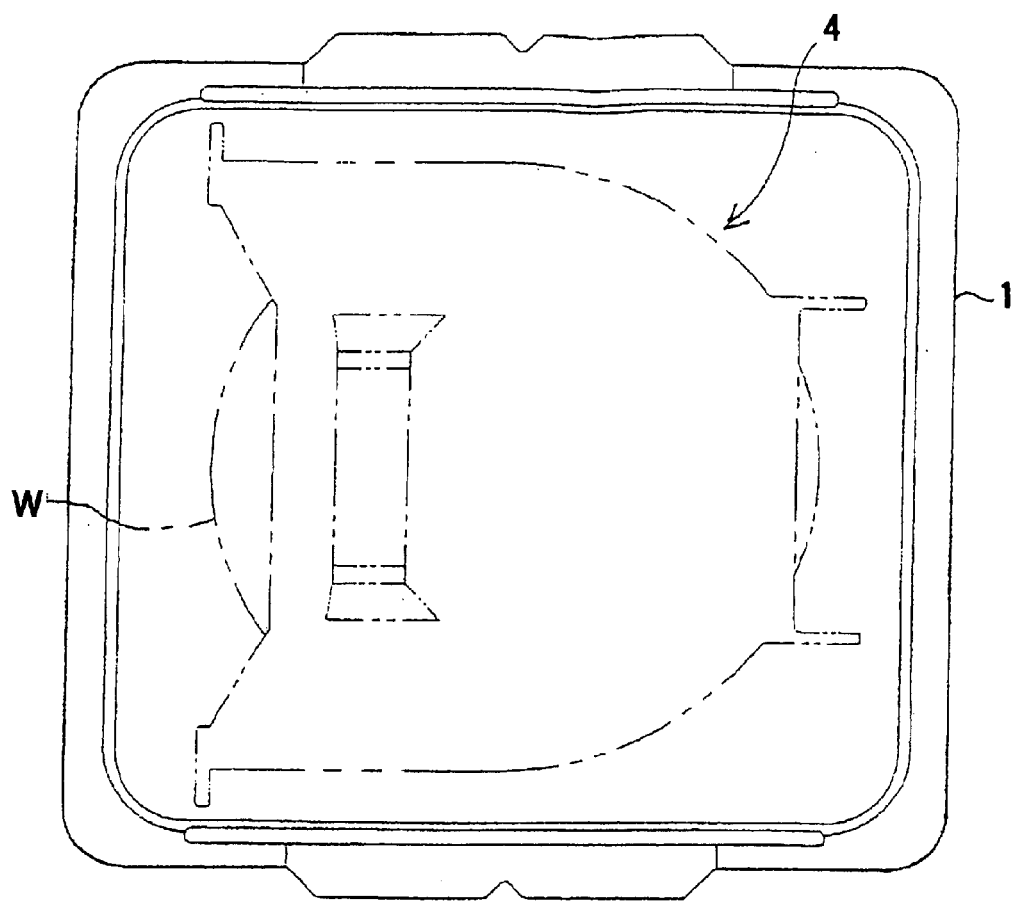
FIG. 55 is a top view of the substrate transport pod of the present invention.

FIGS. 55 and 56 show an example of loading a substrate cassette 4 for storing substrates W having exposed copper surface, hermetically sealing the pod, and transporting the pod together with the cassette 4 in the hermetically sealed condition. In this case, the substrate transport pod 1 is constructed as a general SMIF pod. Here, degradation of the insulation film can be prevented by providing a dehumidifier inside the substrate transport pod 1 for 8-inch wafers to control the humidity in the interior of the substrate transport pod 1. It is preferable to control the inside humidity to less than 10% or more preferably to less than 5%. When the humidity is low, and there is a danger of damaging the insulation film due to generation of static charges, it is preferable to store/transport substrates while the copper surfaces on the wafers are grounded to discharge the static electrical charges.

By installing a particle filter and a fan motor in the interior of the substrate transport pod 1 so as to clean the inside air by circulating the internal atmosphere, it is possible to prevent cross contamination of the substrates. Also, by installing both a chemical filter and particle filter in the interior of the substrate transport pod 1, both particles and ions can be removed. It is obvious that only particle filter may be used or only an ion filter as the chemical filter may be used. Also, when the fan motor is provided inside the substrate transport pod 1, the fan may be operated without installing a battery inside the pod 1 so that the fan motor may be operated through a power outlet provided on a receiving platform member by placing the substrate transport pod 1 on the platform.

Also, although the interior space of the substrate transport pod 1 is normally filled with air, but by using an inert gas having limited concentration of oxygen, oxidation of copper can be prevented. The amount of oxygen should be lower than 10,000 ppm, or more preferably lower than 1,000 ppm.

Figure 57A:
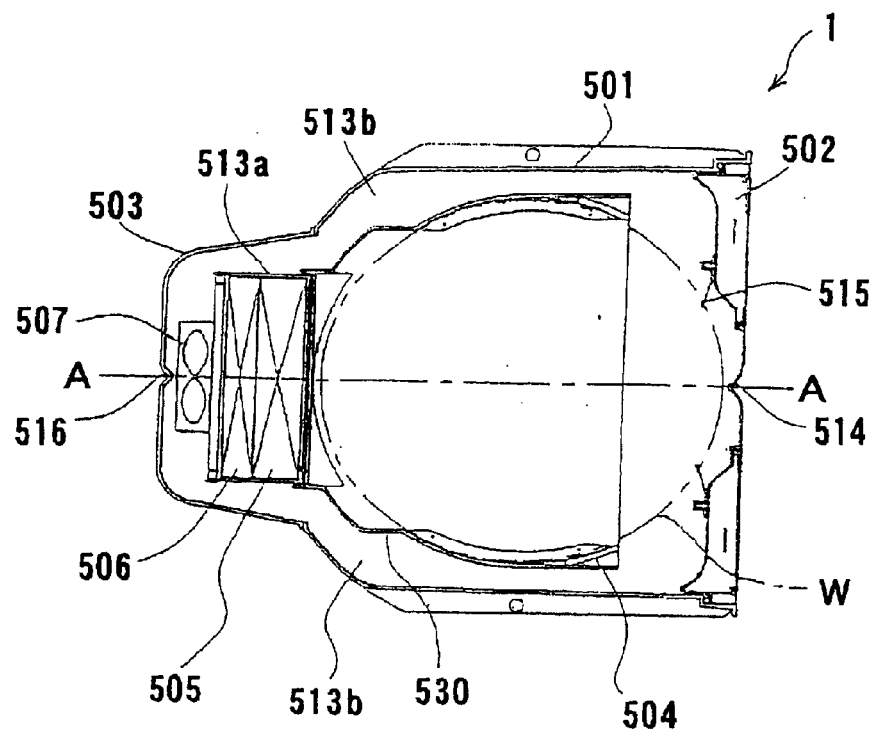
FIGS. 57A and 57B are, respectively, a top view and a vertical cross sectional view of a substrate transport pod provided with an air cleaning apparatus.
Figure 57B:
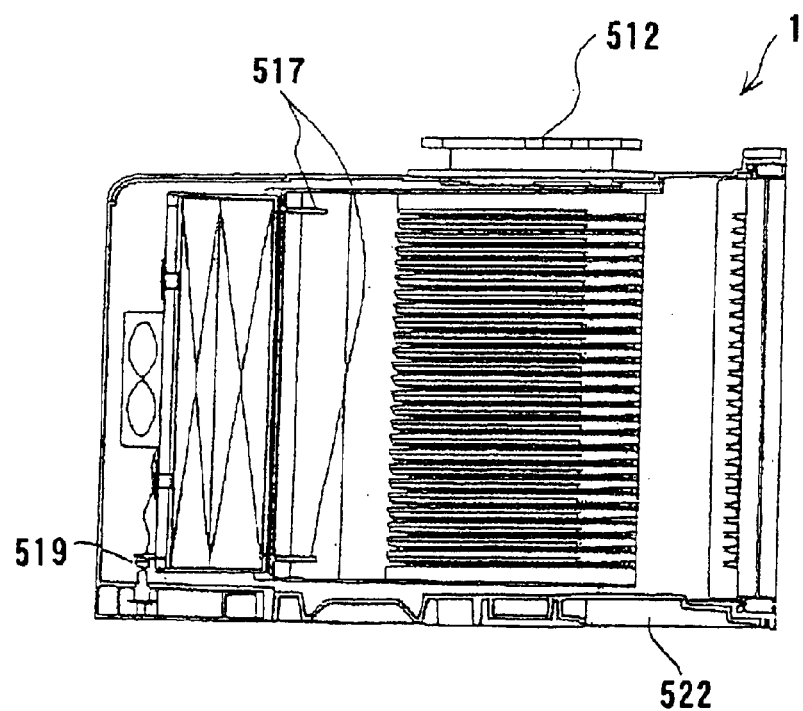
Figure 58A:
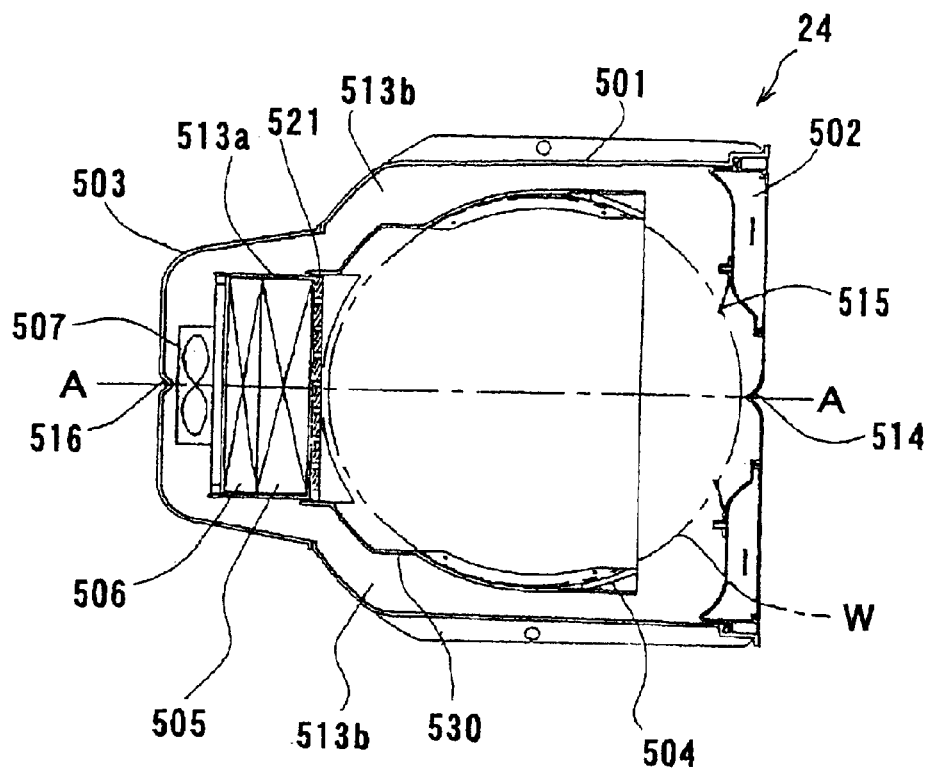
FIGS. 58A and 58B are, respectively, a top view and a vertical cross sectional view of a substrate transport pod.
Figure 58B:
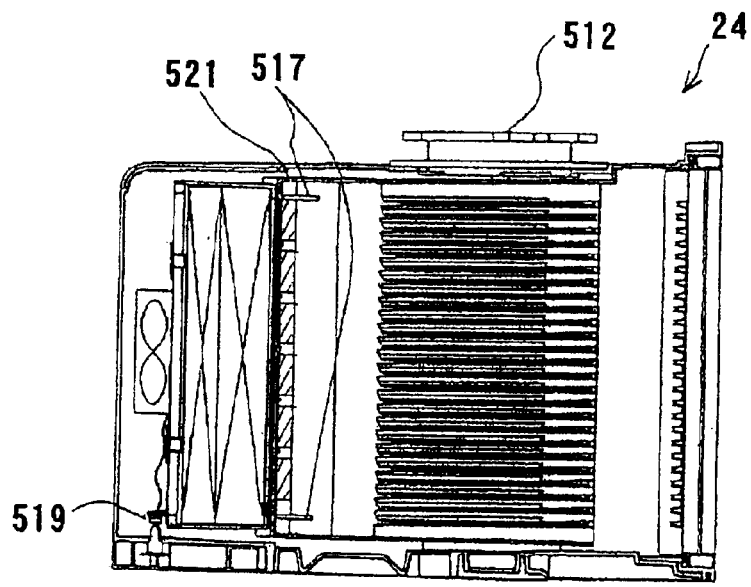
Figure 59A:
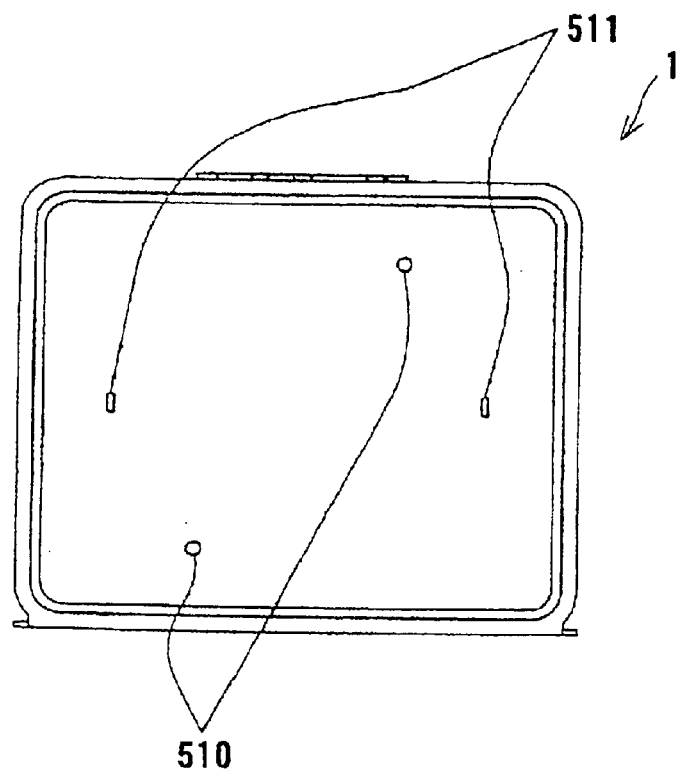
FIGS. 59A and 59B are, respectively, a top view of a power input apparatus and a bottom view of the substrate transport pod.
Figure 59B:
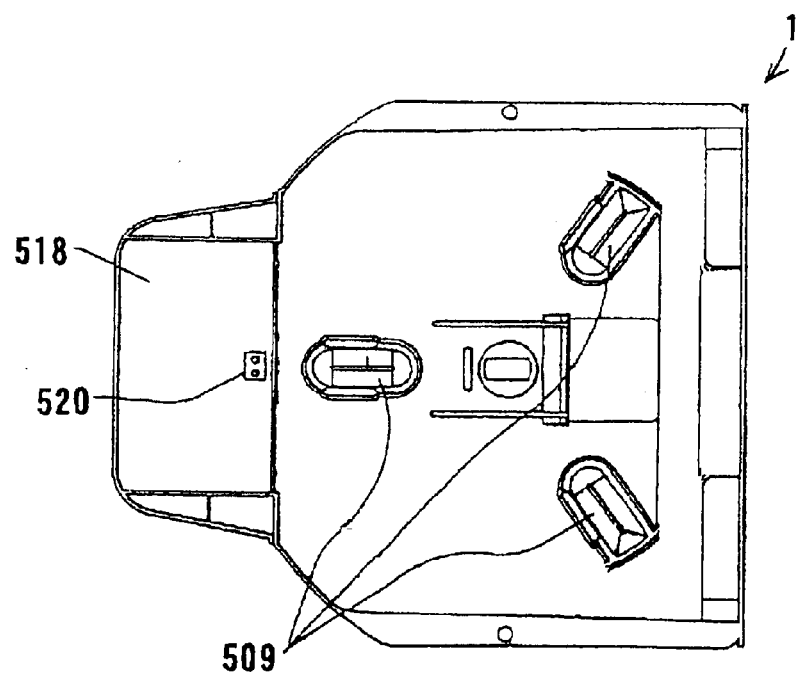

FIGS. 57, 58 and 59 show another example of the substrate transport pod 1. This pod 1 is used for transport and storage of substrates by accommodating a plurality of 300 mm substrates W on a substrate support member 504 that is affixed to the inside of the pod main body 501. This substrate transport pod 1 is comprised by a pod main body 501; a substrate transport door 502 provided on the side surface of the pod main body 501 of a square tube shape whose opening section can be operated mechanically by being linked to an automatic substrate transport door controller; a lid member 503 disposed opposite to the opening section for covering an opening provided for changing filter and fan motor and the like; a substrate support member 504 for holding substrate wafers W, a ULPA filter 505, a chemical filter 506; and a fan motor 507.

The substrate transport door 502 is operated by a mechanical device, and on the bottom section of the pod main body 501, there is provided a V-groove 509 for coupling with a kinematic coupling pin 508 for positioning transport door accurately on the precision automatic door device. The substrate transport door 502 is provided with a positioning pin receiving section 510 and a latch receiving section 511 for inserting the latch key for door operation so as to enable to automatically open or close the door from the automatic door device side. Also, a robot holding means 512 is provided so as to enable to transport the pod using such transport apparatus as OHT (overhead hoist transport) or AGV(automatic guided vehicle). The material of construction may be PC, PEEK and PEI and the like. The designs for V-groove 509, positioning pin receiving section 510, latch receiving section 511 for inserting the latch key for door operation, robot holding means 512 and other items regarding automation interfaces are carried out according to SEMI standard E1.9, E47.1, E57, E62.

The interior of the substrate transport pod 1 is divided into a center chamber 513a in the center and a pair of side chambers 513b by a partition plate 530a unified with a pair of spaced left/right substrate support member 504 between the substrate transport door 502 and the lid member 503. On the substrate transport door 502 side of the partition plate 530, a substrate support member 504 is integrally provided, which has a taper section that widens towards the door side so as to couple with the door. The movable wafer vibration prevention mechanism 515 presses the wafer in the vertical direction and holds the wafers in their fixed positions inside the pod and so as to prevent vibration of the wafers. The movable wafer vibration prevention mechanism 515 is provided on the inner side of the substrate loading/unloading door 502, for example.

On the lid 503 side of the center chamber 513a, a ULPA filter 505 that serves as the particle filter and a chemical filter 506 that serves as the gaseous contaminants filter are disposed so as to permit the air to flow from the lid 503 side to the substrate transport door 502 side. On the upstream side of the filter 506, a fan motor 507 is disposed so as to circulate the air towards the substrate transport door 502.

Both ends of the substrate transport door 502 are shaped so as to curve smoothly towards the interior, and in the center section, a triangular flow control plate 514 is provided, but this flow control plate 514 may be omitted. Also, the substrate transport door 502 is provided with a fixation jig 515 for substrate shifting prevention. Similarly, the internal surface of the lid member 503 is also curved towards the interior, and in the center, a triangular flow control plate 516 is provided. Also, a flow control plates 517 are provided in two locations adjacent to the inside opening for outflow of clean air, for the purpose of supplying clean air uniformly to a plurality of substrates W. Further, a flow control plate 521 may be provided at the back of the filter section. The flow control plate 521 can be made of a porous plate or mesh. Because the porous plate or mesh or fixed flange contact the process gas directly so that it is preferable to avoid using metals that are susceptible to corrosion by the process gas, so that resin materials such as polybutylene terephthalate and polycarbonate are preferable, but if there is no danger of corrosion, stainless steel may be used.

Here, when twenty five substrates W are stored in the substrate transport pod 1, the separation distance between the interior surface of the substrate transport pod 1 and the No. 1 substrate and that between the same and No. 25 substrate are set wider than the separation distance between other substrates W. In this case, No. 1 substrate refers to the substrate near to the pod bottom side. The space associated with No. 1 substrate relates to the distance between No. 1 substrate and the inside surface of the pot bottom section, and the space associated with No. 25 substrate relates to the distance between No. 25 substrate and the inside surface of pod top section. It is preferable that the distances associated with No. 1 and No. 25 substrates be more than 2 mm and less than 10 mm. By adopting such a wide separation distance, although uniform flow of air through the substrates W is adversely affected, a flow control plate 517 provided at the outflow opening of clean air is designed to carry out effective cleaning by creating a uniform flow of air at the clean air entry section between the substrate carrier main body and No. 1 and No. 25 substrates. Also, a porous plate or mesh member may be placed on the downstream side of the ULPA filter 505 for the purpose of equalizing the wind velocity and protecting the ULPA filter.

In the bottom section of the lid member 503 is disposed a power unit 518 having a secondary battery, which has a contact point to connect to the terminal 519 of the fan motor 518. Inside the power unit 518 is housed an operation control board for the fan motor 507, and the fan motor 507 is operated according to a control program prescribed in the board to control its operation start/stop timing and rotational speed. Also, at the bottom section of the power unit 518 is provided a charging terminal 520 so as to enable to charge a secondary battery automatically when it is mounted on the on the charging station or on the substrate transport door controller by connecting to the terminal on the apparatus side.

As described above, when various filters and secondary battery are installed on the substrate transport pod, the center of gravity of the pod shifts to the filter side. If it is attempted to transport the pod in the OHT or so on by grasping the robot holding means 512, for example, while its center of gravity is displaced towards one side, there is a danger of damaging the hoist and others on the OHT system. To avoid such a problem, it is desirable to reduce the weight of filter and secondary battery. Further, it is preferable to place a counter weight near the substrate transport door 502 and/or near the opening section of the pod main body 501 so that the center of gravity of a fully-loaded pod is within ±100 mm, or more preferably within ±60 mm of the substrate facial reference line. The substrate facial reference line refers to a plane that dissects the substrate in two parts and is parallel to the front surface of the substrate carrier through which the substrates are loaded/unloaded. Another method is to shift the center of gravity by making the latching mechanism housed inside the substrate transport door 502 with a metallic material, for example, to increase the weight of the substrate transport door 502. That is, it is preferable to adjust the center of gravity so that the center of gravity of the substrate transport pod in the horizontal direction is contained within a circle having a radius dimension that is 90% of the substrate radius, or more preferably within 70% of the substrate radius.

Figure 31A:
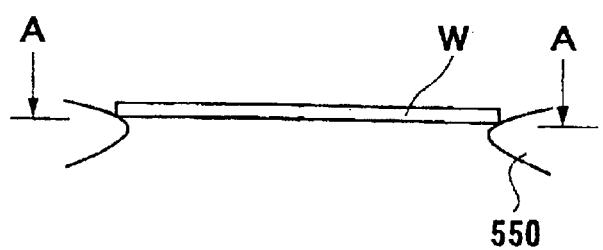
FIGS. 31A and 31B are diagrams of wafer supports.
Figure 31B:
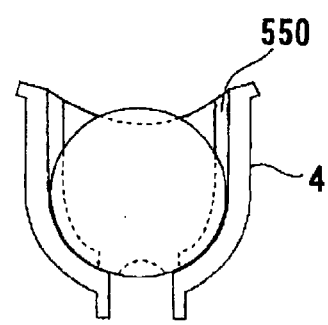
Figure 60A:
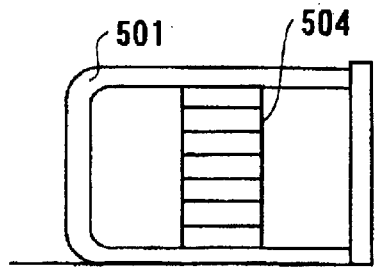
FIGS. 60A to 60H are diagrams of various methods of discharging the static electricity from semiconductor wafers disposed inside the substrate transport pod.
Figure 60B:
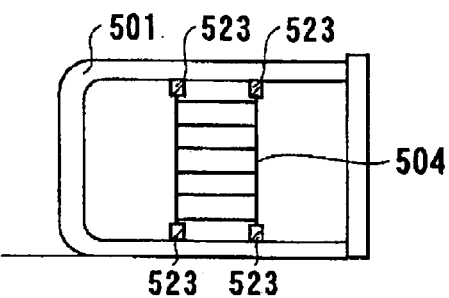
Figure 60C:
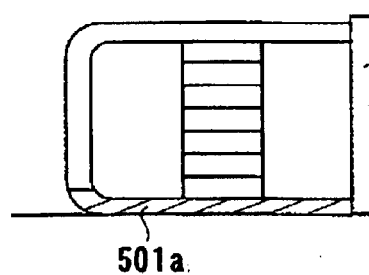
Figure 60D:
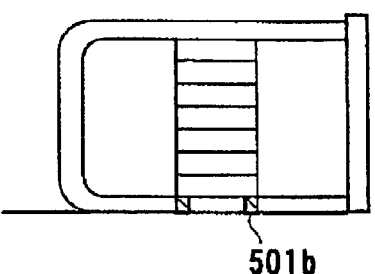

As shown in FIG. 31, the semiconductor wafer W is supported on a carrier 4 by a protrusion 550 constructed of an electrically conductive material. FIGS. 60A to 60H show methods of discharging static electricity on the wafers stored inside the substrate transport pod. As shown in FIG. 60A, wafer discharging from the FOUP structure is carried out by grounding to the apparatus side, through the substrate support member 504 that supports the wafers inside the pod (corresponds to the protrusion 550 shown in FIG. 31). The substrate support member 504 is a unified body that includes the pod main body 501, so that the entire member including the substrate support member is made of an electrical conductor. Also, when the substrate support member 504 and the pod main body 501 are separate members, it is preferable that the substrate support member 504 and the pod main body 501 be made of some electrical conductor, and connecting them electrically using an electrical conductor, as shown in FIG. 60B. Further, as shown in FIG. 60C, it is permissible to make only the bottom section 501a of the pod main body 501 using an electrical conductor. And, as shown in FIG. 60D, it is permissible to make only the substrate transport section 501b that is in contact with the substrate support member 504 using an electrical conductor.

Figure 60E:
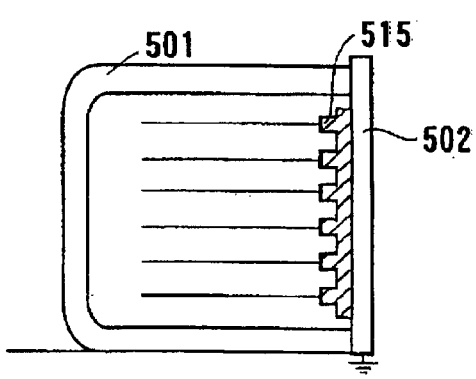
Figure 60F:
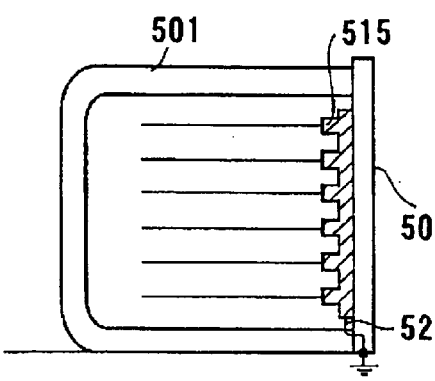

A second method of substrate discharging method for the FOUP structure pod is shown in FIG. 60E. In this method, the charges are grounded through the door to an apparatus that mounts the pod by making the fixation jig 515 (to prevent substrate shifting) and the door 502 using an electrical conductor. Also, as shown in FIG. 60F, it is permissible to make only the fixation jig 515 with an electrical conductor and grounding to the grounding terminal 524 so as to connect the bottom section of the pod to an external ground. Here, the external ground refers to a processing apparatus or a transport apparatus.

Figure 60G:
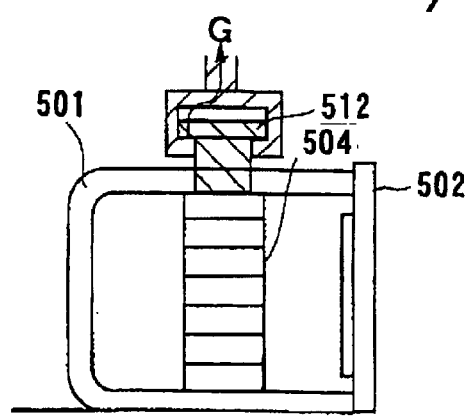
Figure 60H:
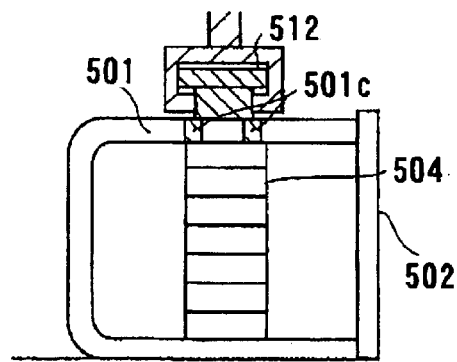

A third method of discharging the substrates from the FOUP structure pod, as shown in FIG. 60G, is through the robot holding means 512 for transporting the pod in the OHT system. The substrate support member 504 and the flange 512 are made into a unified member, and the charges on the wafers are grounded through the substrate support member 504 to the robot holding means 512 to the OHT system. Also, as shown in FIG. 60H, it is permissible to make the robot holding means 512 separate from the substrate support member 504 and connecting them electrically by making a portion 501c of the pod main body 501 using an electrical conductor. Further, it is permissible to make only the portion 501c that contacts the robot holding means and substrate support member using an electrical conductor.

Figure 61:
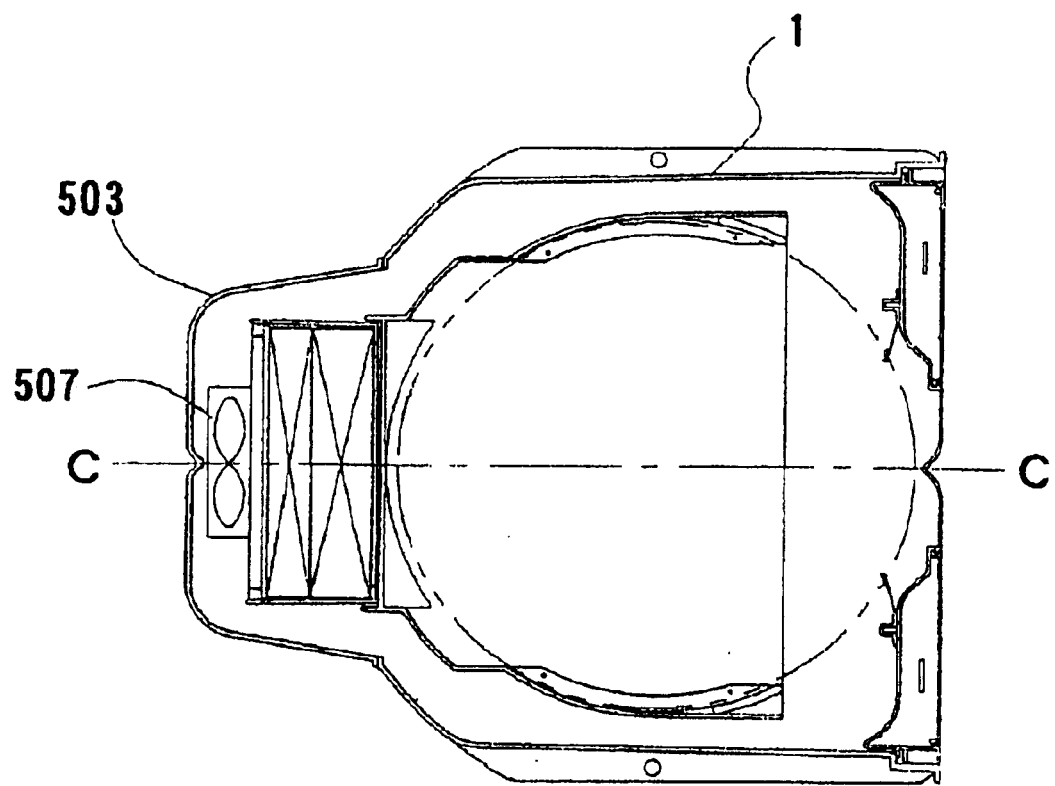
FIG. 61 is a top view of a substrate transport pod.
Figure 63:
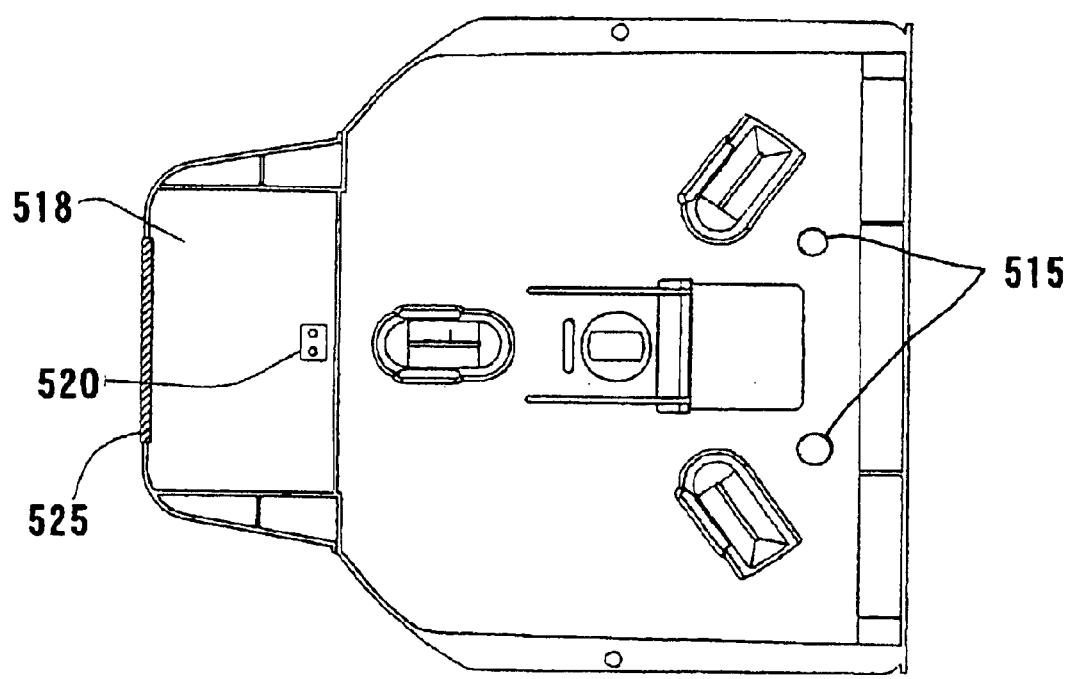
FIG. 63 is a bottom view of the substrate transport pod.

FIGS. 61, 62 and 63 show another variation of the automation-ready substrate transport pod designed for 300 mm wafers. A power unit 518 housed inside the bottom section of the pod 503 is provided with a contact point to connect to the terminal 519 of the motor fan 507. In the bottom section of the power unit 518 is provided a charging terminal 520 so that the secondary battery can be charged automatically when the pod is seated on a control apparatus for automated opening/closing of the wafer transport door or on a charging station by contacting the terminal on the apparatus side. Also, if the dry gas supply and dehumidification using solid polymer electrolytic film, the dry gas purging port 515 is housed in the bottom section of the pod main body 1. However, the position, size and number of the solid polymer electrolytic film 525 and the dry gas purging port 515 may be altered to suit the desired drying speed and target temperature, and are not limited to those shown in the diagrams.

Figure 64:
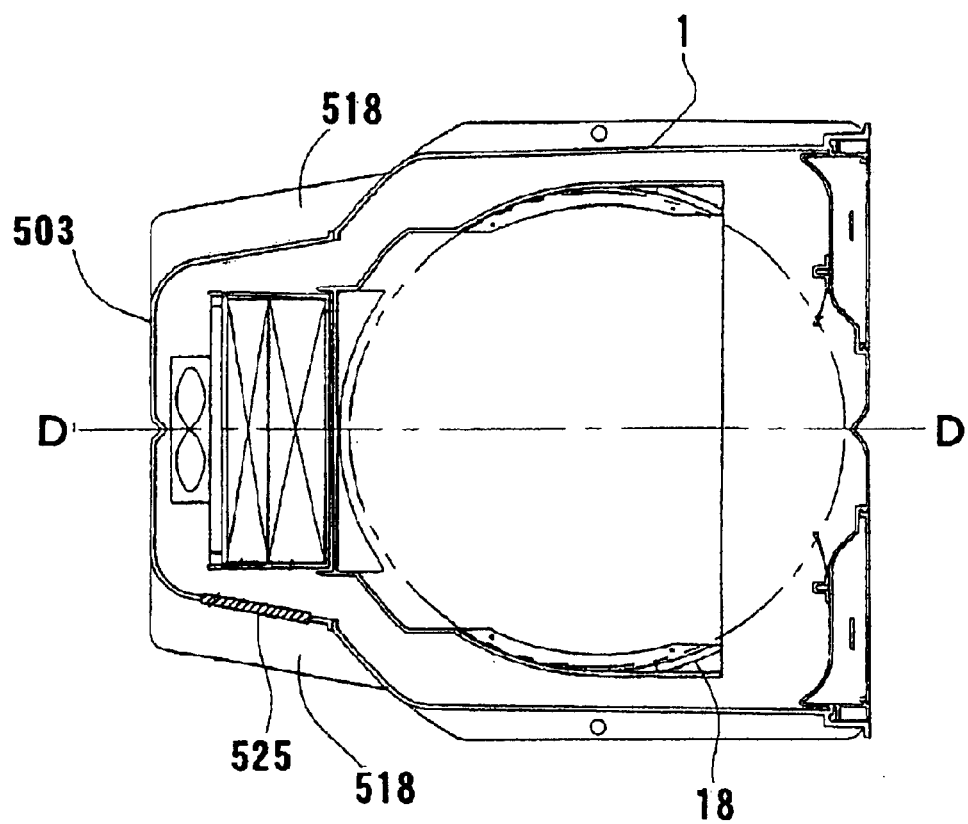
FIG. 64 is a top view of the substrate transport pod.
Figure 65:
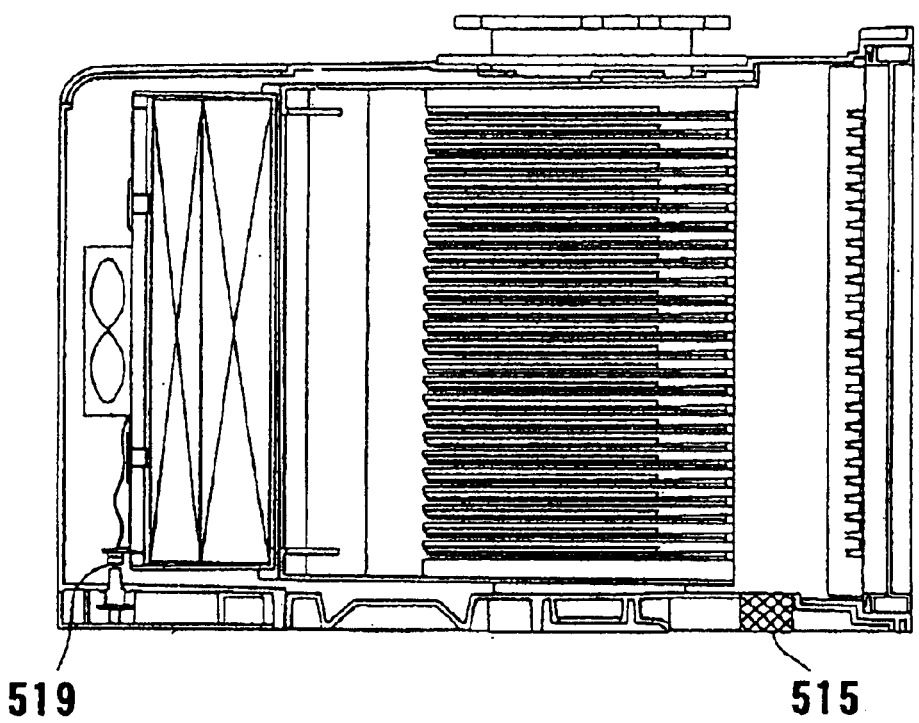
FIG. 65 is a cross sectional view of a substrate transport pod.
Figure 66:
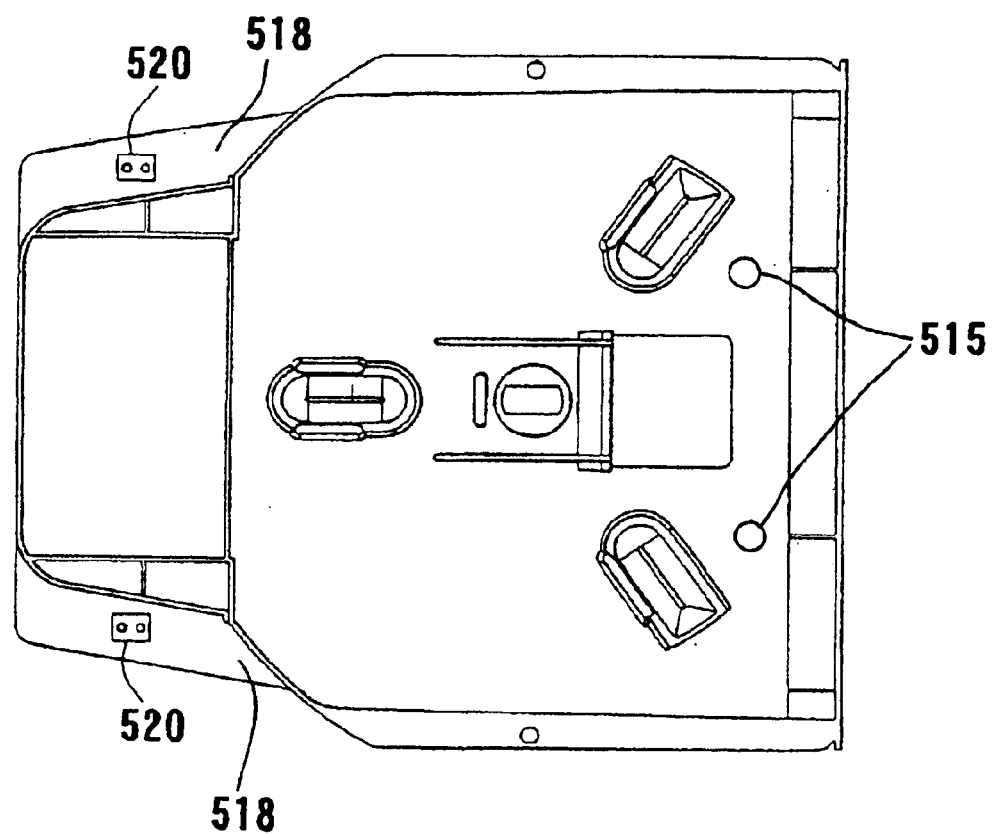
FIG. 66 is a bottom view of the substrate transport pod.

FIGS. 64, 65 and 66 shows automation-ready substrate transport pods having a solid polymer electrolytic film in a different location than those shown in FIGS. 61, 62 and 63. In this case, because the solid polymer electrolytic film itself is housed inside the bottom section of the pod 1, direct current can be supplied from the power unit 518 housed inside the pod 503 linked to the main body 1 without going through the terminal 514.

Figure 67:
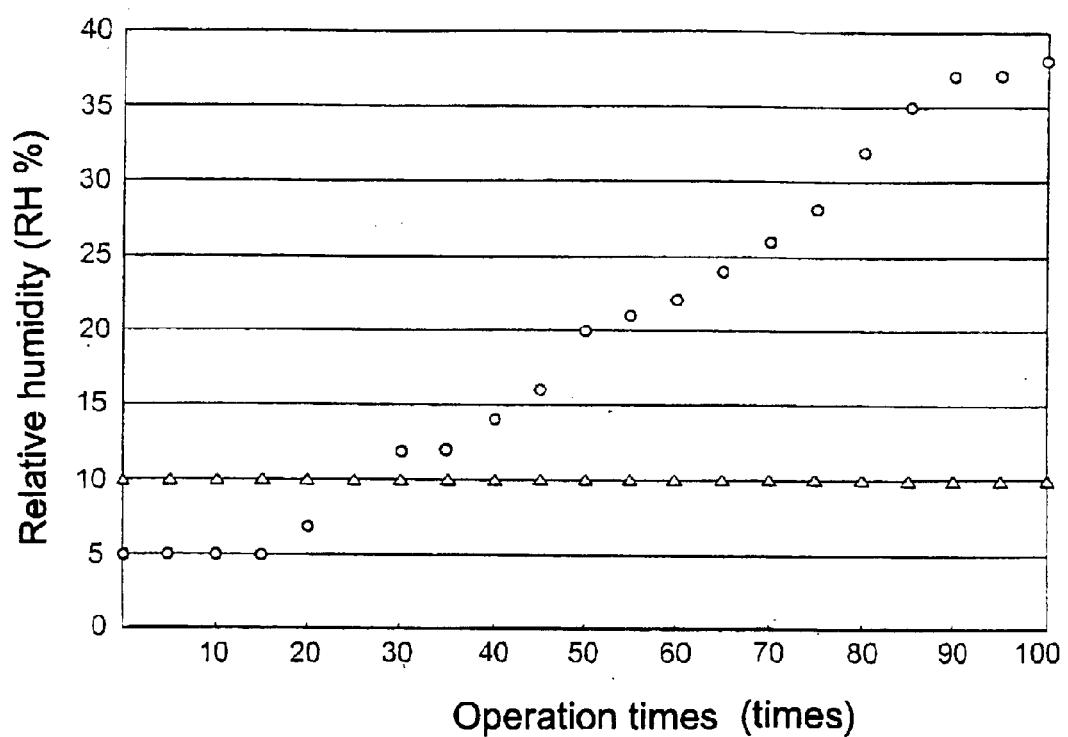
FIG. 67 is a graph to compare the service life of a dehumidifier.

Next, the dehumidifying capacity of the substrate transport pod having the dehumidifying unit 525 based on the solid polymer electrolytic film after repeated use will be explained with reference to FIG. 67. In a clean-room having a relative humidity of 40% at 22° C., a wafer carrier 4 having twenty pieces of cleaned semiconductor wafers was placed inside the substrate transport pod, and the pod was sealed with the lid. After waiting for six hours, ultimate humidity inside the pod was measured. The results are shown by Δ in the diagram. The horizontal axis relates to the number of operations and the vertical axis relates to eventual humidity generated inside the pod. For comparison, data on ultimate humidity achieved when dehumidifying agent was placed inside the box, and the data are shown by O in the same graph. In the substrate transport pod having the dehumidifying agent, the initial capability (i.e., reduction in relative humidify from 40% to 5%) was maintained up to fifteen repetitions, but the relative humidity gradually increased with continued use, and after fifty and more repetitions, the humidity did not drop below 20%. On the other hand, the substrate transport pod containing the dehumidifying unit 10 having the solid polymer electrolytic film continued to maintain its initial capability (that is, reduction in relative humidify from 40% to 10%).

In the substrate transport pod described above, the gaseous contaminants filter 506 is constructed, in this embodiment, by wrapping particulate activated charcoal for organic material removal with a non-woven ion exchange cloth for inorganic ion removal, but the filtering medium may include pulverized activated charcoal, activated carbon fibers, high purity silicon, zeolite, ceramics or activated charcoal with addition agents. Activated carbon fibers may be produced from a raw material of rayon, kynol, polyacrylonitryl or crude oil, or pitch, and carbon formed in fiber shape is reacted with steam and carbonic gas at over 800° C. to carry out the so-called activation reaction. Some activated carbon fibers are made with binder addition that does not affect its absorption quality to control strength and dust generation, but as a raw material, it is preferable that the addition should be less than 50 weight % and preferably less than 30 weight %.

Activated charcoal has numerous fine pores between the base crystals due to removal of unreacted carbon during the process of activation. Owing to such fine pores and large specific surface area, activated charcoal exhibits very high adsorption capability. Utilizing this property, activated charcoal filters filled with particulate activated carbon are available commercially. Also, filters using activated carbon fibers having finer pores than particulate activated carbon and higher specific surface area, or filters carrying activated carbon particles of about 0.5 mm on a urethane foam body of open-pore structure are also available commercially.

Also, it is permissible to use high purity silicon which is the same material as the semiconductor substrate for the absorbing agent. The conditions on the surface of high purity silicon are divided into hydrophilic and hydrophobic types, each of which differs in its absorbing characteristics. Hydrophobic surface produced by washing with diluted hydrofluoric acid is generally more sensitive to the environment, and exhibits a high adsorbing power for hydrocarbons. However, the hydrophobic surface of silicon changes to a hydrophilic surface when oxide film grows, so that the adsorbing characteristics change with time which is a disadvantage. Hydrophilic surface is excellent in adsorbing polarized organic substances, such as BHT (2,6-Di-t-butyl-p-cresol) and DBP (dibutyl phthalate).

Also, because there is no material degradation when high purity silicon is used as the adsorbing agent, the filter can be reused after washing. Also, when there is a contaminant that cannot be removed by using chemical filter or ULPA filter, silicon performs a role of dummy filter. In any case, it is more effective to use silicon not by itself but in combination with activated charcoal.

On the other hand, non-woven ion exchange cloth and fibers can be obtained by introducing ion exchange sites through radiation graft polymerization. That is, a starting material, a polymer such as polyethylene and polypropylene or natural polymeric material such as cotton and wool is subjected to radiation using electron beam or gamma radiation to produce numerous activation sites. Such activation sites are called radicals which are highly reactive, and by combining such radicals with a monomer, it is possible to impart properties different from the starting material.

This technology is called graft polymerization because a monomer is grafted to the starting material. By using radiation graft polymerization, a monomer having the sulfone group, carboxyl group or amino group that acts as ion exchange agent, such as styrene sulfonic acid sodium salt, acrylic acid, allylamine, can be bound to a non-woven polyethylene cloth. It is then possible to obtain a non-woven ion exchange cloth that produces much higher ion exchange rate than ion exchange beads, which are normally referred to as ion exchange resin.

Similarly, an ion exchange medium of the starting material can be converted into an ion exchange medium in the original shape, by first radiation grafting a monomer capable of introducing an ion exchange group such as styrene, chloromethyl styrene, glycidyl methacrylate, acryronitrile, acrolein to a starting material, and then introducing an ion exchange group.

The filtering medium of ULPA filter or HEPA filter has been using glass fibers, but it has been discovered that glass fibers can form $BF_3$ by reacting with the vapor of hydrogen fluoride (HF) used in semiconductor processing, and has become a problem. In recent years, PTFE filters and HEPA filters that does no contain boron or metallic impurities and resistant to acids, alkalines and organic solvents are commercialized. In the present applications, glass fibers or PTFE may be selected as appropriate.

The operation of the substrate transport pod 1, having a plurality of substrates W stored therein, when it is transported inside a copper plating apparatus 34 will be explained with reference to FIG. 68.

In this copper plating apparatus 34 is provided an automatic substrate transport door controller. Inside the copper plating apparatus 34, a fan-filter unit comprised by the fan motor 7, ULPA filter 5, chemical filter 6 and dehumidifier 8 is used to reduce particulate contaminants, gaseous contaminants and moisture. Chemical filter 6 and dehumidifier 8 are employed as needed. The dehumidifier 8 may be placed anywhere at the boundary between outside and inside of the enclosure, but if it is desired to dehumidify more actively, it is preferable to place it in a fast flowing region such as near the motor fan 7 or within the circulation path in the enclosure. When the substrate transport pod 1 is transported inside the copper plating apparatus 34 and is placed in a specific location and the clean-room is isolated by means of the gate valve and the like, the automatic substrate transport door controller opens the substrate transport door 602. After which, using the wafer mapping apparatus 603, wafer storage slots and the number of wafers are selected. After which, a substrate handling robot 621 inside the copper plating apparatus 34 removes the substrate W for processing, and after the processing is completed, the processed substrates W are returned to the substrate transport pod 1. Then, when the processing of all the substrates W is completed, the substrate transport door 602 is closed and sealed by the automatic substrate transport door controller, and from this point, the motor fan 7 is operated through the power input terminal 608 to clean the air inside the substrate transport pod.

Figure 68:
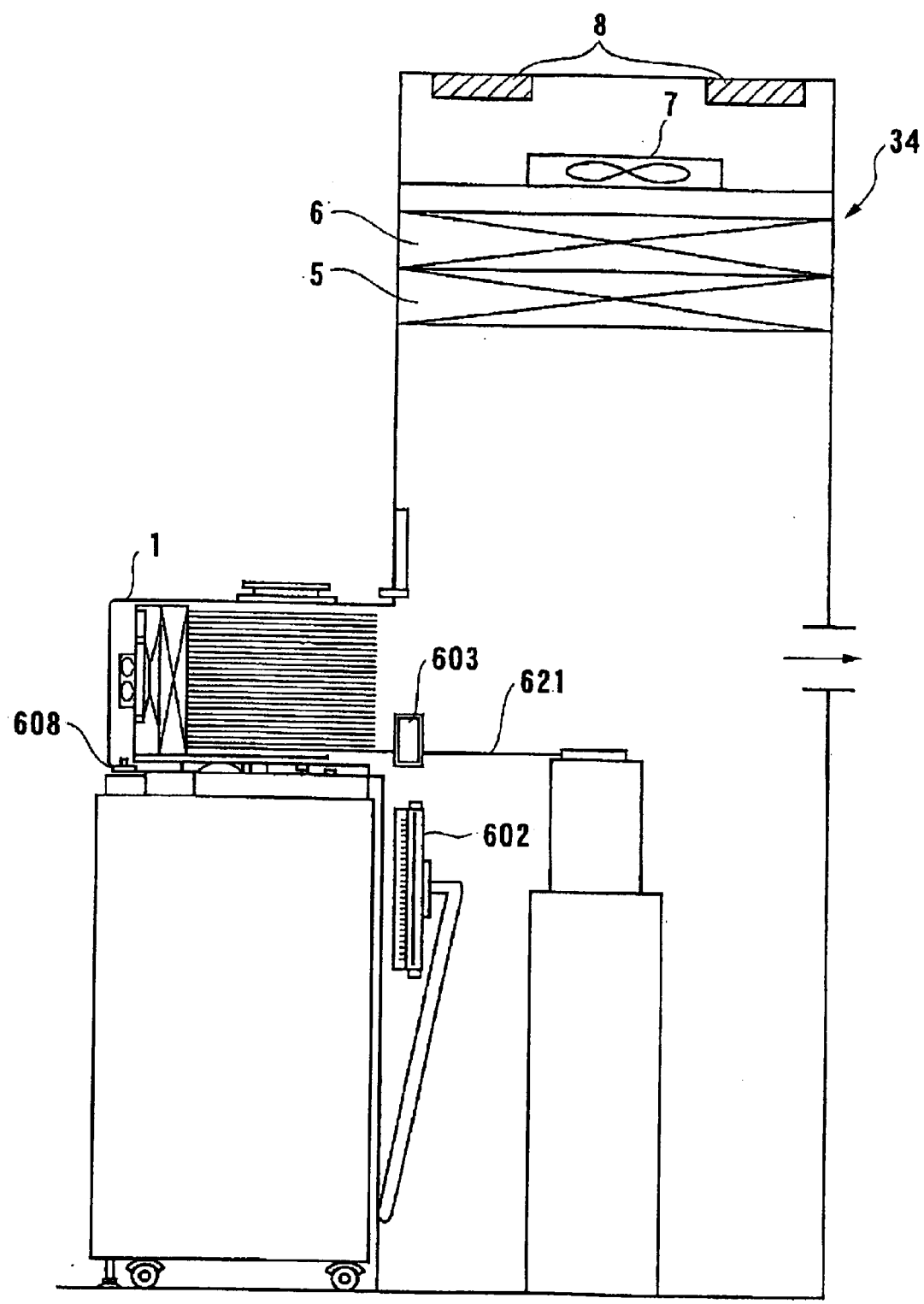
FIG. 68 is a diagram to show the attachment of the substrate transport pod to a processing apparatus.

As shown in FIG. 68, the substrate transport pod 1 may be operated such that when the wafers to be processed are removed, the substrate transport door 602 is closed and the wafer to be processed are stored in the pod 1. Also, when the substrate transport door is not opened or closed during the processing of one lot, it is preferable to provide a fan-filter unit having the chemical filter 6 and dehumidifying agent or dehumidifier 8 in the interface section in addition to the ULPA filter, so as to prevent contamination of the wafers yet to be processed by moisture and organic matters. Further, the fan filter unit may circulate the air inside the interface. Also, dehumidification may be performed using dry air or $N_2$.

Figure 69:
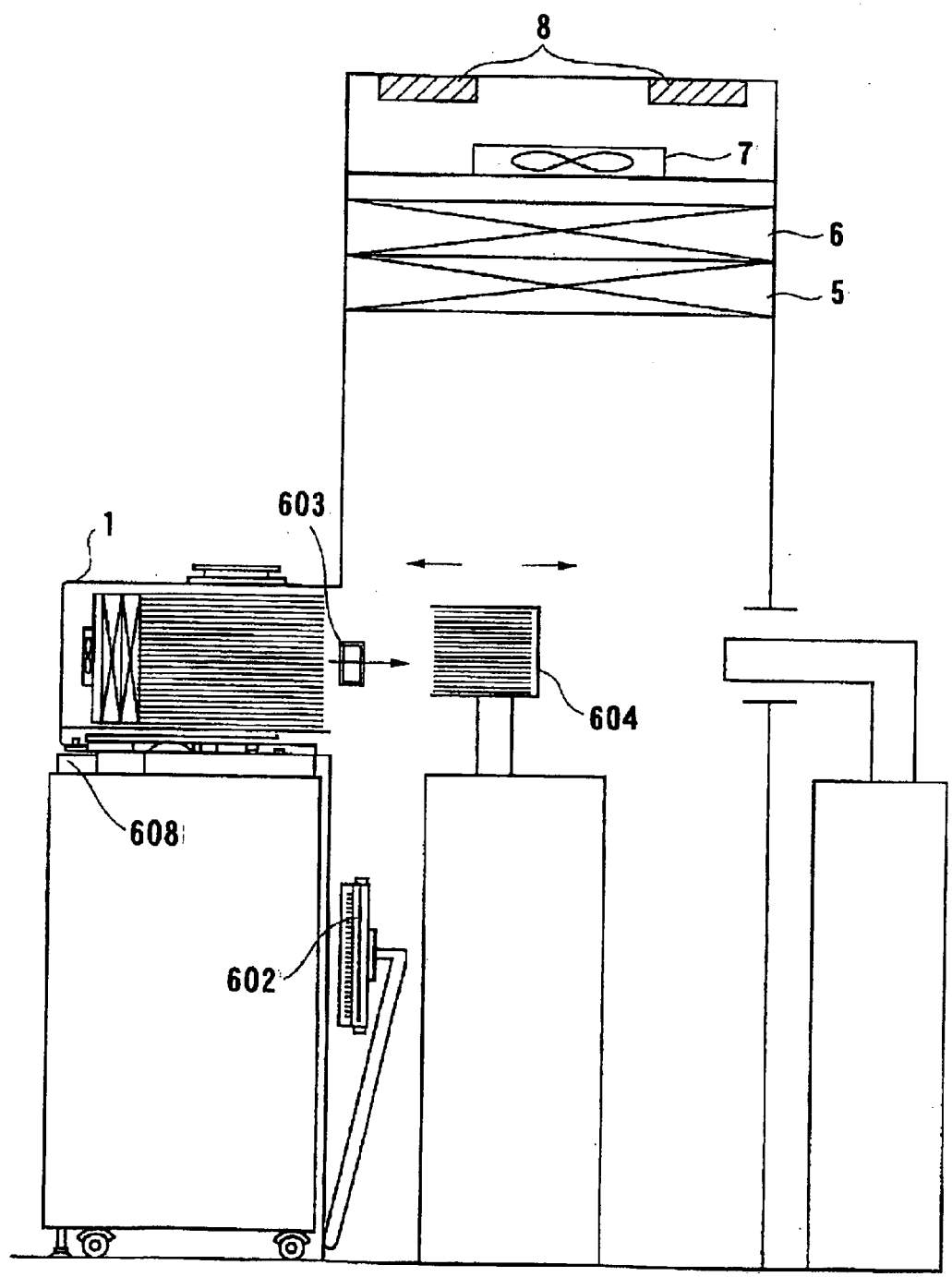
FIG. 69 is a diagram to show transport of substrates from the substrate transport pod mounted on a processing apparatus.

As shown in FIG. 69, comparing the degree of cleanliness of the interface interior with that of the pod interior, interior of the pod is cleaner because of its smaller volume. Therefore, when the pod 1 is placed in the interface entry, all the wafers in one lot inside the pod 1 are placed on the temporary cassette 604, and the pod is made to standby until all the wafers in one lot are processed while supplying the power to the pod through the power input terminal. By so doing, the interior of the pod can be kept at a desired degree of cleanliness while it is in the standby mode. In this case also, as in the system shown in FIG. 64, in addition to the ULPA filter, it is preferable to place a fan-filter unit that has a chemical filter, dehumidifying agent or dehumidifier in the interface section. Further, the fan-filter unit may be operated so that the air is circulated inside the interface. Also, dehumidification may be performed using dry air or $N_2$. When the substrate transport door 502 is closed, the pod 1 is transported to a next processing station or to a storing place by OHT or AGV, for example.

In the pod shown in FIG. 57, for example, the motor fan 507 is operated according to a pre-determined program. Accordingly, a flow from the motor fan 7 is created through the gaseous contaminants filter (chemical filter) 506 and ULPA filter 505. The air entering the center chamber 513a is divided smoothly into two streams by the flow control plate 514 located in the substrate transport door 502, and an air circulation path is created by each flow passing through the side chamber 513b and returning to the fan motor 507.

The fan motor may be provided with an optical or mechanical detector to detect the status of the door so that it is operated only when the door is closed. The purpose of this arrangement is that, if the fan motor is operated while the door is open, external air that contains various contaminants is introduced into the pod to shorten the life of the chemical filter, and this situation is prevented by adopting this arrangement. Another purpose is to prevent the internal surface of the pod from being contaminated by entry of the external air.

A method of supplying power to the fan motor and/or dehumidifier will be explained. The apparatus side that supplied power from an external power source comprises a positioning pin for positioning the pod in a specific location, a control board for controlling the supply voltage and current and a power input terminal.

The air is cleaned by passing through the gaseous contaminants filter 506 and ULPA filter 505, and is guided by the entry flow control plate 517 placed at the inner side of the opening section of the partition plate 530 unified with the pod main body to the spaces between the wafers. By providing the entry flow control plate 517, air is prevented from flowing excessively through the space between the substrate W and the partition plate 530 unified with the substrate support member 504. The air that passed through the wafers W flows along the flow control plate 514 and the inner surface of the substrate transport door 502, and then inverts to return to the fan motor 507 through the side chamber 513b.

In this process, solid particulate matters adhered to various parts or gaseous substances emitted from such matters are carried by the circulation air and are cleaned in the two types of filters 505, 506 and flows over the substrates W. Therefore, not only external contaminants but also so-called self-generated contaminants emitted from the objects inside the substrate transport pod are prevented.

Whether the means for generating air flow is the fan or gas purging, it is preferable that the air is re-circulated at least once or preferably more than three times during the period between storing the substrate in the substrate transport pod and removing the substrates therefrom again, and the number of circulations can be adjusted depending on the environment required by the stored substrates and in relation to the degree of contamination associated with the preceding and succeeding environments to the current environment. Various patterns of operating the motor fan 507 may be considered depending on the operational requirements of the substrate transport pod 1. In general, during the initial stage of processing, continuous operation or fast flow operation to increase the number of circulation in unit time is desirable such that it is operated so as to produce at least more than one circulation in ten minutes, or more preferably, once or more and less than ten times in one minute. By adopting such an operational pattern, contaminants brought into the pod are actively removed. After cleaning is continued for some time, the flow rate may be decreased or intermittent operation may be carried out to reduce contamination that can be produced by the substrates W or construction materials of the interior of the substrate transport pod. By so doing, power consumption by the fan motor 50 is reduced, resulting in that the frequency of charging the secondary battery can be reduced.

The total weight of the substrate transport pod 1 having a width of 389.5 mm, depth of 450 mm and height of 335 mm and containing twenty five pieces of substrates of 300 mm diameter is about 10 kg. In this embodiment, circulation conditions are such that the fan motor 507 is operated to produce a flow rate of 0.12 $m^3$/min through the substrates W at a wind velocity of 0.03 m/s in the center section of the space between the substrates W. The flow rate can be altered by varying the speed of the fan motor 507.

Figure 70A:
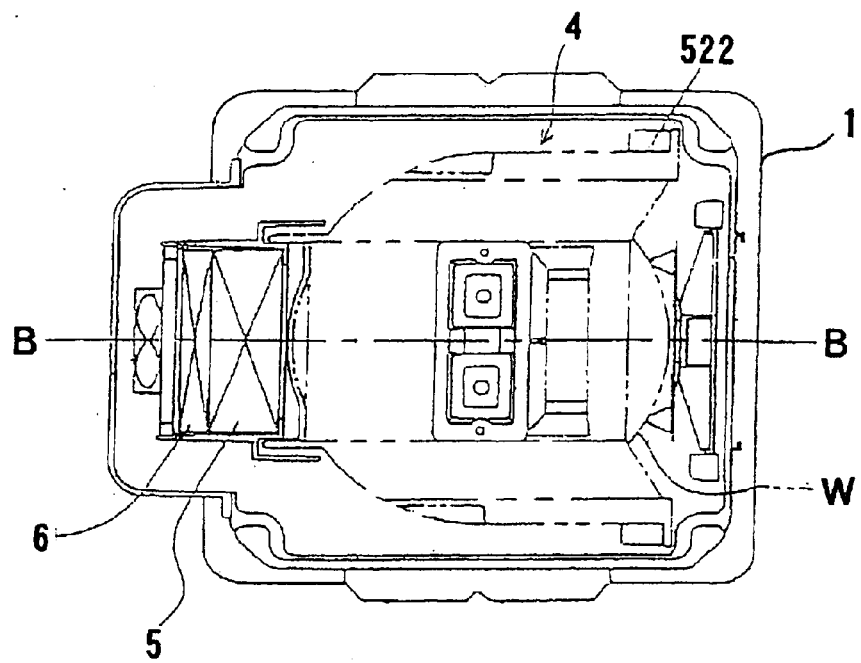
FIGS. 70A and 70B are, receptively, a top view and a vertical cross sectional view of a substrate transport pod.
Figure 70B:
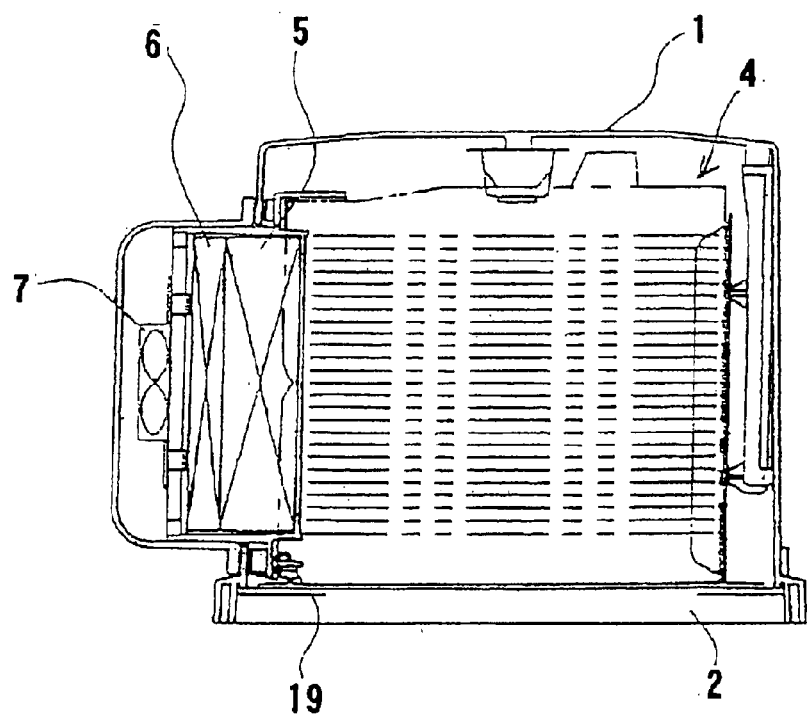

FIGS. 70A and 70B show an example of the substrate transport pod 1, and this pod 1 differs from the previous pod in that the size of the substrate W is 200 mm, the door 2 for the mechanical interface is housed in the bottom section of the substrate transport pod 1 and the substrates W are placed in a substrate cassette 4, which is then stored in the substrate transport pod 1. The method of cleaning the air in the substrate transport pod 1 is the same as that described above. Here, in this example, the secondary battery for operating the motor fan 7 and fan motor control circuit are housed inside the door 2.

Figure 71A:
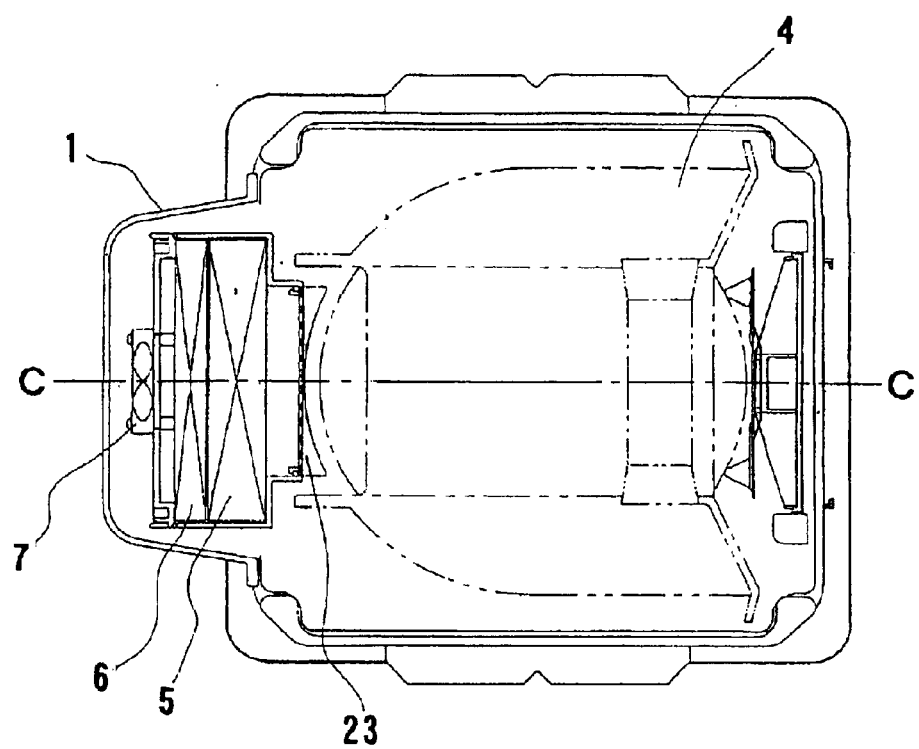
FIGS. 71A and 71B are, respectively, a top view and a vertical cross sectional view of a substrate transport pod.
Figure 71B:
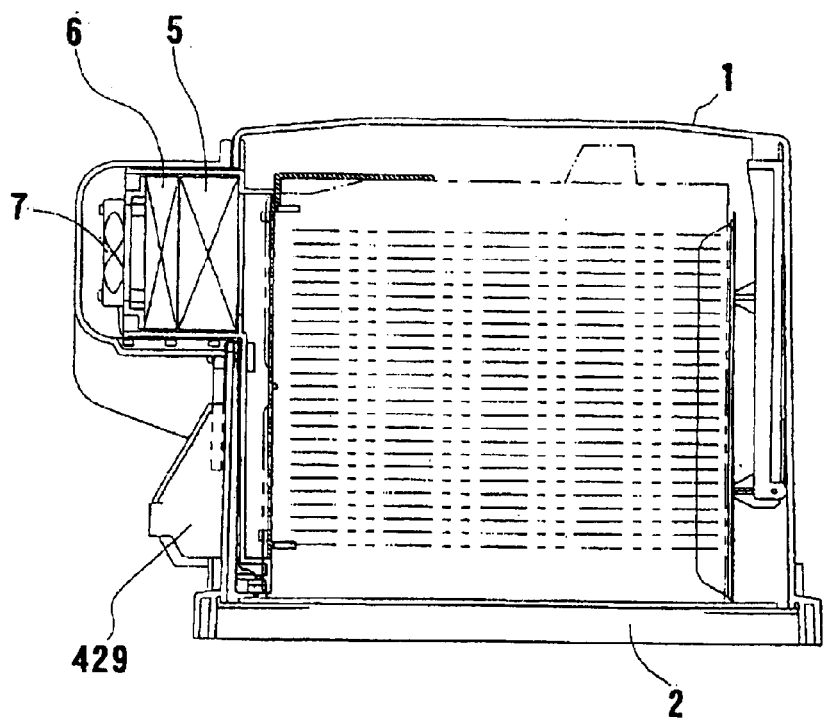

FIG. 71 shows another example of the substrate transport pod. In this embodiment, an improvement is that an operational history managing apparatus 429 (information processing apparatus) is attached to the pod described above. In this embodiment also, the air circulated by the motor fan 7 passes through the gaseous contaminants filter 6 and ULPA filter 5, and the flow is made uniform by a punching plate 23 and is supplied to the wafers. The punching plate 23 is designed to have varying size of the openings. Specifically, openings are made larger in the upstream side which is located directly below the filter, and are made smaller in the downstream side. By adopting such a design, air flow in the piling direction of the wafers is made uniform. The air flows through the wafers and returns along the inner walls to the motor fan 7 to circulate and replace the air in the pod. This example illustrates a typical automation-ready substrate transport pod, and is not meant to specify the location of the operational history managing apparatus (information processing apparatus) 429.

The total weight of the substrate transport pod 1 having a width of 283 mm, depth of 342 mm and height of 254 mm and containing twenty five pieces of substrates of 200 mm diameter is about 6 kg including the cassette 4 and the wafers. In this example, circulation conditions are such that the motor fan 7 is operated to produce a flow rate of 0.05 $m^3$/min through the substrates W at a wind velocity of 0.03 m/s in the center section of the space between the substrates W.

Figure 72:
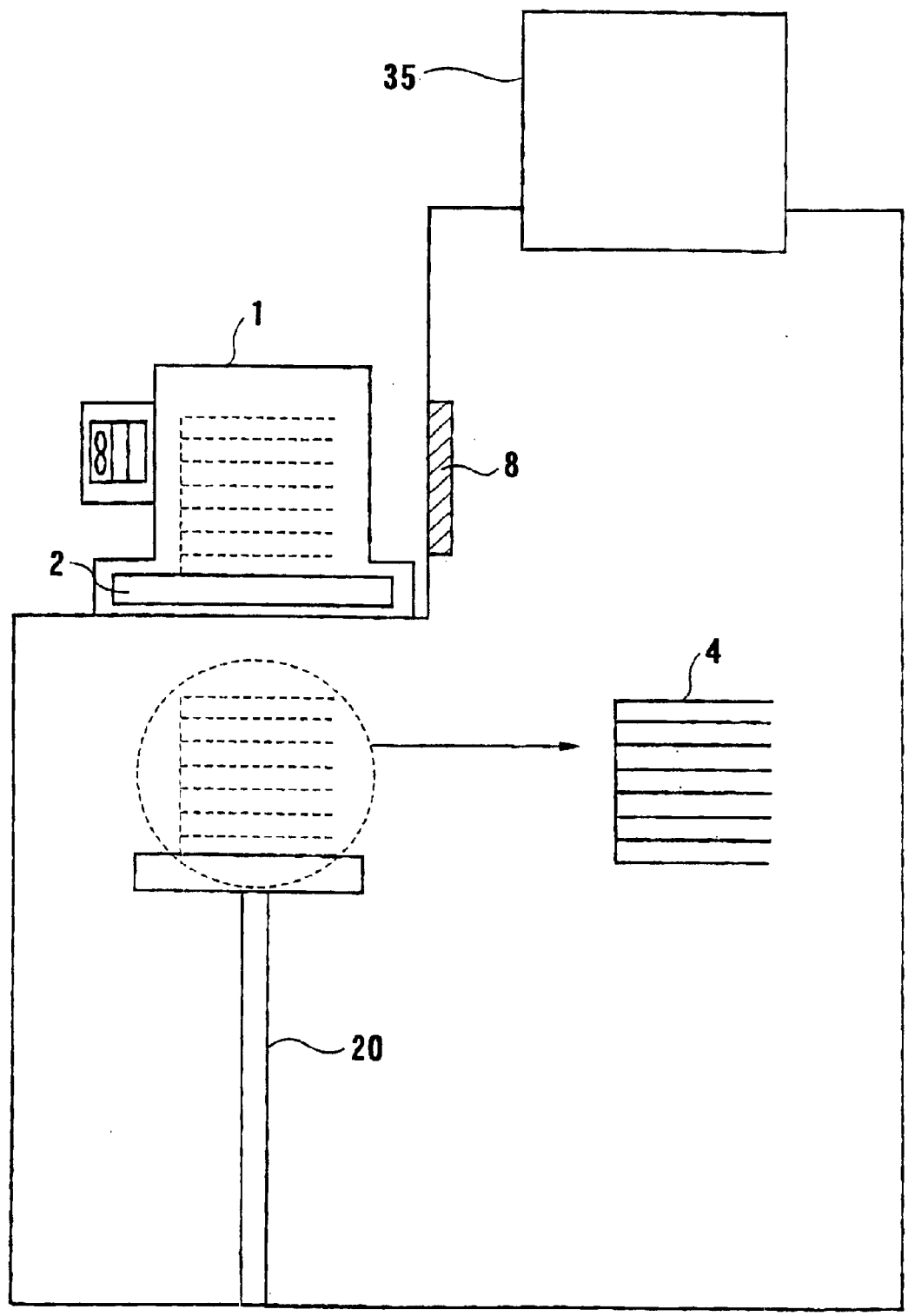
FIG. 72 is a diagram to show a substrate transport pod mounted on a processing apparatus.

The operation of the substrate transport pod for 200 mm substrates, when it is transported into a copper plating apparatus will be explained with reference to FIG. 72. The combination of fan filter unit 35 inside the interface and other arrangements are the same as those for the substrate transport pod for 300 mm wafers. The substrate transport door 2 and the carrier 4 are separated from the substrate transport pod 1 by means of an elevator. After transferring the wafers W in the carrier 4 for each lot to the interface side, the elevator 20 is raised and the substrate transport door 2 is returned to the pod main body 1, and the pod may be kept waiting until processing for one lot is completed.

Figure 73:
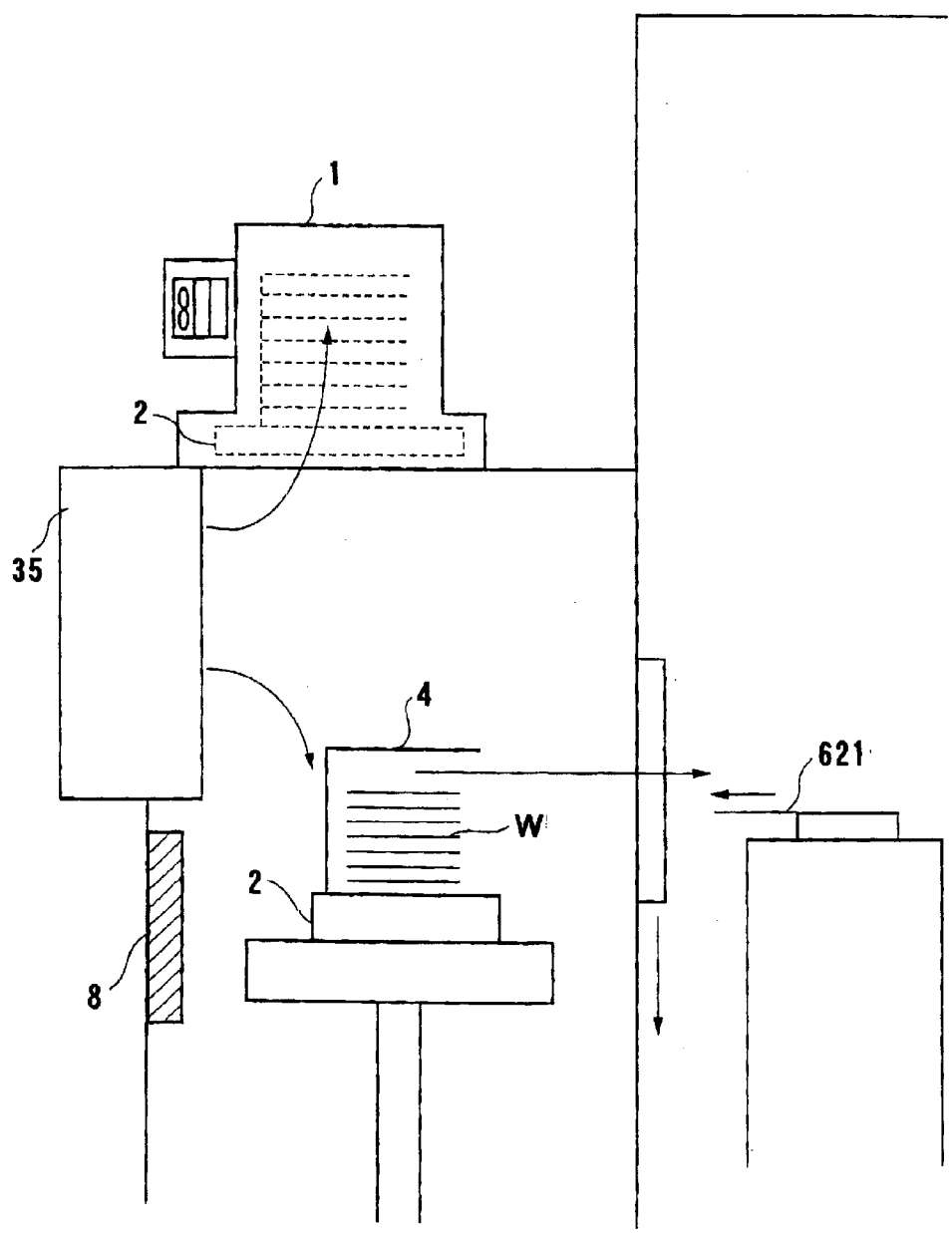
FIG. 73 is a diagram to show an example of operation of the pod shown in FIG. 72.

Also, as shown in FIG. 73, during the processing of the one lot of wafers, if the pod main body 1 is left open while the substrate transport door 2 is in the standby mode with the carrier 4 and unprocessed wafers, it is preferable that the air flow from the fan-filter unit 35 be supplied not only to the door 2, carrier 4 and the wafers W but to the interior space of the pod main body 1.

The substrate transport pod storing silicon wafers having a coating of a low dielectric insulation film is gripped by a robot that engages with a robot holding means attached to the substrate transport pod, for example, and is placed on a transport apparatus such as AGV. It is preferable that the robot arm be provided with sensing means to detect whether the substrate transport pod has been gripped and a locking device to prevent the pod from slipping. The AGV detects that the pod has been mounted in the correct position, and whether or not the pod is a type that required power supply, and supplies a portion of the power from the battery on the AGV or a portion from an external source to the substrate transport pod 1, and operates the motor fan 7 provided within the substrate transport pod, so as to transport the wafers to the next processing apparatus such as a coating apparatus, etching apparatus or copper plating apparatus while circulating the air inside the substrate transport pod through the dehumidifying agent or an electrical dehumidifier and controlling the humidity and concentrations of chemicals in the interior of the pod below specified values.

Whether the means for generating air flow is a fan or gas purging, it is preferable that the air is re-circulated at least once or preferably more than three times during the period between storing the substrate in the substrate transport pod and removing the substrates therefrom again, and the number of circulations can be adjusted depending on the environment required by the stored substrates and in relation to the degree of contamination associated with the preceding and succeeding environments to the current environment. If there is no restriction on the power consumed by the fan, it is most preferable that the gas be circulated constantly. Here, it should be noted that "the nature of the environment required by the stored substrates" refers to the creation of an environment within the pod during transit between the processes so that all or any particular species of contaminants in the pod that may reduce the yield, such as particulate matters, ions, dopants, organic substances, moisture are kept below the target control level. The type of environment demanded by the substrates stored for each processing step will be explained specifically below.

The wafers coated with a photo-resist in a photo-resist coating apparatus are transported by a substrate transport pod, having an internal chemical filter that absorbs ammonia to create an environment containing a lesser amount of ammonia, from the coating apparatus to an exposure apparatus. This is because chemically-enhanced photo-resist materials having increased sensitivity are being used in recent years, and such materials absorb ammonia in air and react to result in the so-called T-top structure. The level of ammonia inside the substrate transport pod transporting silicon wafers is preferably less than 1 $\mu g/m^3$, or more preferably less than 0.5 $\mu g/m^3$, or most preferably less than 0.1 $\mu g/m^3$.

Also, another reason for reducing the ammonia level is that the resist-coated wafer surface is exposed to the environment not only inside the substrate transport pod but also inside the coating apparatus, exposure apparatus, developing apparatus and etching apparatus. The environment control may also be exercised in wafer transport section having transport robotic arm.

The resist-layer after insulation film etching is removed by the asher so that the "T-top phenomenon" need not be considered. Therefore, only the humidity inside the substrate transport pod needs to be controlled during the transport of wafers from the etching apparatus to the ashing apparatus, transport from the ashing apparatus to the metal film forming apparatus by CVD, and for transporting to the plating apparatus. Further, if chemical contamination of the side surface of the insulation film groove after etching is a problem, wafers may be transported from the etching apparatus to the ashing apparatus and to the metal film forming apparatus, in a substrate transport pod equipped with a chemical filter, in addition to a dehumidifying agent or dehumidifier.

Further, for transporting inside the substrate transport pod, silicon wafers coated with copper film from a metal film forming apparatus such as CVD or plating apparatus by way of annealing apparatus to a CMP apparatus, and further to an insulation film forming apparatus such as coating and CVD apparatus, it is possible to prevent the growth of oxide film by controlling the humidity in the interior of the substrate transport pod 1 by providing dehumidifying means such as dehumidifier or dehumidifying agent inside the substrate transport pod 1. In this case, it is preferable to control the humidity to be less than 10%, or more preferably less than 5%. To prevent the slightest oxidation film growth, it is preferable to reduce the humidity to less than 10% within ten minutes after opening the door 2 of the pod, or more preferably to 10% within three minutes or most preferably to less than 5% within three minutes. Also, from the viewpoint of shortening the operation of clean-rooms, it is desirable to reduce the humidity quickly. Here, when there is a danger of damaging the elements by static electricity due to low humidity, it is preferable to transport/store the wafers for removing the charges by grounding through the surface layer formed with the copper film.

Conversely, when the wafers are transported between processes that prioritize ion removal, such as the exposure processing that requires ammonia to be reduced, it is necessary to adjust the humidity to a level that enables the ion exchange agent to operate effectively so that, instead of reducing the humidity limitlessly, it is preferable to control the humidity to higher than 10% and less than 50%.

In any event, it is important to establish an environment that contains less than the managing target concentration suitable for each process, to control the environment in all the substrate transport pods that operates between the actual apparatuses (including the fore-shelf of the apparatus) in a plant, it is preferable to mount communication means that enable to communicate operating conditions for electrical drive sections such as fan and dehumidifying unit. Control method for operation of fan and dehumidifying unit to achieve a specific humidity environment will be explained with reference to FIGS. 74 and 75.

FIG. 74 shows an example of a method for humidity control by controlling the operational pattern of the fan. In all cases, the results were obtained under the same operating conditions that (1) two dehumidifying units are mounted on the pod, which were operated continually; and (2) ancillary dehumidifying agent is not used. It was found that when the fan is stopped (shown by ○ in the diagram), the humidity of about 30% was reached in 20 minutes and about 20% in 60 minutes, and these levels were maintained. Also, intermittent fan operation (on 30 seconds and off 150 seconds; shown by * in the diagram), the humidity of about 20% was reached in 25 minutes, and about 10% in 90 minutes, and these levels were maintained. When the fan was operated continually (shown by ◆ in the diagram), the humidity of about 20% was reached in 10 minutes, and less than 10% in 20 minutes. From these results, it can be understood that, for processes that require removal of ions as priority, for example, to perform ion removal only, the dehumidifying unit may be stopped, but if gentle dehumidification is required along with ion removal, intermittent operation of the fan is effective.

Next, FIG. 75 shows a case of controlling the humidity by operational pattern of the fan, by mounting two dehumidifying units based on solid polymer electrolytic film on the substrate transport pod. In all cases, the results were obtained by varying the operating conditions of the dehumidifying units and using the same operating conditions that (1) the motor fan is operated continually and (2) ancillary dehumidifying agent is used. The results obtained when only one dehumidifying unit was used (shown by ♦ in the diagram) show that the humidity of about 20% was reached in 20 minutes, about 15% in 40 minutes and these levels were maintained. When two units were operated during the first 30 minutes and switched to one unit operation (shown by * in the diagram), the humidity of 10% was attained in about 5 minutes, and an 8% level was the maintained. When two units were operated continually (shown by ○ in the diagram), the humidity was also 10% in about 5 minutes, but the ultimate humidity maintained was less than 5%. Accordingly, the ultimate humidity reached in the pod is dependent on the film area of the dehumidifying unit, therefore, in the substrate transport pod having the dehumidifying unit based on the solid polymer electrolytic film, it is preferable that the film area be more than 0.3 $cm^2/L$ and less than 10 $cm^2/L$, or more preferably more than 0.6 $cm^2/L$ and less than 5 $cm^2/L$ of the unit volume of the pod. In any case, it can be understood that, in a process requiring a rapid reduction in humidity, it is effective to use an operational pattern so that the fan is operated continually and is combined with a dehumidifying material. Here, for an absorbing agent that can be combined with the dehumidifying unit based on a solid polymer electrolytic film, a chemical filter (activated charcoal, ion exchange medium and the like) can perform adequately well. It is possible to use only one dehumidifying unit to lower the humidity relative quickly while aiming for the ultimate humidity range to enable removal of ionic species.

In practice, it is desirable to adjust the humidity level to suit each process by re-writing the operational pattern of the electrical drive section such as the fan and dehumidifying unit through the communication means described earlier. Further, the dehumidifying unit may be operated automatically by providing a humidity sensor inside the pod, and operate the dehumidifying unit according to its humidity data.

In the process described below, silicon wafers are transported inside a processing apparatus by following steps reverse to those related to transporting from the processing apparatus to AGV. Power supply to the substrate transport pod may be performed while the substrate transport pod is mounted on the processing apparatus in the standby mode.

Further, it is permissible that the substrate transport pod need not be directly mounted on the processing apparatus but it may be in the standby mode or in the waiting mode for the processing apparatus by placing the pod on a charging apparatus provided on the temporary fore-shelf of the processing apparatus while power is being charged to maintain a clean environment, and then transport the pod to the processing apparatus when appropriate. Also, it is permissible that not only the substrate transport pod but also the loading/unloading section of the processing apparatus may be subjected to cleaning to reduce-organic substances and ionic contaminants by using a chemical filter and the like, and to control the level of humidity around the wafers by operating the dehumidifying means.

Also, the interior of the substrate transport pod 1 is normally filled with air, but by using an inert gas having a controlled oxygen level, oxidation of copper film can be prevented. It is preferable that oxygen be less than 10,000 ppm, or more preferably less than 1,000 ppm.

Further, by providing a particle filter 5 and a motor fan 7 inside the substrate transport pod 1 to prevent chemical and particulate contamination of metallic surfaces to circulate and clean the interior air, cross contamination of wafers can be prevented. Also, by providing both a chemical adsorption filter 6 and a particle filter 5 inside the substrate transport pod 1, particles and ions can be removed. Here, it is permissible to provide only the particle filter or only an ionic filter for the chemical filter. Also, when the motor fan 7 and others are provided inside the substrate transport pod 1, the motor fan 7 may be operated without providing a battery inside the substrate transport pod 1, by supplying the power to the motor fan 7 through the receptacle provided on the base member when the substrate transport pod 1 is mounted on the base member.

As described above, the internal wiring processes for a semiconductor chip comprised by low dielectric insulation film and copper wiring demand different environments inside the substrate transport pod, depending on the characteristics of the films formed on the silicon wafer surface. Therefore, for each processing of wafer surface, it is preferable that the wafers be transported inside respective substrate transport pods having a dehumidifying device and chemical filter and the like so as to meet the requirements of processing of surfaces comprised by a low dielectric insulation, processing of surfaces comprised by a photoresist material, or processing of surfaces comprised by a metallic film such as copper film.

Further, one substrate transport pod having a dehumidifying device, chemical filter and particle filter may be used through all the wiring processes of semiconductor wafers.

In any event, it is important to establish an environment that contains less than the target concentration suitable for each process, to control the environments in all the substrate transport pods that operate between the actual apparatuses (including the fore-shelf of the apparatus) in a plant, and it is preferable to mount communication means to enable to communicate operating conditions for electrical drive sections such as fan and dehumidifying unit.

Figure 76:
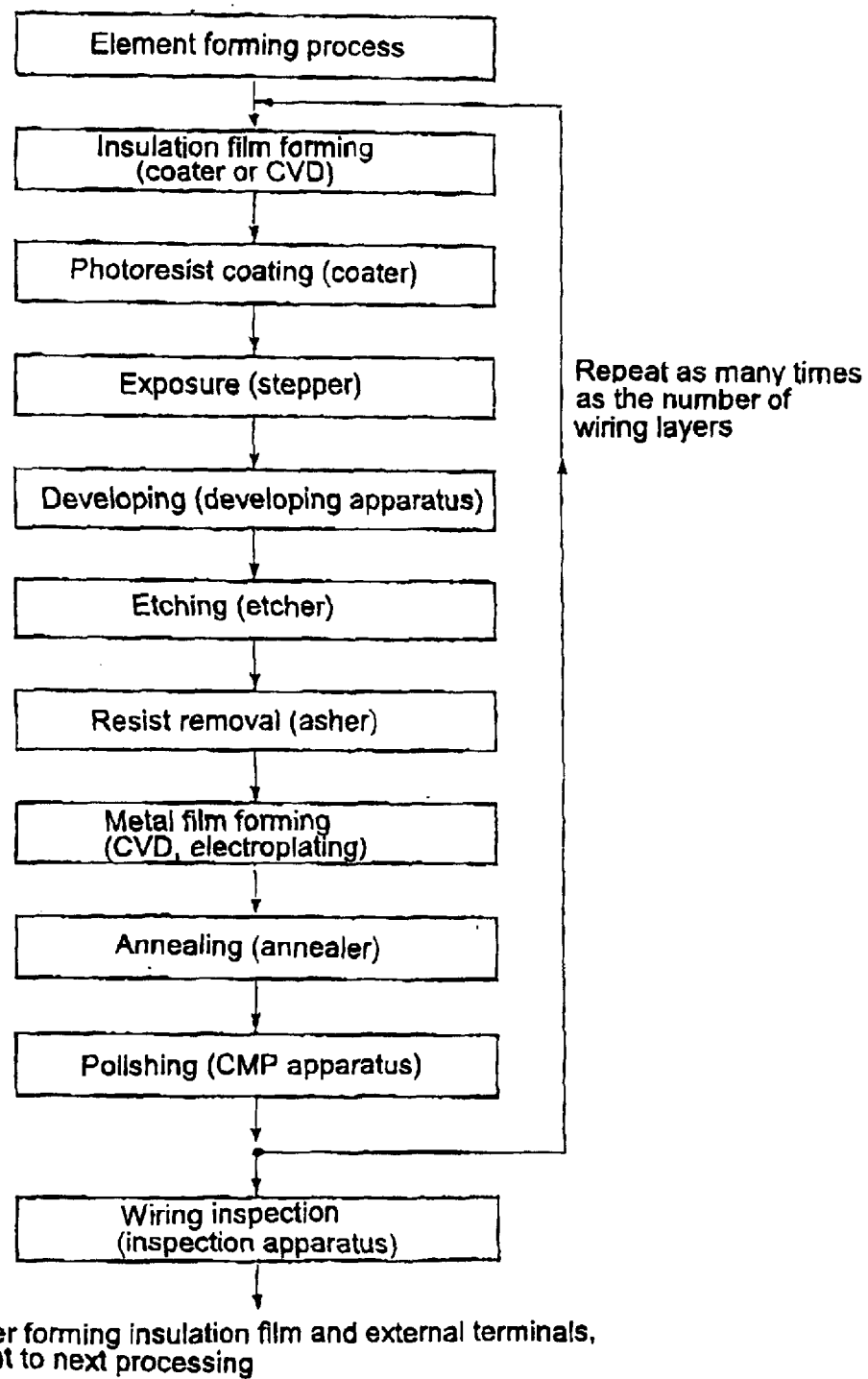
FIG. 76 is a flowchart of a first stage of semiconductor device production.
Figure 77A:
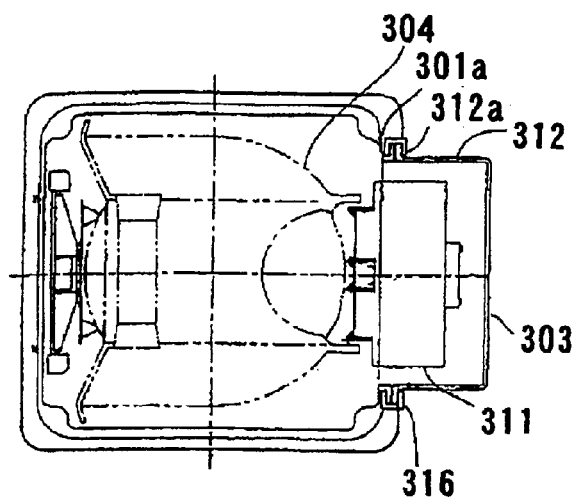
FIGS. 77A to 77D are diagrams of a substrate transport pod that allows detachment of filter and moisture aversion parts.
Figure 77B:
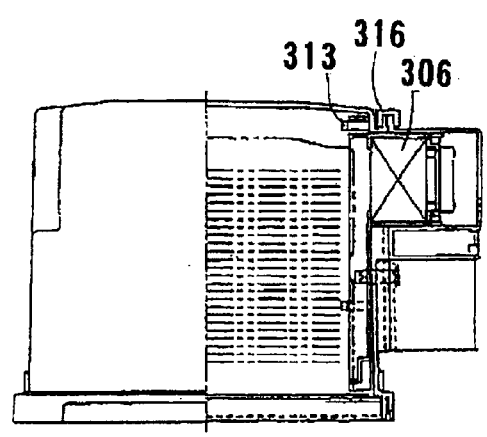
Figure 77C:
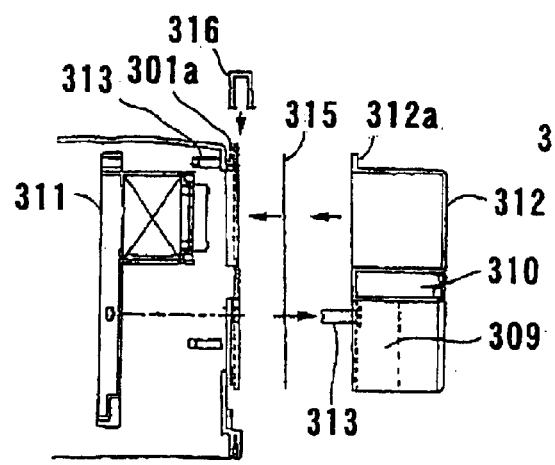
Figure 77D:
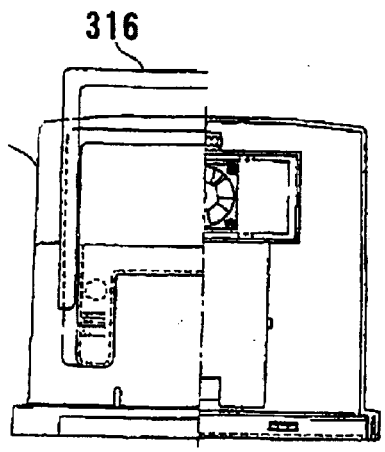
Figure 78A:
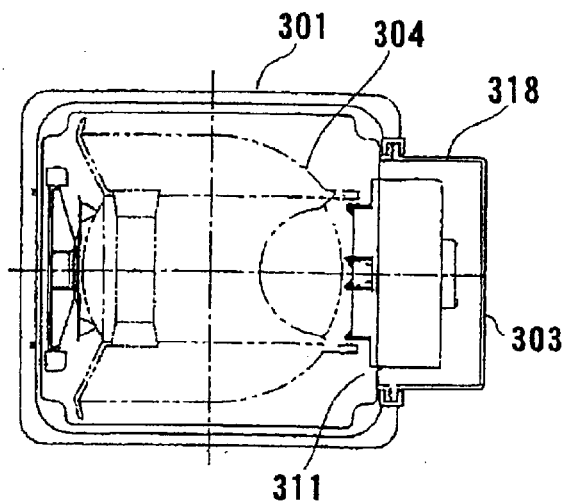
FIGS. 78A to 78D are diagrams of a variation of the pod shown in FIG. 77.
Figure 78B:
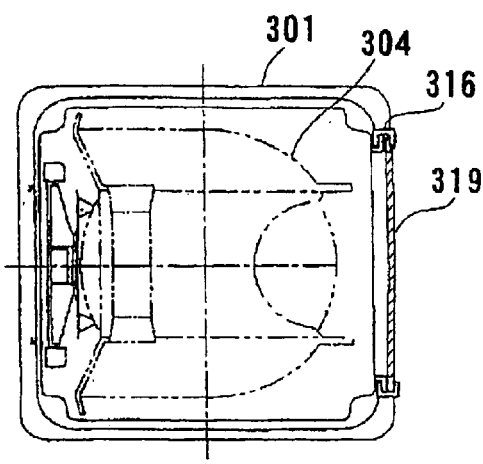
Figure 78C:
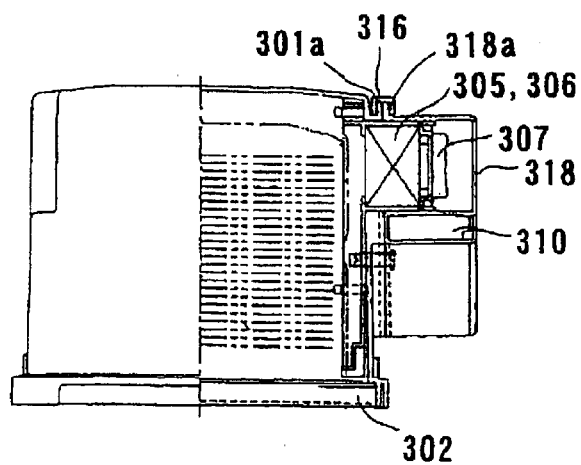
Figure 78D:
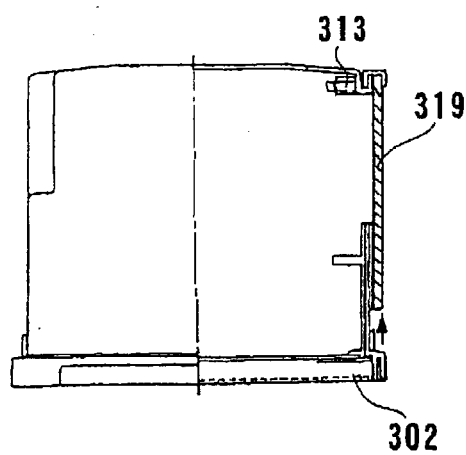

Also, as shown in FIG. 76, when a substrate transport pod having data storing device of data related to various processes explained above, after completing wiring of all the layers, process data such as the apparatus identification numbers that the pod has passed through are given to the process managing computer, and at the same time, electrical properties of the chip wiring are measured. Then, the process managing computer performs data processing, such as statistical analysis of the data, using the data of the processing apparatuses that the wafers had passed through, and the results are sent as feedback data for the next lot of manufacturing.

The above process data will be explained in conjunction with the substrate management aspect of the operational history managing apparatus (information processing apparatus) 429 shown in FIG. 71. In normal manufacturing plants, there are several processing apparatuses, and each apparatus performing the same process often has different recipes. For this reason, operational history management refers to managing the information related to processing of one lot of wafers through steps performed by different processing apparatuses, including time information as to when the process was carried out. The recipes refer to parameters in respective processing programs such as processing sequence of various apparatuses and control parameters (control target values of temperature, pressure, type and quantity of gas, and time and the like). The processing apparatus referred to here relates to semiconductor manufacturing apparatus, and "between the apparatuses" relates to components in the exterior of the pod, including such items as load-ports, transport apparatus, transfer apparatus, fore-shelf and storage depot. The substrate transport pod is washed and dried, and the stored data are cleared so as to be ready for the next lot. Also, as shown in FIG. 76, inspection of each wiring layer may be performed after completing wiring of all layers.

FIG. 77 shows another substrate transport pod of the present invention. This substrate transport pod is designed so that a filter block 311 having filters 305, 306 and the fan motor 307 is freely detachable from the pod main body 301. Then, a control board 309 and a secondary battery 310 are mounted on an electrical parts block 312, which is hermetically sealed to be water proof. The flange section 312a of the electrical parts block 312 and the flange section 301a of the pod main body 301 are joined via a packing or an O-ring 315, and are affixed in a binder-like clamping mariner by means of a flange guide 316. As shown in FIG. 77D, the flange guide 316 is a ⊃-shaped part, and clamps the electrical parts block 312 to the pod main body 1 from three directions. Also, a clamp that binds the flange section 312a and the flange section 301a of the pod main body 301 may be used. The filter block 311 is freely detachably fixed by means of a hook 313 protruding into the interior of the pod.

To wash the substrate transport pod 301, the filter block 311 is detached from the pod main body 301 by disengaging the hook 313 to release the filter block 311. The electrical parts block 312 is water-proofed as mentioned above so that the pod main body 301 can be washed directly by detaching the filter block 311. Also, the electrical parts block 312 can also be freely detached by removing the flange guide 316. Therefore, by removing the electrical parts block 312 and replacing it with a plate and clamping the plate using the flange guide 316, the opening section can be sealed, so that the pod 301 may be washed in this condition. Filter exchange in the filter section 311 can be carried out readily by removing the filter block 311 from the pod main body 301.

FIG. 78 shows another substrate transport pod that enables easy washing. In this embodiment, filters 305, 306, a fan motor 307, a control board 309, a secondary battery 310 and the connectors for connecting these components are integrally fixed to a block 318, and are freely detachable as a whole from the pod main body 301. The block 318 is provided with a flange section 318a, and is joined and affixed by the flange guide 316. Between the flange section 301a of the pod main body and the flange section 318a of the casing 318 is provided a packing or an O-ring for hermetic sealing The pod is washed by removing the flange guide 316 to remove the filter block 318. Then, the plate 319 is attached. The washing plate 319 is attached against the flange section 301a of the pod main body with a packing or an O-ring by pressing and clamping with the flange guide 316. The flange guide 316 is ⊃-shaped as in the embodiment shown in FIG. 77. Here, to facilitate attachment, each flange section may contain a magnet in some locations so as to provide temporary fixation.

The substrate transport pods with air cleaning capability have components (moisture aversion parts) that are not suitable for washing, so that they cannot be immersed in water in a washing machine as can the conventional substrate transport pods To wash the present pods, the moisture aversion parts may be made water-proof, but the filters need to be exchanged sometimes so that it is necessary to design the filters to be readily detachable. The present substrate transport pod has been made washable without having to remove the moisture aversion parts by separating the filter section from the moisture aversion parts such as electrical parts into self-contained units. The moisture aversion parts (secondary battery and control boards) are sealed to be water-proofing water-proof and affixed to the substrate transport pod, so as to facilitate washing the substrate transport pod without detaching the moisture aversion parts.

Such a structure is effective when using special washing machines designed for the present substrate transport pod, but normal substrate transport pods that do not have air cleaning capabilities cannot be washed in the same machine. This is because the dimensions of the present pod are different from the dimensions for normal pods because of the air cleaning apparatuses mounted on the pod. In this case, it is necessary to design so that the moisture aversion parts including filters, and electrical parts are wholly detachable. When the air cleaning apparatuses are detached, the pod can be fitted to a normal washing machine. However, when the air cleaning apparatuses are detached from the pod main body, there will be vacant portions that create holes on the pod main body, so that if the pod is subjected washing as it is, it means that detergent that enters into the interior of the pod is scattered outside thereof. Therefore, by setting the plate to the vacant portions, it has been enabled to use general purpose washing machines for washing the present substrate transport pods.

The joint sections between the block containing water aversion parts and the pod main body must be easily detachable while providing hermetic sealing to be water-proof. Therefore, it is necessary that the joint sections between parts, that are subjected to washing while being attached to the pod, be made in a flange shape, and a packing or an O-ring should be inserted into the interface as described above. To facilitate the pod and the flange to be attached temporarily, magnets may be mixed in respective parts. Method for drying may include dry gas purging, warm air drying, vacuum drying, and spin drying, and it is preferable that the cleaned and dried parts are assembled with the water aversion parts in clean environment.

Figure 84:
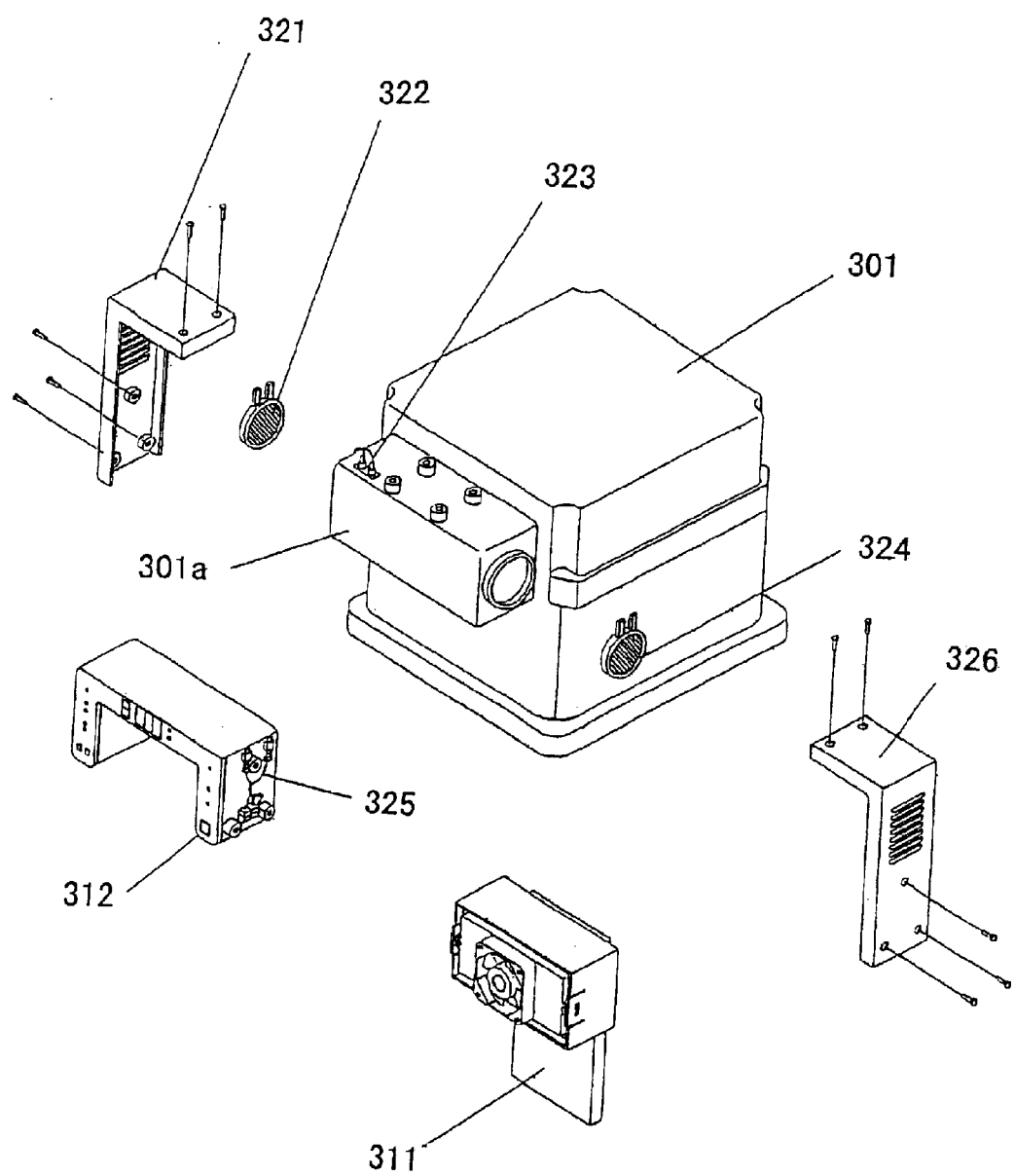
FIG. 84 is an exploded perspective view of a substrate transport pod.

FIG. 84 shows another structure of the substrate transport pod. The feature of this structure is that the area of the opening section other than the substrate transport door has been minimized. An expanded section 301a is integrally formed on the side wall section on the pod main body 301 for containing the filter block 311. The expanded section 301a is provided with a dehumidifying unit 324 of a circular or polygonal shape, and a dehumidifying unit cover member 326 is attached thereto. The electrical parts block 312 is isolated from the interior of the pod that needs to be clean, and is fixated from the exterior of the pod 301 by means of a one-touch-hook, for example. The electrical drive parts such as the fan motor and electrical dehumidifier are connected to the electrical parts block 312 from the exterior of the pod main body by way of wiring means 325. It is preferable that filter exchange be carried out by means of a unified filter block 311 that integrates the particle filter, gas contaminants filer, filter case and air circulation apparatus so as to maintain its performance capability. In the present structure, it is possible to exchange only the filter block without dismantling other components. When the pod is to be washed, the dehumidifier unit cover 326 is detached first. Next, the dehumidifying unit 324 is detached. Next, the filter block 311 is removed from the interior of the pod main body 301, and lastly, the electrical parts block 312 is removed. An opening generated by the removal of the dehumidifying unit 324 may be sealed with a stopper when the pod is to be washed.

Figure 79A:
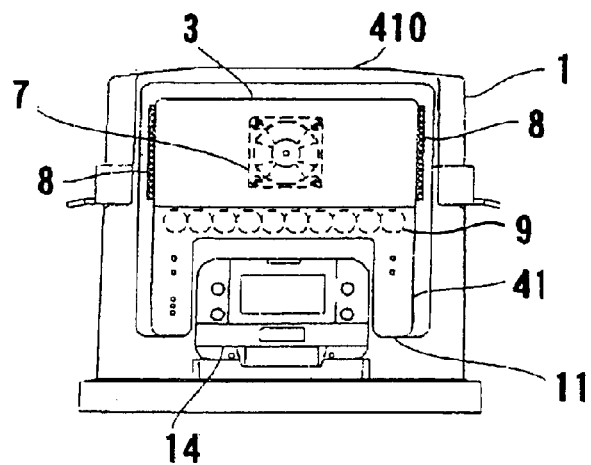
FIGS. 79A, 79B and 79C are diagrams of the structure of a power input section seen in a front view, a bottom view and a cross-sectional view.
Figure 79B:
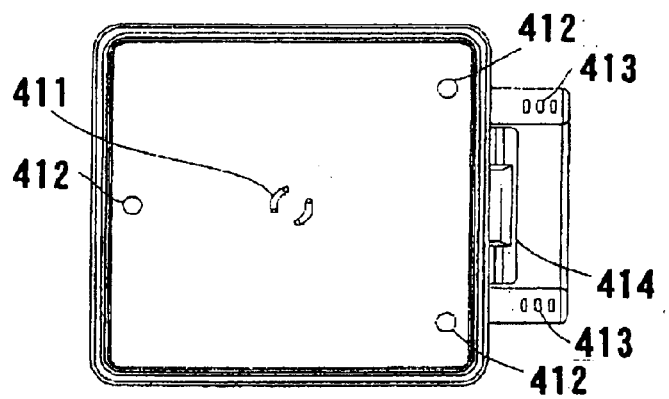
Figure 79C:
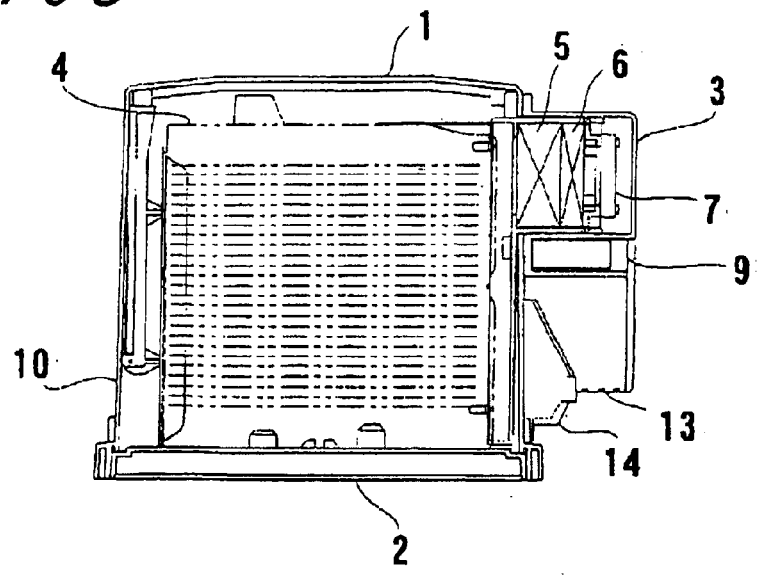

Next, the substrate transport pod that can be powered through external source will be explained with reference to FIGS. 79A, 79B and 79C. This pod is used to hold a plurality of substrates W of 200 mm diameter, for example, in a substrate cassette, which is housed in a pod 410 to be transported or stored. This substrate transport pod 410 is comprised by: a pod main body 1 of a square shape having a side wall opening section; a substrate transport door 2 linked to a substrate transport door operating apparatus so as to operate the opening section provided on the bottom surface of the pod main body by mechanical means; a lid member 3 for covering the opening section for mounting or detaching filters and fan motor; a cassette 4 for holding wafers; a ULPA filter 5; a gaseous contaminants filter 6; a motor fan 7; a dehumidifying unit 8; a secondary battery for operating the motor fan 7 and the dehumidifying unit 8; and an operation control board 9. On the bottom surface of the substrate transport pod 410 are provided a latching device 411 for mechanically operating the substrate transport door 2, a positioning hole 412; and a secondary battery charging terminal 413.

In this embodiment, charging terminal 413 on the substrate transport pod-side is located on its bottom surface, but the terminal may be located on the side surface or upper surface as necessary. FIG. 79 shows a managing information storage (information processing apparatus) 414 also for reference. Also, in this embodiment, the door of the substrate transport pod is located on the bottom section, but the pod is applicable to a structure in which the door is located on the side surface or upper surface. Also, in this embodiment, the substrate is stored in the horizontal position, but the pod is applicable if they are located in the vertical direction.

Figure 80A:
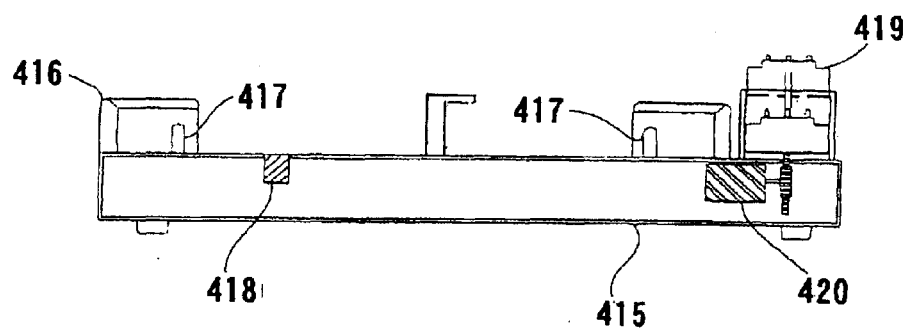
FIGS. 80A and 80B are diagrams of the structure of a power input apparatus seen in a vertical cross sectional view and a top view.
Figure 80B:
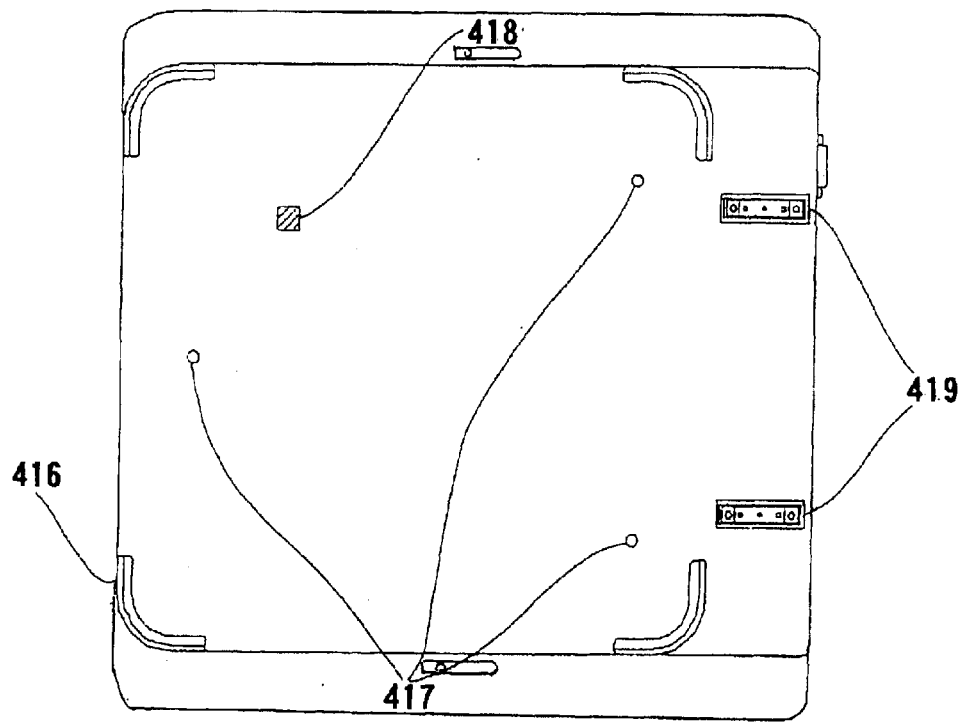

The power input apparatus for charging the secondary battery disposed on the substrate transport pod is an example of a charging setup to receive the substrate transport pod in the vertical position and the charging terminals on the apparatus side and the pod-side contact each other to carry out charging and/or supplying power, as shown in FIGS. 80A and 80B. The power input apparatus comprises a charging system and a supply system for converting commercial voltage source to a specific voltage required and supplying power directly to the fan motor and dehumidifying unit. By obtaining the power from such commercial power source to the fan motor or dehumidifying unit, it is possible to operate continually over a long period. The power input apparatus is comprised by: a power supply main body 415; a guide member 416 for guiding the bottom four corners of the pod; a positioning pin 417 linked to the guide member for seating the pod in a specific location; detection means 418 disposed in the interior of the power supply main body 415 for detecting whether the pod is present and/or the necessity for supplying power; a terminal moving mechanism 420 also disposed in the inferior of the power supply main body 415 for raising or lowering of the powering connector 419 according to detected information from the detection switch 418; powering connector 419; and a pod fixation mechanism 421 for mechanically affixing the substrate transport pod. The power input apparatus referred to above relates not only to a simple charging device to supply or receive charges but relates all inclusively to the door operating apparatus having charging capability, temporary holding apparatus, semiconductor manufacturing apparatus, automated transport apparatus, and performance inspection apparatus. Of the constituting elements mentioned above, the guide member 417 and the pod fixation mechanism 421 may be omitted. Here, in this embodiment, although the secondary battery is disposed on the substrate transport pod, but the system is similarly applicable to a substrate transport pod that does not have a secondary battery, that is, a pod having air cleaning apparatus and dehumidifying device that operate only through an external power supply.

Figure 81A:
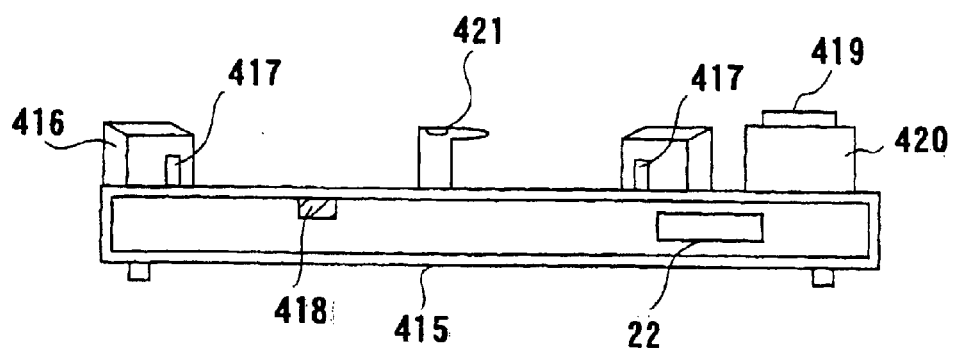
FIGS. 81A and 81B are diagrams of the structure of another power input apparatus seen in a cross sectional view and a top view.
Figure 81B:
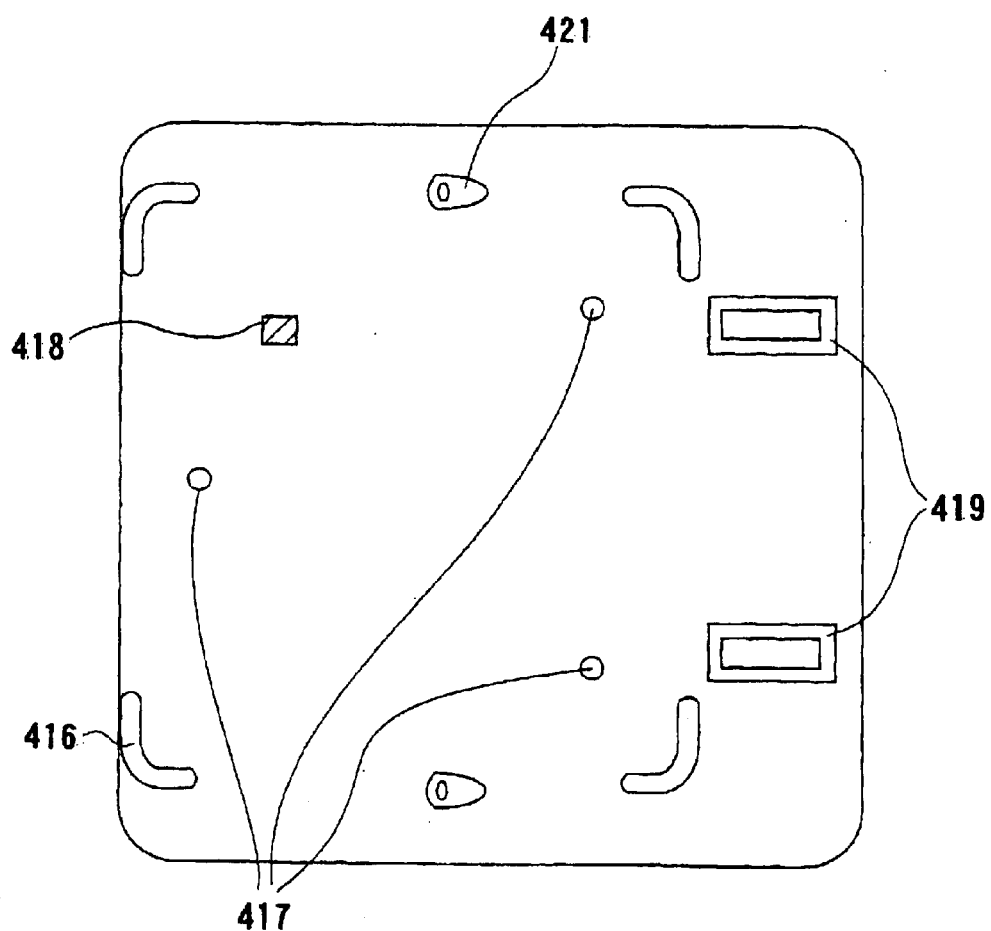

Another embodiment of the method for supplying power relates to a non-contacting manner of supplying the power. This method is based on a proven method of electromagnetic induction, being used for electric shavers, electric brushes and electric cars. Electromagnetic induction is realized by receiving or amplifying the magnetic flux generated by the current flowing in a wire or coil from an external AC source so as to supply necessary power, and is a type of transformer. The feature of electromagnetic induction type power supply is that no wear of terminals occurs because on non-contact, no generation of sparks, no danger of electrical shock, and no danger of shorting when used in wet environment. The outline is shown in FIGS. 81A and 81B. This power input apparatus is comprised by a charging system and a supply system that supplies power directly to the fan motor and dehumidifying unit after converting the commercial power to a specific voltage. By obtaining the power from such commercial power source to the fan motor or dehumidifying unit, it is possible to operate continually over a long period. The power input apparatus is comprised by: a power supply main body 415, a guide member 416 for guiding the bottom four corners of the pod; a positioning pin 417 linked to the guide member for seating the pod in a specific location; a detection device 418 disposed in the interior of the power supply main body 415 for detecting whether the pod is present and/or the necessity for supplying power; a control section 422 also disposed in the inferior of the power supply main body 415 for controlling supply voltage and current and the like; a powering connector 419 having a supply line or a coil; and a pod fixation mechanism 421 for mechanically affixing the substrate transport pod. The power input apparatus referred to above relates not only to a simple charging device to supply or receive charges but relates all inclusively to the door operating apparatus having charging capability, temporary holding apparatus, semiconductor manufacturing apparatus, automated transport apparatus, and performance inspection apparatus. Of the constituting elements mentioned above, the guide member 417 and pod fixation mechanism 421 may be omitted. Here, in this embodiment, although the secondary battery is disposed on the substrate transport pod, but the system is similarly applicable to a substrate transport pod that does not have a secondary battery, that is, a pod having air cleaning apparatus and dehumidifying device that operate only through an external power supply.

Figure 82:
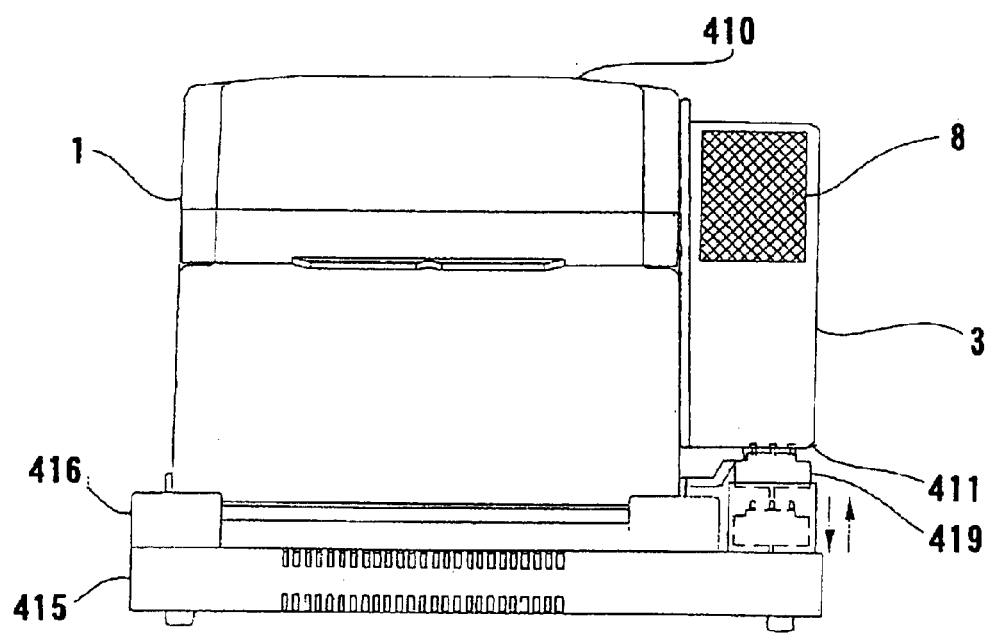
FIG. 82 is a diagram of a substrate transport pod seated on a power input apparatus.

Next, of the actions of the various components carried out during charging, a contact system of charging will be explained with reference to FIGS. 80 and 82. When a pod is transported to a charging apparatus by various transport means (AGV or OHT and the like) to be charged, it is seated in a specific position by the guide member 416 and the positioning pin 417. In some cases, the pod is fixed to the apparatus by the pod fixation mechanism 421. This state is shown in FIG. 82. When the pod 410 is seated, the detection switch 418 in the charging apparatus main body detects seating and/or determines whether charging is necessary, and if it is determined that charging is required, the terminal moving mechanism 420 is operated. The connector attached to the tip of the terminal moving mechanism contacts the charging terminal 411 on the pod-side, and begins charging. Before commencing charging, connection confirmation may be carried out to determine whether the terminals are in contact properly When charging and/or power supply is completed or when the pod is to be transferred due to processing needs, the apparatus side first transmits clear-process information to the power supply control board, and stops supplying of power. Next, the power input terminal retreats to a position to not to interfere with the movement of the pod, and the pod fixation mechanism 415 is released so as to enable process clearing. In this embodiment, the power input connector on the power supply side is disposed on the top surface, but this is not meant to specify the location of the terminal, so that it may be located on the side surface or the top surface as needed. Also, the direction of movement of the power input terminal is not required to be vertical so that the horizontal or slant direction, or a suitable combination of vertical, horizontal, slant or rotation movement may be used.

Next, of the actions of the various components carried out during charging, a non-contact system of charging will be explained with reference to FIGS. 81 and 83. When a pod is transported to a charging apparatus by various transport means (AGV or OHT and the like) to be charged, it is seated in a specific position by the guide member 416 and the positioning pin 417. In some cases, the pod is fixed to the apparatus by the pod fixation mechanism 421. This state is shown in FIG. 83. When the pod 410 is seated, the detection switch 418 in the charging apparatus main body detects seating, and it determines whether charging and/or powering is necessary, and if it is determined that the substrate transport pod requires charging, charging is commenced. Before commencing charging, connection confirmation may be carried out to determine whether the terminals are in contact properly. When charging and/or powering is completed or when the pod is to be transferred due to processing needs, the apparatus side first transmits clear-process information to the power supply control board 422, and stops supplying of power. Next, the pod fixation mechanism 415 is released so as to enable the state of clear-process. In this embodiment, although the power input connector on the power supply side is disposed on the top surface, this is not meant to specify the location of the terminal so that it may be located on the side surface or the top surface as needed. Also, the power input terminal on the apparatus side may be a movable type as in the contact type. The direction of movement may be vertical or horizontal or slant direction, or a suitable combination of vertical, horizontal, slant or rotation movement may be used.

A seating detection mechanism of the substrate transport pod may include a mechanical switch, proximity switch or photo-electric sensor. Mechanical switches are the most common means of detection, and include a button type, rotary type, sliding type, joy stick, and torque type, and miniature models are available in the marketplace. Proximity switches detect an approaching object by means of magnetic or electric field. They are non-contacting type detectors, and are effective when the detection object is metallic or non-metallic. Photo-electric sensors include scatter reflection type, mirror reflection type and transmission type. In the scatter reflection type, its operation is based on light emitted from the emission section that illuminates an object and is scattered/reflected, and a portion of the reflected light returns to the receiver section. In the mirror reflection type light emitted from the emission section is reflected by the mirror to return to the receiver section, and operates when an object shields the light. In the transmission type, emission section and receiver section are placed in different locations, and an object is detected when it shields the light path between the emission and receiver sections. In the above embodiment, any of these methods may be used by considering the size, shape, price and reliability of each method.

For the connectors, there are a coupling type, clip type or contact type. In the coupling type, a plug section is inserted into a socket section, and it is widely used for power and communication cables. For those applications that require little plugging and unplugging, this method is the most reliable. In the clip type, the conductive area is clamped by the clip, and it is used often when making temporary connections so that it is not well suited to the present embodiment. In the contact type, a spring section and a plate section are in contact at a point. This method is useful when the space available for the connector is narrow. The contact type spring section includes plate spring and coil spring, and many commercial products are available. In this embodiment, the above connection devices, excepting the clip type, are useful but from the viewpoint of low space requirement, the contact type is the most preferable.

As described above, a drive power source is required when the cleaning and/or electric dehumidifier are to be mounted on the substrate transport pod. There are two methods of obtaining a drive power source: one method is to provide a power source such as secondary battery on the pod, and another method is to supply power from an external source.

First, the method based on mounting a secondary battery will be explained. The purpose of mounting a battery on the pod is to maintain low levels of contaminants and humidity, even when external power supply cannot be provided, by operating the air cleaning apparatus and/or electric dehumidifier. Batteries that may be considered for mounting may include: rechargeable secondary batteries, for example, a lead storage battery, NiCd battery, nickel/metal hydride battery (Ni-MH), lithium ion battery (Li-ion), and polymer battery. Polymer batteries use a solid or gel type polymeric electrolyte, and therefore, they are different from other type of batteries, so that there is no danger of liquid leaking and a metal container is not required leading to improved safety. Also, there is an advantage that it allows freedom in designing the shape. Other power sources include solar batteries. Two methods of using the solar battery are to use it to drive the fan motor and the like directly or to use it to charge a secondary battery mounted on the pod. The substrate transport pod having the air cleaning apparatus and/or electric dehumidifier may utilize a secondary battery or a solar battery or a combination of secondary battery and solar battery.

The location for charging the battery may include, for example, a door operating apparatus, transport apparatus, storage depot or specialized local charger. When a secondary battery is mounted, it is necessary that the charger be provided only where the pod stays for a prolonged period. The pod may stay for a long time on the door operating apparatus and in the storage depot. Therefore, operation by secondary battery may be chosen only while transporting in the transporting apparatus, so that, even if the transport apparatus should experience problems and the pod is delayed, a clean interior atmosphere can be maintained in the pod.

The quickest general method of charging the battery is the following. First, preliminary charging is performed at 0.2~0.3 cmA, and the battery voltage is confirmed at this stage. If the battery voltage is higher than a specific voltage, the process is shifted to quick charging. Next, quick charging is performed at the maximum of 1 cmA. The end point of quick charging is reached when the battery temperature rise per unit time (dT/dt) reaches a pre-determined value. This is based on the method of judging the completion time of charging according to the amount of electrical energy injected into the battery manifesting in a given rate of temperature rise. When the quick charging is completed, the battery has been charged to 80~90% of its full capacity. Then, trickle charging is performed at a low current of $\frac{1}{20}$~$\frac{1}{30}$ cmA. When the trickle charging is completed, the battery is charged to the 100% capacity.

General quick charging method follows the following sequence.

(1) Charging is performed at 0.2~0.3 cmA, and the battery voltage is confirmed. If the battery voltage is higher than a specific voltage, it changes to quick charging.

(2) Quick charging is performed at the maximum current of 1 cmA. The end of quick charging is reached when the temperature rise per unit time (dT/dt) reaches a specific value. At the completion of quick charging, 80~90% of the full charge is attained.

(3) Charging is continued at a low current of $\frac{1}{20}$~$\frac{1}{30}$ cmA. When the trickle charging is completed, 100% of the battery capacity is reached.

Figure 86:
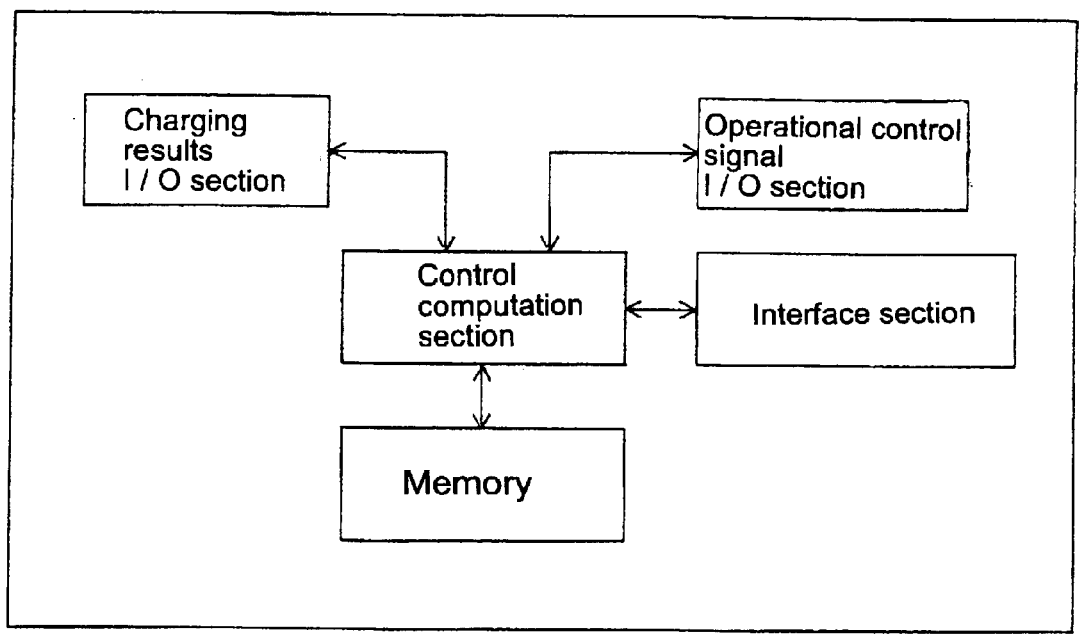
FIG. 86 is a block diagram of the control section on the powering apparatus side.

FIG. 85 shows a control section on the pod-side for providing battery protection and showing accurate residual capacity. This apparatus has a control board on the pod-side having the information processing function shown in FIG. 85, and a control board on the charger side having the information processing function shown in FIG. 86. The "measurement results input/output section" on the pod-side receives battery capacity, operation times and power consumption rate and others for the fan motor and/or electric dehumidifier, and next, necessary data are computed in the "control computation section" and the data are stored in the "memory" as information on the battery capacity, accumulated power consumption and the like. The "operational control signal input/output section" receives dedicated ID number of the pod, operation conditions such as operation patterns of the fan motor and/or electric dehumidifier and the like, which are stored in the "memory". Operational state of the pod, such as the battery residual capacity, is output from the "memory" according to the control computation actions stored in the "memory". The "interface section" has the capability to transmit information stored in the "memory" by wire or radio to the charger.

The "interface section" on the charger side receives information such as ID number of the pod and accumulated power consumption and others, and necessary data are computed in the "control computation section", and the data such as charging times are stored in the "memory". The "charging control circuit section" performs charging of the battery according to various information such as charging times stored in the "memory" and according to computed control actions including information on the voltage or current and the like output from the "measured results input section" through the "interface section".

That is, because residual charge and operation times and accumulated power consumption are stored in the "memory" by the control board on the pod-side, this method enables to display more accurate information on the residual battery life. Also, because the battery capacity is computed constantly, performance degradation due to overcharging of secondary battery can be prevented. Also, the charging side is able to compute the shortest charging time based on the residual capacity of the secondary battery on the pod-side, and display the results.

Next, the structure of the electrical system will be explained. For example, if a charging system for charging the secondary battery is combined with a powering system for operating the air cleaning apparatus and/or electric dehumidifier, the power to operate the air cleaning apparatus and/or electric dehumidifier is consumed from the secondary battery. In this method, charging and discharging of the secondary battery is repeated to result in shortening the service life. When the pod is connected to the dedicated charger, it is preferable to separate the charging system from the powering system. By isolating the charging system from the powering system, when the pod is connected to the charger, the secondary battery is subjected only to charging process, and the service life can be increased. The longer the time of connection to the charger, this effect becomes more significant.

Next, the method of supplying power from an external source will be explained. The purpose of supplying total power to operate the air cleaning apparatus and/or electric dehumidifier externally is to reduce the weight and cost of the pod by not mounting the battery on the pod. The power to the pod may be supplied when the pod is in the standby mode on the door operating apparatus, on the transport apparatus, in storage depot, or in the standby mode at a local charger. This method has a disadvantage such as the necessity for the power source to be located within the movement range of the pod, but the weight of the pod can be reduced and the cost lowered.

The substrate transport pod of the present invention having the air cleaning apparatus and/or electric dehumidifier may have a secondary battery or be driven by external power source.

Examples of methods for powering the pod will be explained in the following with reference to the drawings.

Figure 87A:
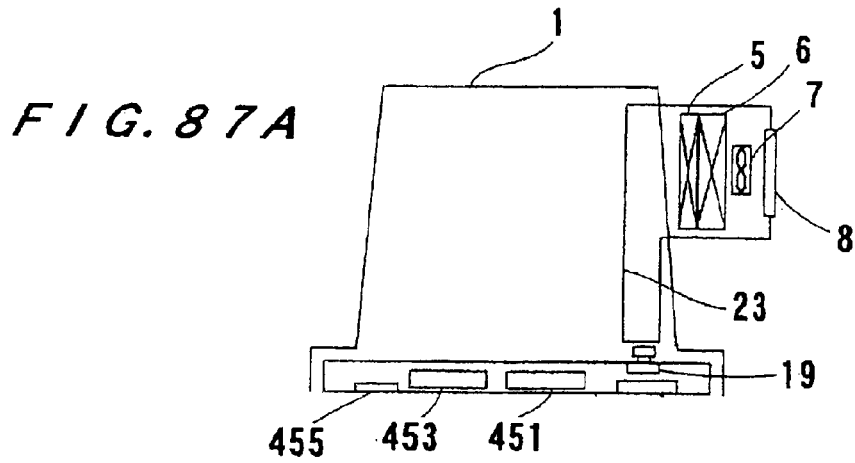
FIGS. 87A, 87B and 87C are diagrams showing a transport state, seated state and door descended state of the substrate transport pods.
Figure 87B:
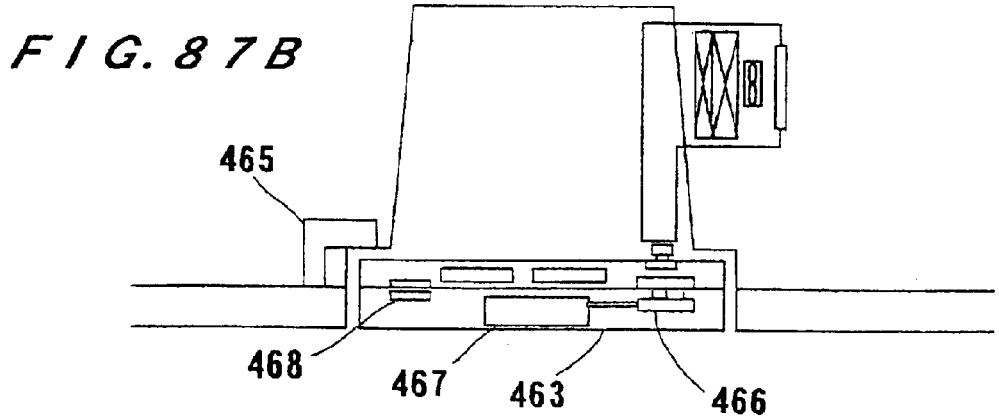
Figure 87C:
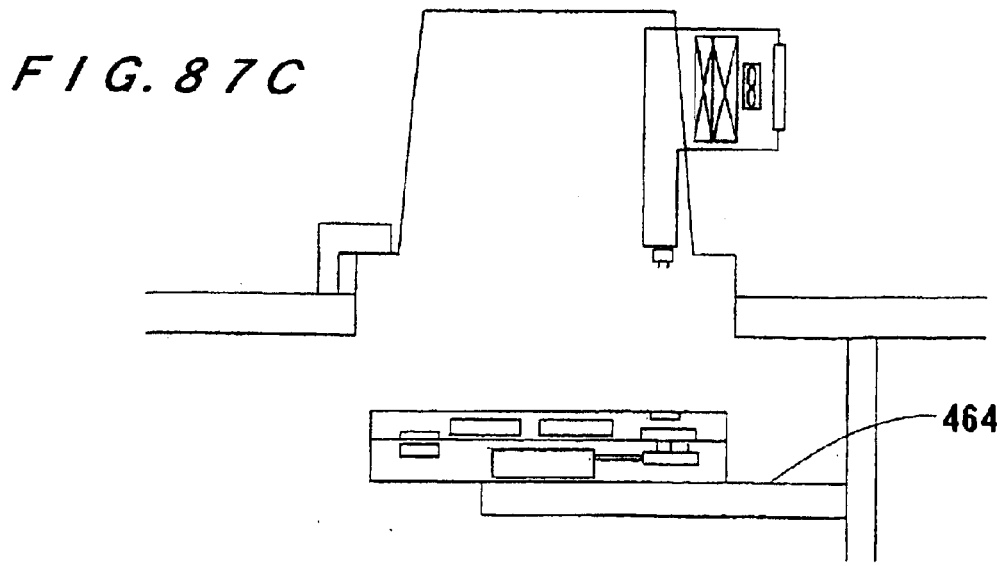

FIGS. 87A, 87B and 87C will be used to explain the process of powering the substrate transport pod, having an air cleaning apparatus, comprised by: a pod main body 1; a secondary battery 451; an operational control board 453; a power input terminal 454; a door 2 having reaction plate 455 housed internally or attached; a particle filter 5, a gaseous contaminants filter 6; a dehumidifier 8; an air circulation apparatus 7; a flow control plate 23; and a connection terminal 19. The power input apparatus for powering the substrate transport pod is comprised by: a port door 463; a port door moving apparatus 464; a pod fixation arm 465; a power input terminal 466; a power input terminal moving mechanism 467; a pod identifier sensor 468 and others. The apparatus having the powering capability includes, for example, door operating apparatus, storage depot, storage shelf, transport apparatus such as AGV, RGV, PGV, OHS and others; and inspection apparatus. When the substrate transport pod is seated on the power input apparatus, the pod is fixed in position by means of the pod fixation arm 465 and, at the same time, the pod identifier sensor 468 detects whether or not power input is necessary, and when it is determined by the dedicated reaction plate that power input is required, power is input. It is permissible to confirm, during the initial stage of powering, that the terminal on the pod-side and terminal on the power side are correctly in contact for proper conduction. The combination of filter and dehumidifier to be mounted may be altered suitably. Also, the flow control plate 23 may be omitted. In the case of the substrate transport pod having the door on the side surface of the pod, the reaction plate and reaction seal may be disposed on the pod bottom section.

FIGS. 88A, 88B and 88C will be used to explain the process of powering the substrate transport pod, having an air cleaning apparatus, comprised by: a pod main body 1; a door 2 having a reaction plate or reaction seal 455 and a door open/close detection sensor 469 housed internally or attached; a particle filter 5, a gaseous contaminants filter 6; a dehumidifier 8; an air blower 9; a flow control plate 23; a secondary battery 9; an operation control board 453; a power input terminal 454; and a door open/close sensor. The door open/close sensor 469 is provided for sensing the status of the door and adjusting the operation of the fan motor and/or dehumidifier. When the door is in the open state, to prevent inflow of contaminated air in the outer environment of the pod, the operation may be stopped or the rotational speed of the fan is reduced, for example Instead of detecting the door status, it is permissible to adjust the operation of the air cleaning apparatus by detecting whether or not the cassette and/or wafers are present inside the pod. Or, the power input apparatus for powering the substrate transport pod is comprised by: a port door 463; a port door moving apparatus 464; a pod fixation arm 465; a power input terminal 466; a power input terminal moving apparatus 467; a pod identifier sensor 468 and the like. The apparatus having the powering capability includes, for example, door operating apparatus, storage depot, storage shelf, transport apparatus such as AGV, RGV, PGV, OHS and others; and inspection apparatus. When the substrate transport pod is seated on the power input apparatus, the pod is fixed in position by means of the pod fixation arm 465 and, at the same time, the pod identifier sensor 468 detects whether or not power input is necessary, and when it is determined by the dedicated reaction plate or by the reaction seal that power input is required, power is input. It is permissible to confirm, during the initial stage of powering, that the terminal on the pod-side and terminal on the power side are correctly in contact for proper conduction. The combination of filter and dehumidifier to be mounted may be altered suitably. Also, the flow control plate 23 may be omitted. In the case of the substrate transport pod having the door on the side surface of the pod, the reaction plate and reaction seal may be disposed on the pod bottom section.

Figure 89A:
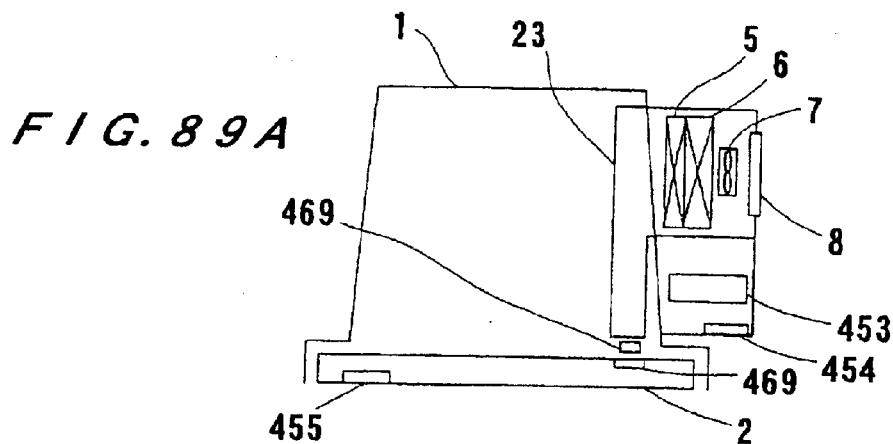
FIGS. 89A, 89B and 89C are diagrams of another variation of the example shown in FIG. 87.
Figure 89B:
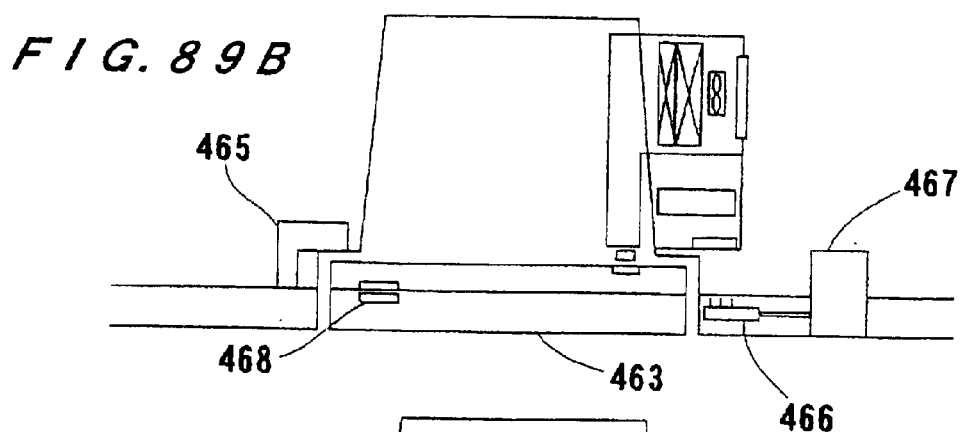
Figure 89C:
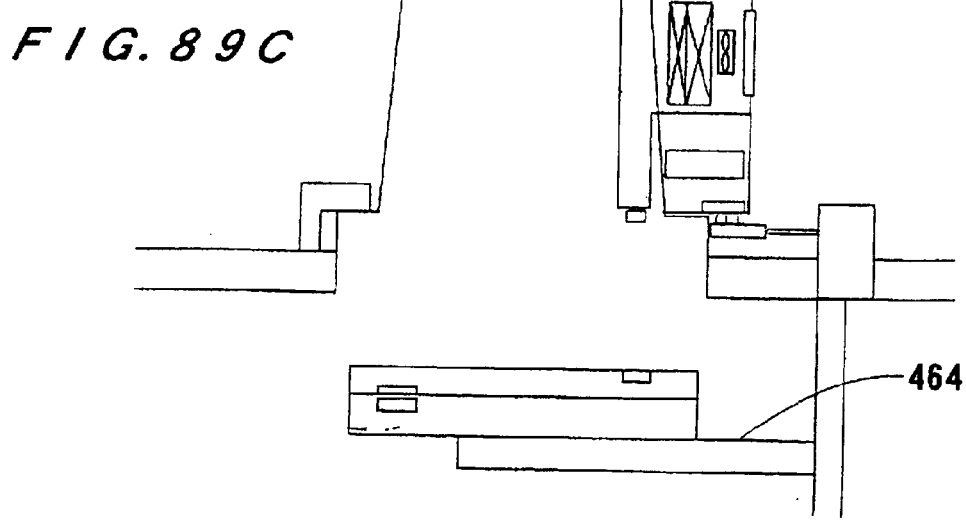

FIGS. 89A, 89B and 89C show, respectively, the pod in the transport state, seating state and door descended state. The diagrams explain the process of powering a substrate transport pod, having an air cleaning apparatus, comprised by: a pod main body 1; a door 2 having a reaction plate or reaction seal 455, a door open/close detection sensor 469, a gas supply port 470, and a gas exhaust port 471 housed internally or attached; and an air cleaning unit having a particle filter 5, a gaseous contaminants filter 6, a dehumidifier 8, an air blower 7, a flow control plate 23, an operation control board 453, a power input terminal 454, and a door open/close sensor. The door open/close sensor is provided for sensing the status of the door and adjusting the operation of the fan motor and/or dehumidifier. When the door is in the open state, to prevent inflow of contaminated air in the outer environment of the pod, the operation may be stopped or the rotational speed of the fan is reduced, for example. Instead of detecting the door status, it is permissible to adjust the operation of the air cleaning apparatus by detecting whether or not the cassette and/or wafers are present inside the pod. The gas supply port 470 and the gas exhaust port 471 is provided with a check valve and a particle filter respectively, and further may be provided with a gas contaminants removing media.

The power input apparatus for powering the substrate transport pod is comprised by: a port door 463; a port door moving apparatus 464; a pod fixation arm 465; a power input terminal 466; a power input terminal moving apparatus 467; a pod identifier sensor 468. The apparatus having the powering capability includes, for example, door operating apparatus, storage depot, storage shelf, transport apparatus such as AGV, RGV, PGV, OHS and others; and inspection apparatus. When the substrate transport pod is seated on the power input apparatus, the pod is fixed in position by means of the pod fixation arm 465 and, at the same time, the pod identifier sensor 468 detects whether or not power input is necessary, and when it is determined by the dedicated reaction plate or by the reaction seal that power input is required, power is input. It is permissible to confirm, during the initial stage of powering, that the terminal on the pod-side and terminal on the power side are correctly in contact for proper conduction. The combination of filter and dehumidifier to be mounted may be altered suitably. Also, the flow control plate 23 may be omitted. In the case of the substrate transport pod having the door on the pod-side, the reaction plate and reaction seal may be disposed on the pod bottom section.

Figure 90A:
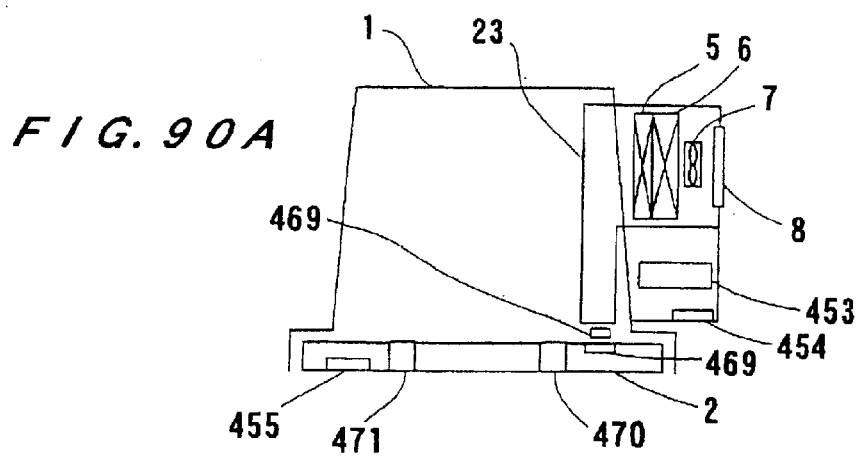
FIGS. 90A, 90B and 90C are diagrams of still another variation of the example shown in FIG. 87.
Figure 90B:
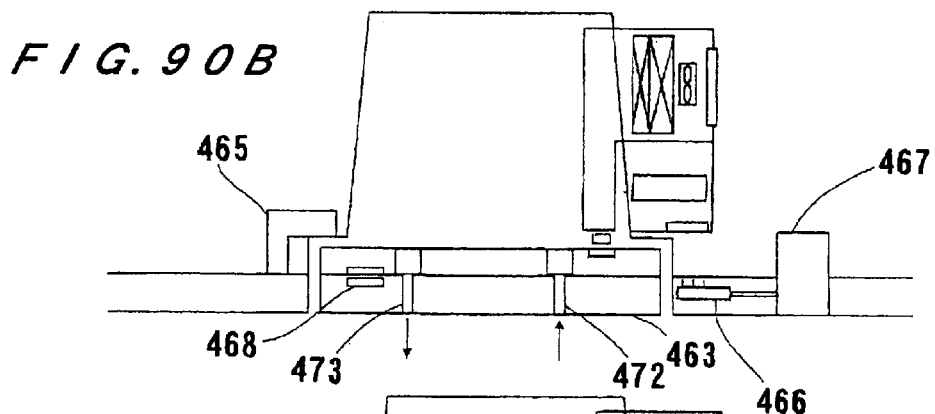
Figure 90C:
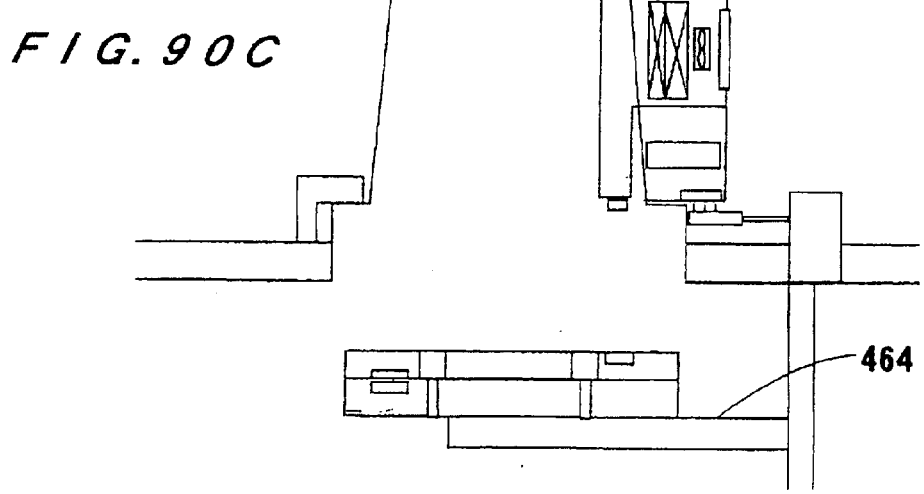

FIGS. 90A, 90B and 90C show, respectively, the pod in the transport state, seating state and door descended state. The diagrams explain the process of powering a substrate transport pod, having an air cleaning apparatus, comprised by: a pod main body 1; a door 2 having a reaction plate or reaction seal 455, a door open/close detection sensor 469, a gas intake opening 470, and a gas discharge opening 471 housed internally or attached; a particle filter 5, a gaseous contaminants filter 6; a dehumidifier 8; an air blower 7; a flow control plate 23; an operation control board 453; a power input terminal 454; and a door open/close sensor 469. The door open/close sensor 469 is provided for sensing the status of the door and adjusting the operation of the fan motor and/or dehumidifier. When the door is in the open state, to prevent inflow of contaminated air in the outer environment of the pod, the operation may be stopped or the rotational speed of the fan is reduced, for example. Instead of detecting the door status, it is permissible to adjust the operation of the air cleaning apparatus by detecting whether or not the cassette and/or wafers are present inside the pod. The gas intake opening 470 and the gas discharge opening 471 are provided with internal one-way valve and the particle filter, but it may be filled with the gaseous contaminants filter medium.

The power input apparatus for powering the substrate transport pod is comprised by: a port door 463, a port door moving apparatus 464; a pod fixation arm 465; a power input terminal 466; a power input terminal moving apparatus 467; a pod identifier sensor 468 and a gas intake pipe 472 and a gas discharge pipe 473 for gas replacement by linking with the gas intake opening 470 and the gas discharge opening 471. The apparatus having the powering capability includes, for example, door operating apparatus, storage depot, storage shelf, transport apparatus such as AGV, RGV, PGV, OHS and others; and inspection apparatus. When the substrate transport pod is seated on the power input apparatus, the pod is fixed in position by means of the pod fixation arm 465 and, at the same time, the pod identifier sensor 468 detects whether or not power input is necessary, and when it is determined by the dedicated reaction plate or by the reaction seal that power input is required, power is input. It is permissible to confirm, during the initial stage of powering, that the terminal on the pod-side and terminal on the power side are correctly in contact for proper conduction. When transporting the wafers inside the pod or clear the process, the interior atmosphere may be replaced with nitrogen gas by utilizing the gas intake pipe 472, gas intake opening 470, gas discharge opening 471 and the gas discharge pipe 473. The combination of filter and dehumidifier to be mounted may be altered suitably. Also, the flow control plate 23 may be omitted. In the case of the substrate transport pod having the door on the side surface of the pod, the reaction plate and reaction seal may be disposed on the pod bottom section. The gas intake opening and gas discharge opening may be disposed on the pod main body side.

Figure 91:
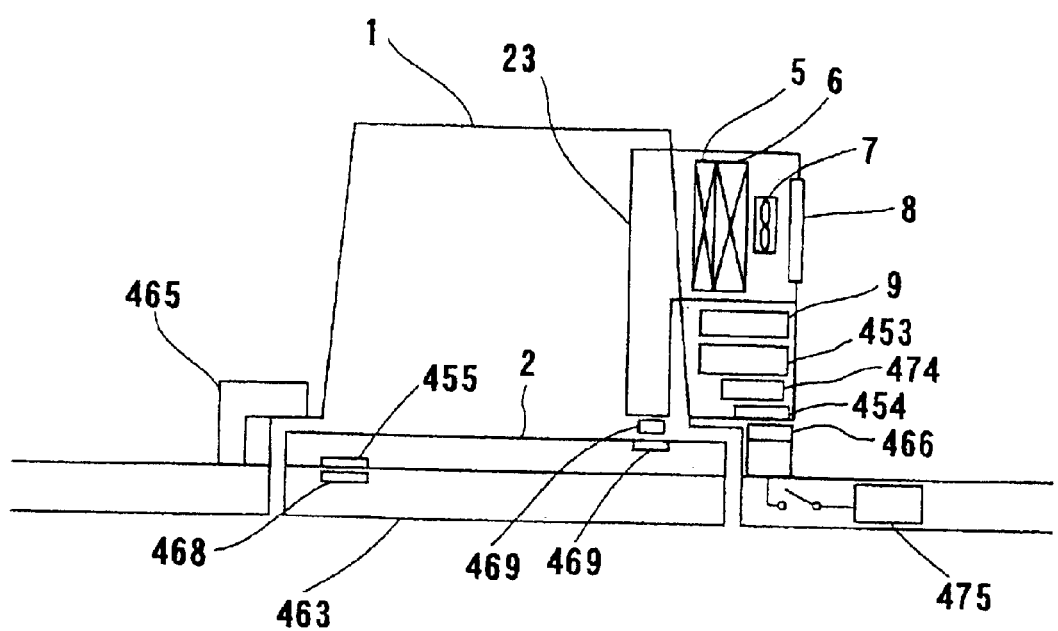
FIG. 91 is a diagram of a substrate transport pod seated on a power input apparatus.

FIG. 91 shows the process of powering a substrate transport pod, having an air cleaning apparatus, comprised by: a pod main body 1; a door 2 having a door open/close detection sensor 469 housed internally or attached; a particle filter 5, a gaseous contaminants filter 6, a dehumidifier 8; an air blower 7; a flow control plate 23; a secondary battery 9; an operation control board 453; a power input terminal 454; and a rectifier 474. The door open/close sensor 469 is provided for sensing the status of the door and adjusting the operation of the fan motor and/or dehumidifier. When the door is in the open state, to prevent inflow of contaminated air in the outer environment of the pod, the operation may be stopped or the rotational speed of the fan is reduced, for example. Instead of detecting the door status, it is permissible to adjust the operation of the air cleaning apparatus by detecting whether or not the cassette and/or wafers are present inside the pod. The power input apparatus for powering the substrate transport pod is comprised by: a port door 463; a pod fixation arm 465; a power input terminal 466; a power control board 475 and the like. The apparatus having the powering capability includes, for example, door operating apparatus, storage depot, storage shelf, transport apparatus such as AGV, RGV, PGV, OHS and others; and inspection apparatus. When the substrate transport pod is seated on the power input apparatus, the pod is fixed in position by means of the pod fixation arm 465. It is permissible to supply power by adding a pod identifier sensor and a reaction plate, and detecting whether or not power input is necessary, and when it is determined by the dedicated reaction plate or by the reaction seal that power input is required, power is input. This embodiment relates to a non-contact type powering system, and the power receiving terminal is wire, coil or core. The power input terminal is also wire, coil or core. The rectifier 474 is a device for converting the alternating current received from the power input terminal 454 to the direct current. The combination of filter and dehumidifier to be mounted may be altered suitably. Also, the flow control plate 23 may be omitted.

Figure 92:
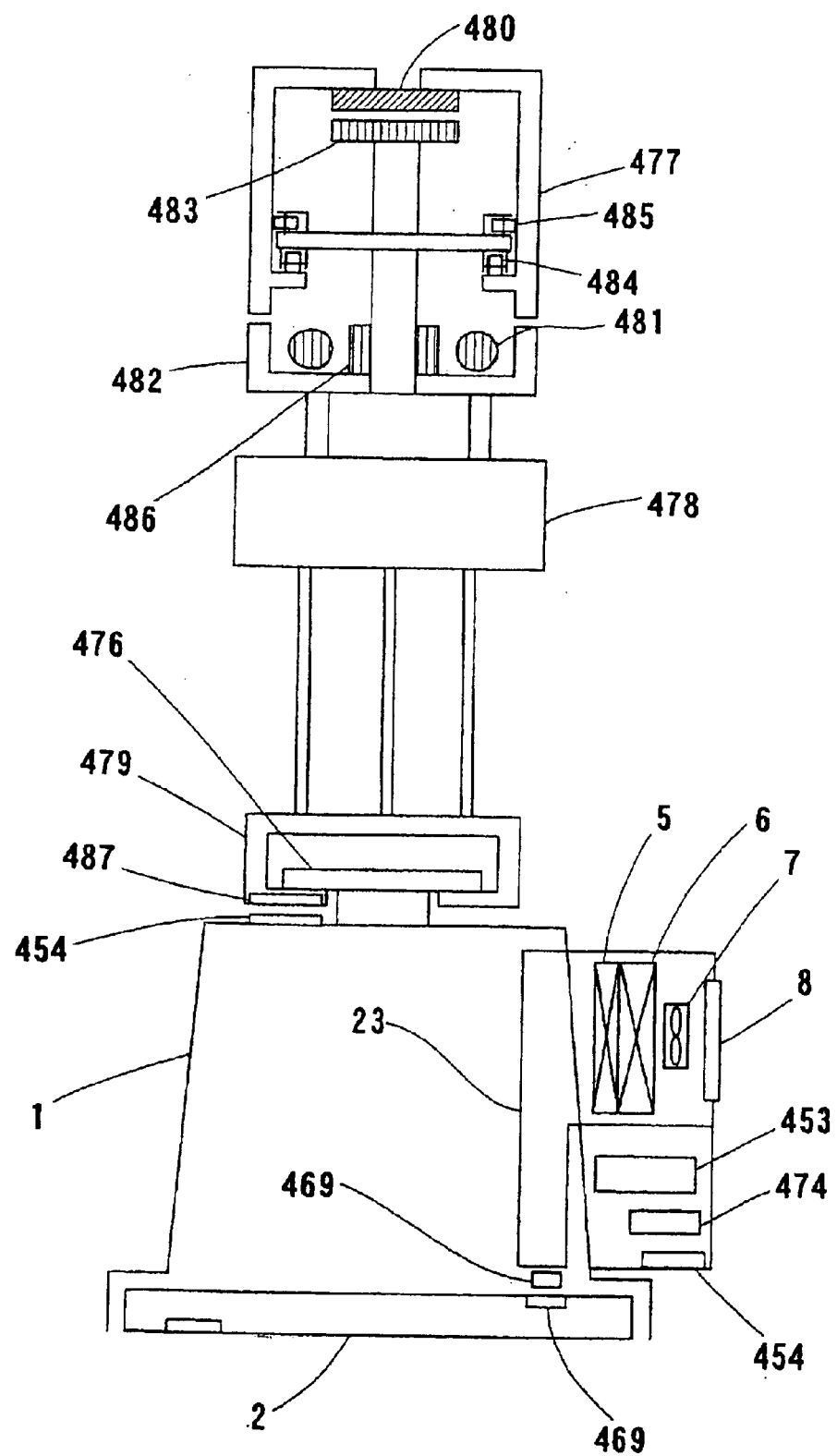
FIG. 92 is a diagram to show a pod transported by OHT, and is being powered.

FIG. 92 shows the process of powering a substrate transport pod, having an air cleaning apparatus, comprised by: a pod main body 1; a robot holding means 476; a door 2 having a door open/close detection sensor 469 housed internally or attached; a particle filter 5, a gaseous contaminants filter 6; a dehumidifier 8; an air blower 7; a flow control plate 23; an operation control board 453; a power input terminal (coil) 454; and a rectifier 474. The power input apparatus for the substrate transport pod having the air cleaning apparatus is a ceiling-based transport apparatus such as OHT. As shown in FIG. 93, OHT is comprised by a guide rail 477 affixed to the ceiling; a hoist 478, and a handling arm 479, and its forward thrust is generally provided by a linear motor. The guide rail has at least a magnetic body 480 and powering line 481. The moving body 482 has a primary coil 483, wheels 484 for supporting the vertical load; wheels 485 for supporting the horizontal load, and a moving-side powering coil 486. The handling arm 479 has a powering coil 487, and the current flows via the power input coil on the moving-side powering coil through the power input line 481, such that a portion of the input power is used for forward thrust power, and a portion is used for the hoist winding power, and the current flows from the powering coil 487 of the handling arm to the pod-side receiving coil 454, and the alternating current is rectified in the rectifier 474, and is further converted to a desired voltage to operate the fan motor and/or dehumidifier.

It is permissible to supply power by adding a pod identifier sensor and a reaction plate, and detecting whether or not power input is necessary, and when it is determined by the dedicated reaction plate or by the reaction seal that power input is required, power is input. The combination of filter and dehumidifier to be mounted may be suitably altered. Also, the flow control plate 23 may be omitted.

Instead of the door open/close detection sensor, a sensor to detect the presence of a cassette may be attached. The attachment location of the sensor may be chosen anywhere, for example, a bottom section, side surface, upper surface or front surface of the cassette. Methods for cassette detection include mechanical sensors, photo-electric sensors, magnetic sensors, and proximity sensors, but non-contact type sensors that do not touch the cassette are preferable.

Next, an information management system of the substrate transport pod will be explained with reference to FIGS. 94 to 99. In this embodiment, the substrate transport pod 1 is provided with data storage means 700 for storing information on contents housed inside the pod such as wafer and the like. Information on wafers stored inside refers to such data as the number of wafers, processing status, processing procedure and lot identification ID, but if the contents are masks, information relates to such objects.

Figure 94:
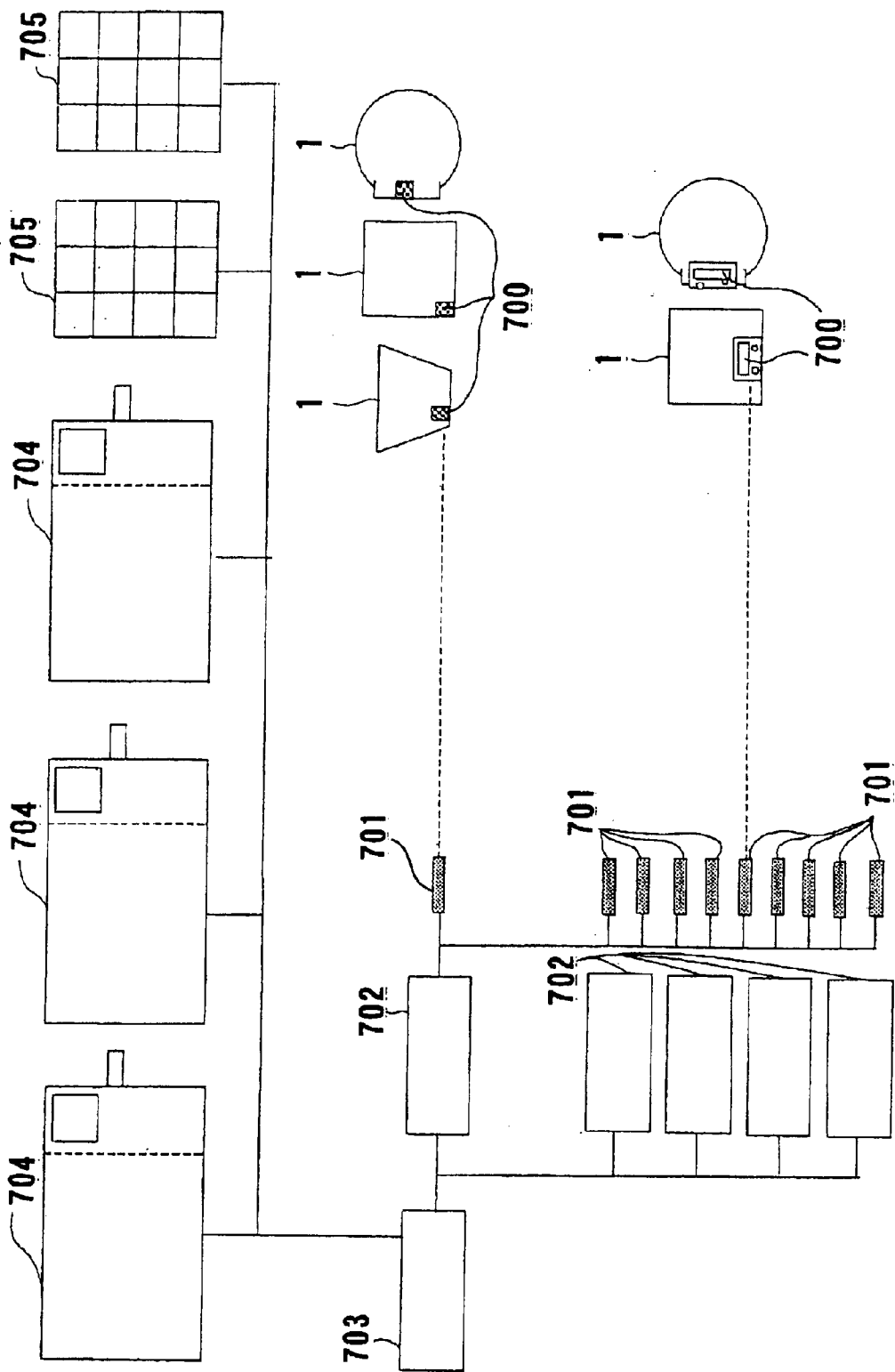
FIG. 94 is a diagram of an information management system for substrate transport pods.

FIG. 94 shows a system for use in the centralized management method. A communication antenna 701 is placed in a location for which information is required, and information arriving in the data storage means at this location is forwarded to the host computer 703 through a controller 702. The control section for the various on-site manufacturing-apparatuses 704 and the stocker 705 for pod storage is also linked to the host computer, and the information on the wafers housed in the interior of the pod 1 is instantly confirmed, and the control section for a manufacturing apparatus instructs to perform processing exactly as the information stored inside the pod 1. When the processing is completed, such information is newly recorded in the data storage means 700, and the pod 1 is transported to the next apparatus by an automatic transport tool (for example, AGV and the like) instructed by the host computer.

Figure 95:
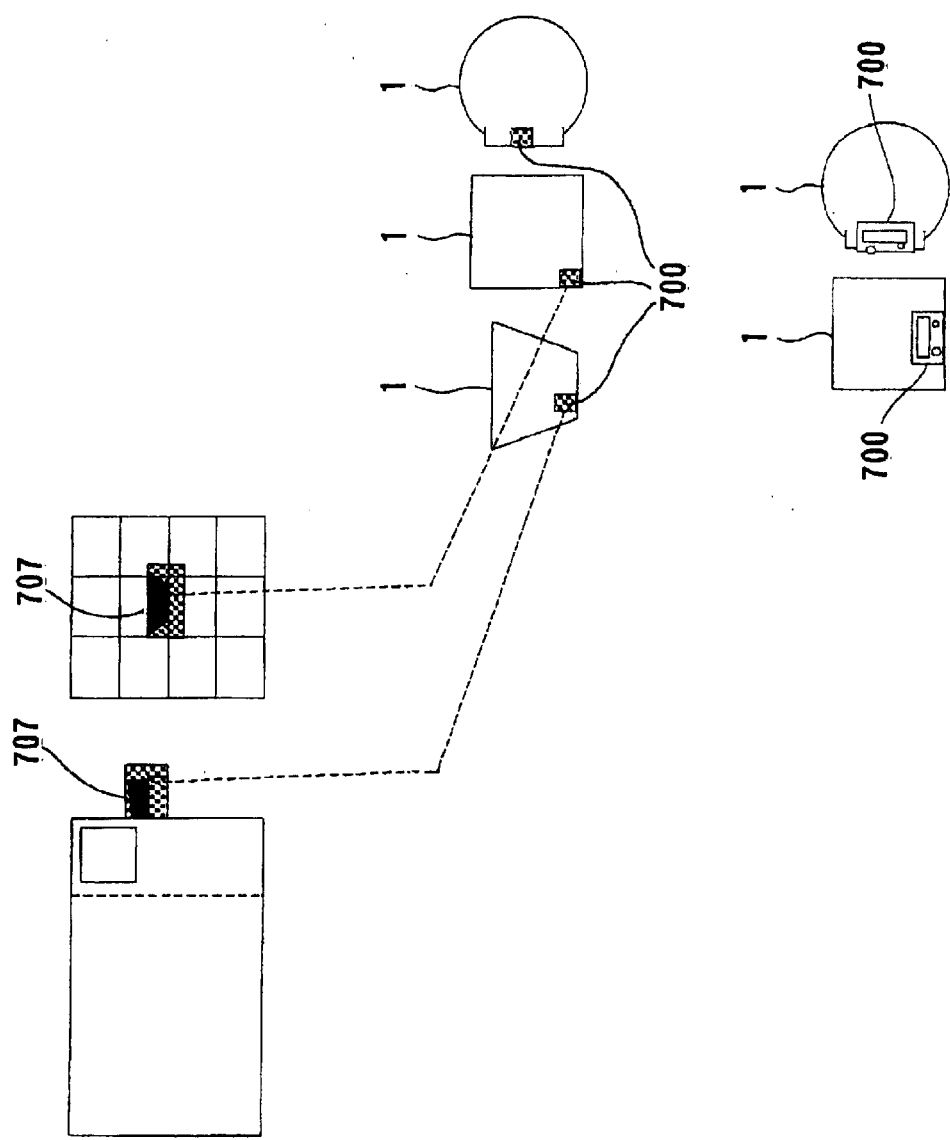
FIG. 95 is a diagram to explain an information holding apparatus attached to the pod side of the system shown in FIG. 94.

FIG. 95 shows a system for use in the on-site management method. The site is provided with interface module 707 for use in reading and writing information in information storage means 700 provided for the pod 1. Information storage means 700 is a data memory means for memorizing information on an object whose carrier, pod and other information are to be managed. Also, storage means 700a is able to read the information in the memory on-site. Accordingly, it is also possible to confirm or overwrite the information on the contents, such as wafers, stored inside the pod, on-site without the intervention of the host computer.

Figure 96:
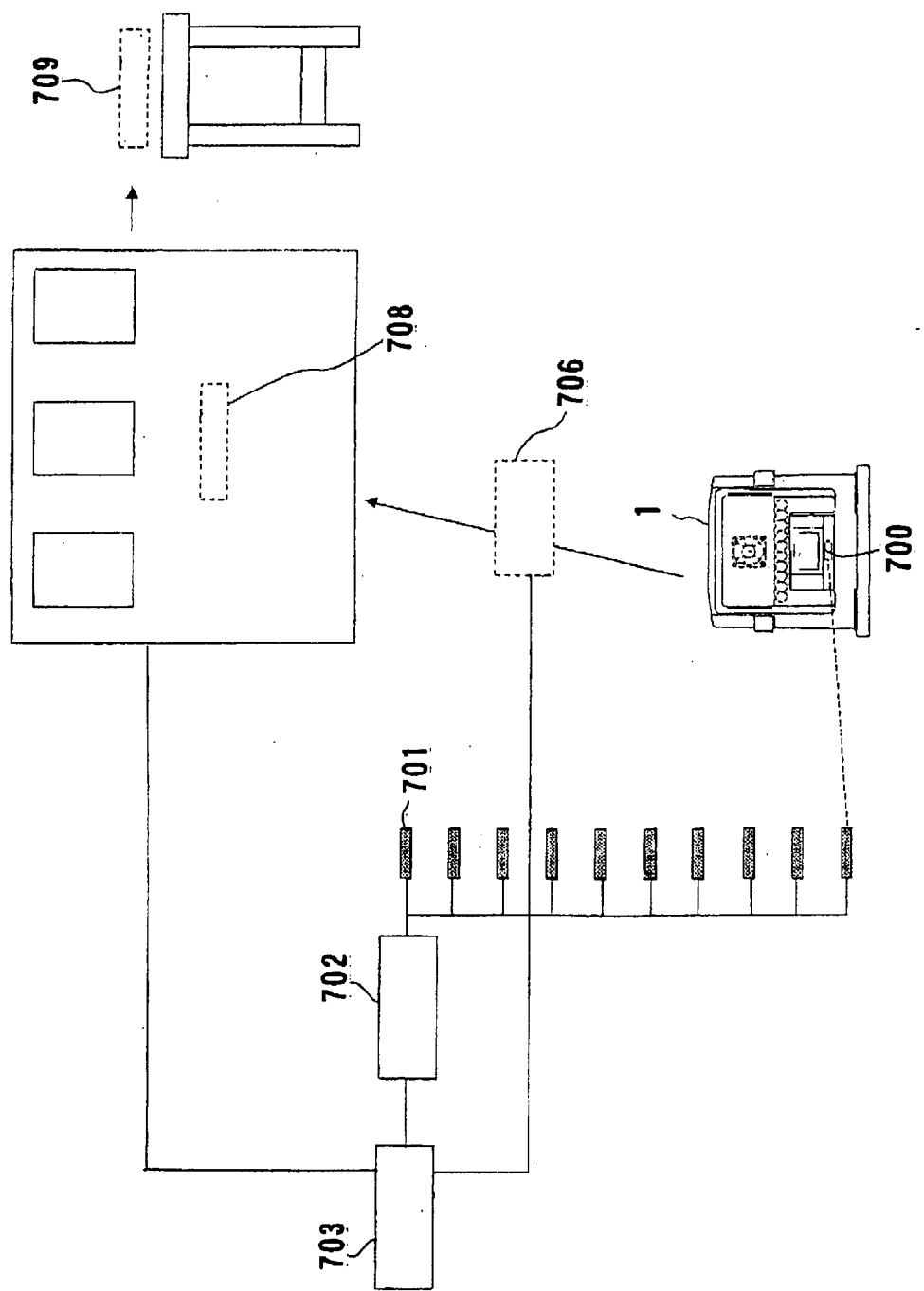
FIG. 96 is a diagram of a management system in managing washing events and filter exchange events.

Next, with reference to FIG. 96, a management system for managing information on filter service life and pod cleaning will be explained. The substrate transport pod 1 is provided with data storage means 700 for accumulating the cumulative operation time $\gamma$ of the driving section for managing the information on filter service life and pod cleaning frequency. This storage means 700 may be provided with computation means. It is obvious that a common storage medium should be used for the data storage means of the pod and for the data storage means for accumulating information on the contents stored inside the pod.

In the computation element, computed information is stored in the data storage means 700 so that the pod is washed when the cumulative operation time $\gamma$ exceeds a certain value and the filter is exchanged when a certain value is exceeded. This information is sent from the host computer 703 to the AGV 706 and the pod washing machine 708 to enable the pod to be washed or filter 709 to be exchanged. For example:

γ=480 hours for washing

γ=7200 hours for filter exchange

It is obvious that, in the case of the on-site management system, the operator can be notified by displaying information regarding filter exchange and pod washing.

In another example of the management system, in order to increase the accuracy of filter service life management, the pod 1 is provided with data storage means 700 for accumulating the processed gas volume α per unit time and the cumulative operation time γ. This device may have computation means. It is preferable that a common storage medium should be used for the data storage means of the pod and for the data storage means for accumulating information on the contents stored inside the pod.

The computation means stores computation results so that the pod will be washed when the cumulative operation time γ exceeds a certain duration, and so that the filter will be changed when a product of the processed gas volume a per unit time and the cumulative operation time γ exceeds a certain value X, for example:

γ=480 hours for washing $\alpha(NH_3\text{-mg/h}) \times \gamma(\text{hours}) = X(NH_3\text{-mg})$ for filter change In the case of a central management system, this information is forwarded from the host computer to AGV 706 and pod washing machine 708 to enable to confirm the need for pod cleaning and filter exchange. It is obvious that, in the case of on-site management system, the operator can be notified by displaying information regarding filter exchange and pod washing.

In still another management system, in order to improve the accuracy of filter service life management, the substrate transport pod is provided with a gas sensor, and has a data storage means for accumulating the processed gas volume β per unit time obtained from the results of sensor measurements and the cumulative operation time γ of the drive section, and a computation element may also be provided. It is obvious that a common storage medium should be used for the data storage means of the pod and for the data storage means for accumulating information on the contents stored inside the pod.

The gas sensor may include a color indicating monitor, a semiconductor sensor and a quartz oscillator sensor, but it is not necessary to be limited to these methods. In the computation element, computed results information is stored in the data storage means that indicates washing is needed when a pre-determined value of cumulative operation time γ of the drive section is exceeded. For example, γ=480 hours for washing, β=monitored value $(NH_3\text{-mg})\div$measuring duration in hours, and $\beta\times\gamma=X (NH_3\text{-mg})$ for filter change.

Processed gas volume β per unit time is computed using the indicated value of the gas sensor and the measuring duration, which is stored in the data storage means. For the centralized management system, various pieces of information are sent from the host computer to AGV and pod washing machine to enable pod washing and filter change. It is also possible, in the case of the on-site management system, to display information on filter change and pod washing on a display section to notify the operator.

Further, in order to operate the entire system smoothly, it is preferable that the computation element on the pod-side has a timing mechanism and data storage means for accumulating malfunction information of the drive parts. For example:

| | |
|---|---|
| γ = 480 hours for washing, | 2000/12/31/12:00, |
| | 2001/01/30/00:00, |
| | 2001/02/28/20:00, |
| α ($NH_3$-mg/h) × γ (hours) = X($NH_3$-mg) for filter change, | |
| | 2000/01/25/08:00, |
| | 2001/10/10/12:00, and |
| fan stop | 2001/12/31/12:00. |

By providing a timing mechanism on the substrate transport pod 1 itself, it is possible to provide some estimate of the frequency of need for cleaning, change the filter, and malfunction of drive parts, and such data are extremely effective for operational purposes. Also, even if malfunction of drive parts occurs during transport of substrates, the search time for a rejection lot is shortened because priority inspection can be provided for the processes that follows such a breakdown.

With reference to the flowchart for the wiring process in FIG. 76, an example of operation of the information management system for substrate transport pod will be explained in the case of using a common medium for the data storage medium to store environment control information for the pod (pod data) and lot history (contents data).

When insulation film forming processing is completed, process completion information is newly entered in the data storage means. Also, receiving pre-stored or externally input information on environmental control during the period for the pod to reach its next processing, the electrical drive section is operated in such a way that moisture and organic control are prioritized for suppressing formation of oxidation film. For example, a plurality of dehumidifying units is operated and the fan is operated continually or intermittently. Also, transport to the target apparatus for resist coating (coater) is carried out by means of automated transport tool (for example, AGV) 706 that received instruction from the host computer. When the pod reaches the target coater, the matching of the coater recipe and processing requirements for the pod content is checked, and processing is carried out only when matching is confirmed.

When resist coating, exposure and development are continuously performed in the interface section, the pod is not used, and therefore, environmental control information may be blank during the period of transport between development to etching processes, but if an emergency situation arises relating to apparatus problems and the like, the memory contents need to be stored in the pod in such a way that instructions are externally entered into the data storage means to operate the electrical drive section to prioritize control of base substances in the environmental control so as to suppress the T-top formation. For example, the dehumidifying units are stopped or only one unit is operated and the fan is operated continually or intermittently. Procedures for lot history (contents information) manufacturing apparatus, and communication of transport apparatus are the same, and therefore, the following process describes only the environmental control aspects.

During transport between the developing apparatus and the etching apparatus, base substance control need not be prioritized to the extent required between the processes of photo-resist coating, exposure and development. When a metal film forming process is performed by etching, asher and CVD, environmental control is not necessary because the processes are carried out on whole substrates in a vacuum using a multi-chamber such as cluster tool and the like. However, when a metal film forming process involves etching, asher and electro-plating, or when processing cannot be carried out on whole substrates due to malfunction of multi-chambers and the like, or chemical contamination of the insulation film after etching on the side wall of the groove is a problem, transport from the etching apparatus to the metal film forming apparatus is carried out using a substrate transport pod having a chemical filter in addition to a dehumidifying agent or a dehumidifier. In such a case, priority controls are performed for all or some of moisture, acid and organic substances.

Further, when transporting copper-coated silicon wafers in the pod from the metal film forming apparatus such as CVD and electro-plating apparatus to the CMP apparatus, by way of the annealing apparatus, further to coater, and to the insulation film forming apparatus such as CVD apparatus, growth of oxidation film can be prevented by providing dehumidifying means such as the dehumidifier or dehumidifying agent inside the pod to control its humidity. In such a case, it is preferable to control to dehumidify inside the pod to less than 10%, or more preferably to less than 5%. To prevent the growth of even slightest oxide film, it is preferable to lower to dehumidify to a specific value within 10 minutes of opening the door 2, or more preferably, within 3 minutes. The electrical drive section is operated to control moisture and organic substances, in particular, priority should be given to controlling the humidity. For example, a plurality of dehumidifying units is operated and the fan is operated continually or intermittently.

Next, another example of the information management system for the substrate transport pod will be explained. This substrate transport pod, as described above, is provided with computation element, memory element and computation processing unit 558 (refer to FIGS. 34A and 34B) having data input/output means. The computation processing unit stores information not only on cumulative operation time of electrical drive section parts such as fan motor or dehumidifying unit, malfunction information, and information on pod itself such as residual voltage of the secondary battery, but also stores information on externally-input information on the amount of processed gas per unit time, operational protocol for electrical drive parts, voltage target for charging and lot process history management. Of course, when the gas sensor is provided inside the pod, it is possible to compute and store actual measured value of the contaminated gas volume, not as pre-determined data. Here, as described in the following, the particle filter, gaseous contaminants filter 6, and fan motor may be used singly or in combination, and their attachment location and properties may be different depending on the process to be applied.

The substrate transport pod having contaminants removal means uses particle filter to remove particulate and metallic contaminants, and uses gaseous contaminants filter to remove ionic and organic contaminants. Also, moisture is removed by using dehumidifying means based on solid polymer electrolytic film for decomposing water or by using dehumidifying agent. There are various target substances to be removed from the interior of the substrate transport pod, as described above, but the target composition for removal is different in each process so that it is not necessary to mount all the means for removing contaminants in the pod. For example, for storage of exposed substrates inside the pod, it is sufficient if a pod has specialized capabilities for removing particulate contaminants and base substances.

Also, after forming metallic film on semiconductor substrates, it is sufficient if a pod has specialized capabilities for removing particulate contaminants, organic contaminants and moisture. On the other hand, for storing exposed semiconductor substrates in the pod, the pod should have specialized capability for removing particle contaminants and chloride contaminants. Also, semiconductor substrates that have been processed with metal film, the pod should have specialized capability for removing particle contaminants, organic contaminants and moisture. On the other hand, for storing washed semiconductor substrates inside the pod, the target substances to be removed depend on the nature of the succeeding process. Further, it is anticipated that new materials will be adopted in the field of film forming, and it is said that adoption of such new materials is largely affected by whether environmental control for the new material is possible or not.

On the other hand, in some processes, filter service life is shortened by the release of large amounts of gases from the processed semiconductor substrates. Examples are found in degassing from organic solvents and the like brought into the pod during the exposure process. It can be anticipated that filter service life can be shortened when one pod is used for one process as in the conventional approach because of needless cleaning of the interior environment of the pod in some processes, so that the filter is no longer capable of performance in processes that require high degree of cleanliness. However, by adopting the present method of using the substrate transport pod, that is, by transporting the substrate in a pod having only those contaminants removal means customized for the processes being applied to the substrates, only those targeted contaminants relevant to the processes under consideration are removed effectively.

When the operation is based on a substrate lot being transported in a given substrate transport pod on a one-to-one basis as in the conventional method, types and concentrations of the contaminant-gases brought into the interior of the pod and types and target levels of the gases to be removed are different in every process, and it is difficult to manage whether the cleaning functions are being sustained sufficiently. However, when the substrates are transported between each process in pods having contaminant removal means, the target gas types and the amount of gas generated are clearly known for each process. For this reason, it is preferable to pre-measure the amount of gas processed per unit time α during storage of the semiconductor wafers for each process, and to determine the need for changing the filter according to whether or not a threshold value, stored in the data storage means, has been reached, where the threshold value is given by a product of the measured value of processed gas volume a and the cumulative operation time γ of a drive part. Similarly, by pre-determining the frequency of washing the pod for each process, the need to wash a pod can be determined from the cumulative operation time γ of the drive part.

When the operation is based on a substrate lot being transported in a given substrate transport pod on a one-to-one basis as in the conventional method, types and concentrations of the contaminant gases brought into the interior of the pod and types and target levels of the gases to be removed are different in every process, and even if the gas level inside the pod is measured with a gas sensor, it is necessary to provide a sensor for each type of gas, so that this approach is not realistic. However, when a pod having suitable contaminant removal means is used for return transport of substrates between processes, the target gas types are known clearly for each process. For this reason, only sensors dedicated to the targeted gas species need to be mounted. Then, by determining the gas processed amount per unit time β by a filter according to measured results by the sensor, it is possible determine the need for washing the pod, according to whether or not a threshold value, stored in the data storage means, has been reached, where the threshold value is given by a product of the processed gas amount per unit time β and the cumulative operation time γ of a drive part. Similarly, by pre-determining the frequency of washing the pod for each process, the need to wash a pod can be determined from the cumulative operation time γ of the drive part.

Specific examples of selection of contaminant removal means and service life of the filters will be described in the following. For example, focusing on a case of the exposure process, the target contaminants for removal are particulate contaminants and base gases that can be found in the pod after processing, and it is not necessary to have removal capabilities for organic contaminants and moisture. Moreover, the exposure process uses a large quantity of organic substances such as photo-resist solvents, so that the filter service life is shortened if organic substance filter is used. Further, because the performance of base substance removal filter depends on humidity, so that if moisture removal is also used, service life of the base substance removal filter is shortened. When the pod is used as a dedicated transport apparatus having only the required filtering functions and unnecessary filtering functions are deleted, the filter is loaded only with particles entering from the clean-room environment when the substrate transport door is opened, and base gas substances. Therefore, the filter need not be changed until the guarantee periods are expired.

Similarly, taking an example of metal film forming process for Cu, the target contaminants for removal are primarily particulate contaminants, organic contaminants and moisture. There is no need for active removal of ionic contaminants. There is very little emission of target gases to be removed from the processed substrates, and therefore, in the dedicated pod operation, the filter is loaded with particles entering from the clean-room environment when the substrate transport door is opened and with organic contaminants.

Although the details regarding other processes will not be described here, in any operation according to the present method, when the pods having contaminant removal means are used to transport substrates back and forth between the processes, filters need not be changed until the guarantee periods are expired.

Table 1 shows an example of comparing the filter lives when used in the conventional one-to-one method and in the present process-specific pod method. In the method based on one-to-one correspondence of pod and substrate lot, service life of filter is shortened in some processes for which cleaning is superfluous, resulting that the degree of cleanliness required cannot be sustained for the process that requires it, so that the filter must be changed. However, by adopting the present method, that is, by transporting the substrates using substrate transport pods having contaminants removal means matched to the specific needs of each process, cleaning is carried out effectively to remove only those contaminants relevant to the processing of individual processes. The result is that the filter service life is extended while minimizing the contaminants that adhere to the substrates.

TABLE 1

| Process Type | 1:1 Lot-Pod | | Process-Specific Pod |
|---|---|---|---|
| | Filter life | Short life cause | Filter life |
| Exposure | 6 months | Loss of basic gas cleaning capability caused by $NH_3$ contaminations from wash process | Over 2 years* |
| Metal film (Cu) | 6 months | Loss of organic gas cleaning capability caused by organic contaminations from organic coating process | Over 2 years* |
| Metal wiring (Al) | 3 months | Loss of acidic gas cleaning capability caused by acidic contaminations from RIE process | Over 2 years* |
| Washing (→film forming) | 3 months | Loss of organic gas cleaning capability caused by organic contaminations from organic film coating process | Over 2 years* |

*Guarantee period of gaseous contaminants filter

FIG. 100 shows a flowchart for determining the charging times for a secondary battery. A substrate transport pod having the contaminants removal means described above has a fan motor and a drive section for operating the dehumidifying unit, so that it is necessary to carry out charging or powering (charging of secondary battery or powering the drive section). If full charge is maintained by connecting constantly to the powering station disposed in the loading port or fore-shelf of the processing apparatus, the process takes too long to match the cycle timing of the substrates returning from the processing apparatus. Therefore, it is necessary to stop charging when sufficient charges are given to enable to operate the longest interval between the preceding charging and the succeeding charging to meet the process cycle timing of the wafers returning from the apparatus. In this embodiment, the following procedure is used to shorten the charging time to meet the process cycle timing of the wafers returned from the processing apparatus. First, When the substrate transport pod 1 having the contaminants removal means is seated in the powering station 721, the residual voltage ε is measured and charging is started. At the same time, communication is started with the controller 702 of the processing apparatus A through the interface 701. Then, the time duration required by the pod to arrive at the next powering station is computed by obtaining a sum of the clean-room operation time (a sum of transport time, batch matching time, holding time for the operator and apparatus, and maintenance time) and the actual processing time (a sum of theoretical processing time, lot loading/unloading time, time for obtaining conditions for preceding wafers, time required for lot linking and quality control), and multiplying the sum by a factor of safety. That is, Charge level=battery usage duration×power consumption−residual power Battery usage duration=(actual processing time+clean-room operation time)×factor of safety.

Then, charging is carried out only to the extent of the charging to the voltage required ξ. Accordingly, it is possible to reduce the charging time.

The substrate transport pod 1 seated in the powering station 721a disposed in front of the apparatus 704a for process A must be charged sufficiently to enable to operate until it can be charged by the powering station 721b disposed in front of the apparatus 704b for process B. Battery driven operation should last for a period of time computed by obtaining a sum of the duration of actual processing for process A and the duration of clean-room operation (a sum of transport time, batch matching time, waiting time for the operator and apparatus, and maintenance time), and multiplying the sum by a factor of safety. Therefore, the amount of charge to be supplied by the powering station disposed in front of the apparatus for process A is computed by obtaining a product of the battery driving time and the power consumption (different depending on the process recipe for the drive parts) and subtracting the residual batter power. Here, the method of charging includes coupling through plus/minus terminal connections provided on the charging apparatus, non-contact method based on excitation of charging current in the coil of an object for power input, or charging double layer electrical condenser. Also, charging/powering may be carried out from the rail of the transport apparatus (AGV or OHT, for example).

Most of the conventional substrate transport pods having no air cleaning capabilities are almost always based on one-to-one correspondence of substrate lot and pod, and are used for transport of substrates through all the processes. It is thought that this method is chosen because the substrates are subjected to hundreds of processes starting from the bare stage to the product stage, so that it is considered necessary to leave processing history management information for each substrate lot as bar codes or memory information on the pod-side. Also, because the required processing duration is different for each process, there is a high probability that the pods tend to accumulate at particular processes. However, according to the present method based on using the pod specialized for transporting between particular processes only, conventional process management methodology cannot be used as it is. Therefore, by transferring the processing history management information for each lot stored or transported from a pod used in a preceding process to a pod used in a succeeding process, processing history management information for each lot can be carried out as smoothly as in the conventional method of using the substrate transport pods based on the one-to-one method.

FIG. 101 shows a conceptual diagram for network management of substrate transport pods. The substrate transport pod 1 provided with data storage means and computation means mounted on the charging station 721 and receives charge, and at the same time, exchanges information with the data collection server (controller) 725 and the server 703 by way of the hub 723. Information is exchanged with the washing machine 708 in addition to each processing apparatus. The substrate transport pod provided with individual contaminants removal means have identifier ID (for example, reference item 558 in FIGS. 34A and 34B), and it is necessary to manage the following information.

(1) identifier ID
(2) processed amount of gaseous contaminants per unit time $\alpha$.
(3) amount of contaminant gas emitted per unit time $\beta$ obtained by a sensor,
(4) cumulative operation time $\gamma$ of a drive part,
(5) operating condition $\delta$ of a drive part,
(6) residual battery voltage $\epsilon$.
(7) required charged voltage $\xi$.
(8) malfunction information $\eta$ on a drive part and
(9) process management information $\theta$ of a lot.

A computation process unit containing memory element that stores at least the nine such parameters is mounted on the pod, and this information is transmitted when it is seated on a powering station. Also, when the pod is not seated on a powering station, information can be managed through the pods network by exchanging radio signals directly with a data collection PC. Here, because it is presumed that the substrate transport pods are used for transporting between processes, so that, for each process, a given value is normally assigned to parameters such as (2) processed amount of gaseous contaminants per unit time $\alpha$, (5) operating condition $\delta$ of a drive part (7) required charged voltage $\xi$. And, the parameters (3) amount of contaminant gas emitted per unit time $\beta$ obtained by a sensor, (4) cumulative operation time $\gamma$ of a drive part, (6) residual battery voltage $\epsilon$ and (8) malfunction information $\eta$ on a drive part vary chronologically according to individual pods. By reading the contents of individual data stored in the memory elements of individual substrate transport pods from the data collection PC, the states of individual pods can be confirmed remotely by using a network such as the LAN shown in FIG. 101.

That is, it is possible to manage the need for filter change (=value of an interval $\alpha \times \gamma$ to $\beta \times \gamma$), for washing (=value of $\gamma$), or if there is malfunction of pod (=value of $\eta$), to enable to prevent yield drop caused by storing a substrate lot in a pod that does not have sufficient cleaning abilities. Also, when it is necessary to alter the information due to malfunction in the processing apparatus side or changes in the operation condition of a drive part, changes in (2) processed amount of gaseous contaminants per unit time $\alpha$, (5) operating condition $\delta$ of a drive part or (7) required charged voltage $\xi$ can be entered remotely in the data memory means of the pod. This entry of information is possible at on-site clean-room by exchanging data directly between the data collection controller 725 and the substrate transport pod 1, and such a procedure can also be used for entering trial parameters and the like for development work.

Also, it is possible to send the information on individual pods I to the washing machines 708 through the network to select those pods that require washing. Also, those pods that require filter change can also be selected at the same time as washing these pods.

On the other hand, the parameter (9) process management information of a lot $\theta$ can be used to understand the process history of a lot, even when the pods do not relate, one-to-one, to the lots, by having the information transferred from a pod used in the preceding process to a pod to be used in the succeeding process. The information can be transferred through the powering station directly, without resorting to the data collection controller 725, and it is normally carried out automatically.

It should be noted that, although an embodiment of the present invention relates primarily to the substrate transport pods having a door on the bottom section, but various aspects of the present invention are applicable also to FOUPs (front opening unified pods).

Also, in the above embodiments, examples relate to substrate transport pods used in a wiring process of semiconductor manufacturing, but the present invention is not limited to wiring processes, and is applicable to all processes of semiconductor manufacturing that require various environments customized to processing conditions. According to the present invention, a structure of a substrate transport pod is provided for use in manufacturing of semiconductor chips comprised by copper wiring of less than 0.18 $\mu$m line width and low dielectric insulation film of less than 3.0 dielectric constant, in which the substrates are stored in the pod in an environment that maintains at least one parameter of air quality, including the level of particles, humidity, the level of organic substances, and the level of ionic gaseous substances, below a constant value. Further, a method is provided for using the pods in an automated semiconductor manufacturing plant in a logical and efficient manner.

It should be noted that, although various structures and methods of operating the substrate transport pods are described, these are meant to be illustrative and not restrictive of the essence of the invention. That is, it is obvious that various variations of the basic invention are possible by combining the elements described in the above embodiments, thereby enabling various variations within the scope of the present invention.

What is claimed is:

1. A method for transporting substrates between a plurality of processes, comprising:
   loading the substrates into a pod from an atmosphere of a first process;
   contacting the substrates to the pod directly or indirectly, the pod having a conductive part so as to enable static charges to be drained from the pod;
   removing at least one contaminant of moisture, particulate substances and chemical substances intermittently or continually so as to expose the substrates to a controlled atmosphere while the substrates are retained in the pod; and
   unloading the substrates from the pod for introduction to a second process.

2. A method according to claim 1, wherein an atmosphere in the first process is different than an atmosphere in the second process.

3. The method of claim 1, and further comprising circulating a gas in the pod having less than 10 particles per cubic meter of a size larger than 0.1 $\mu$m.

4. A method according to claim 1, wherein a gas in the pod is circulated and/or controlled in any selective pattern or atmosphere.

5. The method of claim 1, wherein the controlled atmosphere of the pod is a gaseous atmosphere forming an interior environment of the nod that is controlled by operating at least one of a circulations apparatus and a dehumidifying apparatus.

6. The method of claim 1, wherein the controlled atmosphere of the pod forms an interior environment that is controlled based on information of the atmosphere of the first process.

7. The method of claim 1, and further comprising selecting the pod to be used in said loading that has the most suitable function from a plurality of pods having different functions based on information of the atmosphere of the first process.

8. A substrate transport apparatus comprising a substrate transport pod for holding substrates therein, said substrate transport pod comprising:
   at least one filter for purifying gas selected from a filter for removing particulate substances, a filter for removing chemical substances and a dehumidifying apparatus for removing moisture;
   a circulation apparatus for circulating purified gas;
   a holding apparatus for holding the substrates in contact with said pod, either directly or indirectly, said holding apparatus having a conductive part so as to enable static charges to be drained from said pod.

9. The apparatus of claim 8, wherein said pod is provided with a gas sensor for detecting a processing gas.

10. The apparatus of claim 9, wherein said circulation apparatus is arranged to be controlled according to information provided by said gas sensor.

11. A substrate transport pod for containing, storing or transporting substrates, comprising:
    a pod main body and a door for hermetic sealing of the pod main body, which is formed primarily of a material having moisture absorption coefficient of not more than 0.1%, wherein the pod main body is in contact with the substrates directly or indirectly and has a conductive part so as to enable static charges to be drained from the pod main body.

12. A substrate transport pod according to claim 11, wherein a flow guiding structure is provided in interior of the pod main body for guiding a flow of a gas to the substrates.

13. A substrate transport pod according to claim 11, wherein a sensor is provided for detecting whether the door is opened or closed.

14. A substrate transport pod according to claim 11, wherein a sensor is provided for detecting presence of the substrates.

15. A substrate transport pod according to claim 13, wherein a gas circulation means for circulating a gas through the pod is provided, and operated when the door is in the closed state.

16. A substrate transport pod according to claim 14, wherein a gas circulation means is provided, and operated only when it is detected that the door is closed and the pod contains the substrates.

17. A substrate transport pod according to claim 11, wherein the pod is provided with a gas circulation means in its interior space for circulating an internal gas.

18. A substrate transport pod according to claim 11, wherein the pod is provided with a humidifying means in its interior space for removing moisture from an internal gas.

19. A substrate transport pod according to claim 11, wherein the pod is provided with powering means for supplying electrical power.

20. A substrate transport pod according to claim 19, wherein the powering means comprises secondary batteries installed on the pod.

21. A substrate transport pod according to claim 20, wherein a powering means is further provided for charging the secondary batteries.

22. A substrate transport pod according to claim 19, wherein the powering means is constructed to be non-contacting and is operated electromagnetically.

23. A substrate transport pod according to claim 19, wherein the powering means is constructed to be contacting through point contacts.

24. A substrate transport pod according to claim 19, wherein the powering means is provided at least on a load port of a manufacturing apparatus, in a storage facility or on a transport apparatus.

25. A substrate transport pod according to claim 19, wherein powering is started as the pod is seated in the powering means.

26. A substrate transport pod according to claim 11, wherein the pod is provided with a circulation apparatus for circulating a gas inside the pod and at least one of a particle filter, a chemical filter and a dehumidifying apparatus.

27. A substrate transport pod according to claim 26, wherein a filter and a gas circulation means are formed as a unit in a form of a rod.

28. A substrate transport pod according to claim 26, wherein a filter is cylinder shaped and the gas flows in a radial direction of the cylindrical filter.

29. A substrate transport pod according to claim 26, wherein a filter is rod shaped and the gas flows in a longitudinal direction of the rod filter.

30. A substrate transport pod according to claim 26, wherein a ducting and/or a flow control apparatus is provided for guiding the gas.

31. A substrate transport pod according to claim 11, wherein the pod has a gas intake opening and a gas discharge opening for the gas circulated inside the pod.

32. A substrate transport pod according to claim 31, wherein a reverse flow prevention mechanism is provided at least on the gas intake opening or the gas discharge opening.

33. A substrate transport pod according to claim 31, wherein a ducting and/or a flow control apparatus is provided to connect to the gas intake opening.

34. A substrate transport pod according to claim 31, wherein a chemical filter, and a particle filter and/or a dehumidifying apparatus is provided in the vicinity of the gas intake opening and/or a gas discharge opening.

35. A substrate transport pod according to claim 11, wherein the pod is oriented so that a center of gravity in a horizontal direction lies within at least 90% or preferably 70% of a radius of substrates.

36. A substrate transport pod according to claim 11, wherein the pod is provided with an internal environment matching a processing atmosphere for substrates contained in the pod, and is used to transport the substrates between a plurality of processes.

37. A substrate transport apparatus comprising: a substrate transport pod that can be sealed hermetically for holding substrates therein, said substrate transport pod comprising:
at least one of a particle filter, a chemical filter, and a dehumidifying apparatus for removing, respectively, particulate substances, chemical substances, and moisture from a gas circulated inside the pod;
a gas circulation apparatus for circulating a purified gas;
a holding apparatus for holding the substrates so as to keep the state of the substrates by exposing the substrates to the purified gas; and
an identifier for distinguishing individual pods, whose historical data is managed by a computing apparatus.

38. A substrate transport pod according to claim 37, wherein the pod is provided with a data storing apparatus.

39. A substrate transport pod according to claim 37, wherein the pod has a means for receiving external signals, and controls internal environment in the pod according to the external signals.

40. A substrate transport pod according to claim 37, wherein an internal environment is controlled by sending and receiving information between the pod and a processing apparatus.

41. A substrate transport pod according to claim 37, wherein the pod is provided with processing history management information on substrates, and processing of the substrates is managed by transferring the processing history management information from one pod to other pod.

42. A substrate transport pod according to claim 41, wherein the processing history management is carried out by way of a host computer network.

43. A substrate transport pod according to claim 41, wherein a processing history is transferred from one pod to other pod by a controller provided on a processing apparatus.

44. A substrate transport pod according to claim 37, wherein a washing interval for a pod is managed by information stored in memory means of the pod.

45. A substrate transport pod according to claim 37, wherein a filter change interval of a pod is computed from a product of a processed gas volume and a duration of pod operation.

46. A substrate transport pod according to claim 37, wherein a washing interval is estimated from a duration of pod operation.

47. A substrate transport pod according to claim 37, wherein residual power of secondary batteries provided for a pod is measured, and charging is carried out to a necessary level of power.

48. A substrate transport pod according to claim 37, wherein management of information on individual pods is carried out by sending and receiving information for individual pods by wire or radio transmission through a network.

49. A substrate transport pod according to claim 37, wherein processing history management information for a lot is transferred from a pod used in a preceding step to a pod to be used in a succeeding step.

50. A substrate transport pod according to claim 37, wherein information on a pod to be washed is sent to a pod washing machine so that the pod can be selected and subjected to washing.

51. The method of claim 1, wherein the substrates have surfaces that are resist-coated and the controlled atmosphere has an ammonia level controlled below a given level.

52. The method of claim 51, wherein the ammonia level is controlled by adsorbing ammonia gas with a chemical filter.

53. The apparatus of claim 8, and further comprising a dehumidifying apparatus provided for the pod so that a humidity level interior of the pod is controlled by removing moisture.

54. The method of claim 1, wherein the pod is provided with a contaminant removal means and target components are selectively chosen for removing particulate contaminants, metallic contaminants, ionic contaminants, organic contaminants and moisture, and the pod is used for return transport for each process.

55. A method for manufacturing a semiconductor device by transporting substrates between a plurality of processes, comprising:
loading the substrates into a pod from an atmosphere of a first process;
contacting the substrates to the pod directly or indirectly the pod having a conductive part so as to enable static charges to be drained from the pod;
circulating a gaseous atmosphere through the interior of the pod to remove at least one contaminant of moisture, particulate substances and chemical substances so as to expose the substrates to a controlled atmosphere intermittently or continually while the substrates are retained in the pod; and
unloading the substrates from the god and introducing the substrates into a second process.

56. The method of claim 1, wherein the pod is used in a wiring process in which copper wiring and low dielectric films are formed on the substrates.

57. The apparatus of claim 8, wherein the pod further comprises a moisture aversion part including at least one of a filter, a dehumidifying apparatus and a circulation apparatus, that is detachable for washing.

58. The apparatus of claim 57, wherein a plate can be attached to the pod, whereby the pod can be washed by a pod washing machine when the moisture aversion part is detached and the plate is attached.

* * * * *

UNITED STATES PATENT AND TRADEMARK OFFICE
CERTIFICATE OF CORRECTION

PATENT NO. : 6,758,876 B2
DATED : July 6, 2004
INVENTOR(S) : Yoko Suzuki et al.

It is certified that error appears in the above-identified patent and that said Letters Patent is hereby corrected as shown below:

Column 57,
Line 41, change "nod" to -- pod --.

Column 58,
Line 14, after "provided" delete "in".

Column 60,
Line 47, after "indirectly" add -- , --; and
Line 53, change "god" to -- pod --.

Signed and Sealed this

Thirtieth Day of November, 2004

JON W. DUDAS
*Director of the United States Patent and Trademark Office*